United States Patent
Arneson et al.

(10) Patent No.: US 10,964,561 B2
(45) Date of Patent: Mar. 30, 2021

(54) INTEGRATED CIRCUIT CONTROLLED EJECTION SYSTEM (ICCES) FOR MASSIVELY PARALLEL INTEGRATED CIRCUIT ASSEMBLY (MPICA)

(71) Applicant: Matrics2, Inc., Warba, MN (US)

(72) Inventors: Michael R. Arneson, Warba, MN (US); William R. Bandy, Gambrills, MD (US)

(73) Assignee: Matrics2, Inc., Warba, MN (US)

( * ) Notice: Subject to any disclaimer, the term of this patent is extended or adjusted under 35 U.S.C. 154(b) by 0 days.

(21) Appl. No.: 16/142,448

(22) Filed: Sep. 26, 2018

(65) Prior Publication Data

US 2019/0198361 A1 Jun. 27, 2019

Related U.S. Application Data

(63) Continuation of application No. 14/795,771, filed on Jul. 9, 2015, now abandoned.

(60) Provisional application No. 62/022,590, filed on Jul. 9, 2014.

(51) Int. Cl.
    *H01L 21/00* (2006.01)
    *H01L 21/67* (2006.01)
    *H01L 23/00* (2006.01)
    *H01L 21/683* (2006.01)
    *H01L 23/544* (2006.01)

(52) U.S. Cl.
    CPC .. *H01L 21/67092* (2013.01); *H01L 21/67132* (2013.01); *H01L 21/67144* (2013.01); *H01L 21/6835* (2013.01); *H01L 24/75* (2013.01); *H01L 24/95* (2013.01); *H01L 23/544* (2013.01); *H01L 2221/68313* (2013.01); *H01L 2223/5444* (2013.01); *H01L 2224/75* (2013.01); *H01L 2924/13063* (2013.01); *H01L 2924/13091* (2013.01)

(58) Field of Classification Search
    CPC ........ Y10T 156/1077; Y10T 156/1092; Y10T 156/1075; B28C 2793/0072; H01L 21/6835; H01L 21/6836; H01L 21/78; H01L 21/67132; H01L 2221/68313; H01L 2221/68327; H01L 24/27; H01L 21/67092
    See application file for complete search history.

(56) References Cited

U.S. PATENT DOCUMENTS

| | | | | |
|---|---|---|---|---|
| 1,483,204 | A * | 2/1924 | Strand | B21D 24/02 72/483 |
| 2006/0225273 | A1* | 10/2006 | Arneson | H05K 13/046 29/834 |
| 2016/0013090 | A1 | 1/2016 | Arneson et al. | |

* cited by examiner

*Primary Examiner* — Linda L Gray
(74) *Attorney, Agent, or Firm* — Fiala & Weaver P.L.L.C.

(57) ABSTRACT

Methods, systems, and apparatuses are described for integrated circuit controlled ejection system (ICCES) for massively parallel integrated circuit assembly (MPICA). A unique Integrated Circuit (IC) die ejection head assembly system is described, which utilizes Three-Dimensional (3D) printing to achieve very high resolution manufacturing to meet the precision tolerances required for very small IC die sizes.

15 Claims, 122 Drawing Sheets

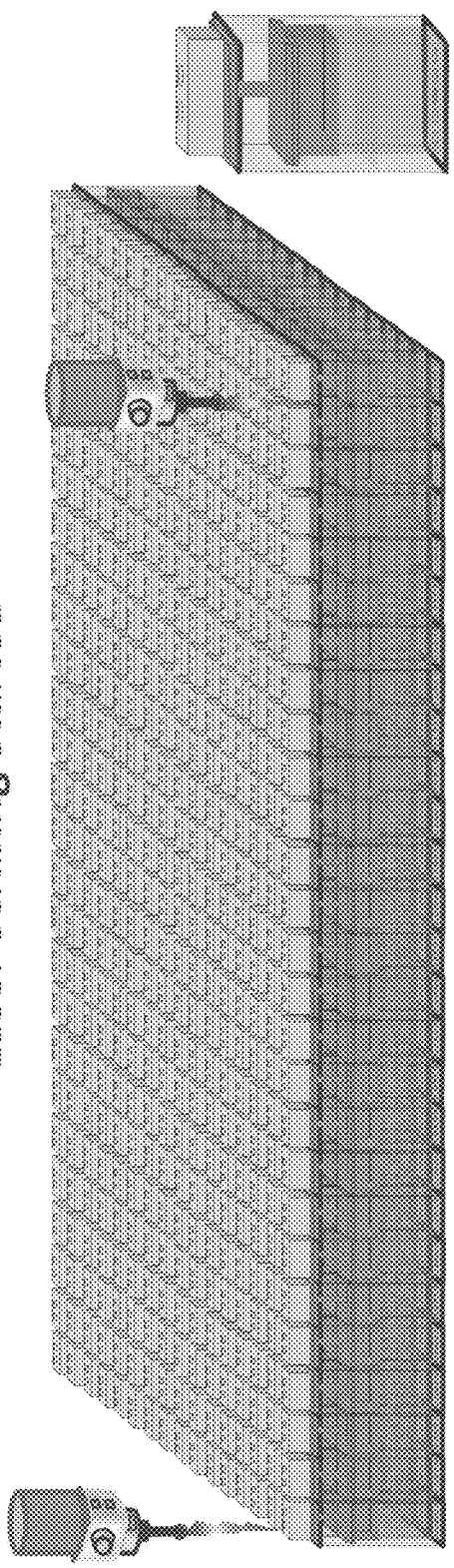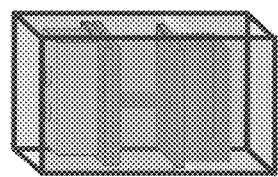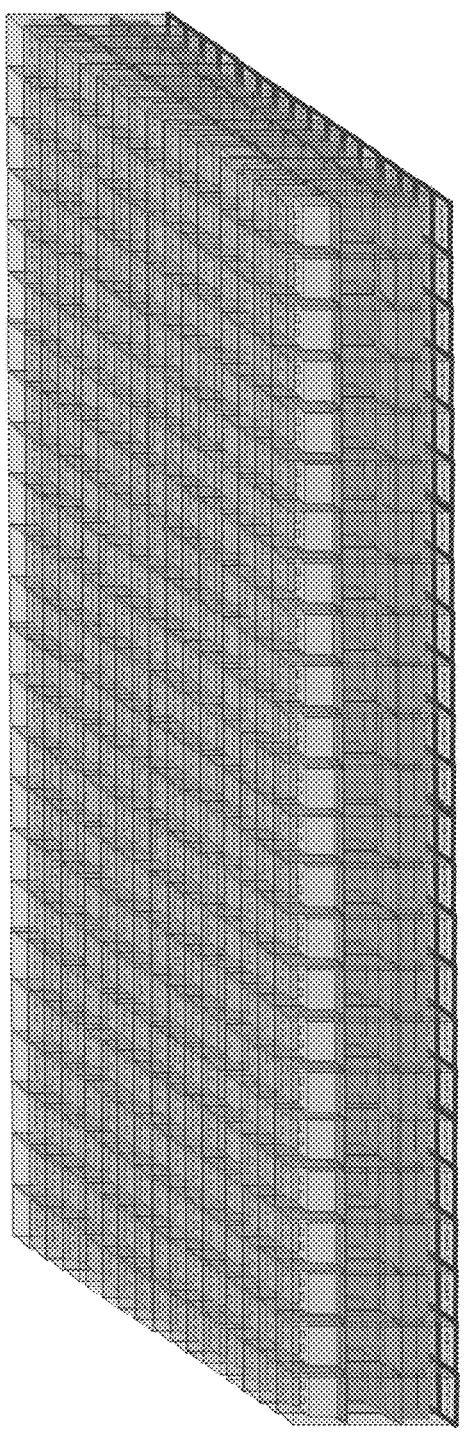
FIG. 13

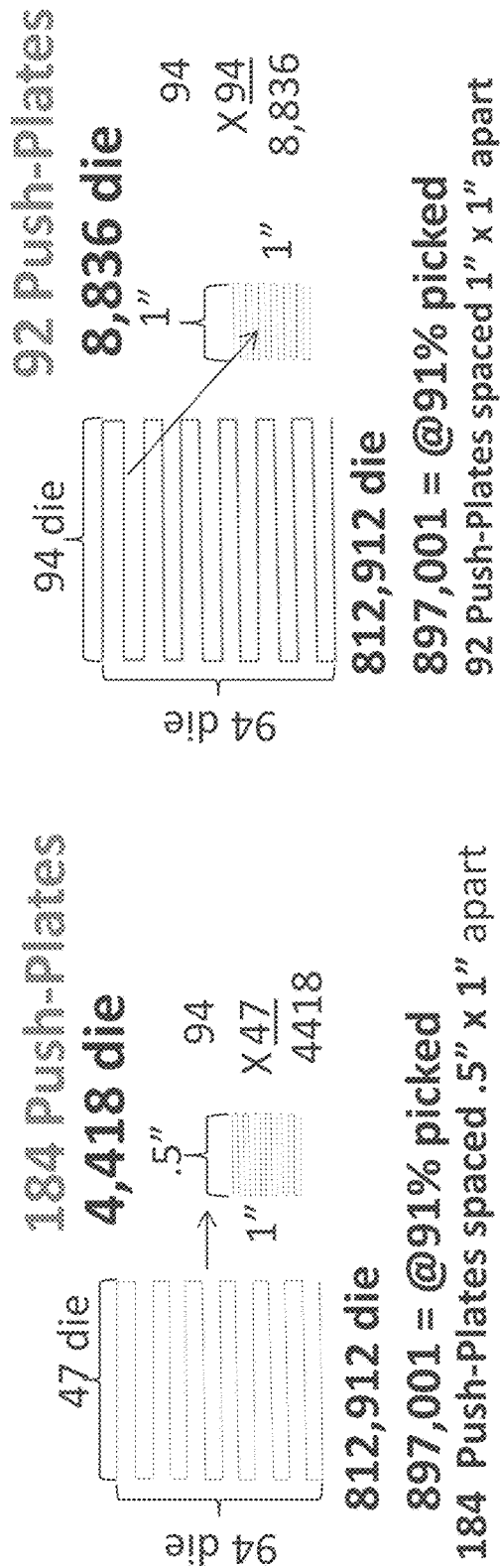
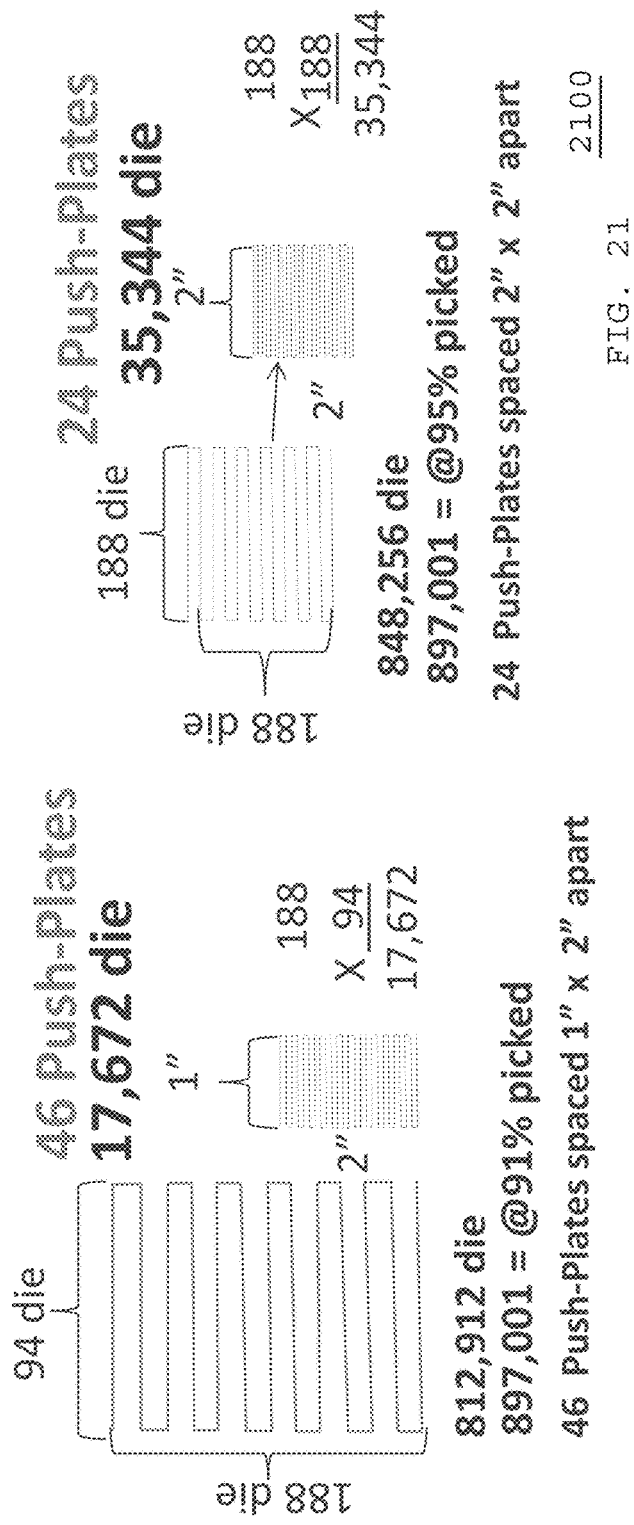
FIG. 21

2200

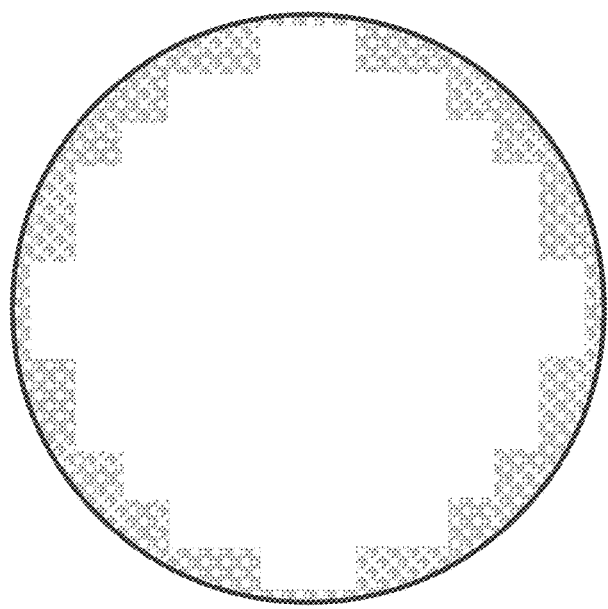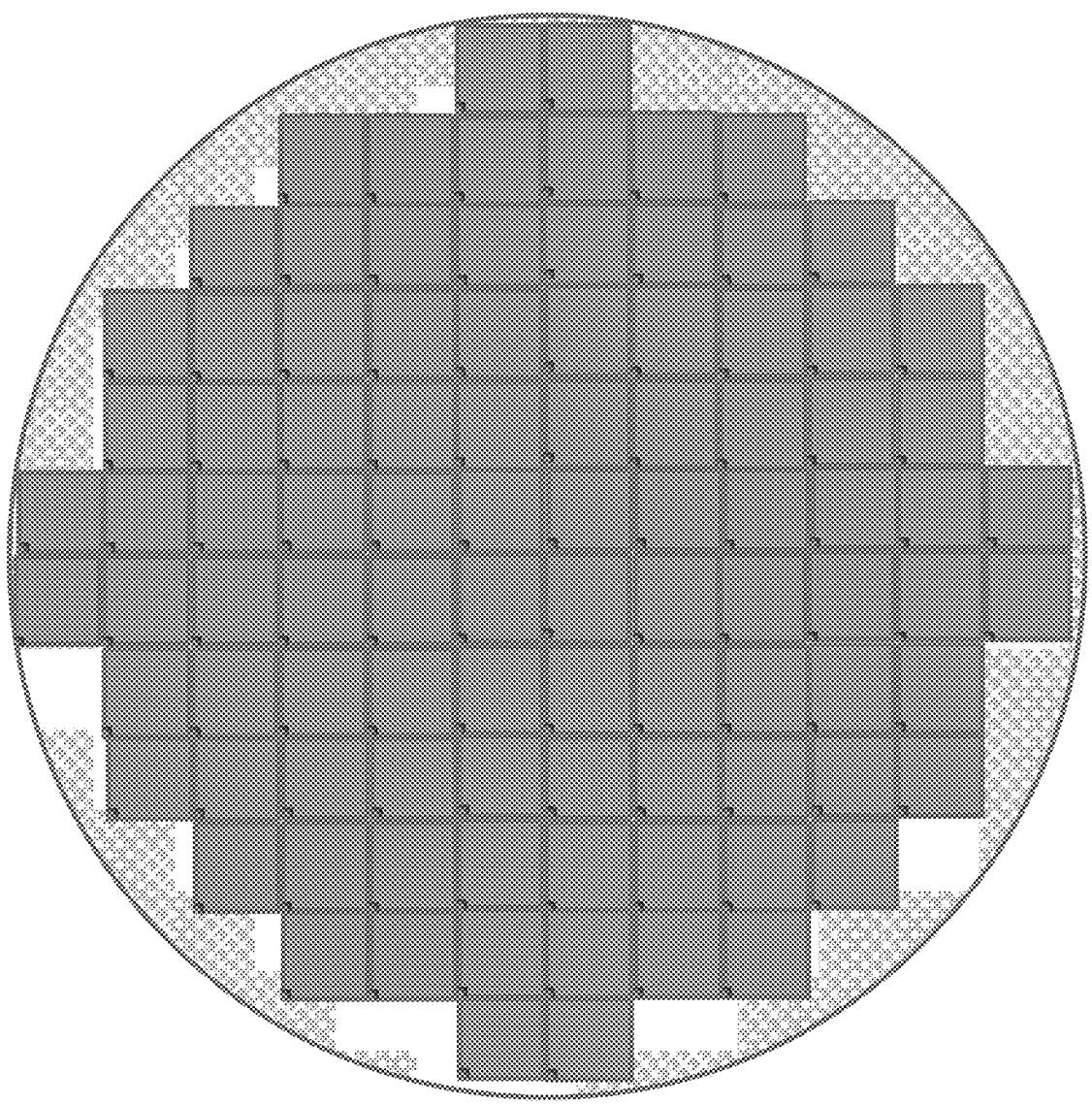
FIG. 23
2300

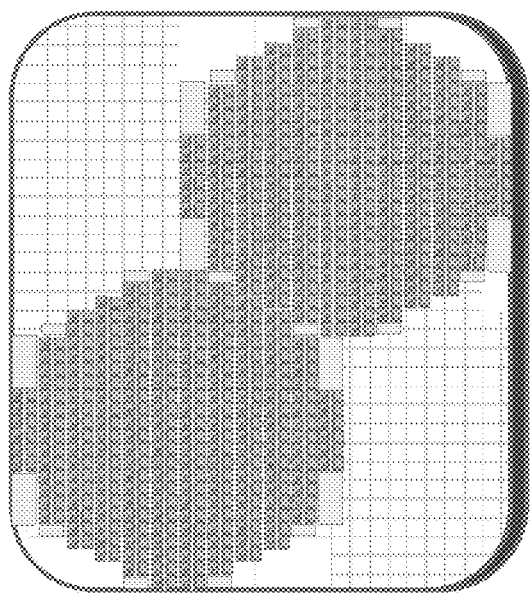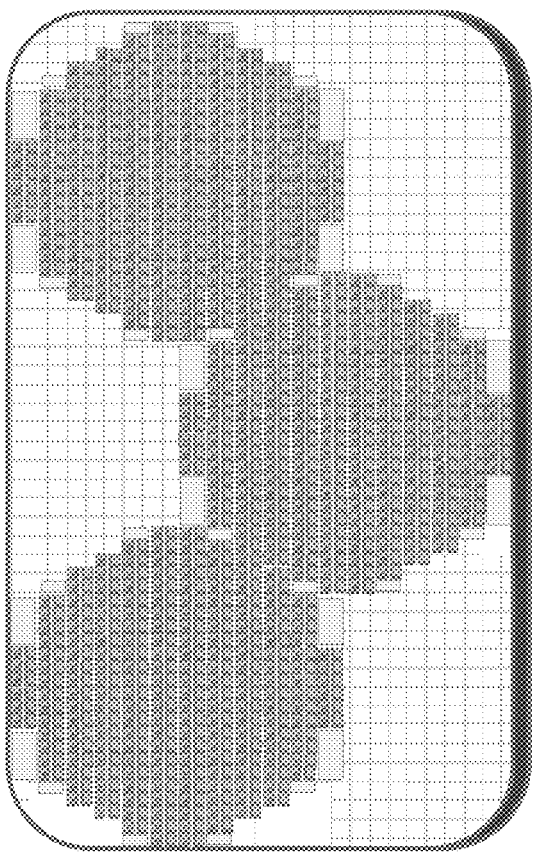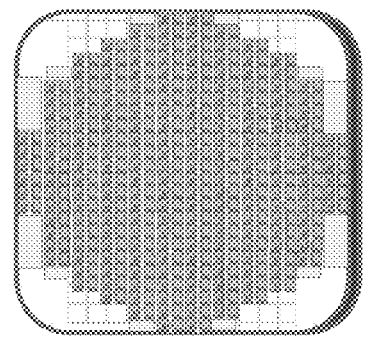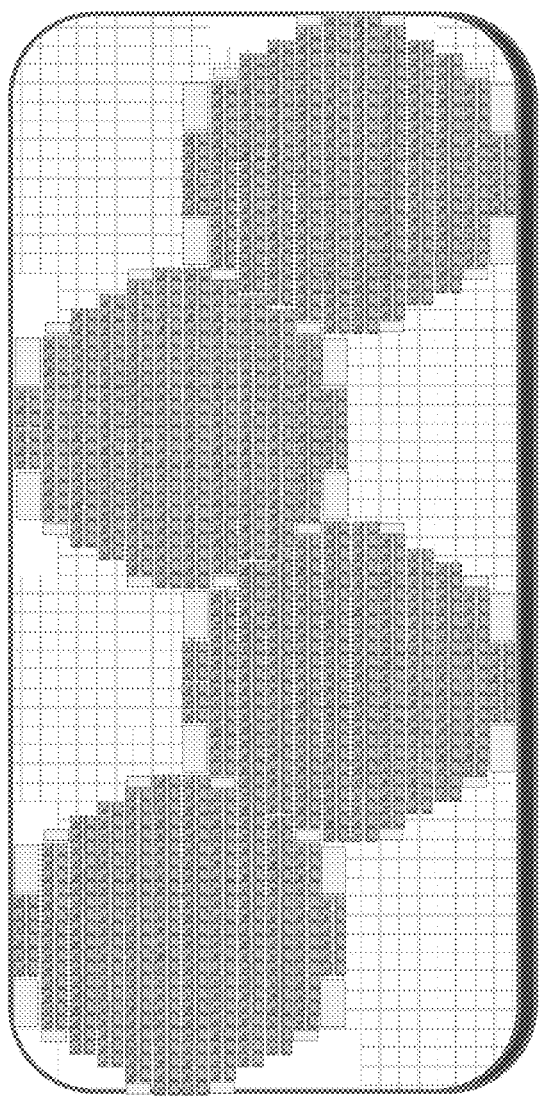
1 – 2 – 3 and 4 wafer Scribing Plates
FIG. 33
3300

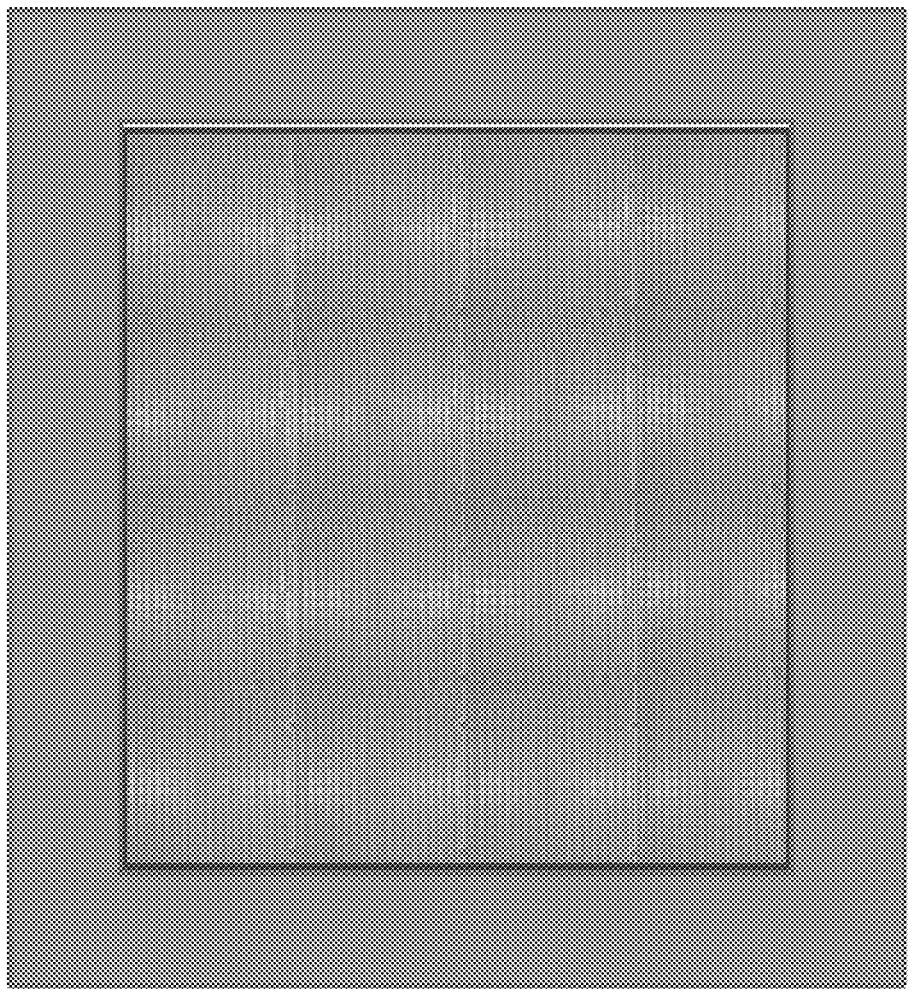
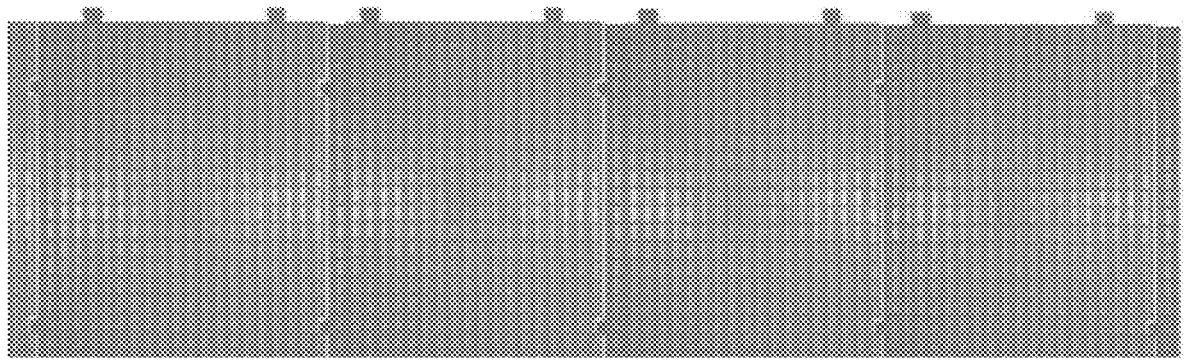
FIG. 44
4400

6500

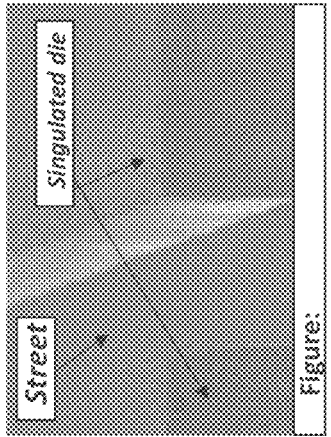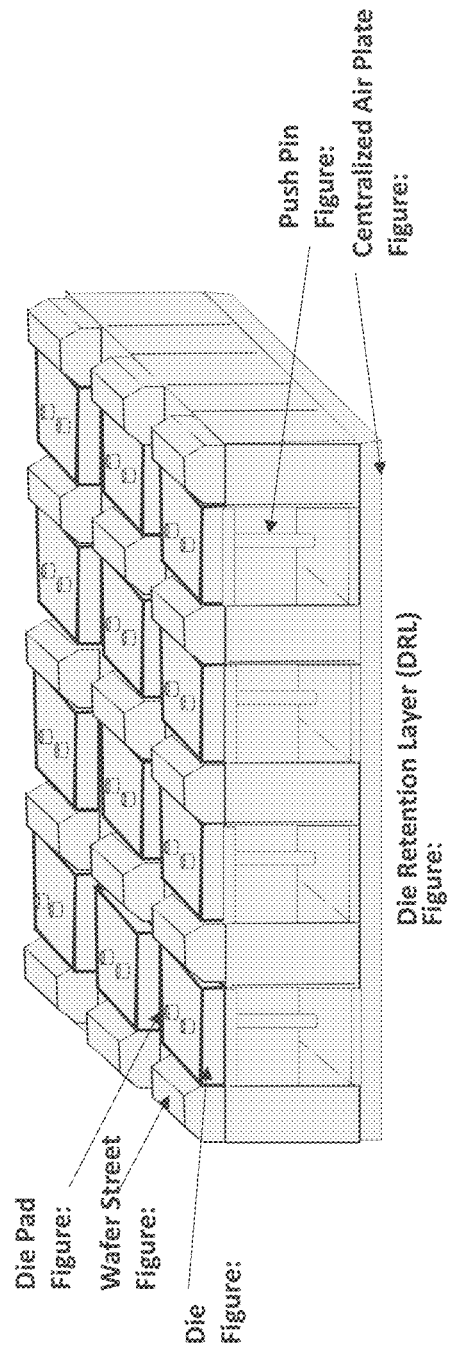
FIG. 68  6800

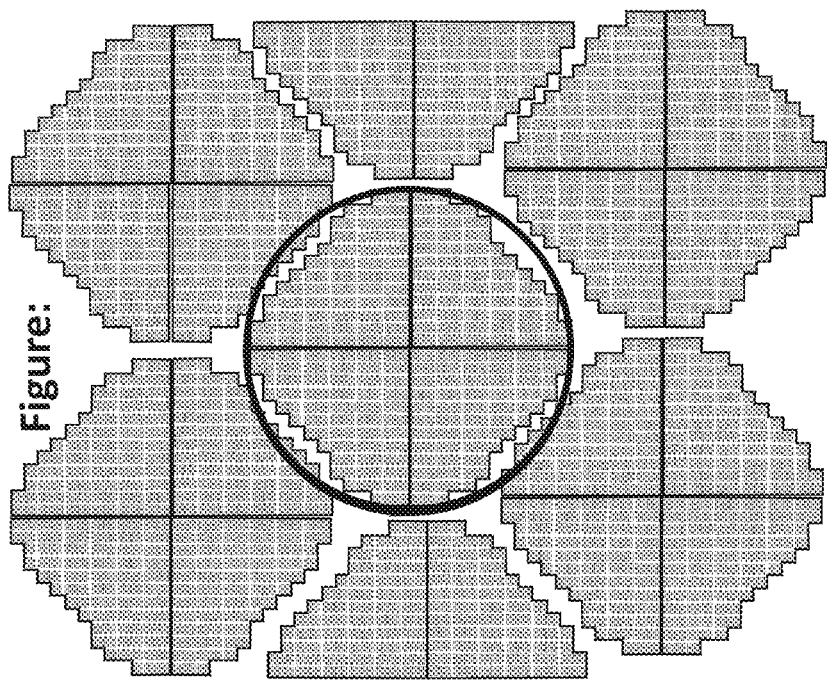
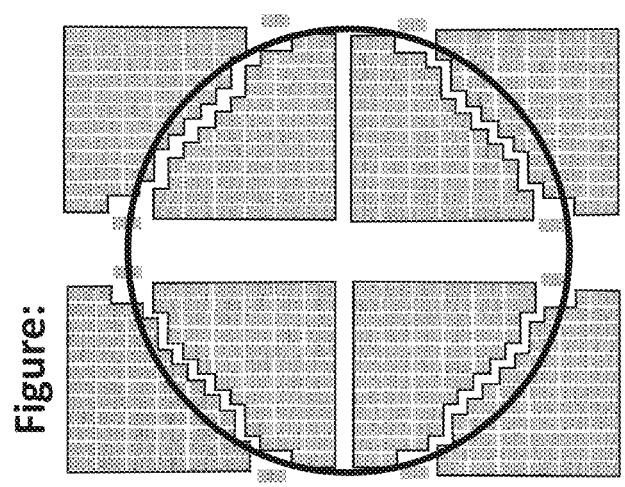
FIG. 88

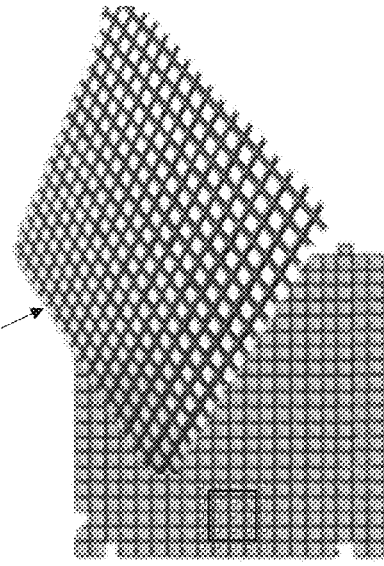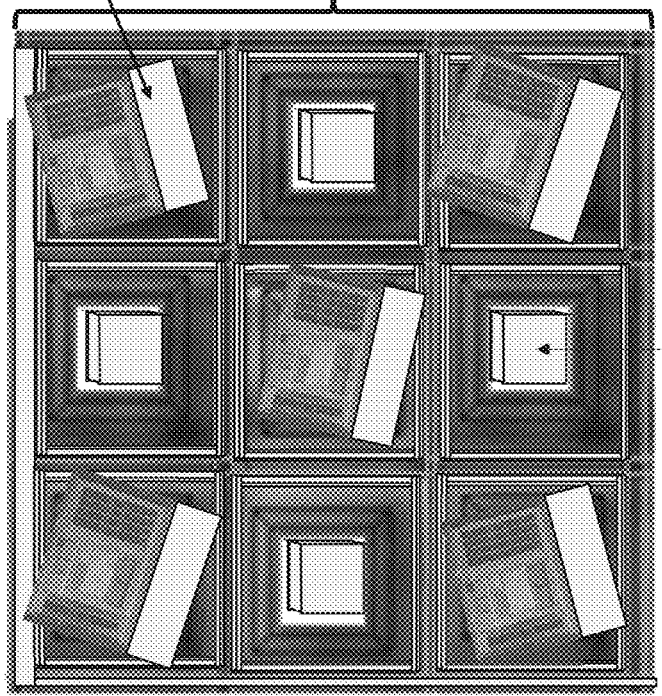
FIG. 99

FIG. 110   11000

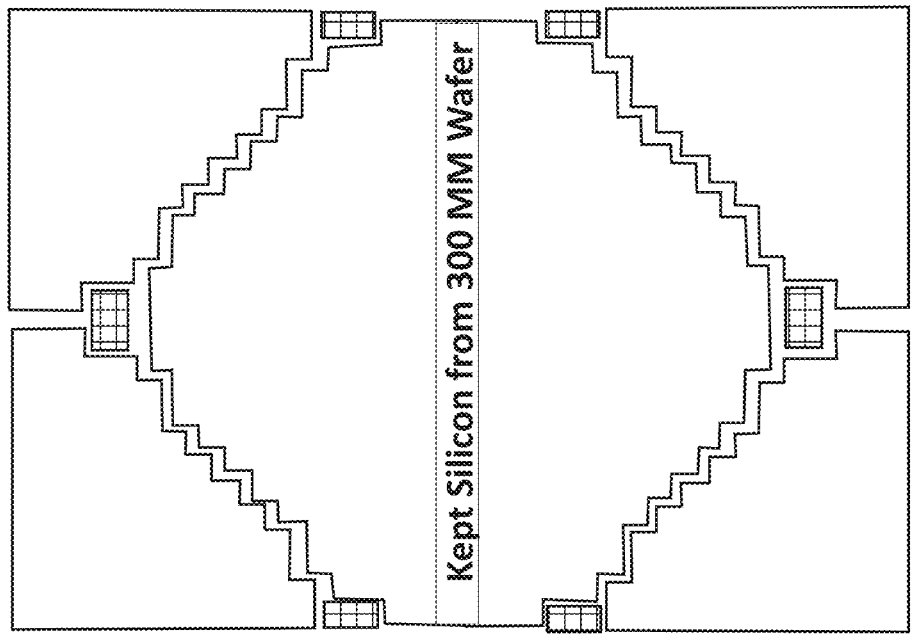
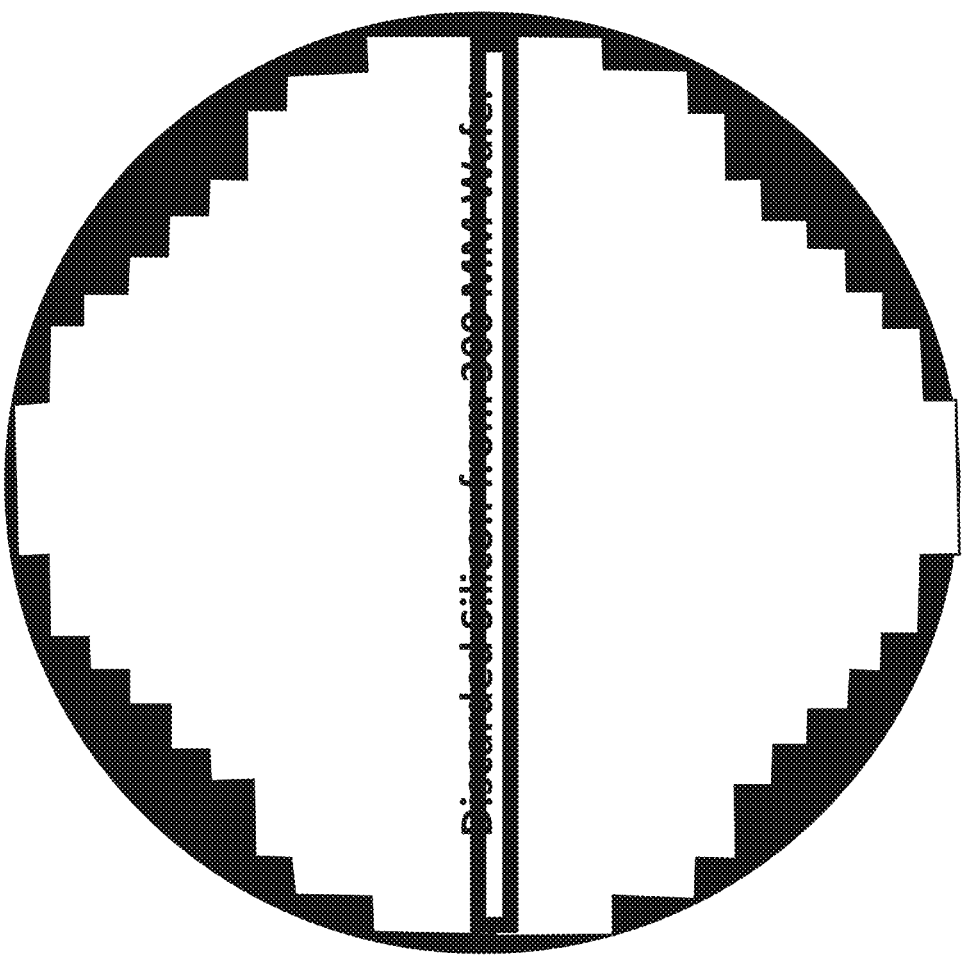
FIG. 121

US 10,964,561 B2

INTEGRATED CIRCUIT CONTROLLED EJECTION SYSTEM (ICCES) FOR MASSIVELY PARALLEL INTEGRATED CIRCUIT ASSEMBLY (MPICA)

CROSS-REFERENCE TO RELATED APPLICATION(S)

This application is a continuation of U.S. application Ser. No. 14/795,771, titled "Integrated Circuit Controlled Ejection System (ICCES) for Massively Parallel Integrated Circuit Assembly (MPICA)," filed Jul. 9, 2015, which claims the benefit of U.S. Provisional Patent Application No. 62/022,590, entitled "Integrated Circuit Controlled Ejection System (ICCES) for Massively Parallel Integrated Circuit Assembly (MPICA)," filed Jul. 9, 2014, which are both hereby incorporated by reference herein in their entireties.

BACKGROUND

Technical Field

The present invention relates to integrated circuit controlled ejection system
(ICCES) for massively parallel integrated circuit assembly (MPICA).

Background Art

A first parallel IC assembly system was built in 2004, which used a mechanical pushpin system to push multiple die in parallel onto an antenna substrate for the manufacture of RFID devices. This pushpin system was difficult and expensive to fabricate, and was not scalable down to the smaller dimensions required for very small die sizes.

BRIEF SUMMARY

Methods, systems, and apparatuses are described for integrated circuit controlled ejection system (ICCES) for massively parallel integrated circuit assembly (MPICA), substantially as shown in and/or described herein in connection with at least one of the figures, as set forth more completely in the claims.

BRIEF DESCRIPTION OF THE DRAWINGS/FIGURES

The accompanying drawings, which are incorporated herein and form a part of the specification, illustrate embodiments and, together with the description, further serve to explain the principles of the embodiments and to enable a person skilled in the pertinent art to make and use the embodiments.

FIG. 1 shows a wafer 100 having a plurality of die, according to an example embodiment.

FIG. 13 shows a side view of a laser scriber, pistons, and wafer scribing plate 1300, according to an example embodiment.

FIG. 21 shows scribing route layouts 2100 for push plates, according to an example embodiment.

FIG. 23 shows a wafers 2300 with grouped die, according to an example embodiment.

FIG. 33 shows wafer scribing plates 3300, according to an example embodiment.

FIG. 44 shows printed antenna patterns 4400, according to an example embodiment.

FIG. 68 shows singulated die in a die retention layer 6800, according to an example embodiment.

Figure 76:
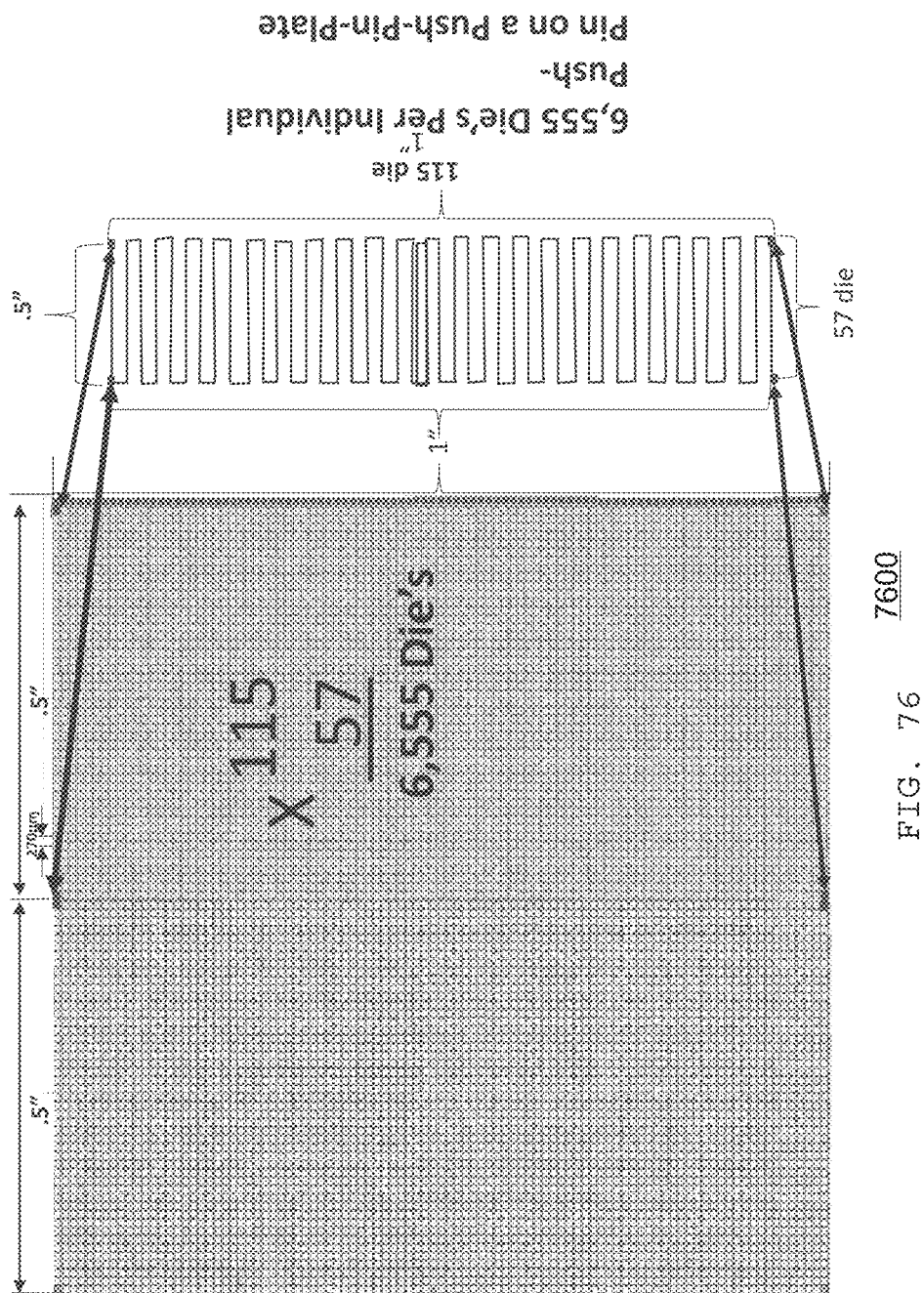

FIG. 76 push-pin-piston layout 7600 for antenna, according to an example embodiment.

Figure 77:
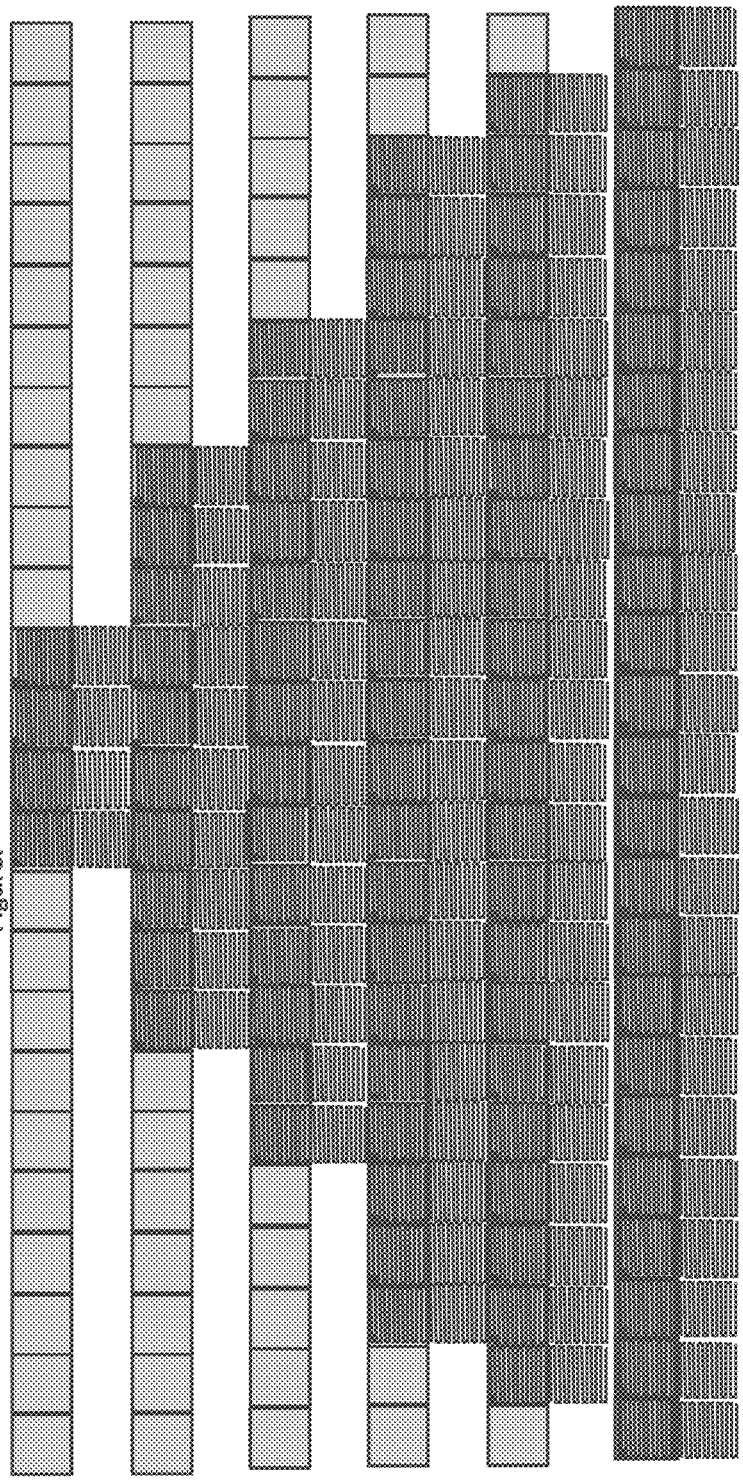

FIG. 77 shows a patterned air plate 7700, according to an example embodiment.

Figure 78:
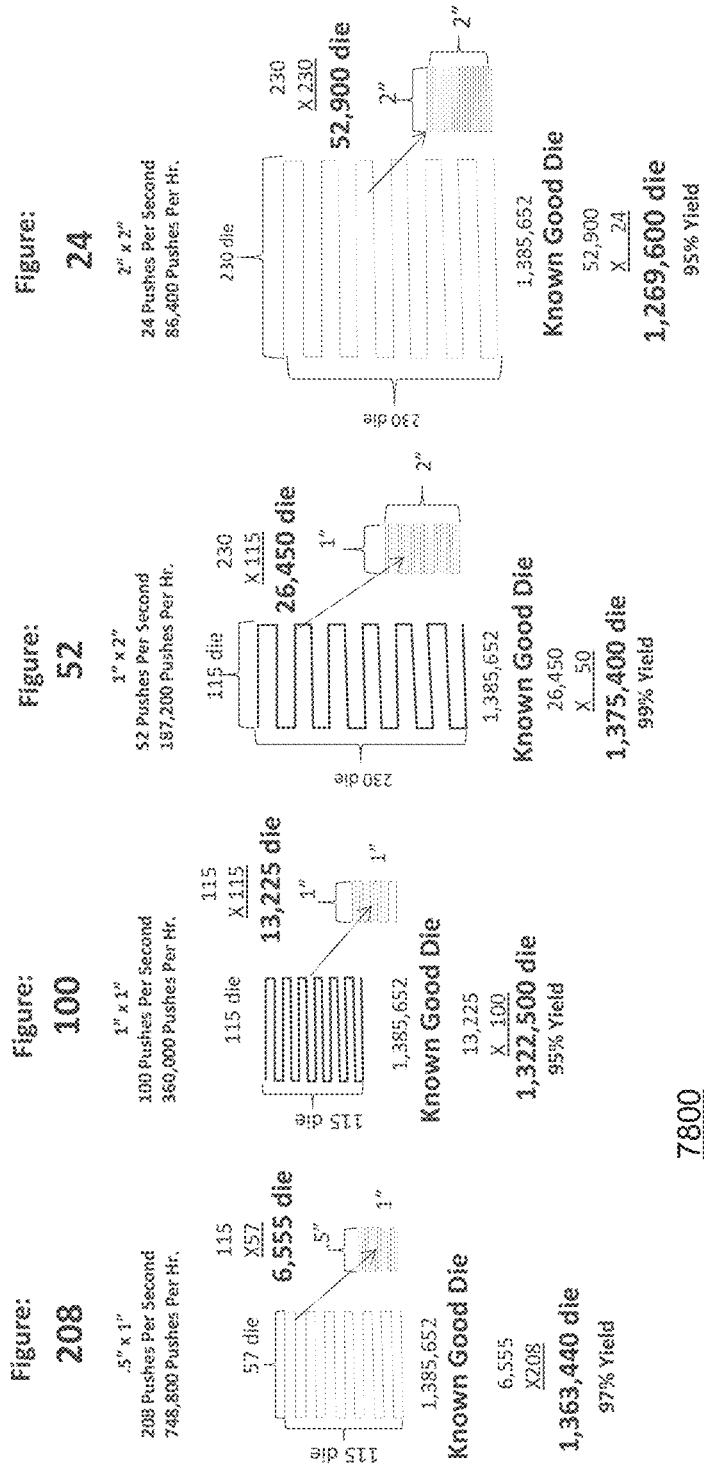

FIG. 78 shows a push-pin-piston layout 7800 for push plates, according to an example embodiment.

Figure 79:
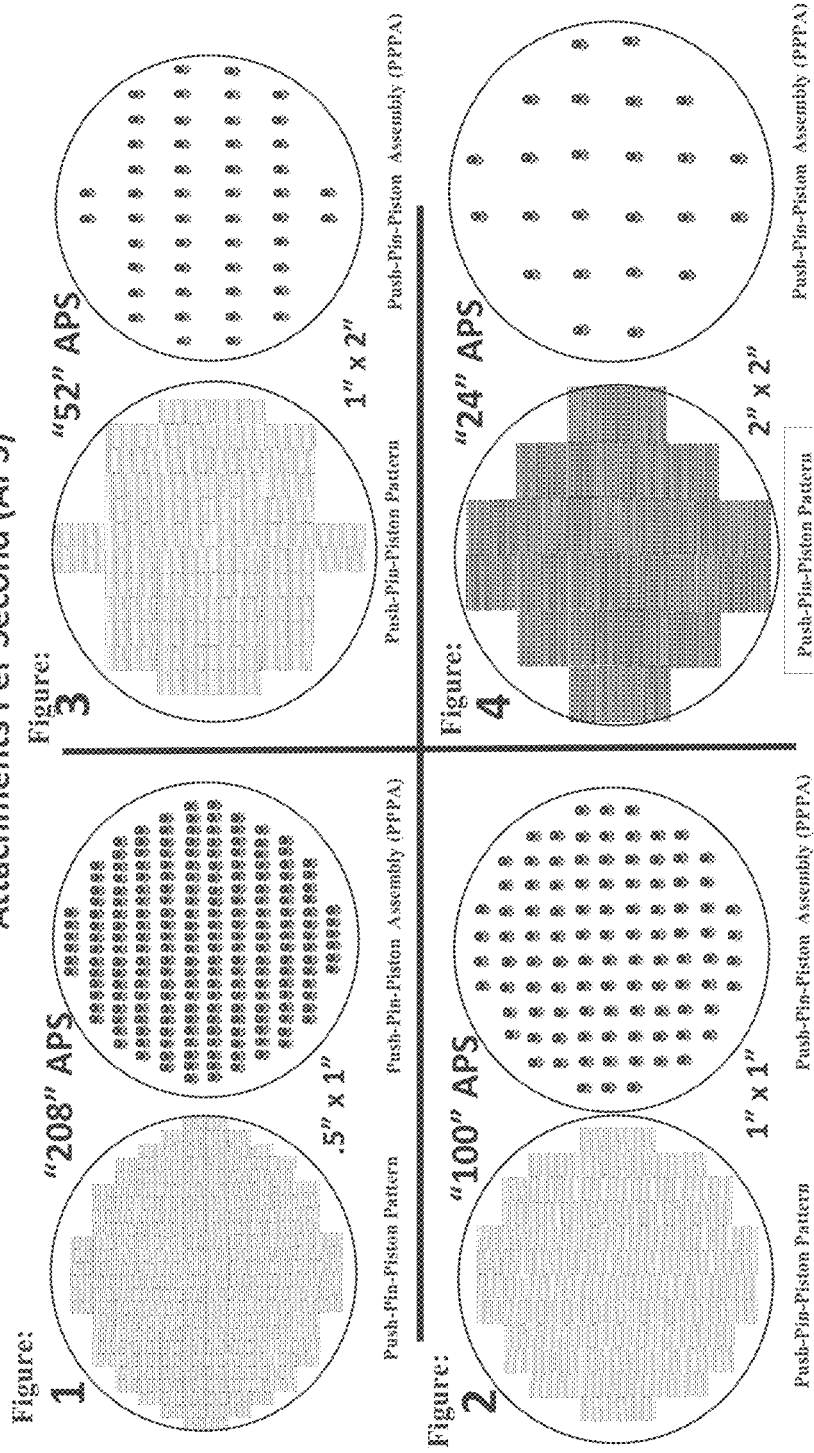

FIG. 79 shows attachment configurations 7900 for push-pin-piston patterns, according to an example embodiment.

Figure 80:
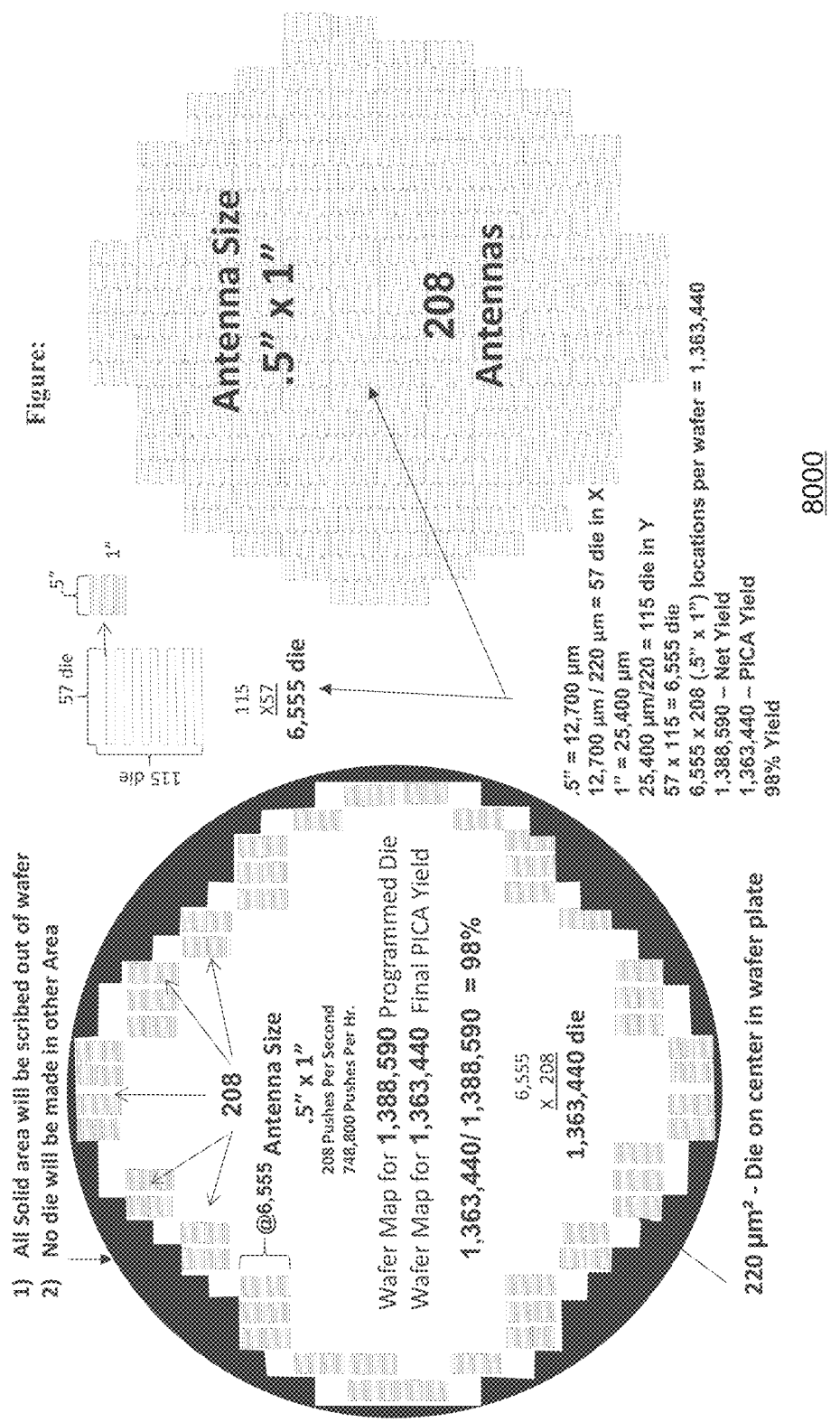

FIG. 80 shows antenna layout configurations 8000 for wafers, according to an example embodiment.

Figure 81:
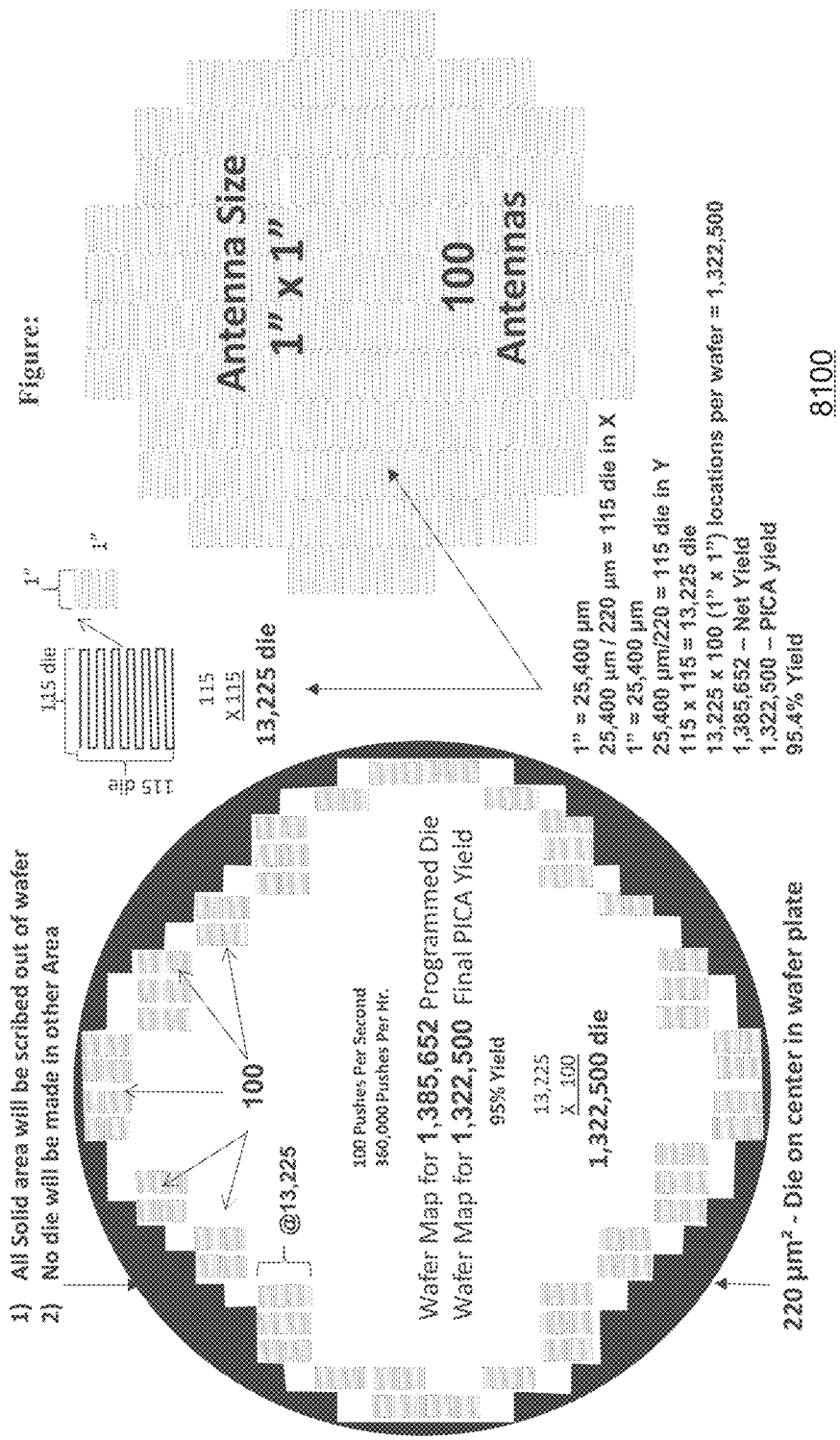

FIG. 81 shows antenna layout configurations 8100 for wafers, according to an example embodiment.

Figure 82:
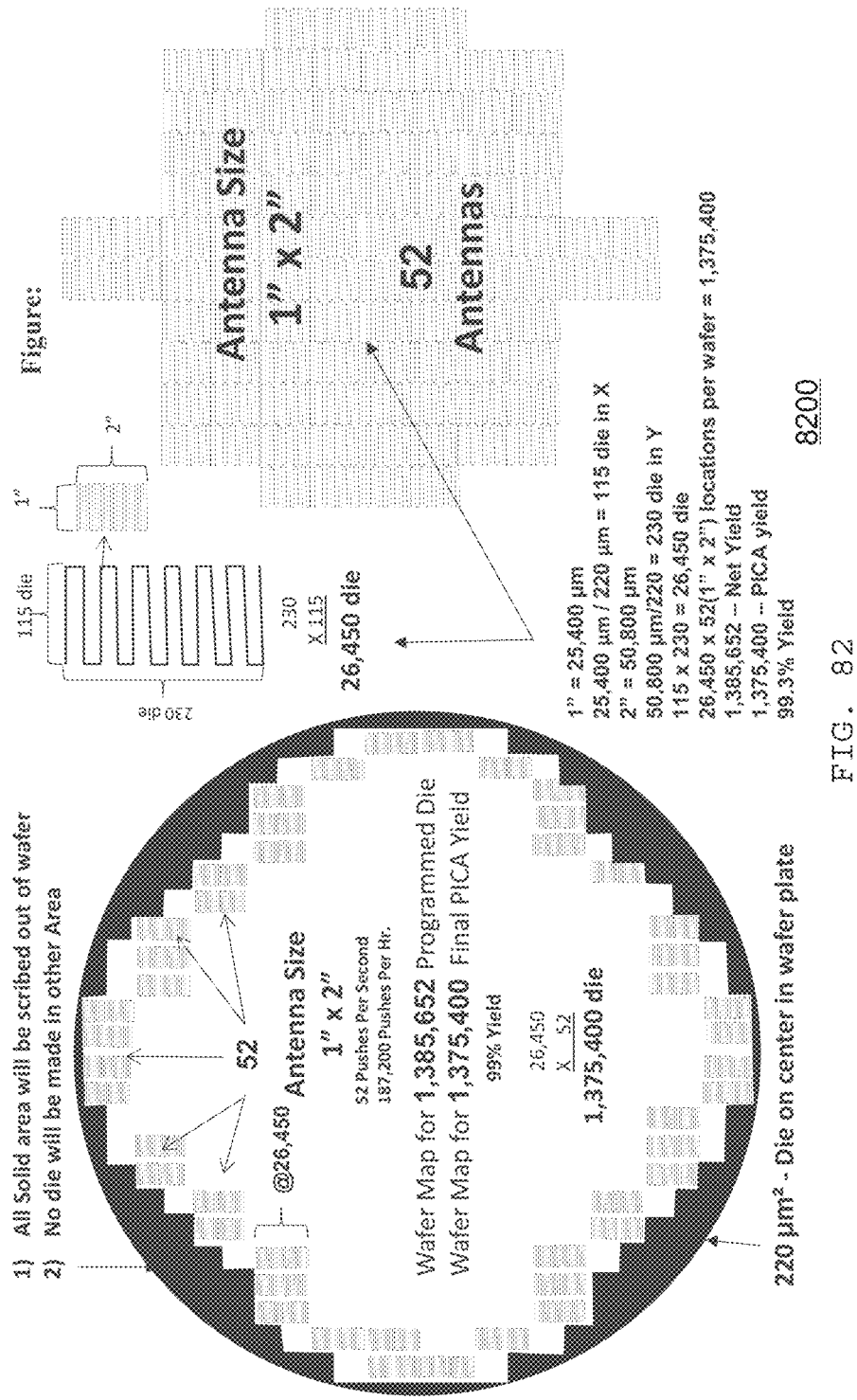

FIG. 82 shows antenna layout configurations 8200 for wafers, according to an example embodiment.

Figure 83:
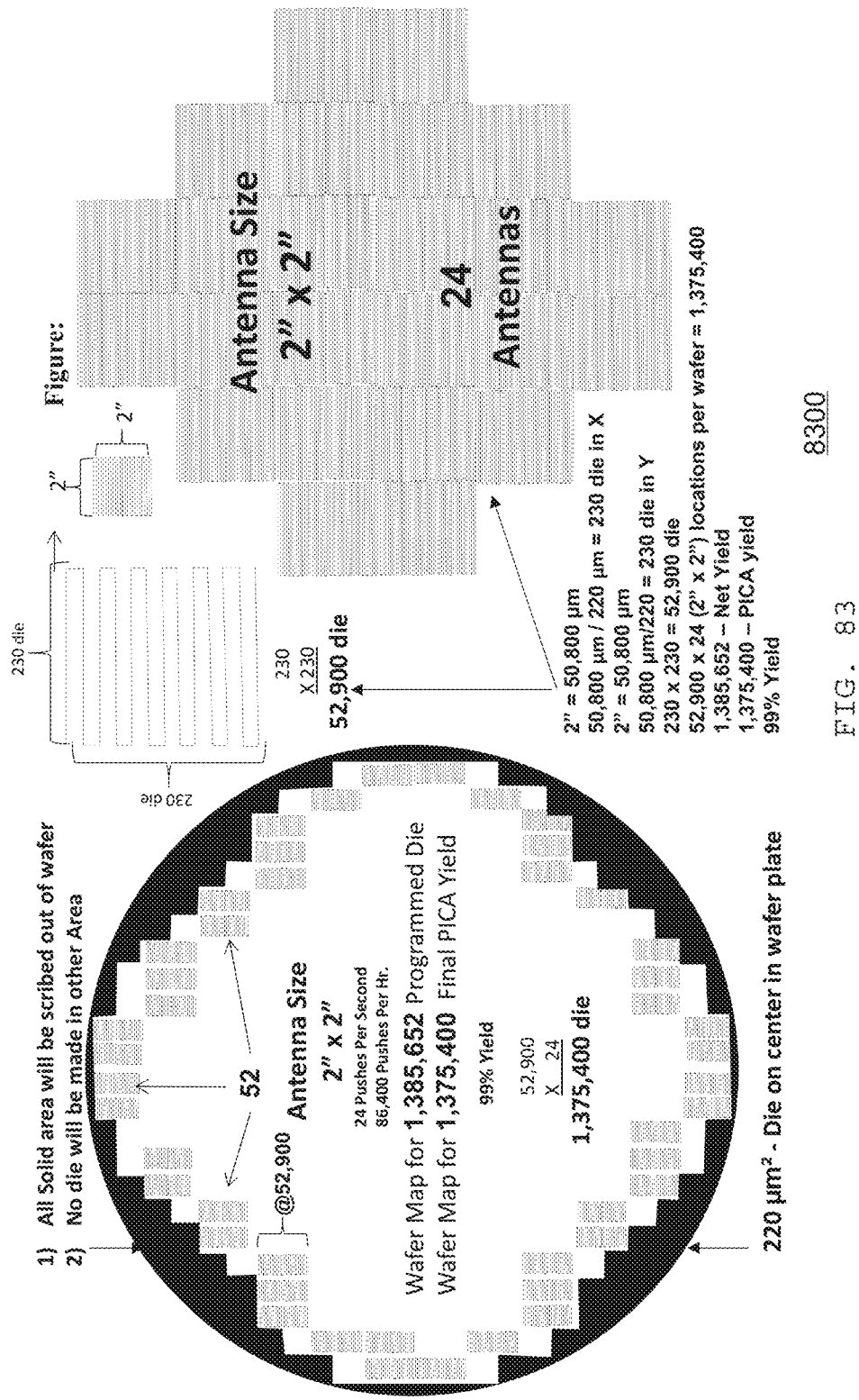

FIG. 83 shows antenna layout configurations 8300 for wafers, according to an example embodiment.

Figure 84:
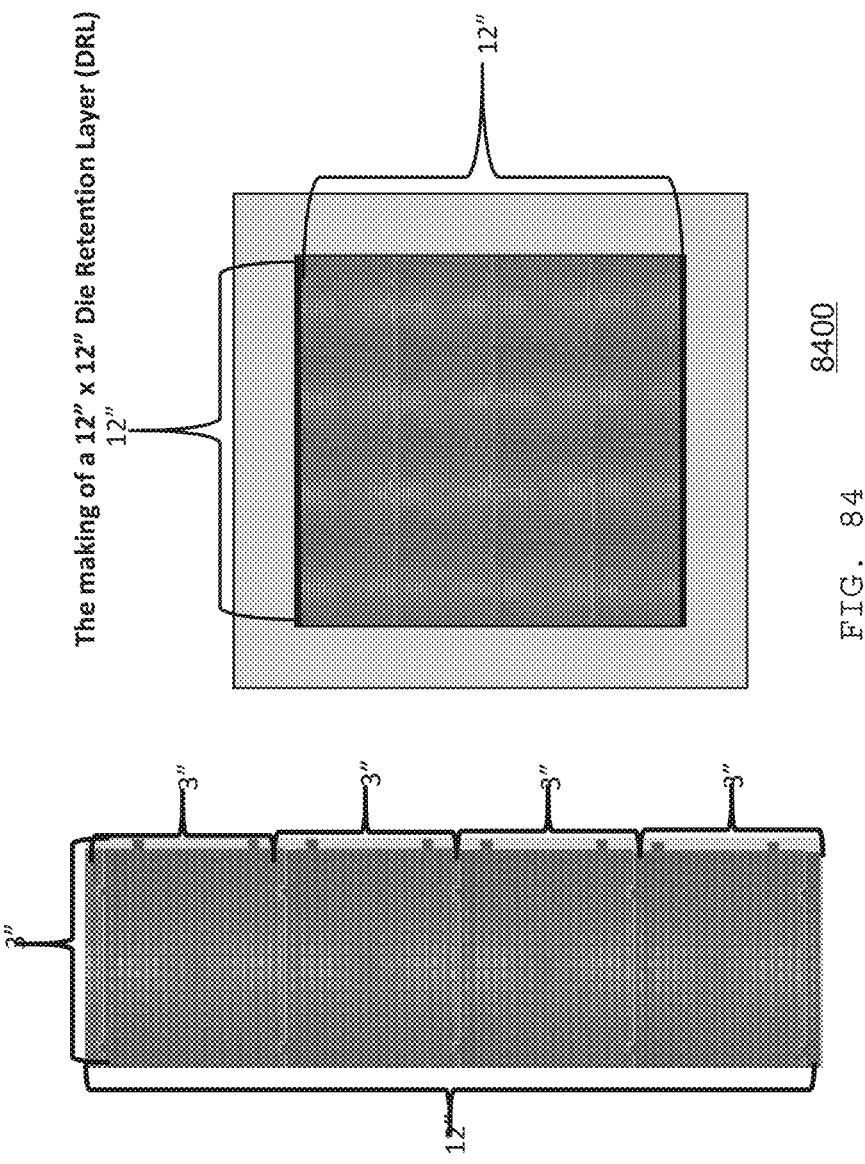

FIG. 84 shows a die retention layer 8400, according to an example embodiment.

Figure 85:
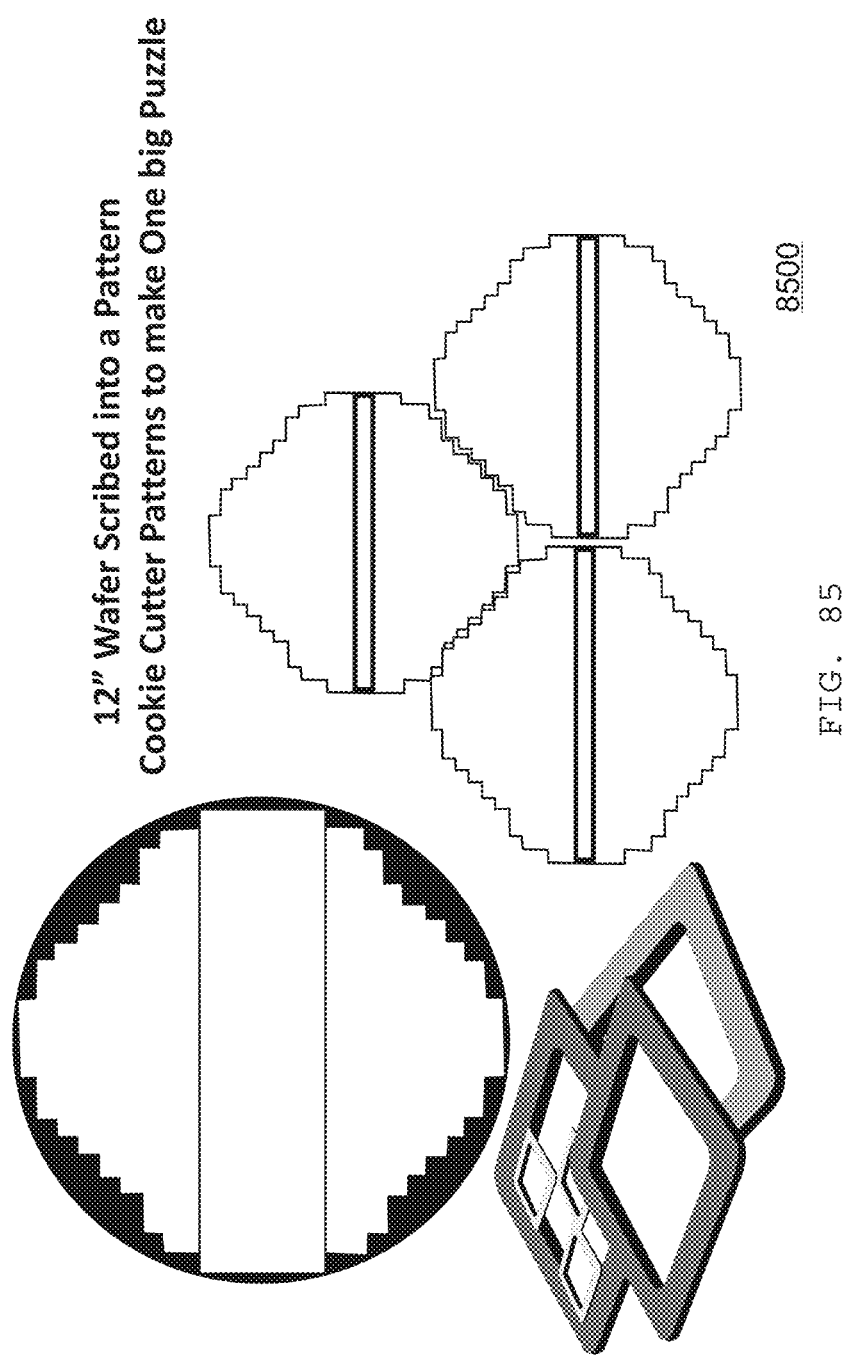

FIG. 85 shows templates 8500 for wafer scribing patterns, according to an example embodiment.

Figure 86:
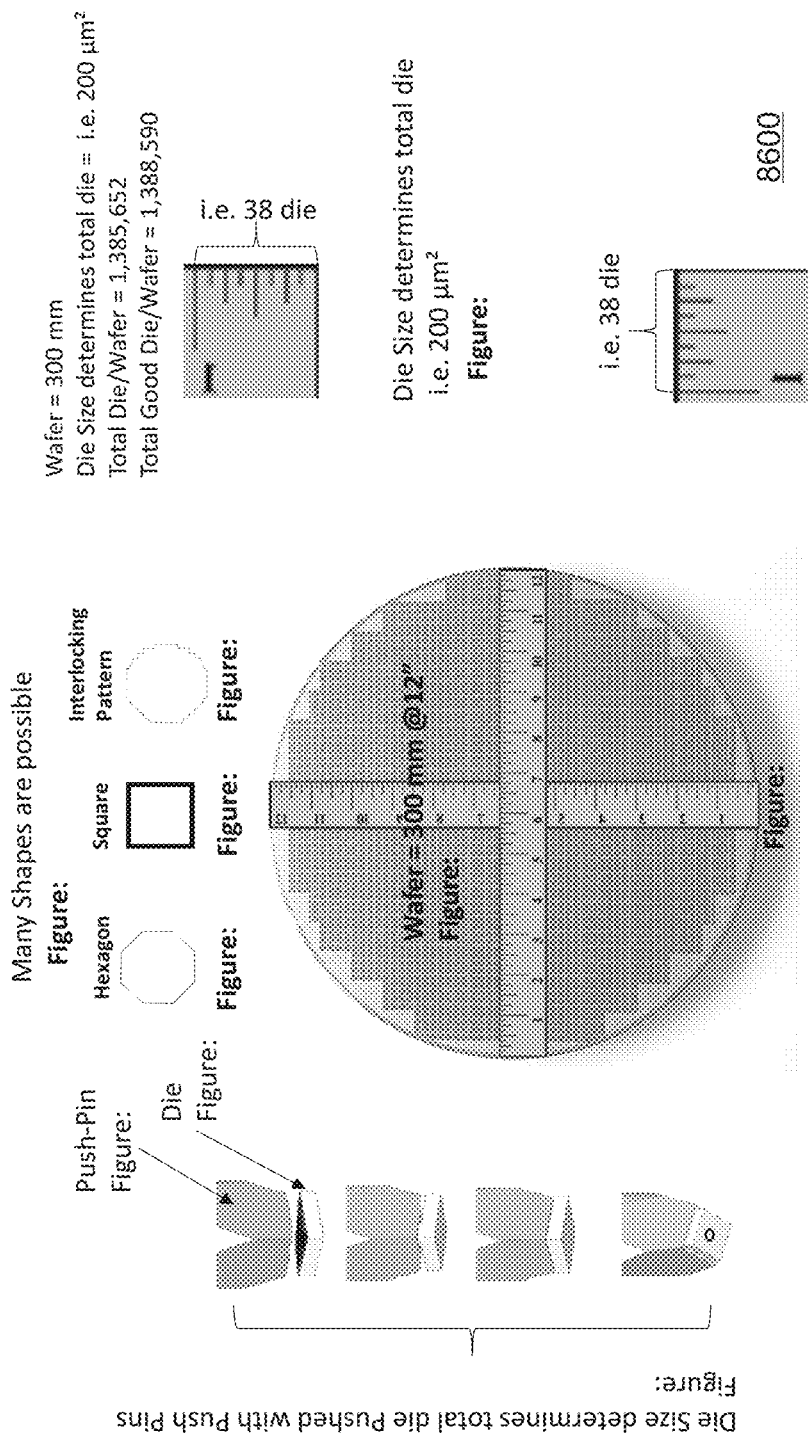

FIG. 86 shows wafer scribing pattern configurations 8600, according to an example embodiment.

Figure 87:
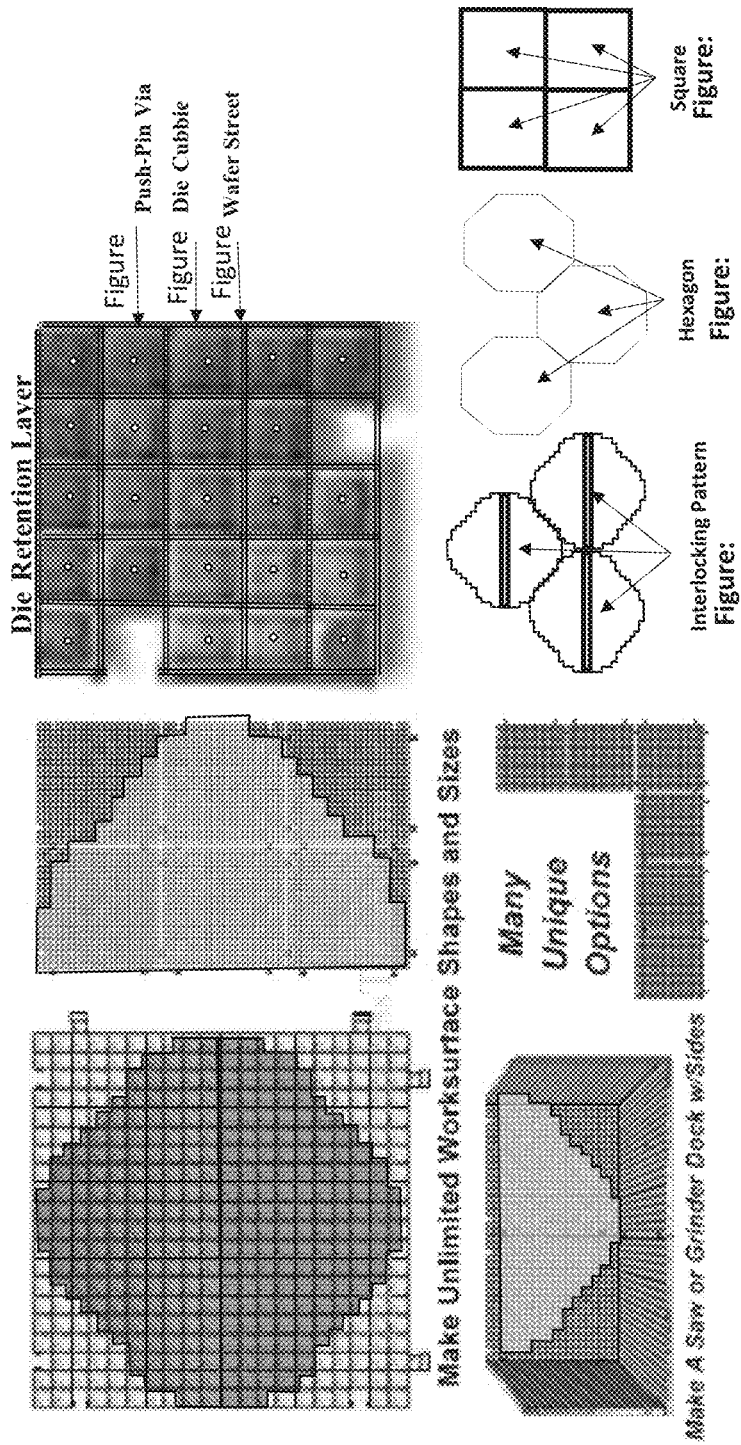

FIG. 87 shows configurations of waffle pack grids 8700, according to an example embodiment.

FIG. 88 shows die or antenna patterns 8800 from wafers, according to an example embodiment.

Figure 89:
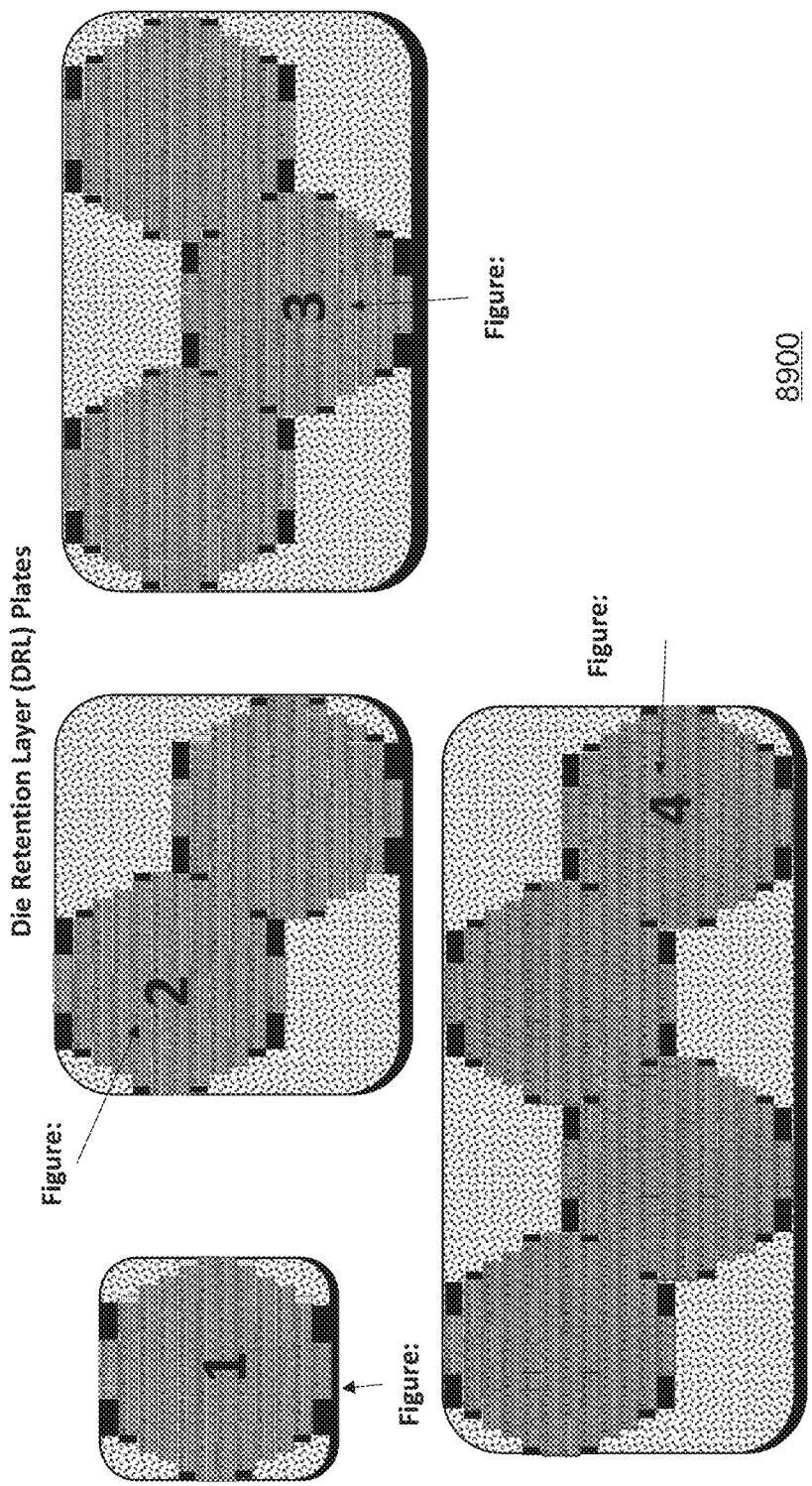

FIG. 89 shows configurations for die retention layer plates 8900, according to an example embodiment.

Figure 90:
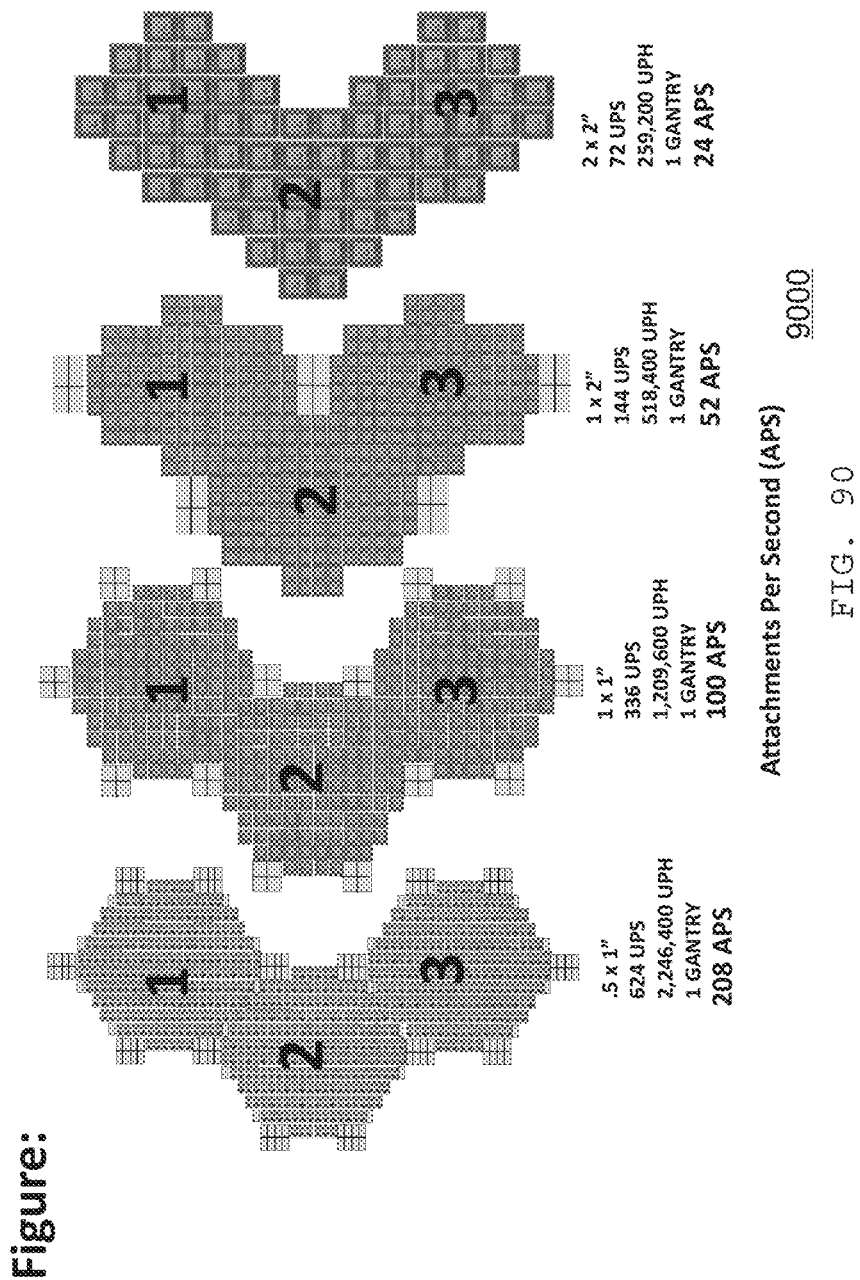

FIG. 90 shows die or antenna patterns 9000 with respect to die retention layer plates and attachments per second, according to an example embodiment.

Figure 91:
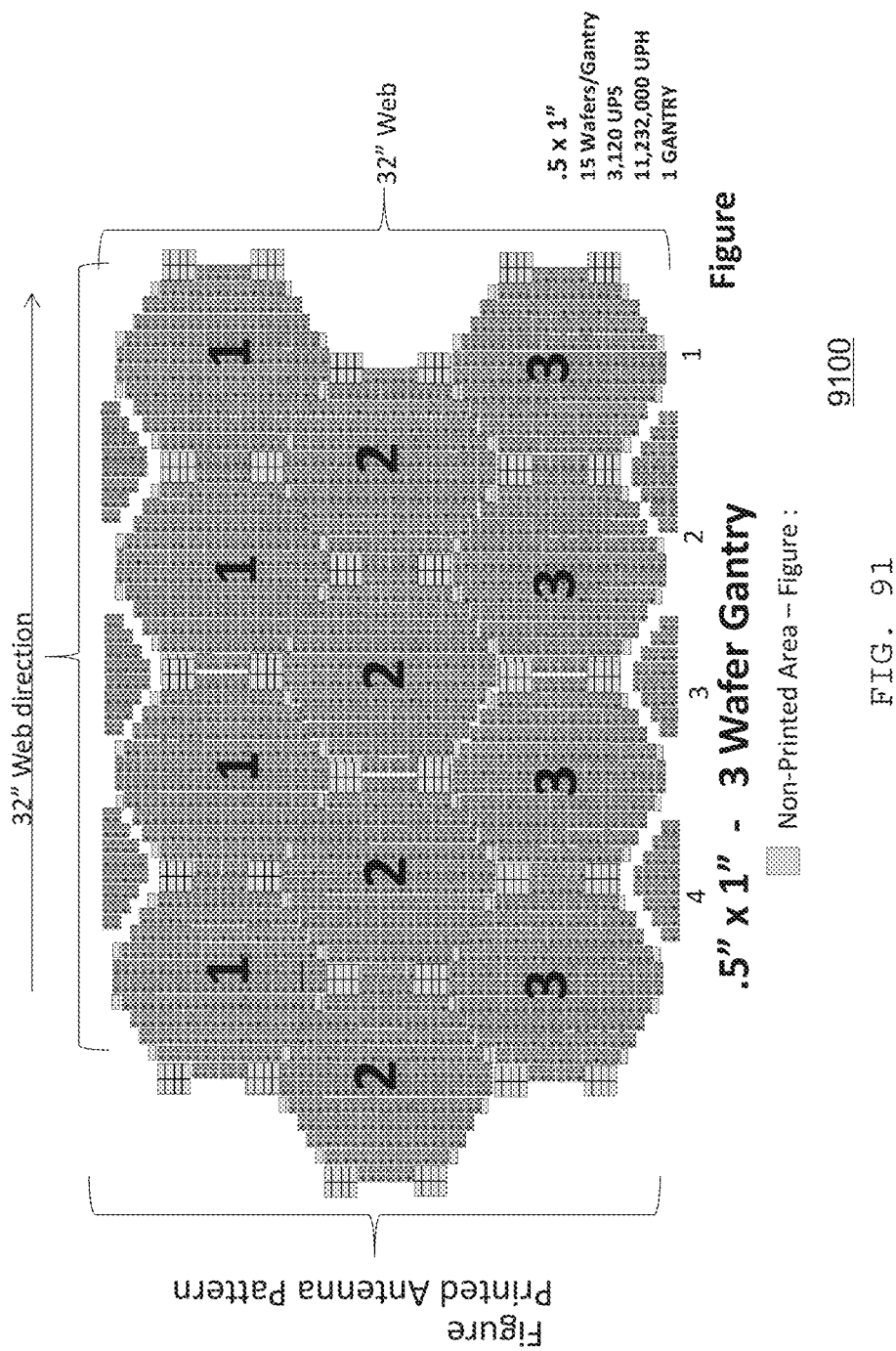

FIG. 91 shows printed antenna patterns 9100 as a web, according to an example embodiment.

Figure 92:
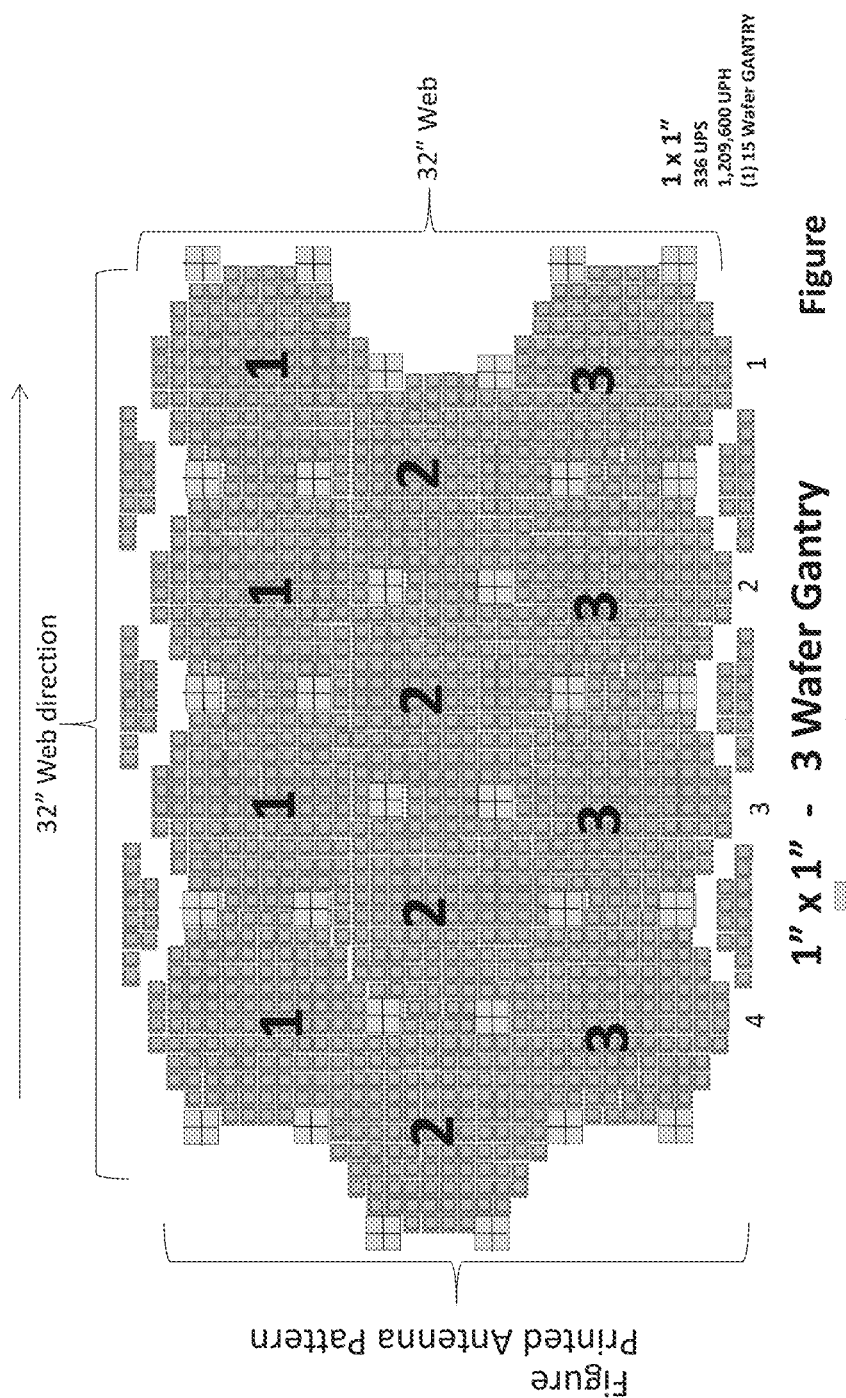

FIG. 92 shows printed antenna patterns 9200 as a web, according to an example embodiment.

Figure 93:
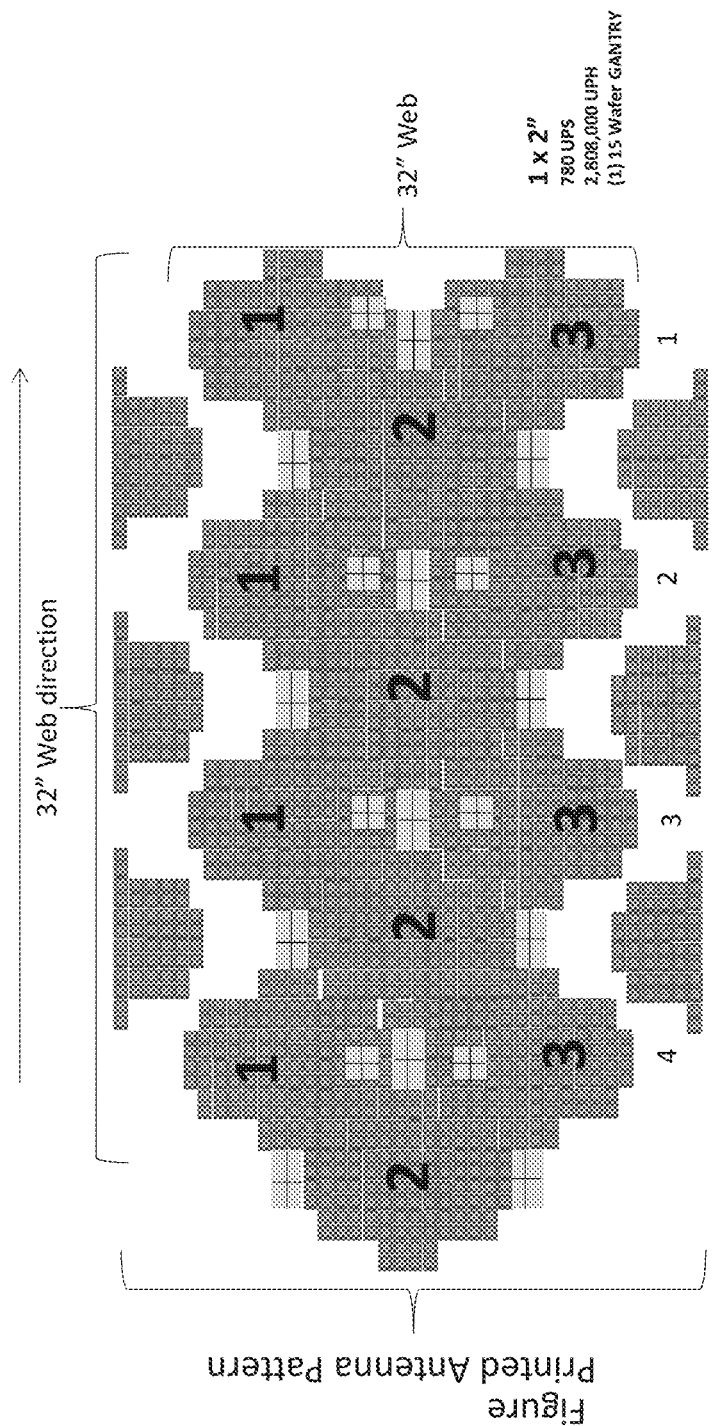

FIG. 93 shows printed antenna patterns 9300 as a web, according to an example embodiment.

Figure 94:
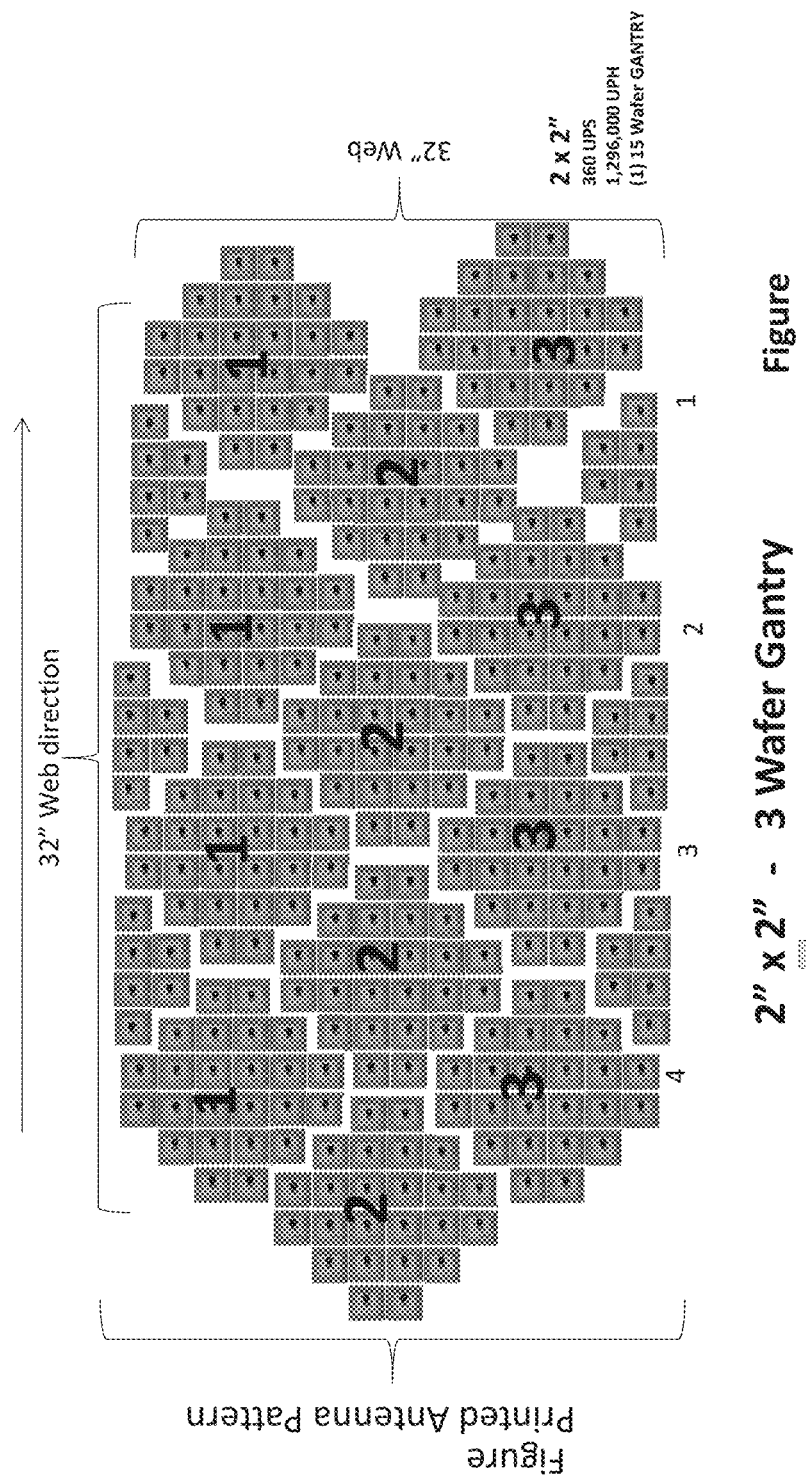

FIG. 94 shows printed antenna patterns 9400 as a web, according to an example embodiment.

Figure 95:
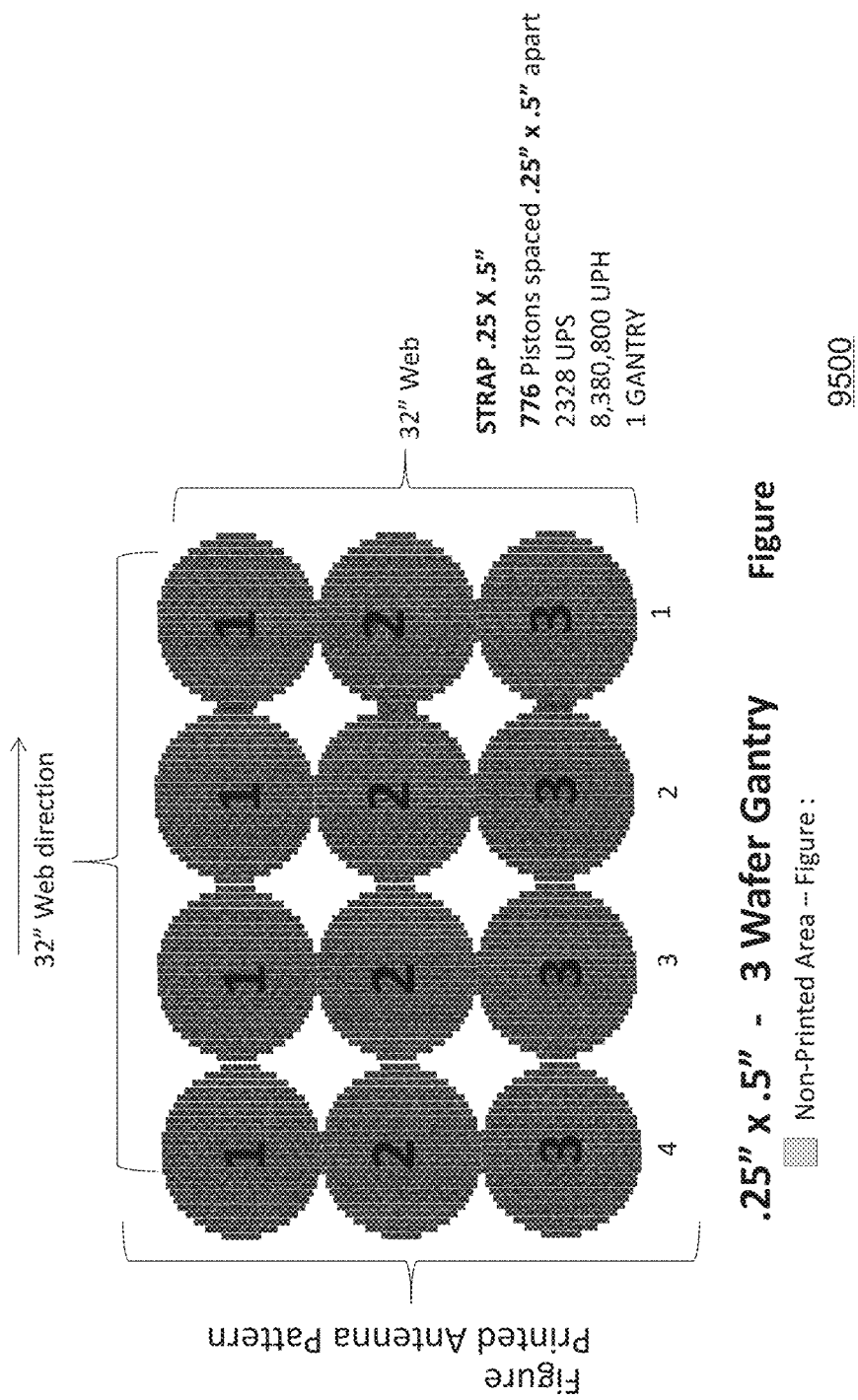

FIG. 95 shows printed antenna patterns 9500 as a web, according to an example embodiment.

Figure 96:
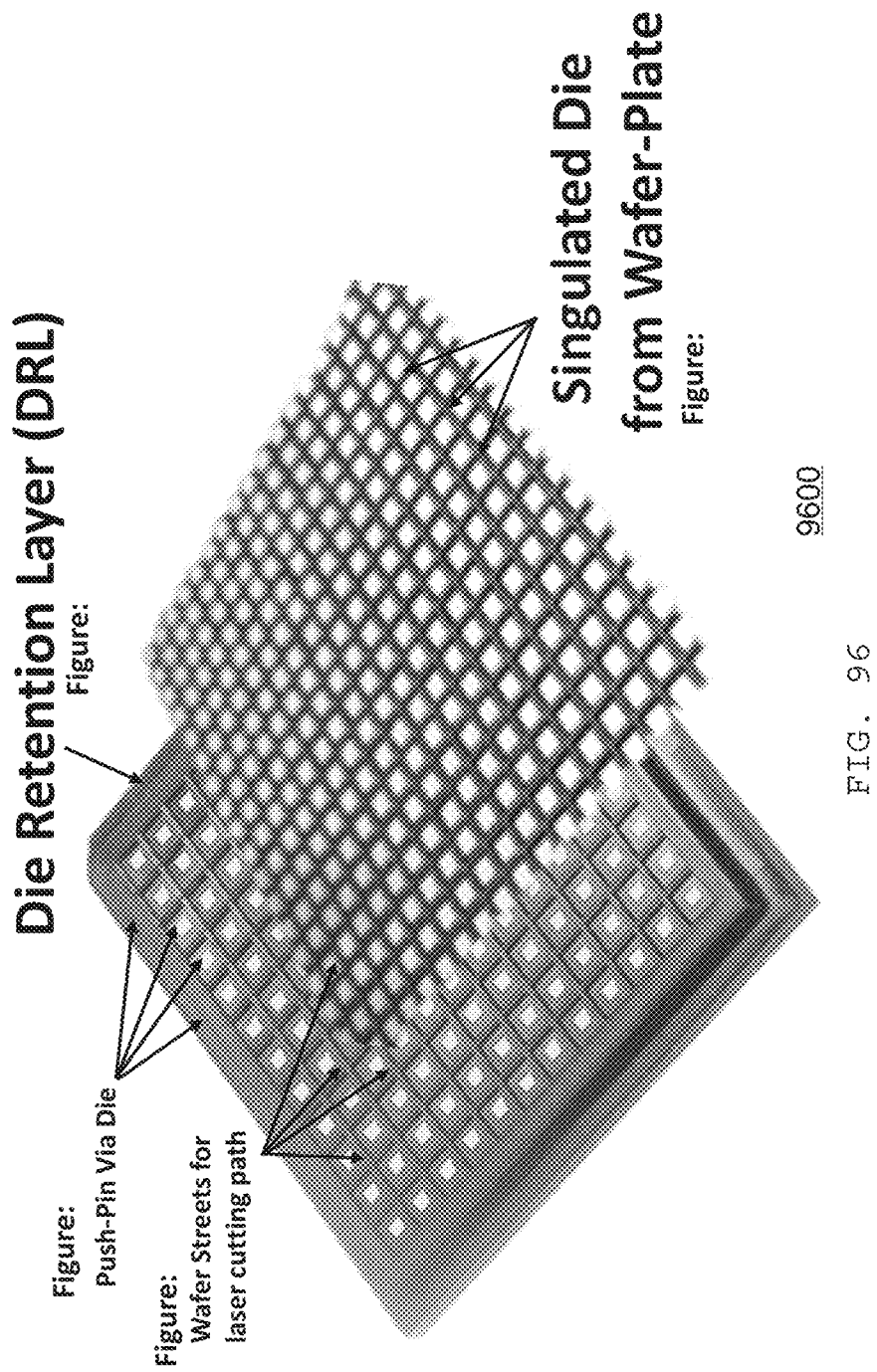

FIG. 96 shows a die retention layer 9600 with singulated die from a wafer plate, according to an example embodiment.

Figure 97:
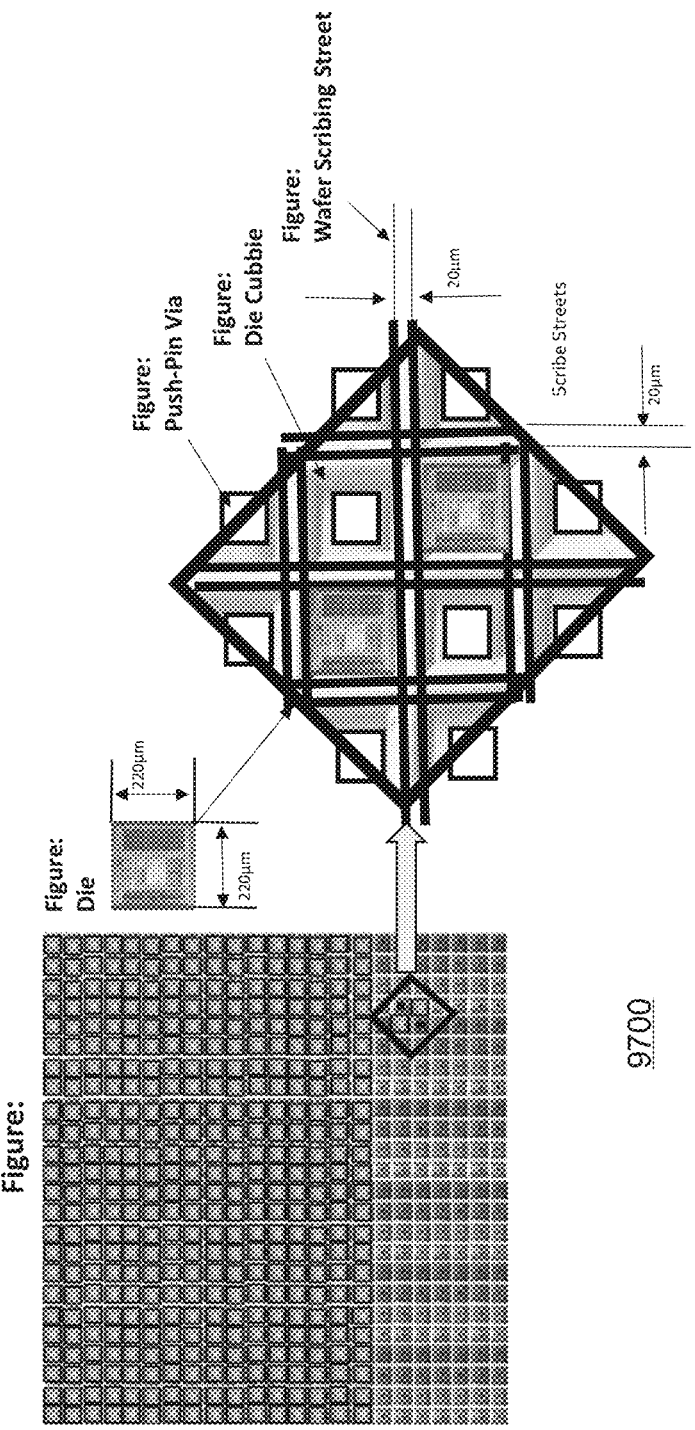

FIG. 97 shows a die retention layer 9700 with an overlay of push-pin vias, die cubbies, and a wafer scribing sheet, according to an example embodiment.

Figure 98:
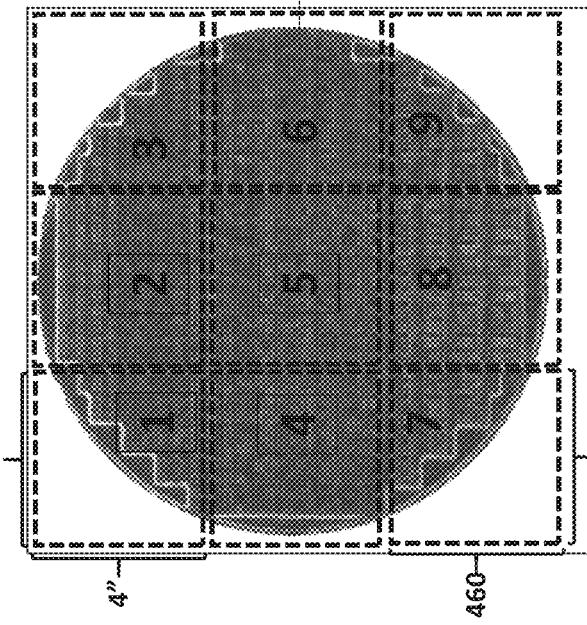

FIG. 98 shows configurations of waffle pack grids 9800 for push-pins, according to an example embodiment.

FIG. 99 shows a top view of a die retention layer 9900 for singulated die with an overlay of push-pin vias and die cubbies, according to an example embodiment.

Figure 100:
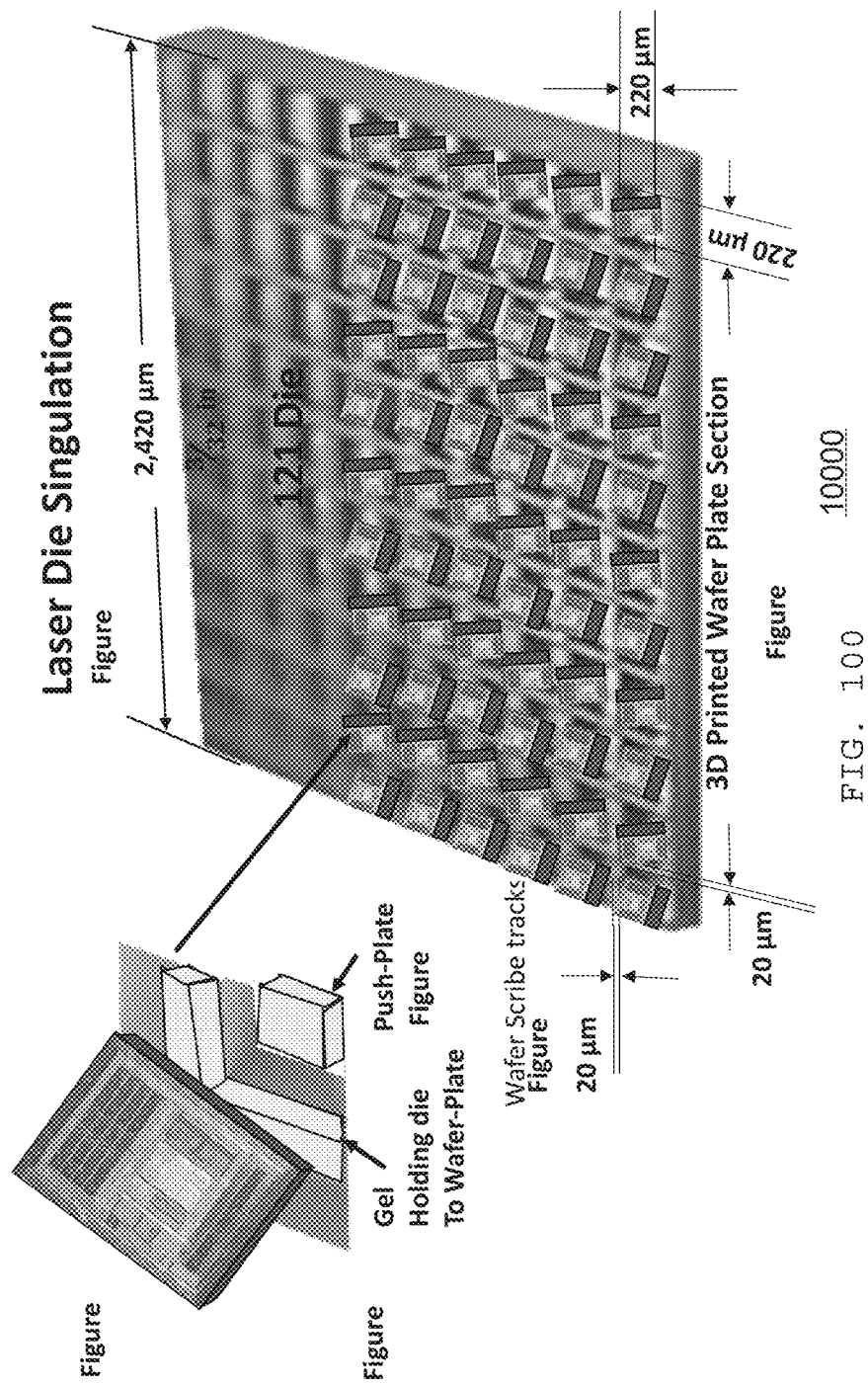

FIG. 100 shows a top view of a die retention layer 10000 for singulated die with an overlay of push-pin vias and die cubbies, according to an example embodiment.

Figure 101:
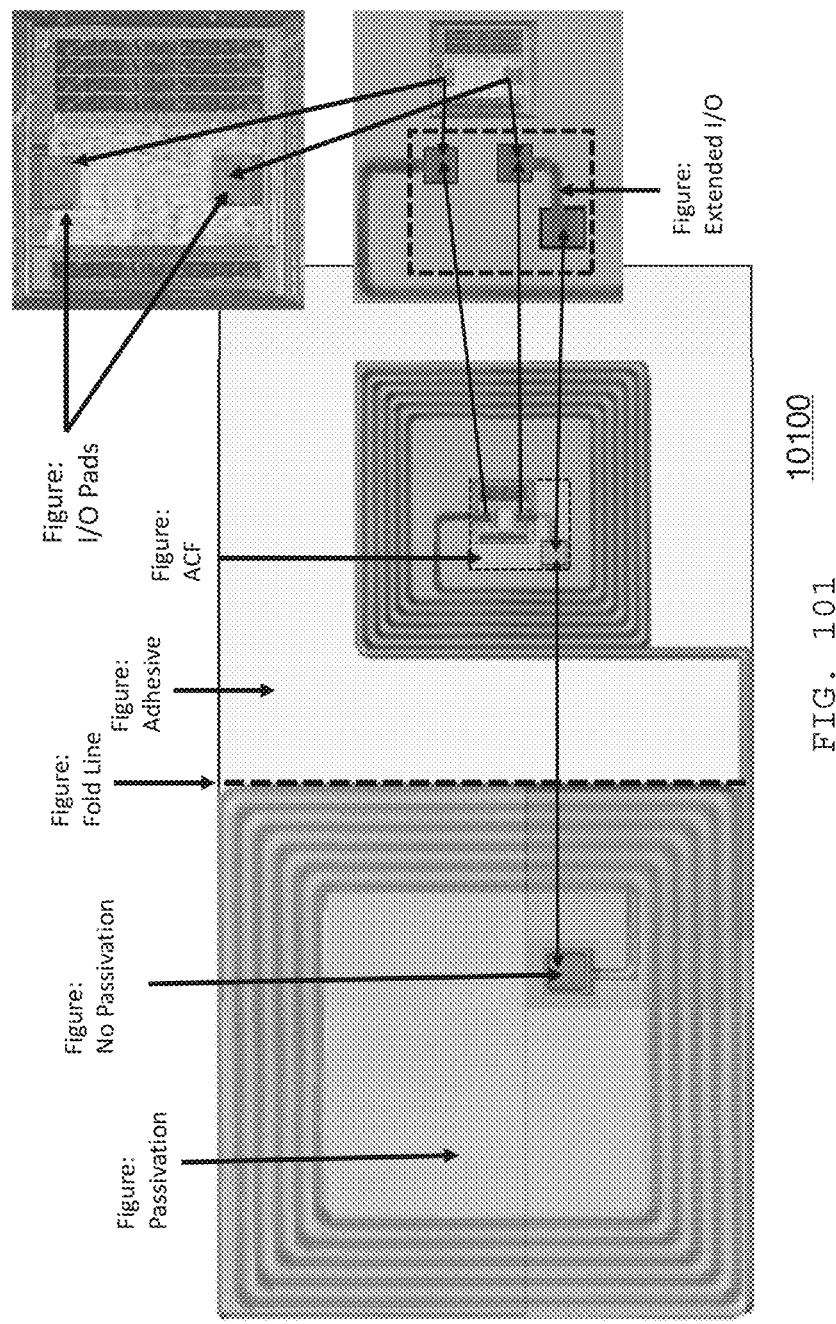

FIG. 101 shows an antenna and corresponding input/output pads of a die 10100, according to an example embodiment.

Figure 102:
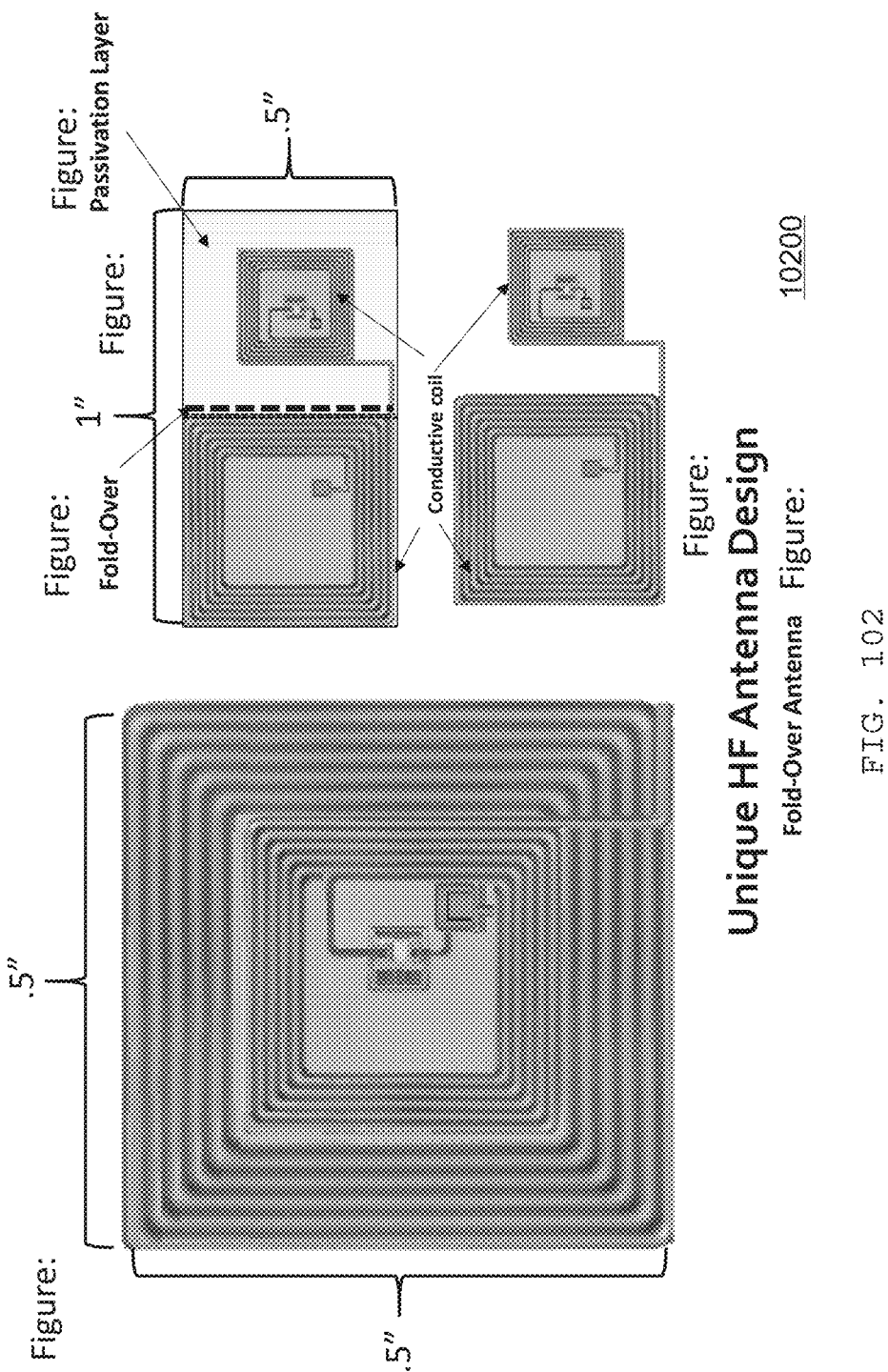

FIG. 102 shows an antenna 10200, according to an example embodiment.

Figure 103:
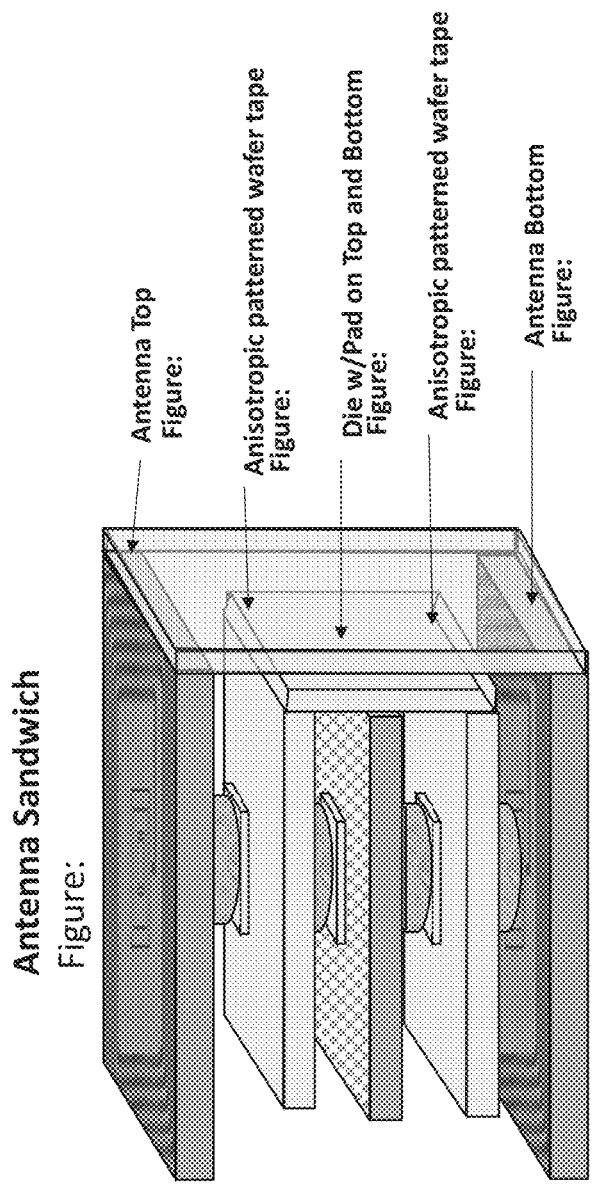

FIG. 103 shows an antenna-die structure 10300, according to an example embodiment.

Figure 104:
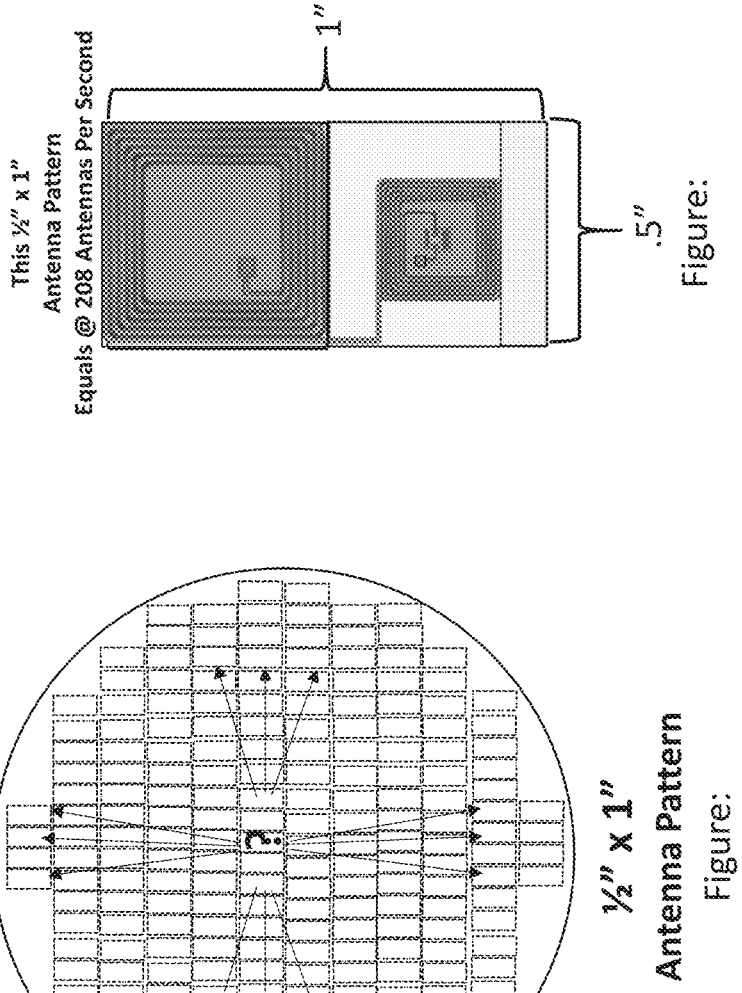

FIG. 104 shows a pattern of antenna 10400 with respect to a wafer, according to an example embodiment.

Figure 105:
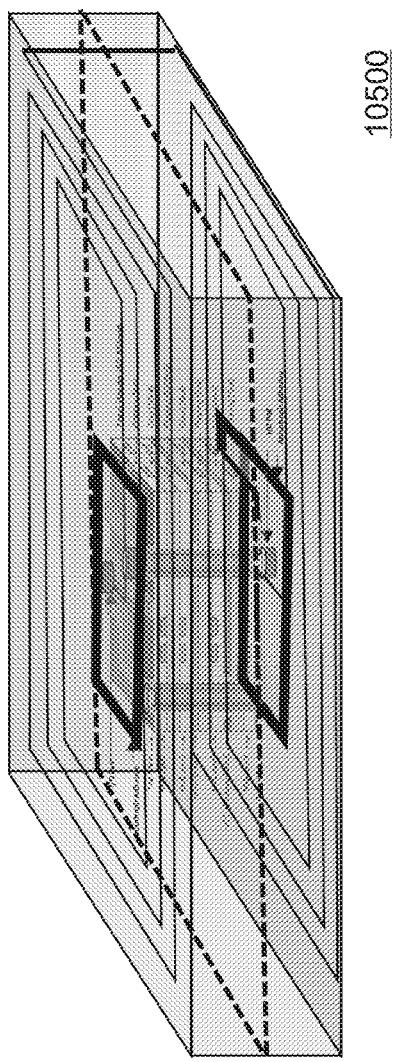

FIG. 105 shows a chip design 10500 for the antenna-die structure of FIG. 103, according to an example embodiment.

Figure 106:
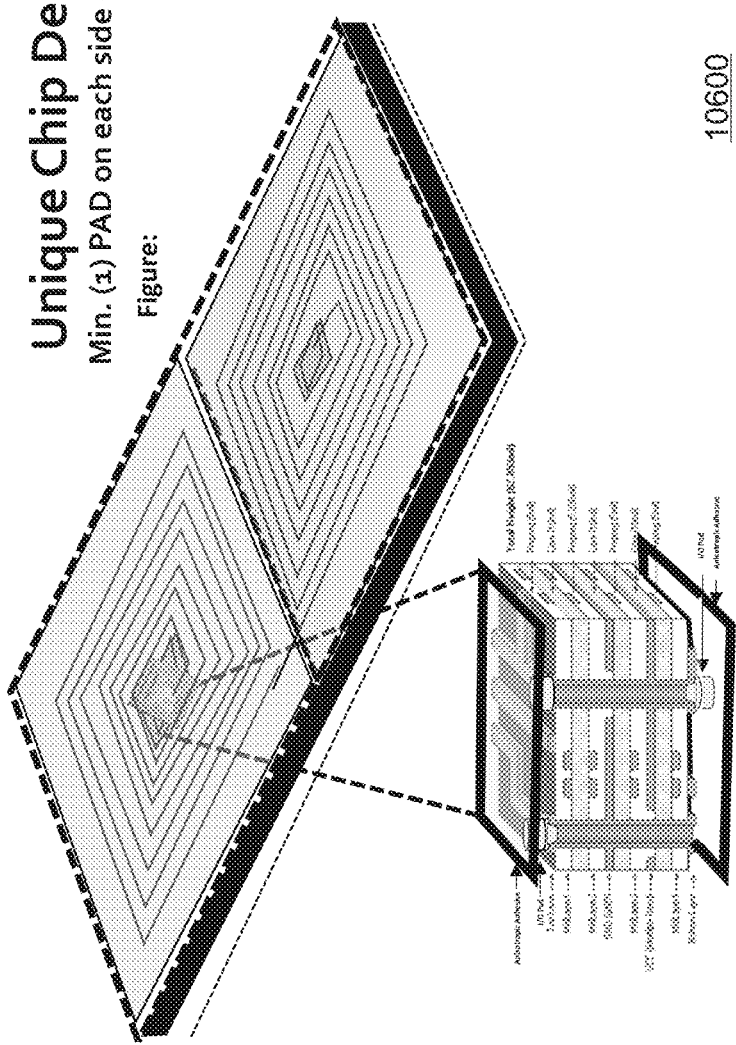

FIG. 106 shows a chip design 10600 for the antenna-die structure of FIG. 103, according to an example embodiment.

Figure 107:
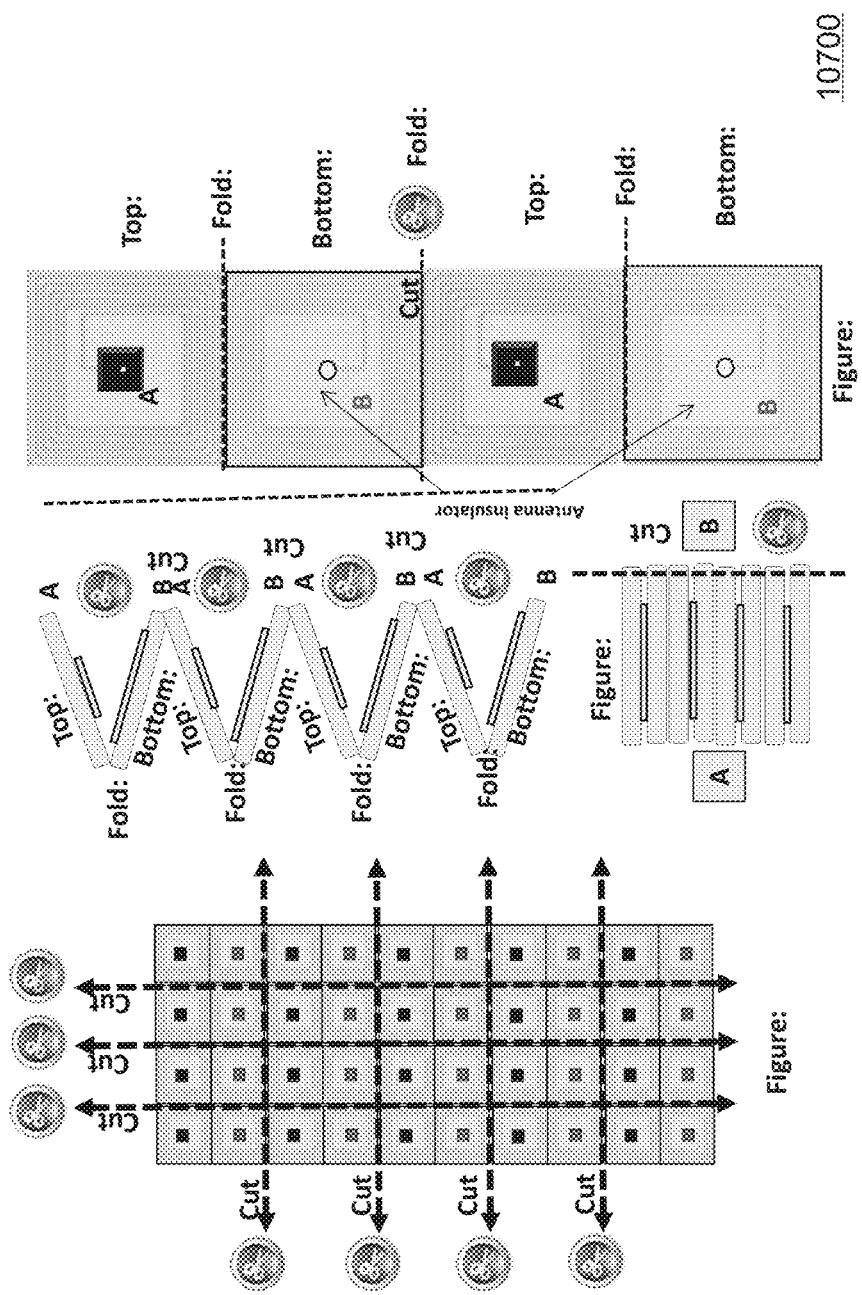

FIG. 107 shows an alternating substrate configuration 10700 for antenna-chip structures, according to an example embodiment.

Figure 108:
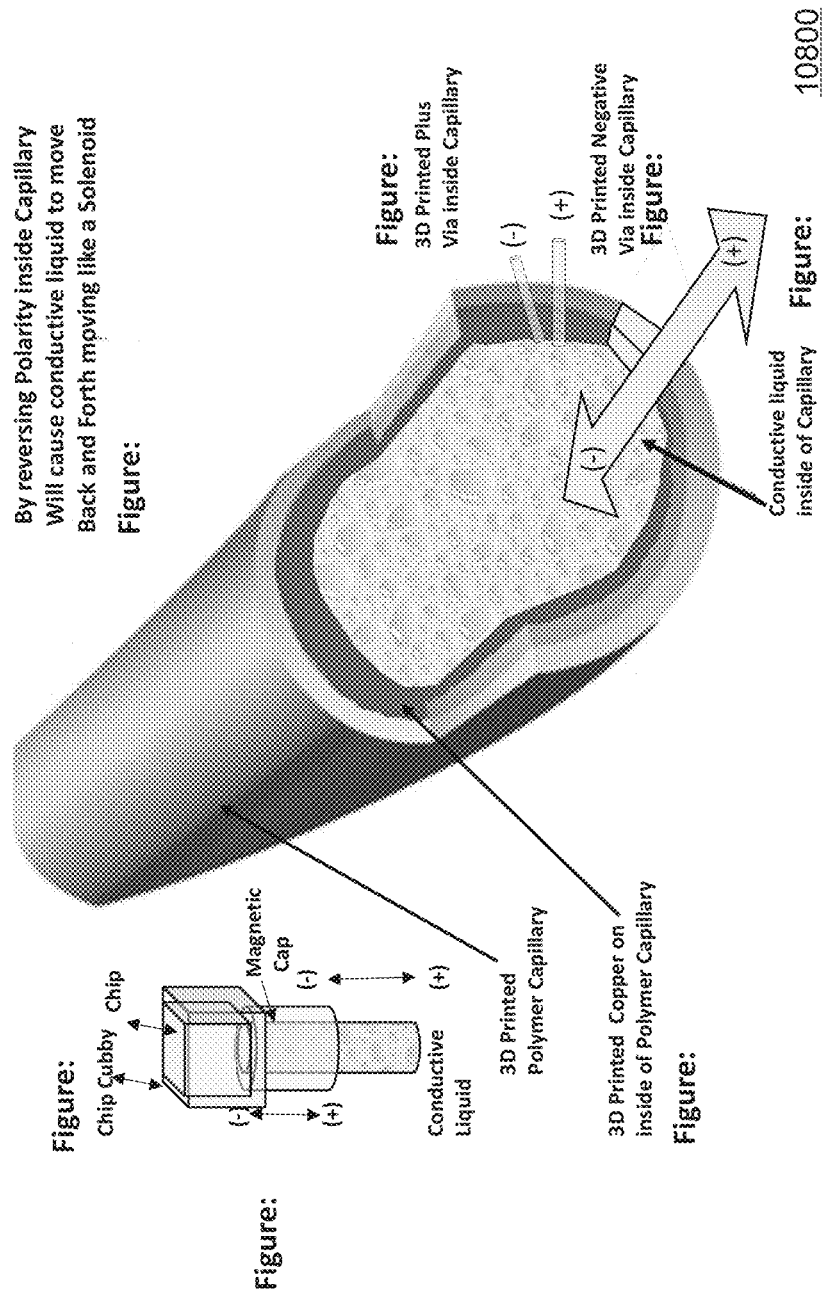

FIG. 108 shows a solenoid capillary 1080000 disposed with a cubby, according to an example embodiment.

Figure 109:
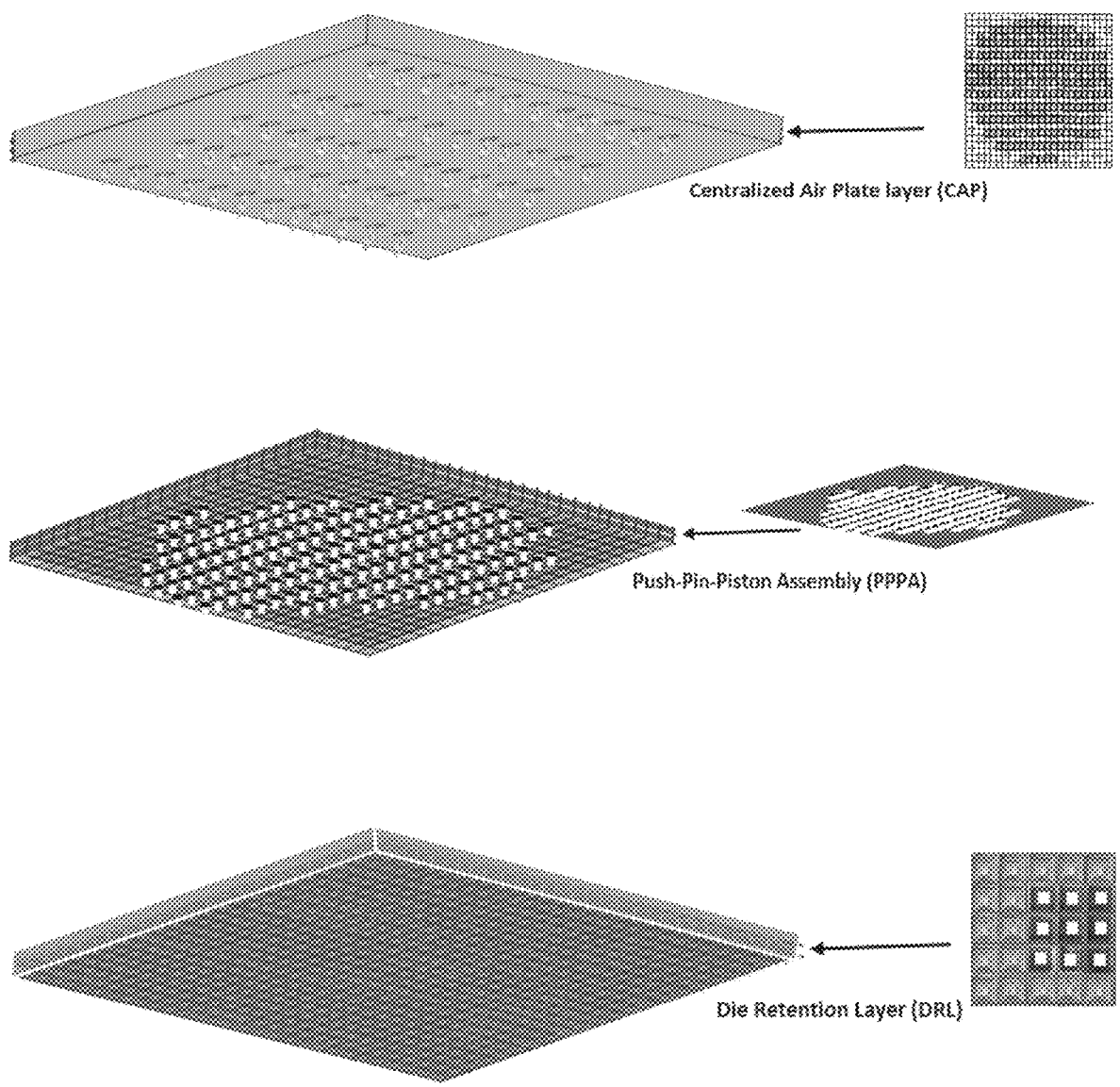

FIG. 109 shows sub-modules of layers of a system 10900 for ICCES for MPICA, according to an example embodiment.

Figure 110:
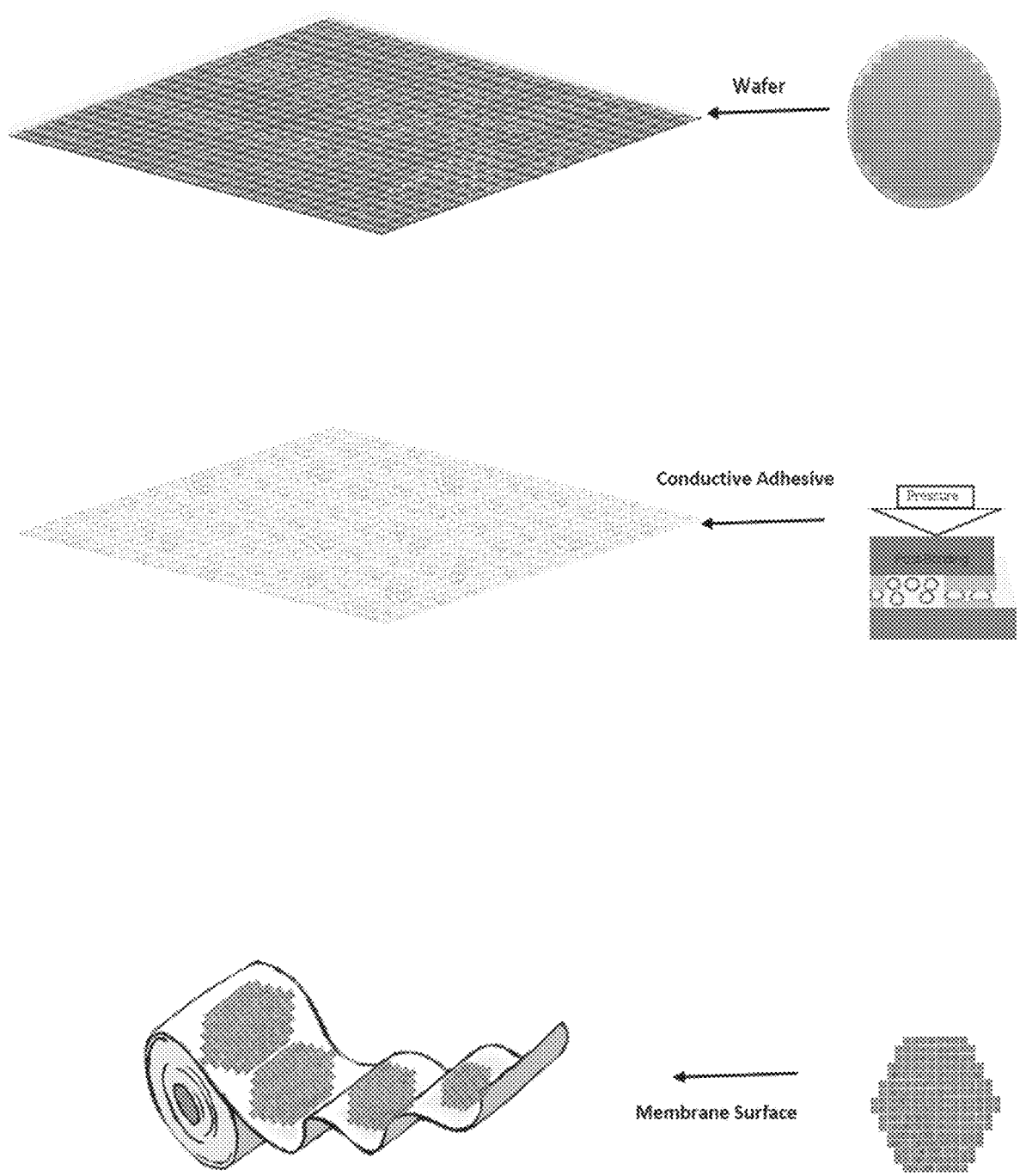

FIG. 110 shows layers of a system 11000 for ICCES for MPICA with adhesion to a membrane/substrate, according to an example embodiment.

Figure 111:
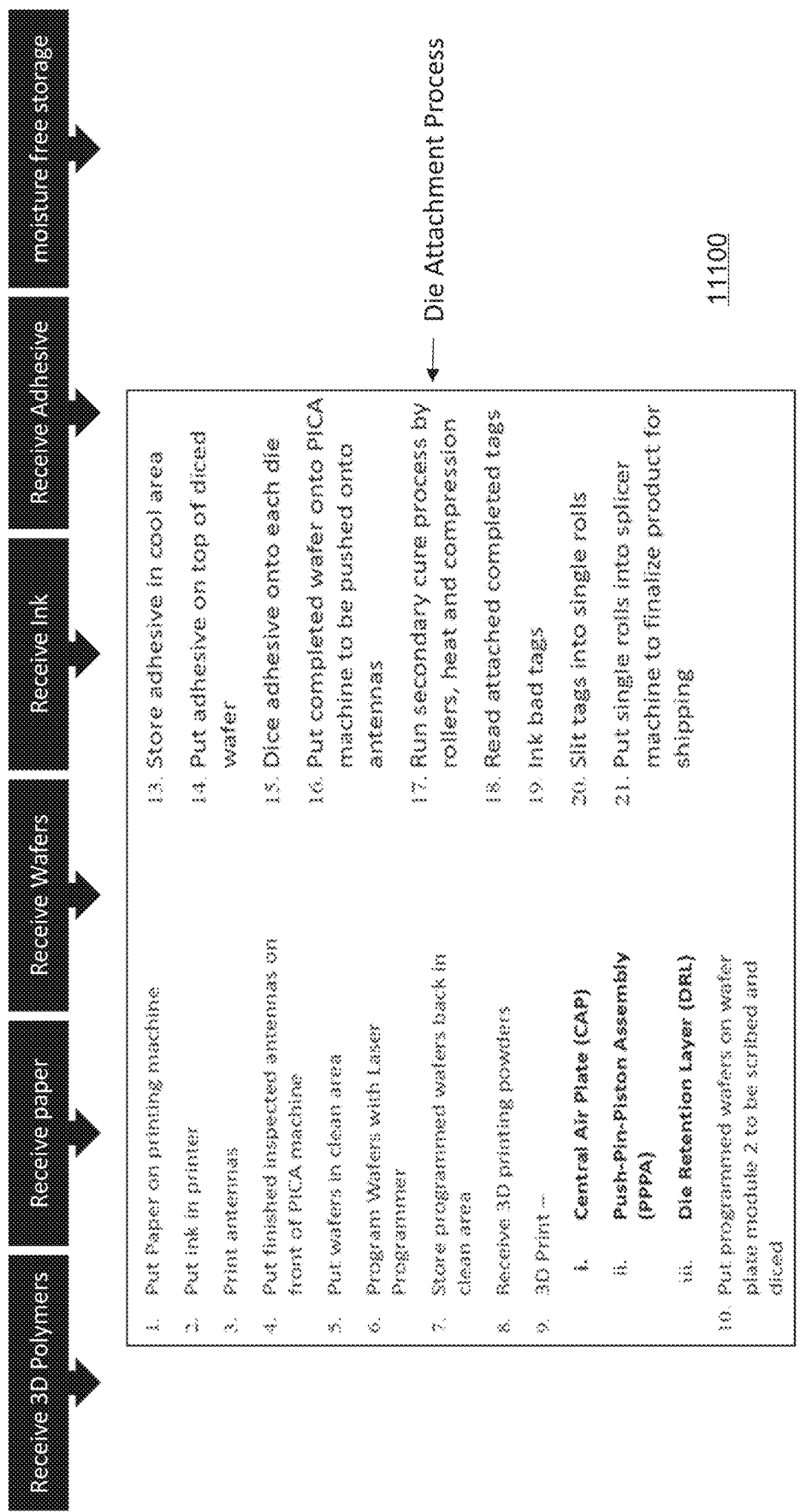

FIG. 111 shows a flow diagram 1110 for ICCES for MPICA, according to an example embodiment.

Figure 112:
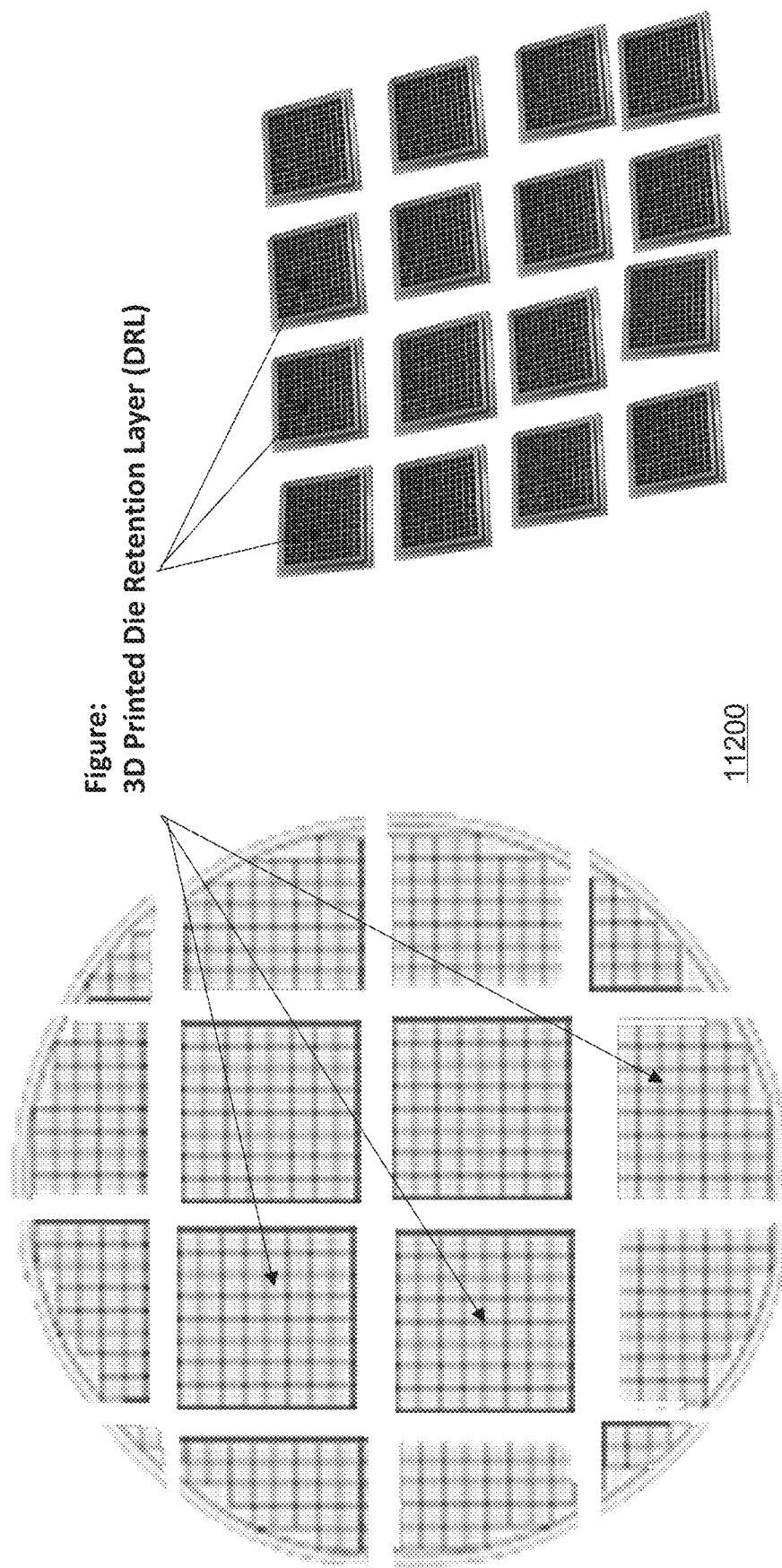

FIG. 112 shows printed die retention layer 11200, according to an example embodiment.

Figure 113:
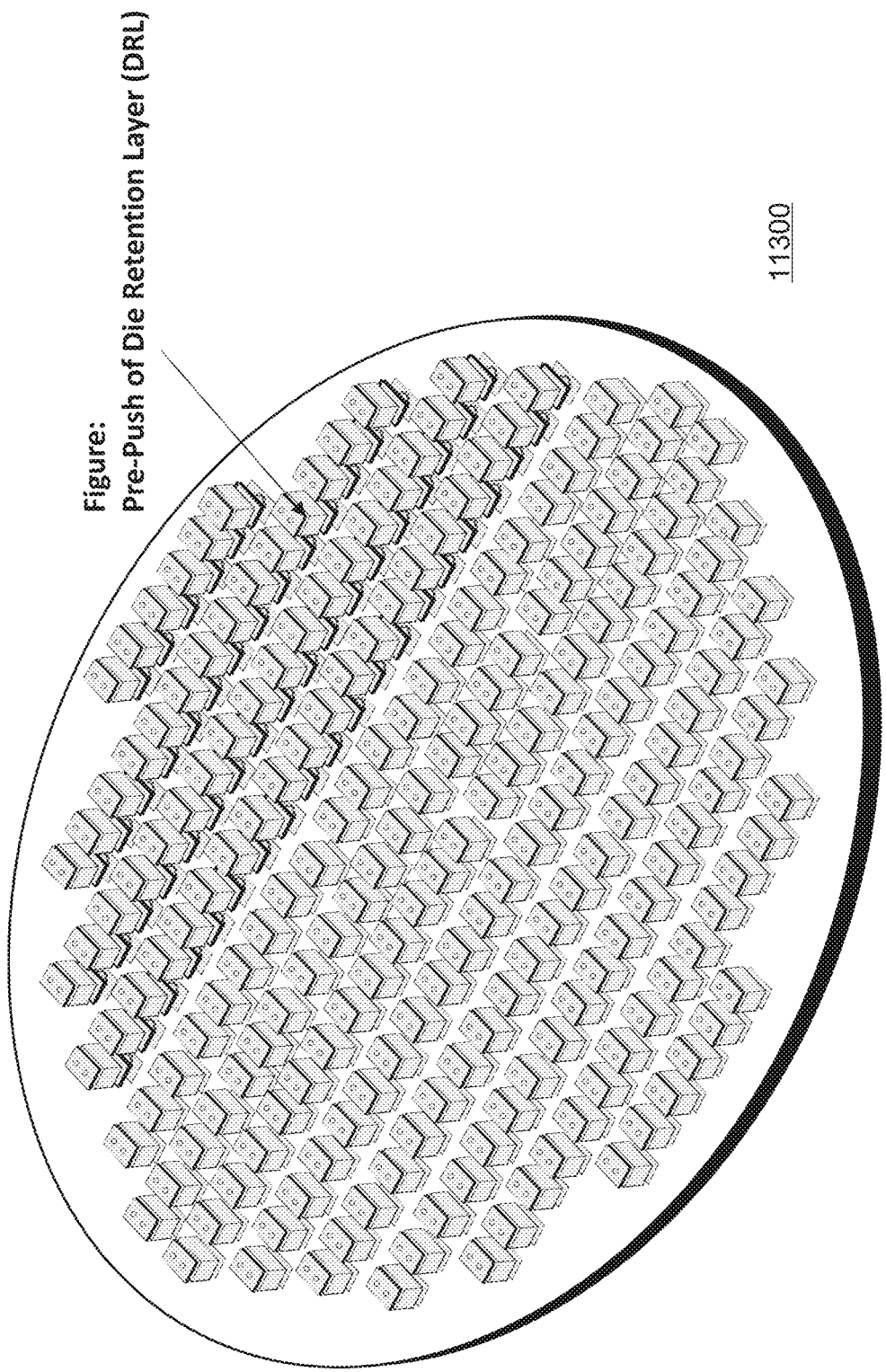

FIG. 113 shows a pre-push die retention layer 11300, according to an example embodiment.

Figure 114:
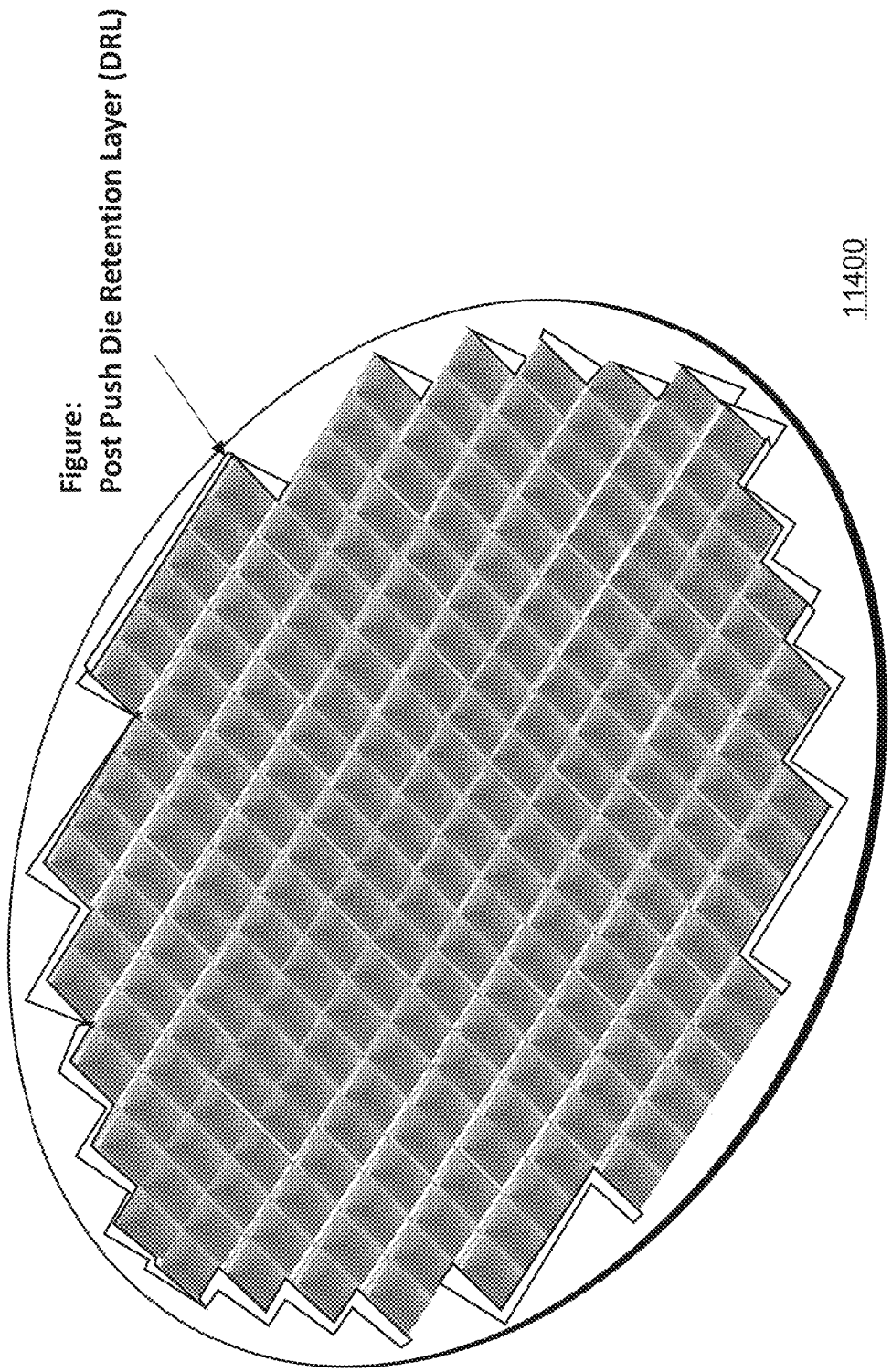

FIG. 114 shows a post-push die retention layer 11400, according to an example embodiment.

Figure 115:
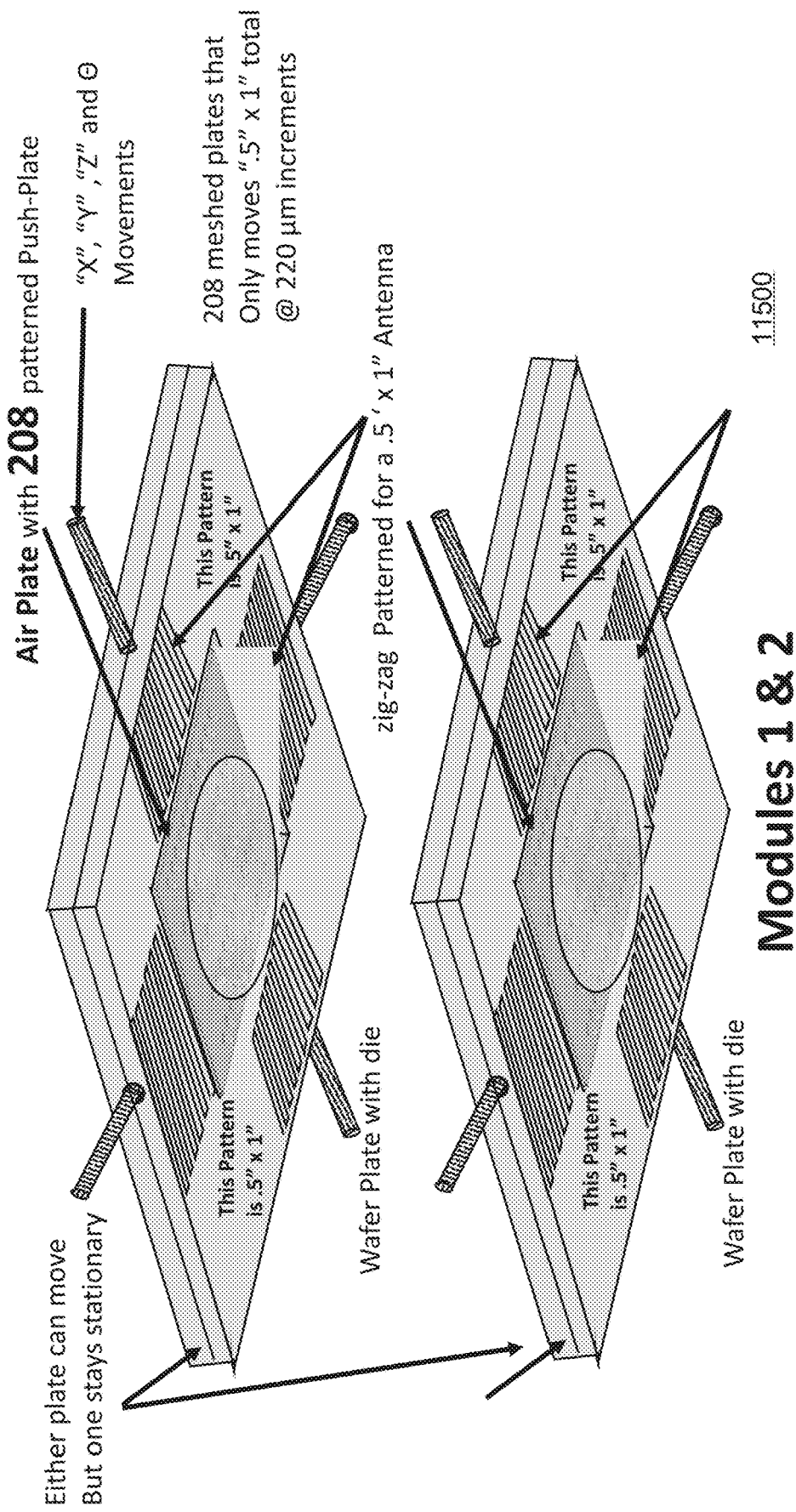

FIG. 115 shows system 11500 including a push plate, a wafer plate, and an air plate, according to an example embodiment.

Figure 116:
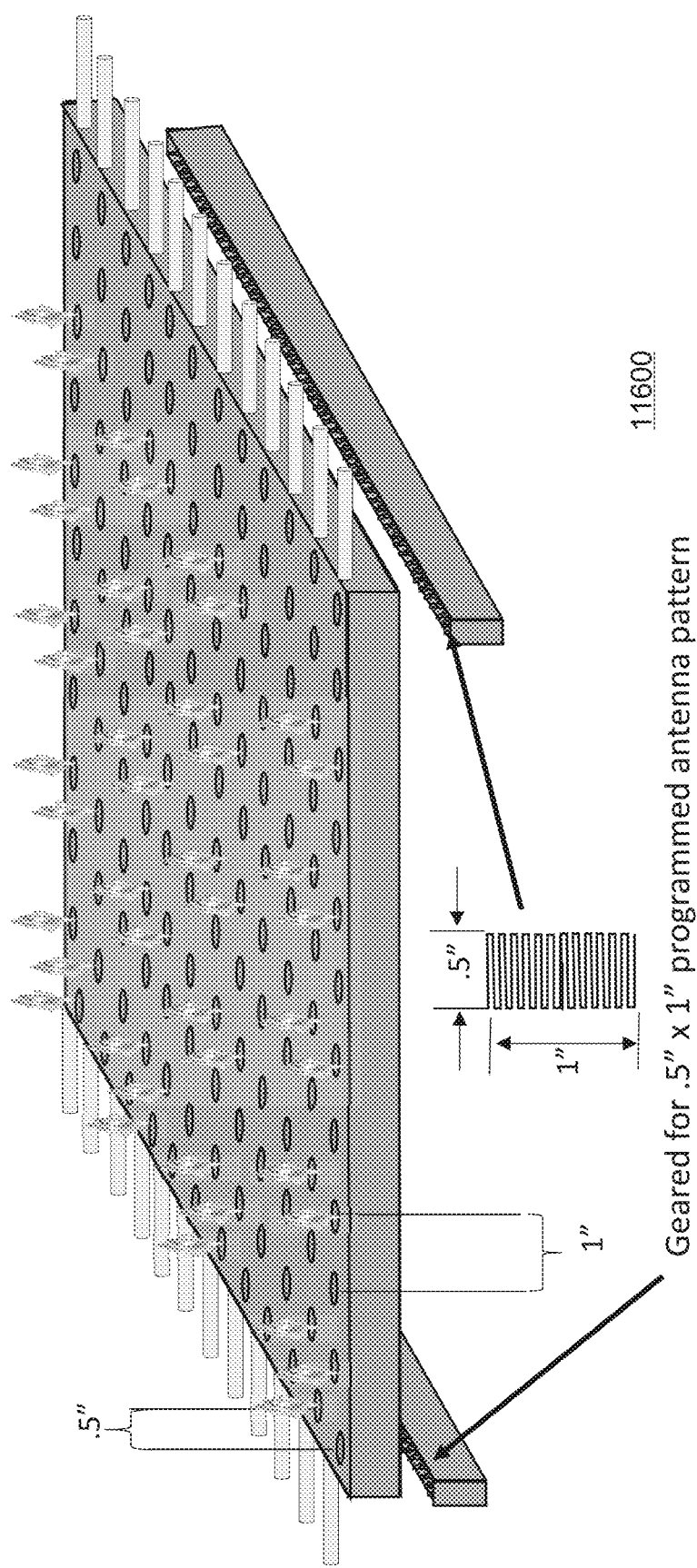

FIG. 116 shows a centralized air plate layer 11600 for a programmed antenna pattern, according to an example embodiment.

Figure 117:
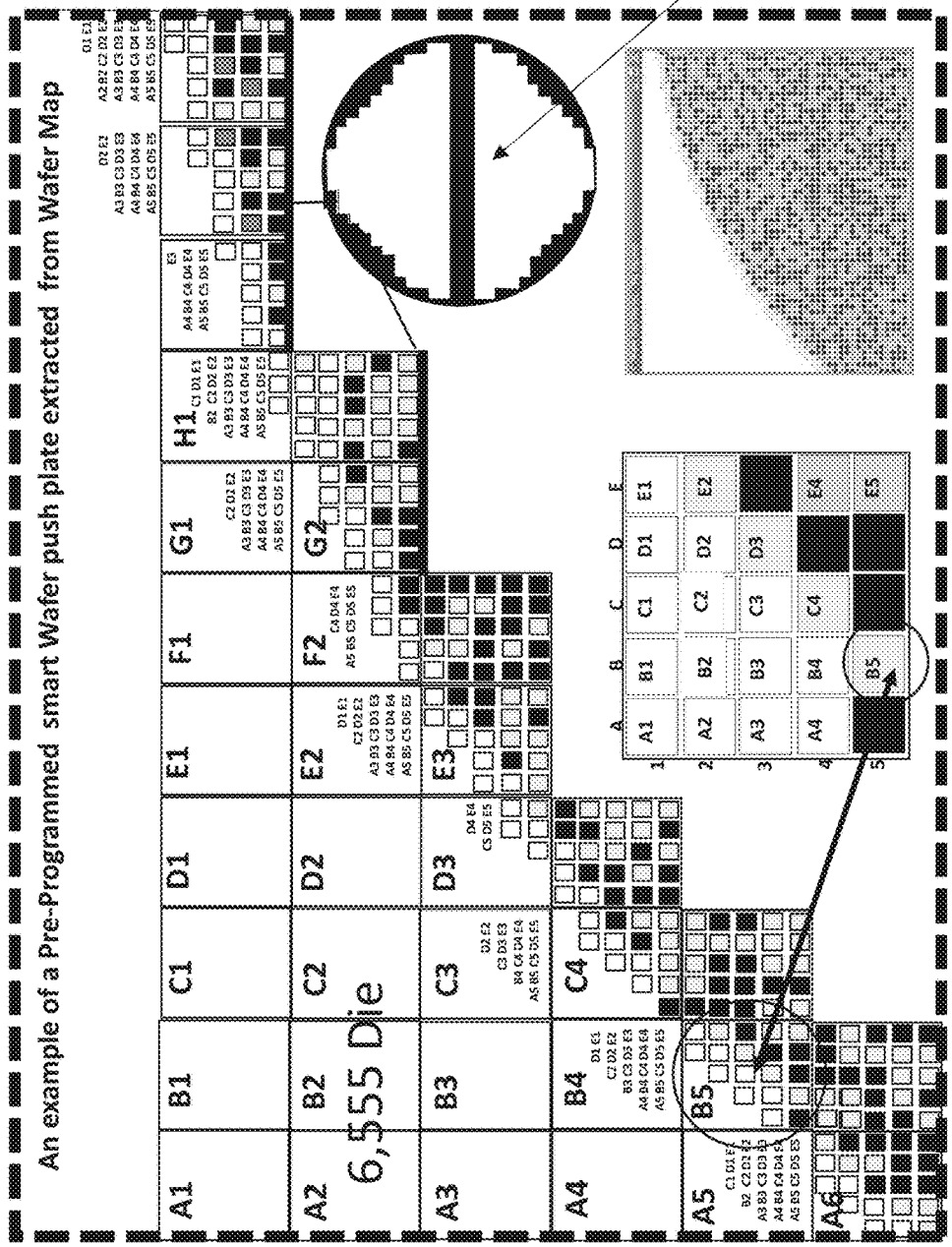

FIG. 117 shows push plate configurations 11700 for wafer maps and a die retention layer, according to an example embodiment.

Figure 118:
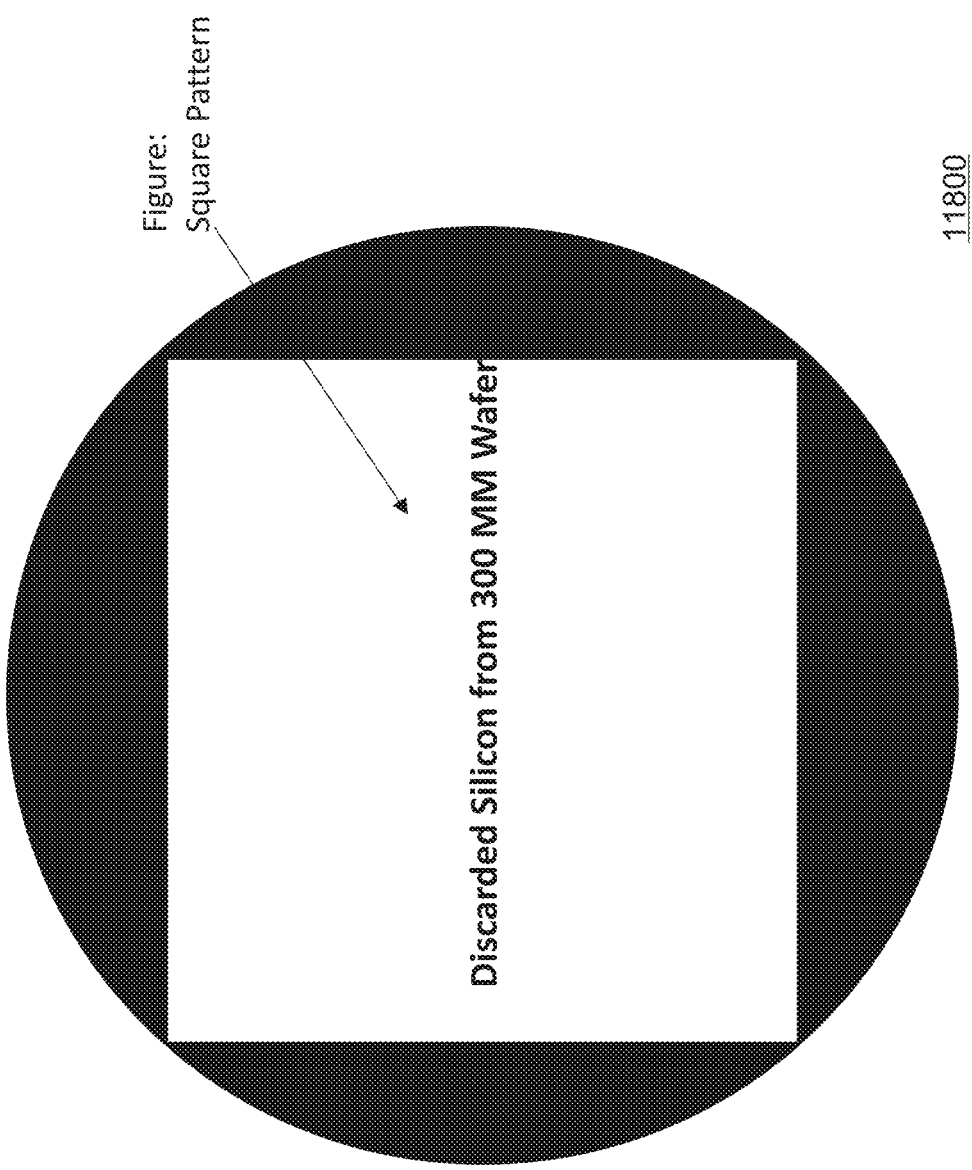

FIG. 118 shows a laser cut pattern 11800 from a wafer, according to an example embodiment.

Figure 119:
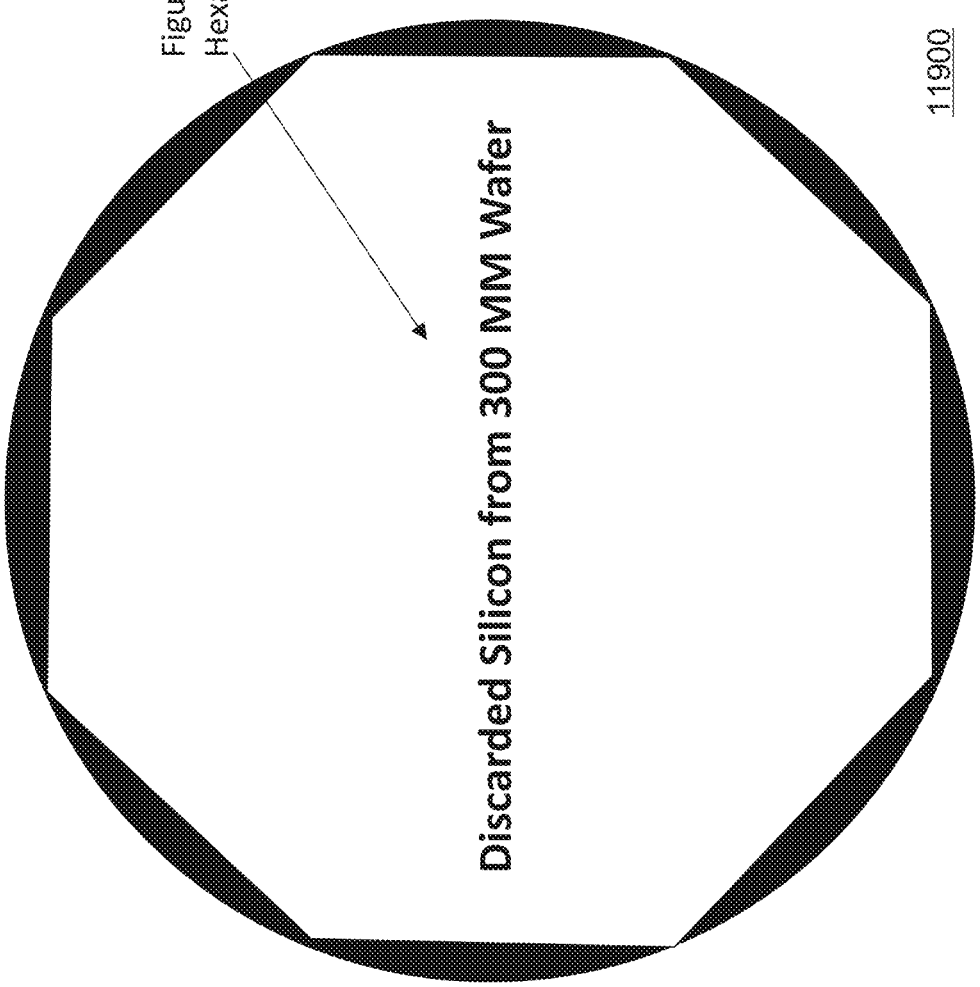

FIG. 119 shows a laser cut pattern 11900 from a wafer, according to an example embodiment.

Figure 120:
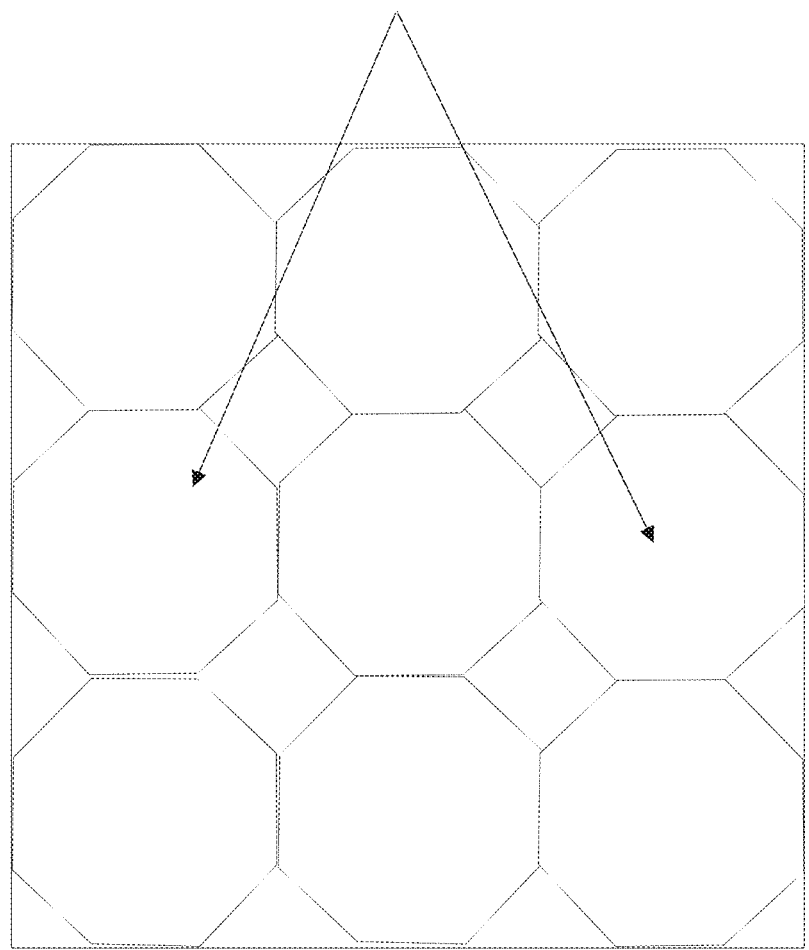

FIG. 120 shows combined laser cut patterns 12000 from wafers, according to an example embodiment.

FIG. 121 shows a laser cut pattern 12100 from a wafer, according to an example embodiment.

Figure 122:
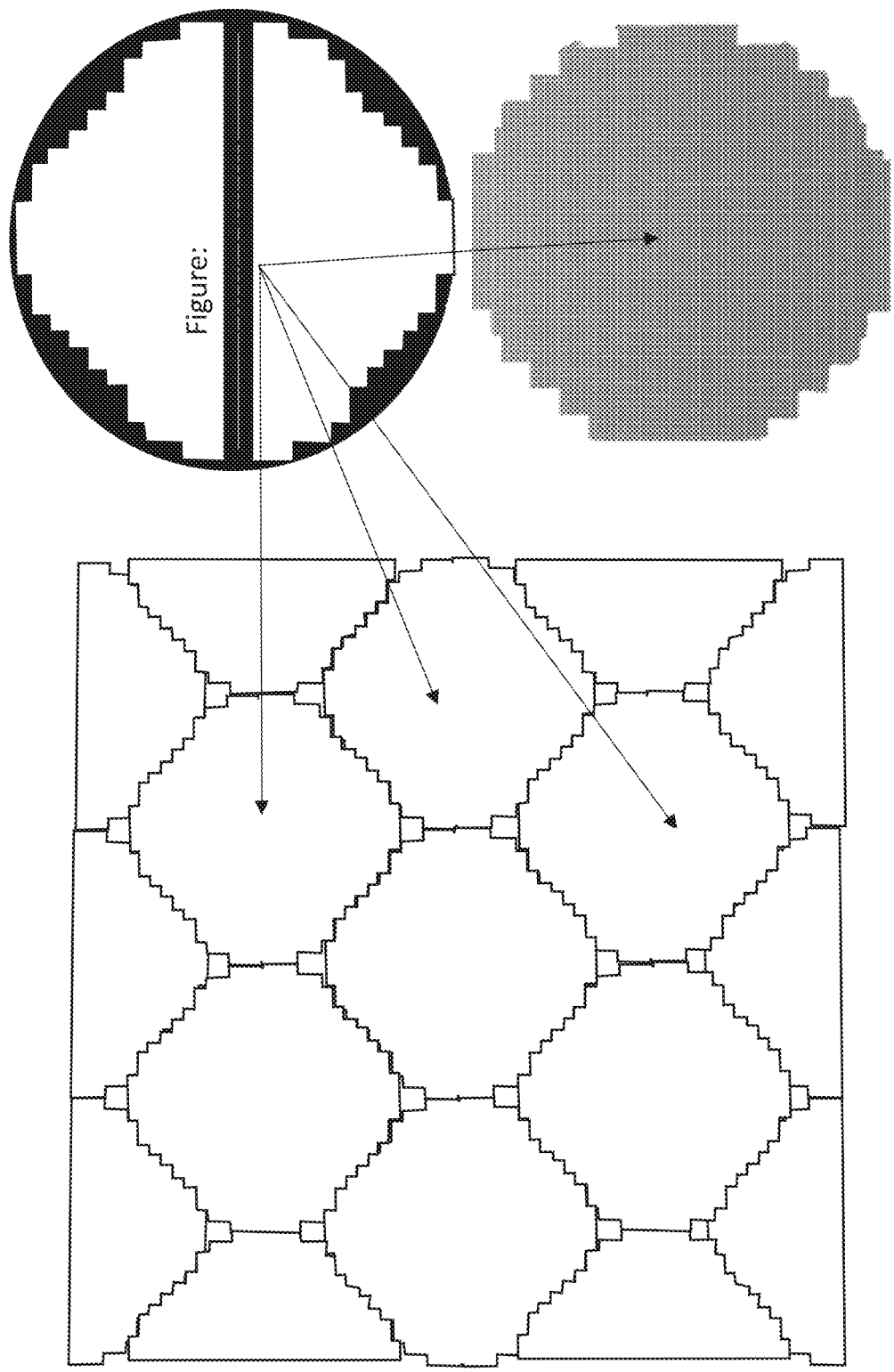

FIG. 122 shows combined laser cut patterns 12000 from wafers, according to an example embodiment.

Embodiments will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION

Introduction

The present specification discloses numerous example embodiments. The scope of the present patent application is not limited to the disclosed embodiments, but also encompasses combinations of the disclosed embodiments, as well as modifications to the disclosed embodiments.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Furthermore, it should be understood that spatial descriptions (e.g., "above," "below," "up," "left," "right," "down," "top," "bottom," "vertical," "horizontal," etc.) used herein are for purposes of illustration only, and that practical implementations of the structures described herein can be spatially arranged in any orientation or manner It is contemplated that different embodiments described herein may be implemented together in various combinations, as would be apparent to one of skill in the art having the benefit of this disclosure. That is, embodiments described herein are not mutually exclusive of each other and may be practiced alone, or in any combination.

Numerous embodiments are described in the detailed description and figures provided.

Example Embodiments

Pick and place techniques are often used to assemble electronic devices. Such techniques involve a manipulator, such as a robot arm, to remove integrated circuit (IC) dies from a wafer and place them into a die carrier. The dies are subsequently mounted onto a substrate with other electronic components, such as antennas, capacitors, resistors, and inductors to form an electronic device.

Pick and place techniques involve complex robotic components and control systems that handle only one or two etc. die at a time. This has a drawback of limiting throughput volume. Furthermore, pick and place techniques have limited placement accuracy, and have a minimum die size requirement. One type of electronic device that may be assembled using pick and place techniques is any RFID "tag." RFID tags may be affixed to any item whose presence is to be detected and/or monitored.

With the presence and advancements of "The Internet of Things" (IoT) and it evolving to where every and all objects, animals or people will be provided with unique identifiers and have the ability to transfer data over a network without requiring human-to-human or human-to-computer interaction. The IoT evolved from the convergence of wireless technologies, micro-electromechanical systems (MEMS) and the Internet. These IoT advancements are leading to the affixing of a tag with a unique identifier to each and every item, and their checking and monitoring by devices known as "Smart Cell Phone readers."

As the market demand increases for products such as these unique identifiers tags, and with the advances of technology and die sizes shrinking, the need for high assembly throughput rates for very small die, and low production costs will be crucial in providing these commercially-viable products. Accordingly, what is needed for this requirement is a method and apparatus for the ultra-high volume assembly of these electronic tags for the Internet of Things (IoT) and that is what is discussed and described here. As one browses through the Internet, one does not find any information about the implementation and manufacturing reality of this world changing Internet of Everything. This is what this disclosure answers with Massive Parallel Integrated Chip Assembly (MPICA) technology. MPICA enables the true reality of the Internet of Everything, and ultimately achieve total world connectivity. Why is MPICA important? There are no other technologies today that can produce a tag in the volumes or at the costs that allow companies to have a good Return on Investment (ROI). For example, the current cost of the Near Field Communication (NFC) microchips are driven by the area of the silicon in the microchip. The typical size of an NFC microchip is ~0.5 mm squared which means that the silicon microchip in very large quantities is priced at around 5 cents. When you have to add the cost for the copper coil, as well as the cost of attaching the coil to the microchip, the cost of the label and the integration into the label, it becomes obvious that even in large volumes (1 Trillion) an NFC tag is unlikely to be available for under 10 US cents. With MPICA we are capable of offering an NFC tag for only 1 US cent (or less) in volumes of trillions per year.

Proctor and Gamble ("P&G") in 2014 sold 41,500,000,000 products from only 23 different brands that year with @$83,000,000,000 revenue from those sales. If you made them apply 1 tag @ a cost of 10 US cents on every one of those 41.5 billion products sold, it would have cost them @$4,150,000,000.00 to implement, which is about 5% of their net sales. With slim margins in today's world that percentage would be a non-starter. But, if you offered a 1 US penny tag to P&G, the cost to implement would be $415,000,000.00 which would be only @0.5 percent of their net sales.

Proctor and Gamble's CEO announced that their 2015 yearly advertising budget would be $2,900,000,000.00 and of which $1,015,000,000.00 will exclusively be spent on digital advertising through the web and print. Which equates to 35% of their total advertising budget. If P&G used only 41% of their digital advertising budget for direct marketing through touch sales from smart phones that would be $416,150,000.00. With the tag cost to implement at only $416,150,000 and at only 41% of their digital advertising dollars it would pay for everything and create a huge ROI for P&G.

NFC will take mobile marketing to a whole new level. NFC enables the use of contactless communication between devices like smartphones or tablets that allows any user the ability to wave their personal communication device(s) over a NFC-compatible device to send information without needing to touch the devices together or go through multiple steps to set up a connection. The short range wireless RFID technology will bring marketers and consumers together like never before, bringing the capability for the real-time exchange of any content and/or data. How much is the Internet of everything worth? $19 trillion The Internet of Everything will have five to 10 times the impact on society as the Internet itself, says Cisco CEO John Chambers.

Cisco CEO John Chambers says a new tech market is coming that will generate an astounding $14 trillion in profits over the next decade: the Internet of Things (IoT). IoT is about putting all sorts of inanimate objects on the Internet like cars, door locks, appliances, smart meters, video surveillance, health care devices, and thermostats and so on. "The Internet of Things, I think will be the biggest leverage point for IT in the next 10 years, $14 trillion in profits from that one concept alone". He's basing this on Cisco's research. Cisco recently released its latest report on Internet trends. The report predicted that by 2017, there will be about 2.8 billion machines on the Internet, representing 30% of the devices connected to the internet worldwide, up from 960 million devices and 17% in 2012. These devices will lead to apps, services, support jobs and will cause businesses and service providers to upgrade their networks, too. Cisco has even coined its own phrase for this: the "Internet of Everything." The Internet of Everything will put a lot of money in a lot of company's pockets, Cisco among them.

NFC has such a broad range of applications that the much less sophisticated quick response (QR) codes (Barcode) pale in comparison. Although QR technologies can be effective for delivering information to consumers, NFC technologies take this concept beyond the stars, allowing unlimited information to be instantaneously transferred and exchanged between individuals and organizations. NFC has much greater functional uses and the potential to ultimately transform the way how all businesses are conducted. For example:

Data on all purchasing behavior collected through NFC exchanges will allow marketers to more effectively target and deliver the right type of marketing content to appeal to and engage with users. It will also make it easier to manage and promote customer loyalty and reward programs, and consumers will no longer need to carry around reward cards and coupons. Individuals will also be able to automatically spread the word about incentives and deals on social networks via automatic NFC-enabled sharing.

NFC tags will be placed in various print media, such as signage, magazines, product displays, and packaging. The tags are capable of reading the preferences and purchasing data of anyone with an NFC-enabled smartphone. This allows marketing messages to be customized to target and attract specific individual consumers.

Smart posters containing custom URL-programmed NFC tags enable seamless transactions with mobile users. Smart posters have been successfully used by businesses including Samsung, VH1, and Lipton. In addition to transferring digital media such as music and video, smart posters can deliver information like product availability and purchase locations.

NFC tags will also equip marketers with real-time analytics to track engagement with a campaign. Furthermore, geo-location mapping will provide specifics on the time and place of transactions and interactions. With data so precise and readily available, businesses will have a greater ability to refocus their efforts in real time and increase their ROI.

NFC has a number of other potential applications that could be far reaching, impacting the way business is done for transit systems, healthcare providers, banks, ticketing outlets, and more. It can also be used to provide things like electronic keyless entry. The potential for increased revenue and reduced expenses makes this technology very appealing for a variety of organizations.

NFC capabilities are currently being incorporated into the networks of mobile carriers, as this technology is set to become the new standard for location-based marketing and communications in the near future.

With the capabilities of NFC technology, every mobile device will become even more crucial to individuals than they already are today. It will become the standard of exchange for business transactions, eventually replacing credit cards and even cash for the average consumer.

Payment systems and marketing loyalty programs will be only the beginning for NFC technology. In addition to the mounting interest in NFC for mobile access control, this technology will empower more efficient, effective industrial applications. Specifically, combining NFC enabled smartphones with ruggedized RFID tags offers additional benefits when compared to traditional RFID solutions. When an application requires frequent interaction with tags at numerous process points by many different parties, the high expense of using traditional handheld readers is extremely cost prohibitive. By replacing handheld readers with NFC smartphones at data collection points, the ROI for the application increases.

Additionally, while the NFC standards for tags enable a broad variety of use cases and security, the concept of "trust" will allow for the ability to confer trust onto any item(s) that are the subject of transactions between individuals and organizations.

In embodiments, a unique Integrated Circuit (IC) die ejection head assembly system is described, which utilizes Three-Dimensional (3D) printing to achieve very high resolution manufacturing to meet the precision tolerances required for very small IC die sizes. Hundreds of thousands of die are retained in this head assembly system until they are selectively ejected in a very controlled and precise way onto an underlying substrate, which they are then attached to. An arbitrarily large number of die can be selected and ejected at a time until all the die are ejected from the head assembly system.

The Integrated Circuit Controlled Ejection System (ICCES) embodiments provide a new approach for Massively Parallel Integrated Circuit Assembly (MPICA). The system is a complex die retention and ejection system that has the size and footprint of a standard silicon wafer on which the die are fabricated. For a die size of 250 microns on a side, there are about 900,000 such die on a 12-inch wafer.

Figure 1:
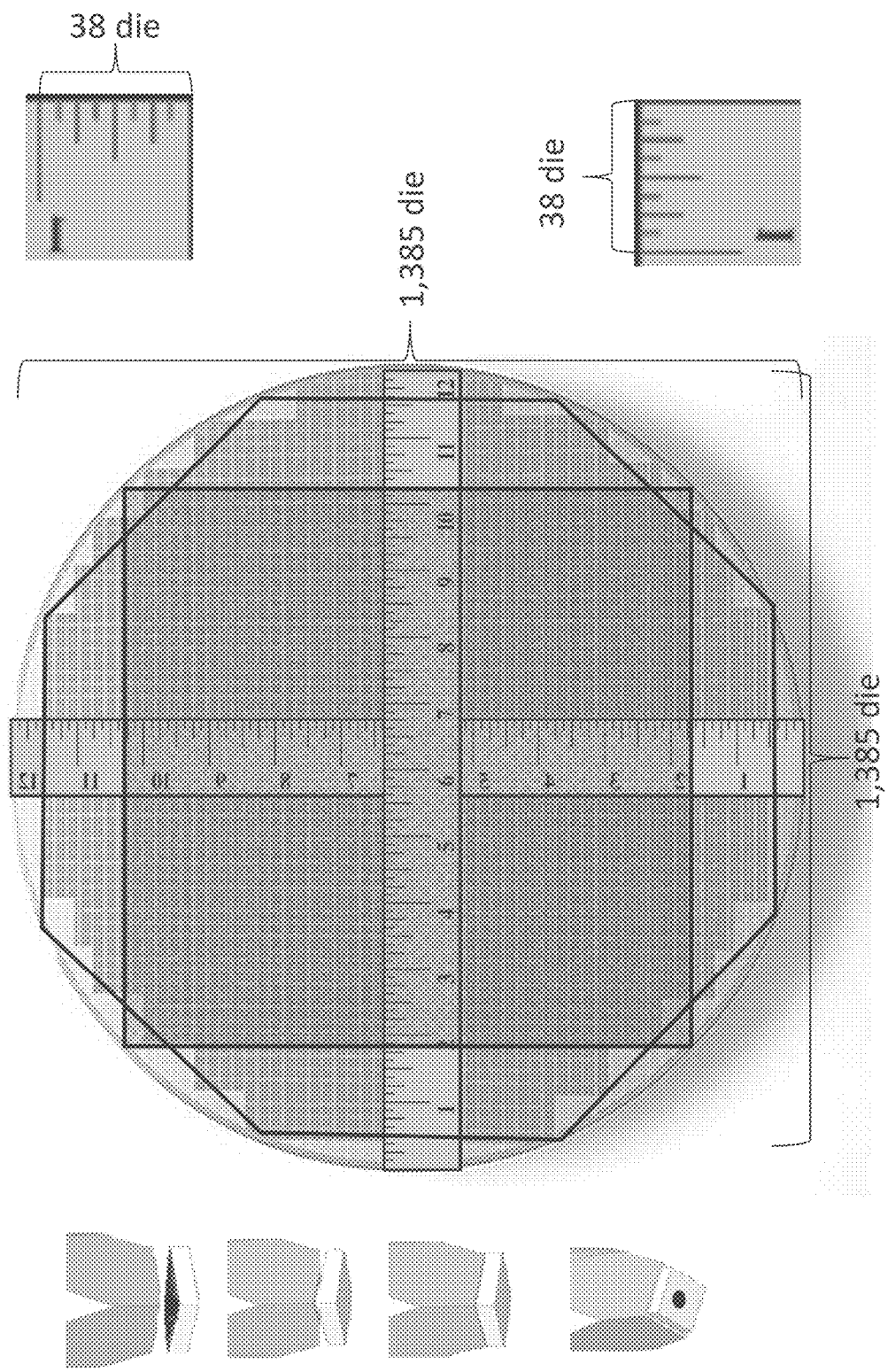
FIGS. 1-122 illustrate numerous structures and processes for parallel integrated circuit assembly, according to example embodiments.
Figure 2:
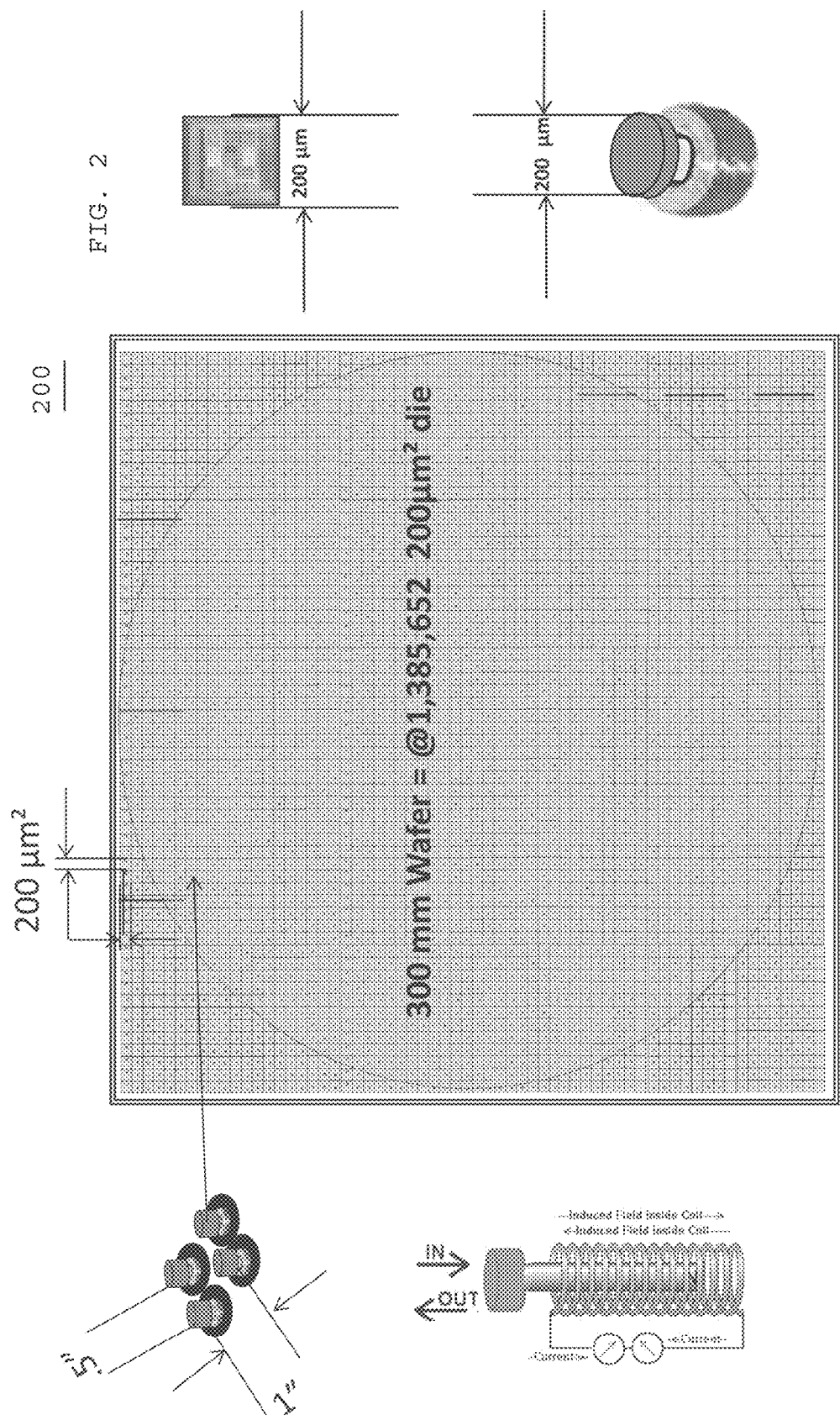
FIG. 2 shows a wafer and piston 200, according to an example embodiment.
Figure 3:
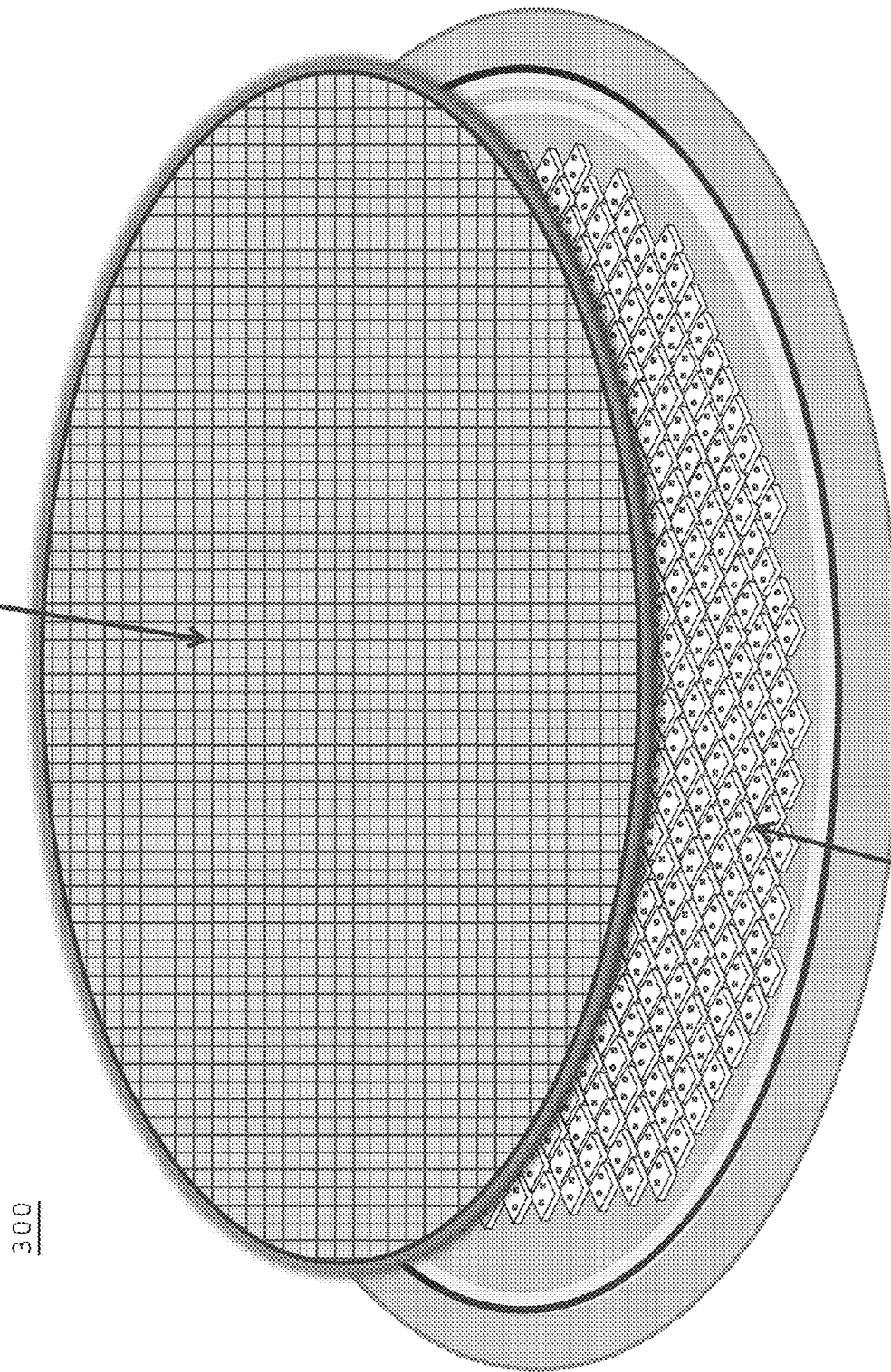
FIG. 3 shows a wafer and adhesive layer 300 with adhesive material, according to an example embodiment.
Figure 4:
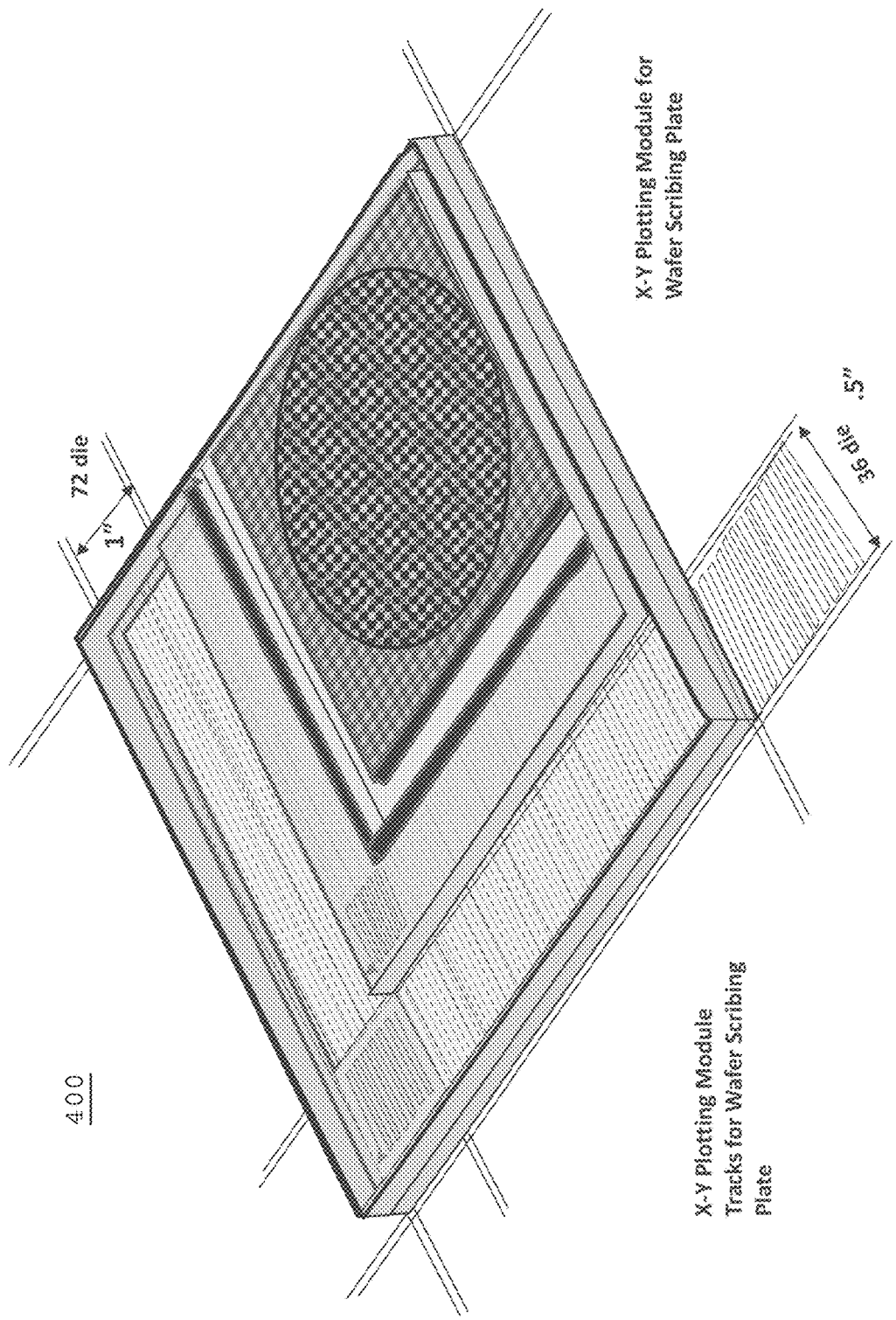
FIG. 4 shows a wafer-scribing and push plates system 400, according to an example embodiment.
Figure 5:
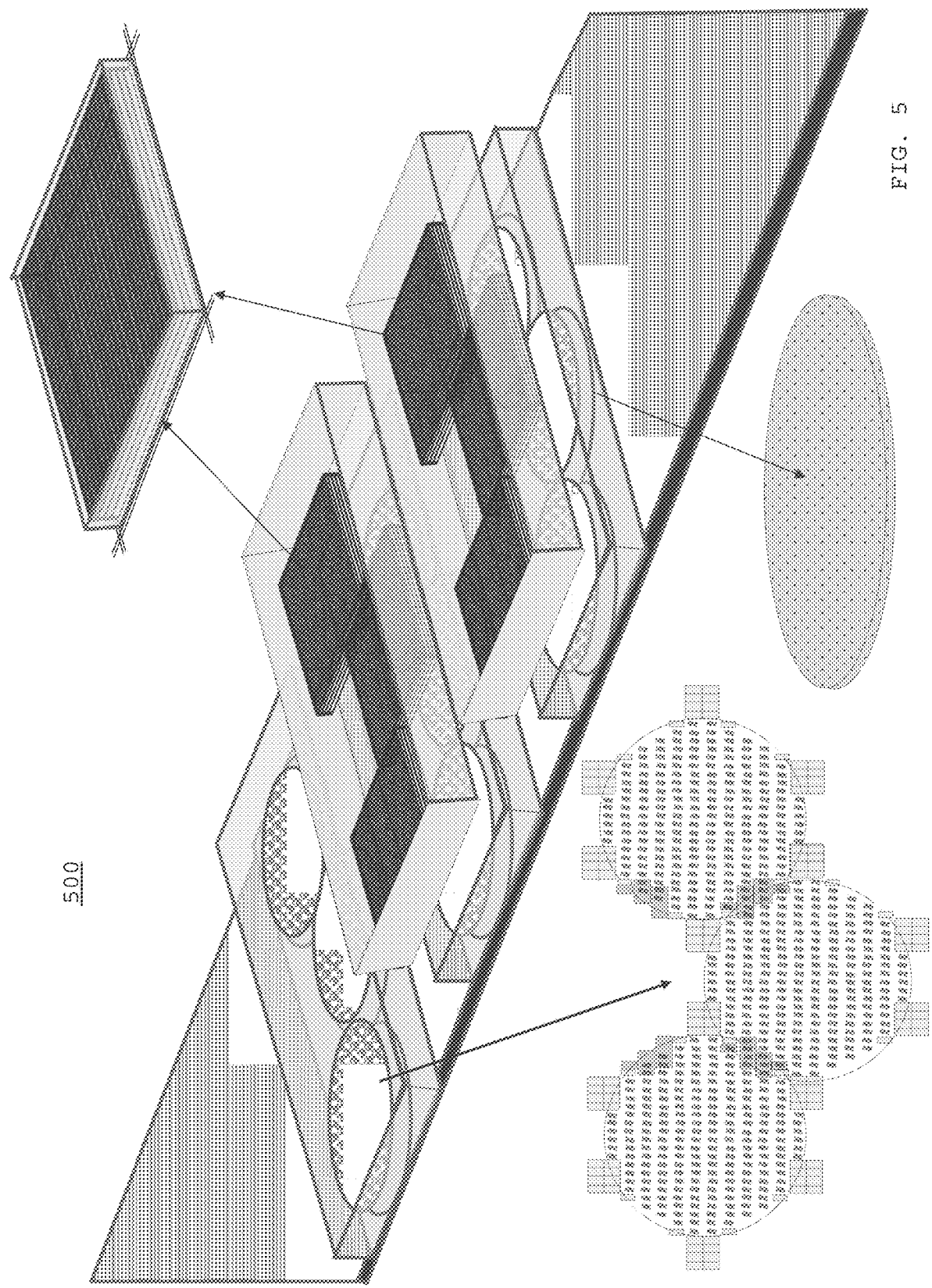
FIG. 5 shows a scaled wafer-scribing and push plates system 500, according to an example embodiment.
Figure 6:
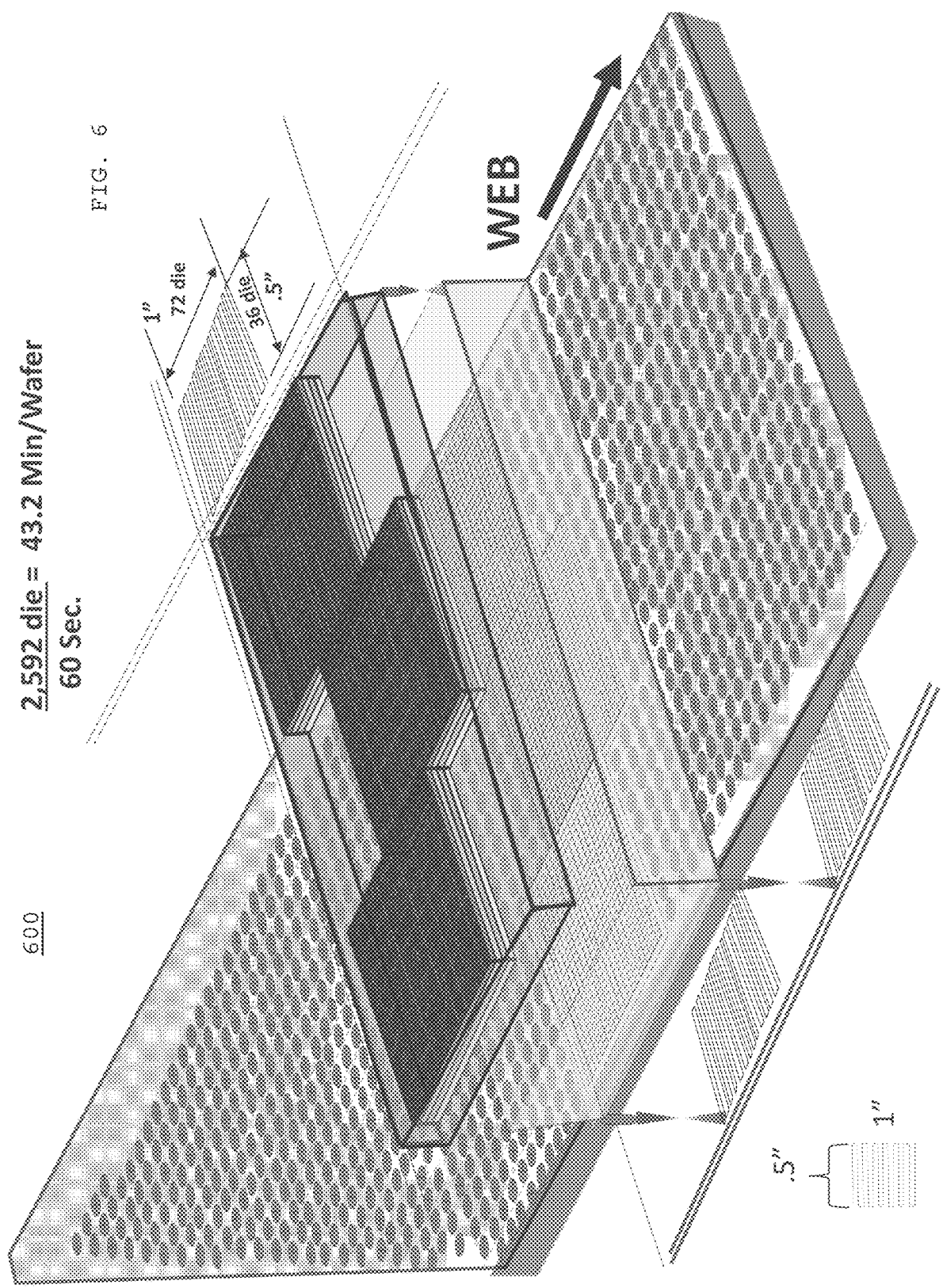
FIG. 6 shows a portion of a system 600 for ICCES for MPICA, according to an example embodiment.
Figure 7:
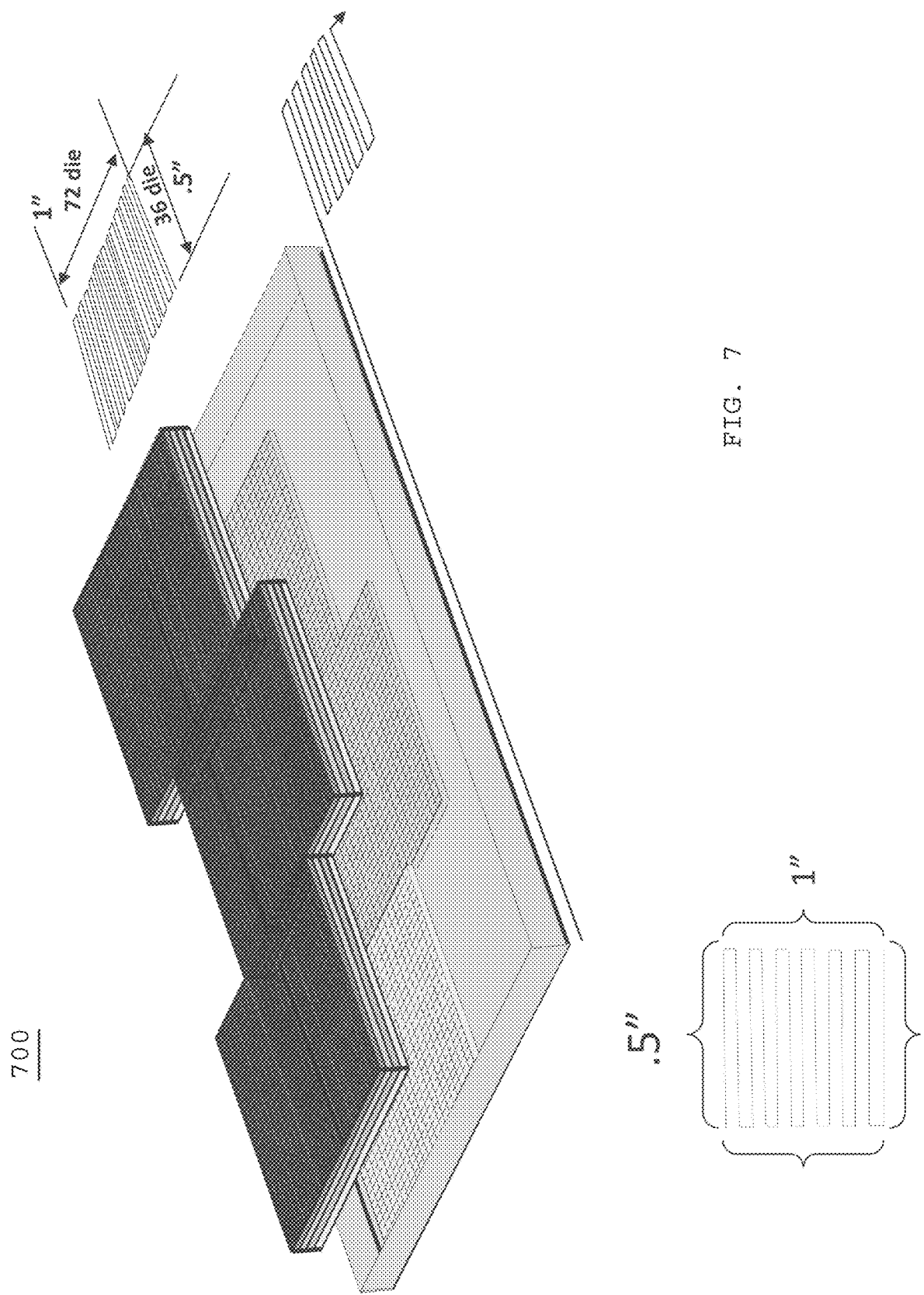
FIG. 7 shows a portion of a system 700 for ICCES for MPICA, according to an example embodiment.
Figure 8:
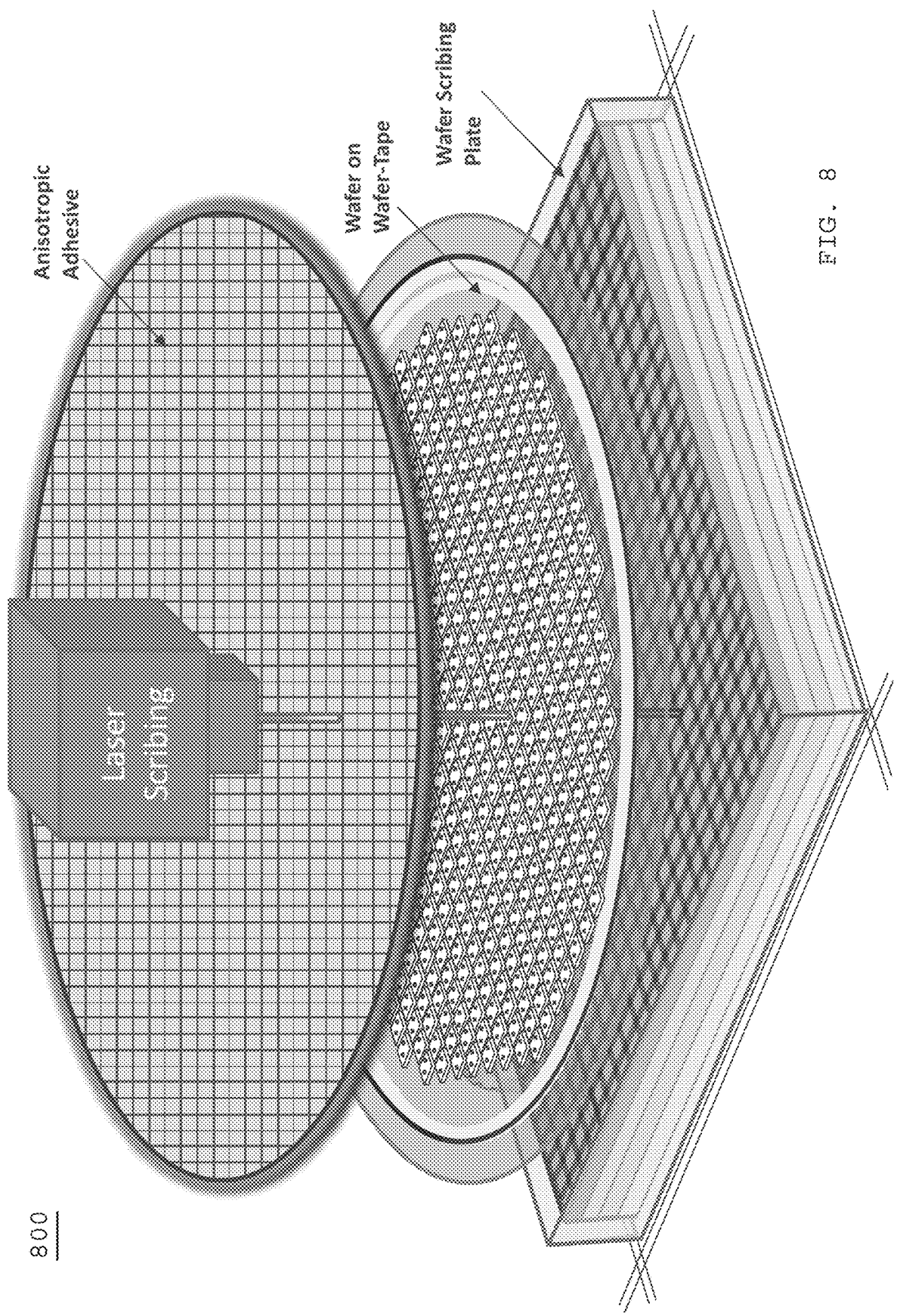
FIG. 8 shows a portion of a system 800 for ICCES for MPICA with a laser scriber, according to an example embodiment.
Figure 9:
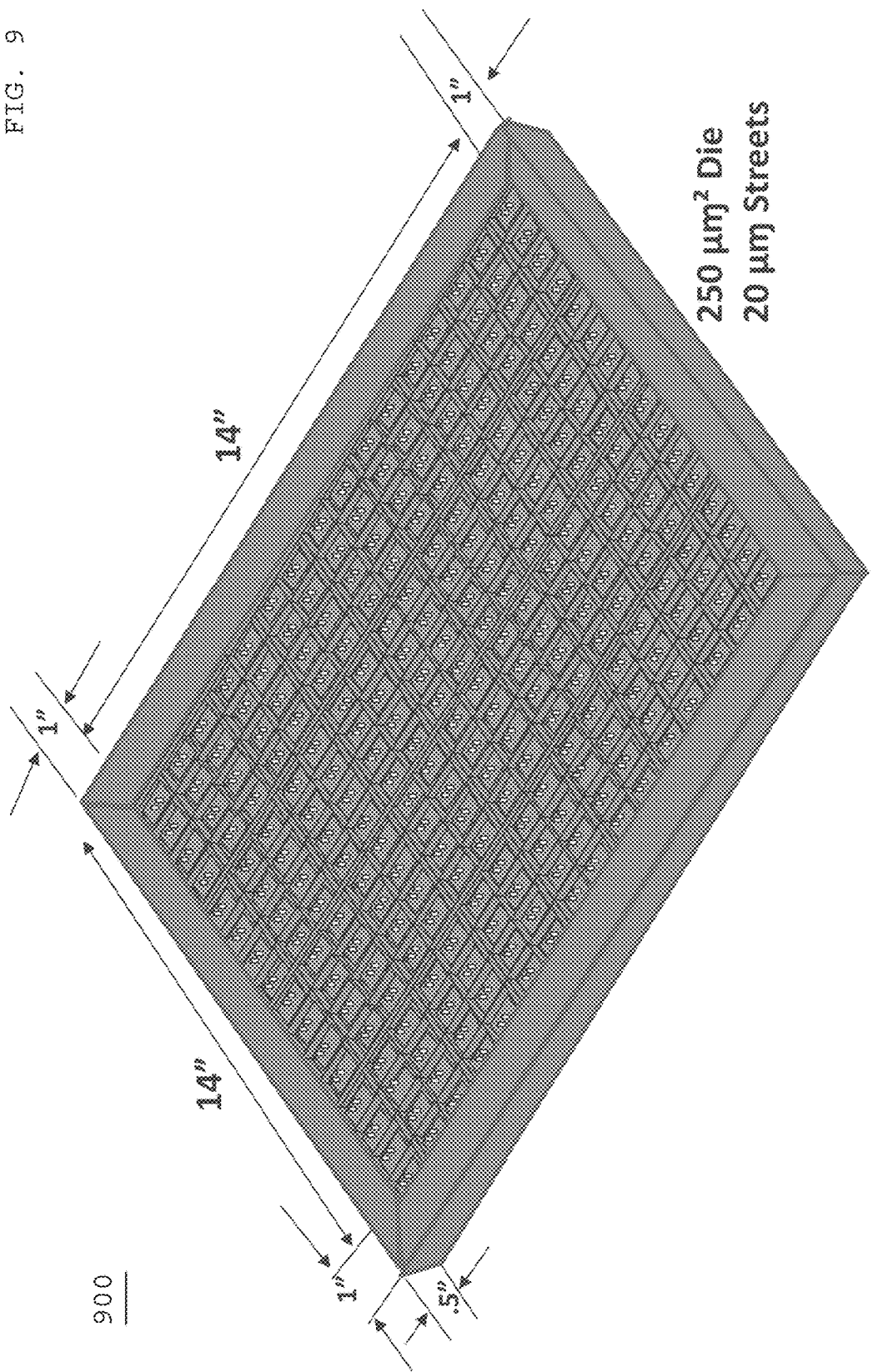
FIG. 9 shows a wafer scribing plate 900 having a plurality of cubbies that hold die, according to an example embodiment.
Figure 10:
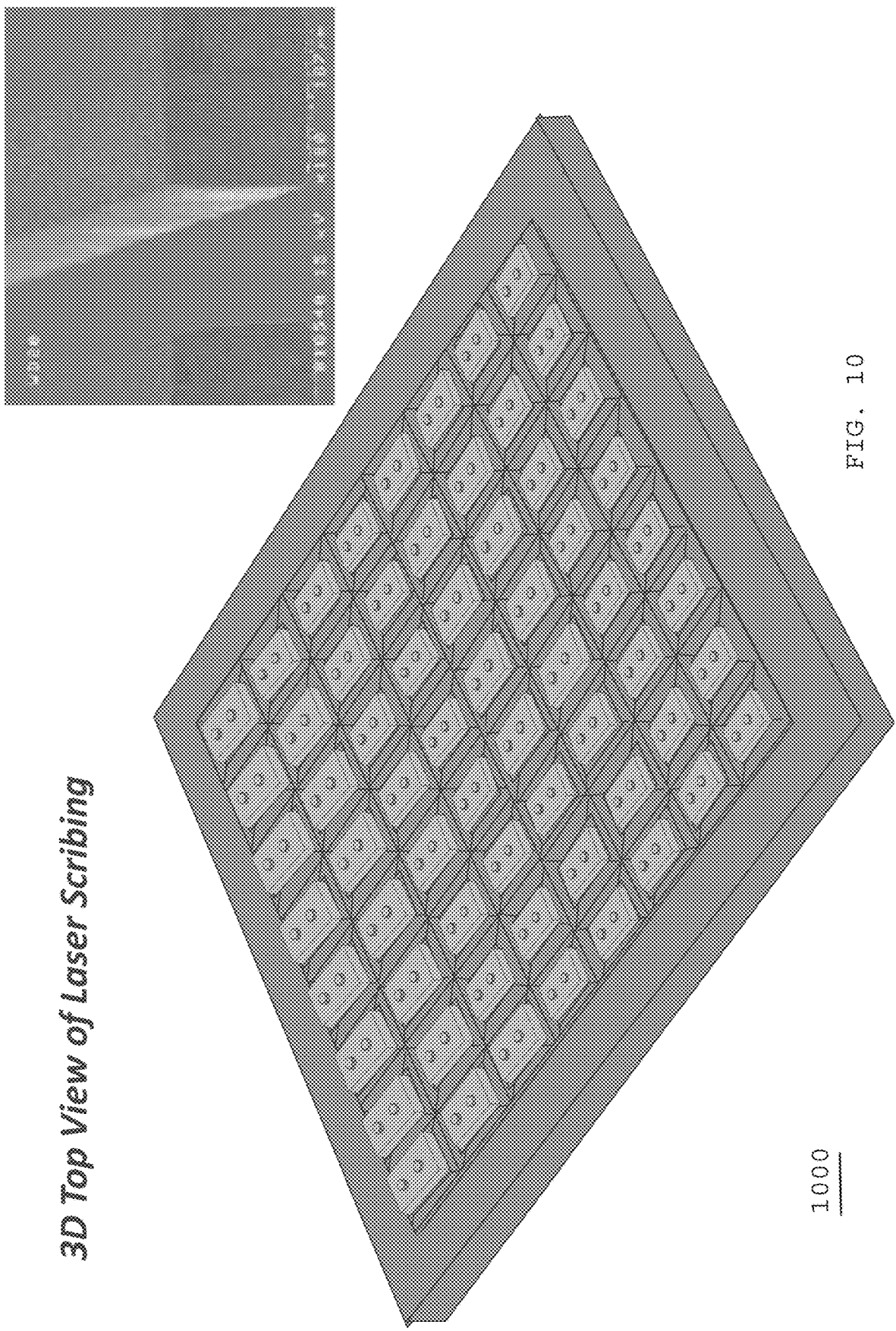
FIG. 10 shows a wafer scribing plate 1000 having a plurality of cubbies that hold die, according to an example embodiment.
Figure 11:
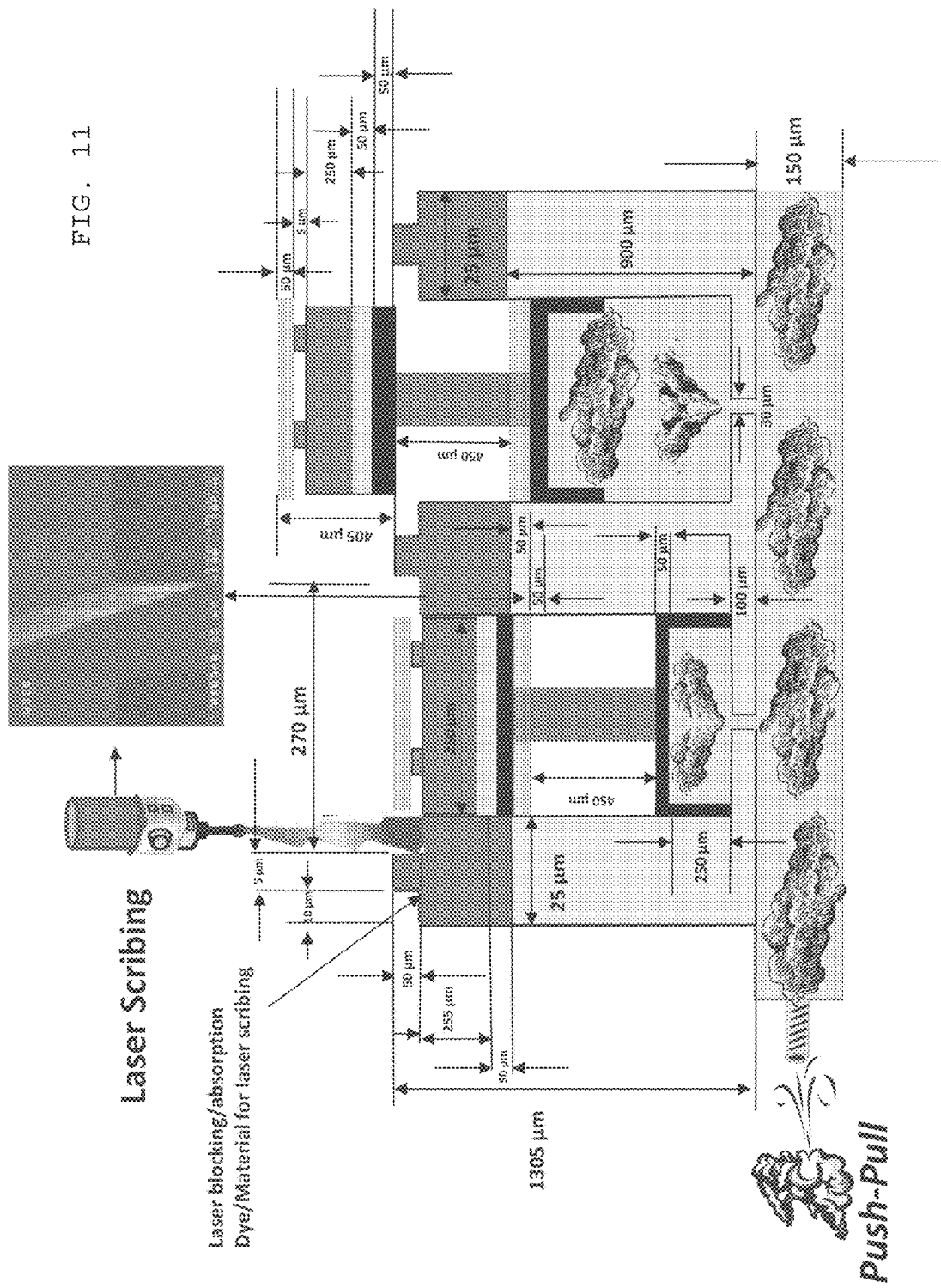
FIG. 11 shows a side view of a laser scriber, pistons, and wafer scribing plate 1100, according to an example embodiment.
Figure 12:
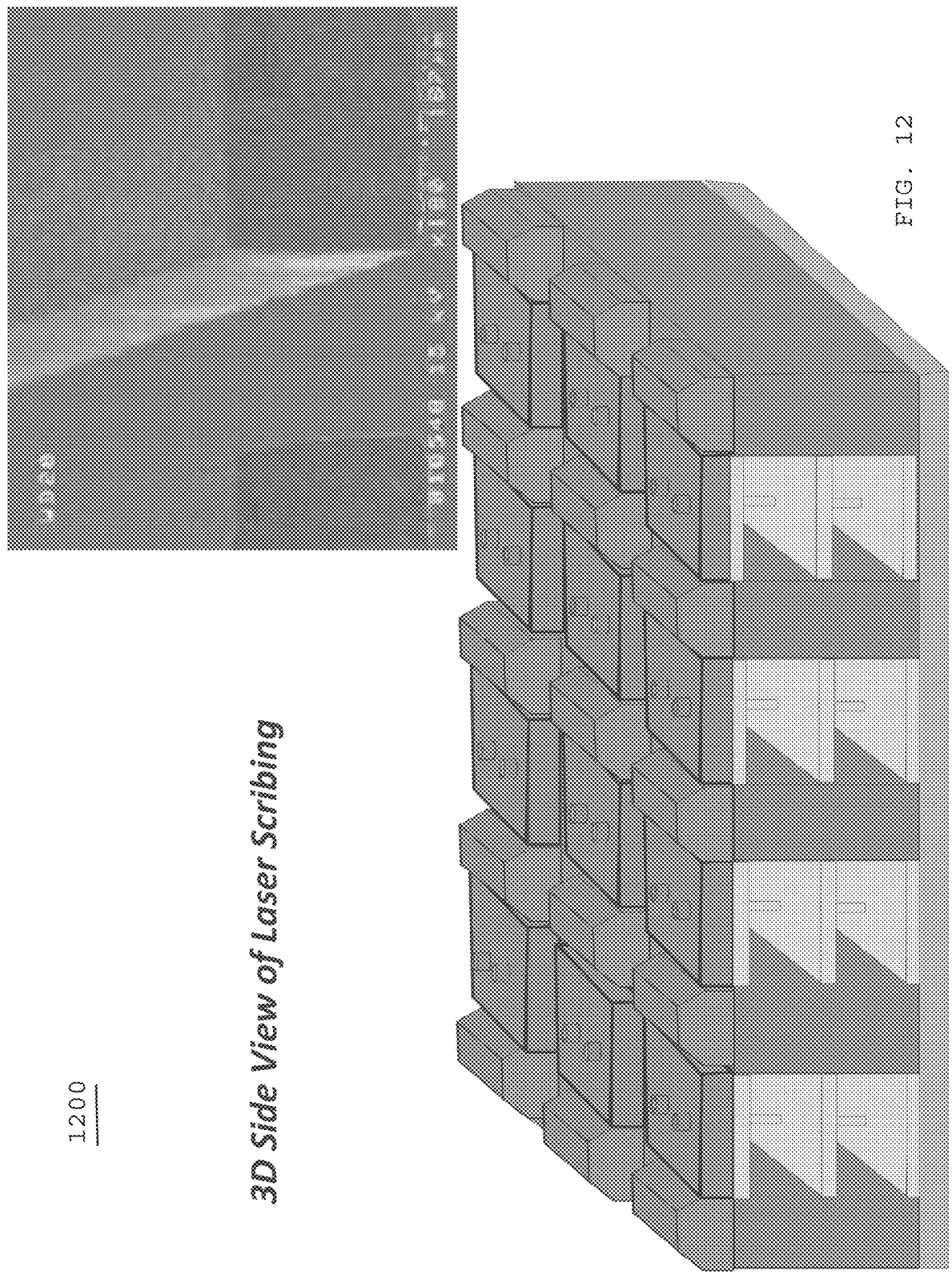
FIG. 12 shows a wafer scribing plate 1200 having a plurality of cubbies that hold die, according to an example embodiment.
Figure 14:
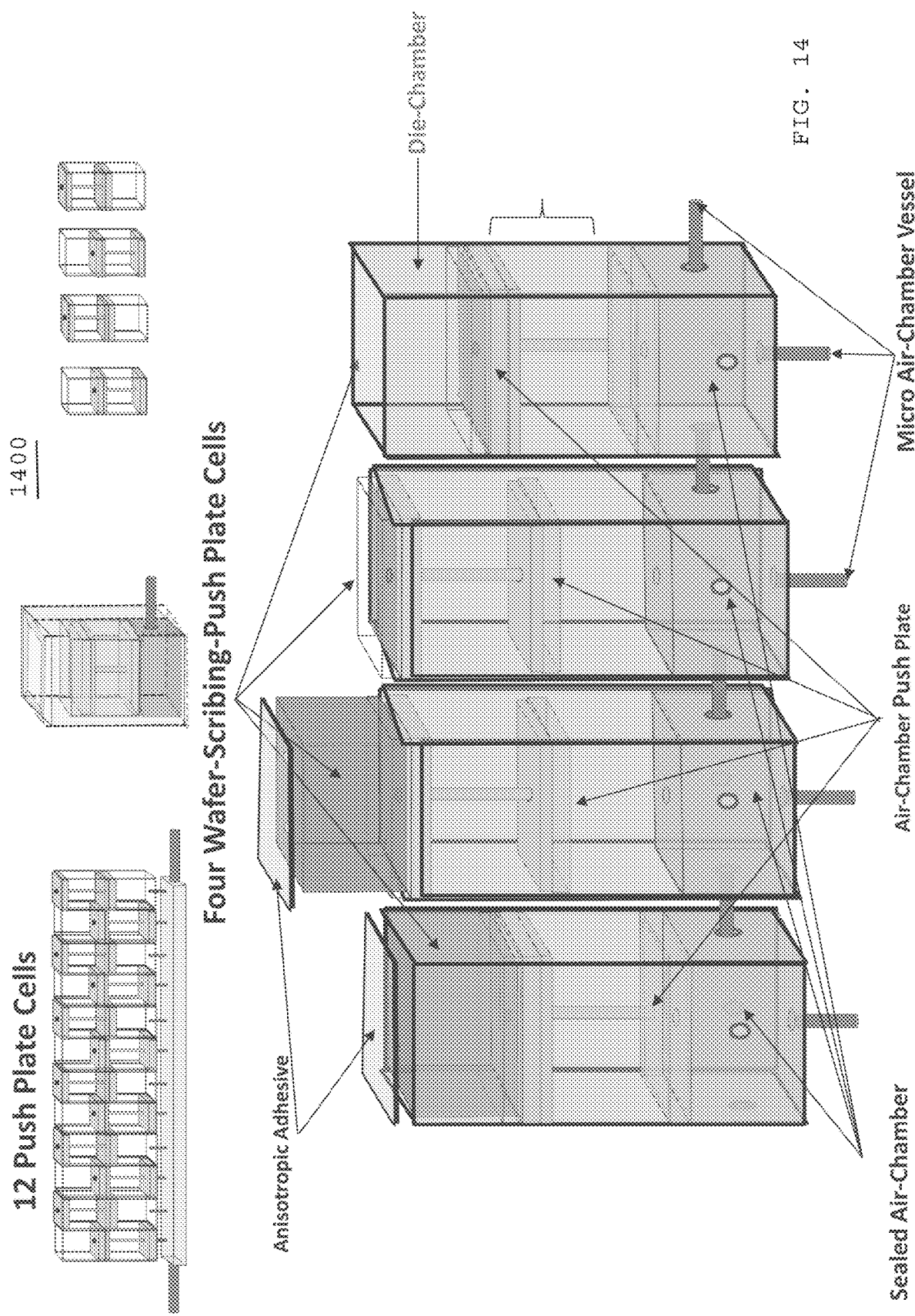
FIG. 14 shows wafer-scribing push plate cells, pistons, and air chambers 1400, according to an example embodiment.
Figure 15:
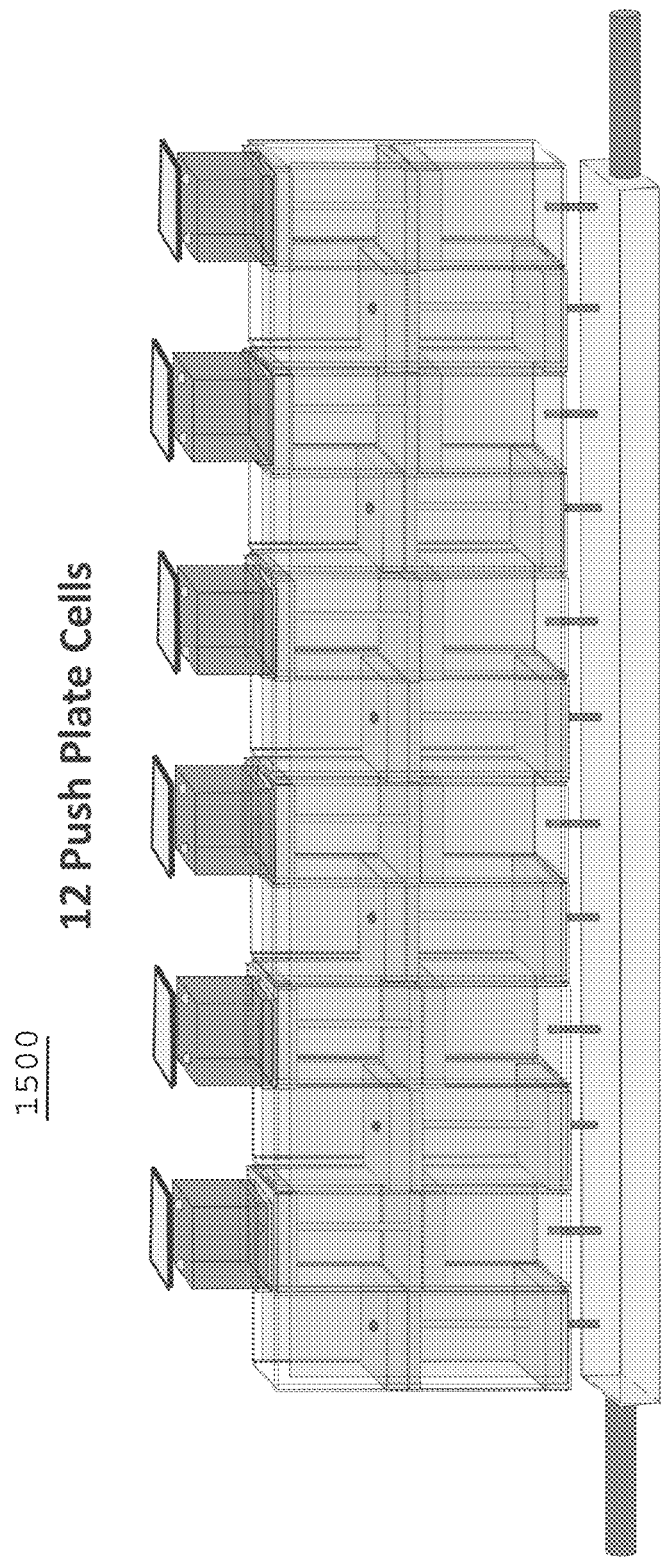
FIG. 15 shows wafer-scribing push plate cells, pistons, and air chambers 1500, according to an example embodiment.
Figure 16:
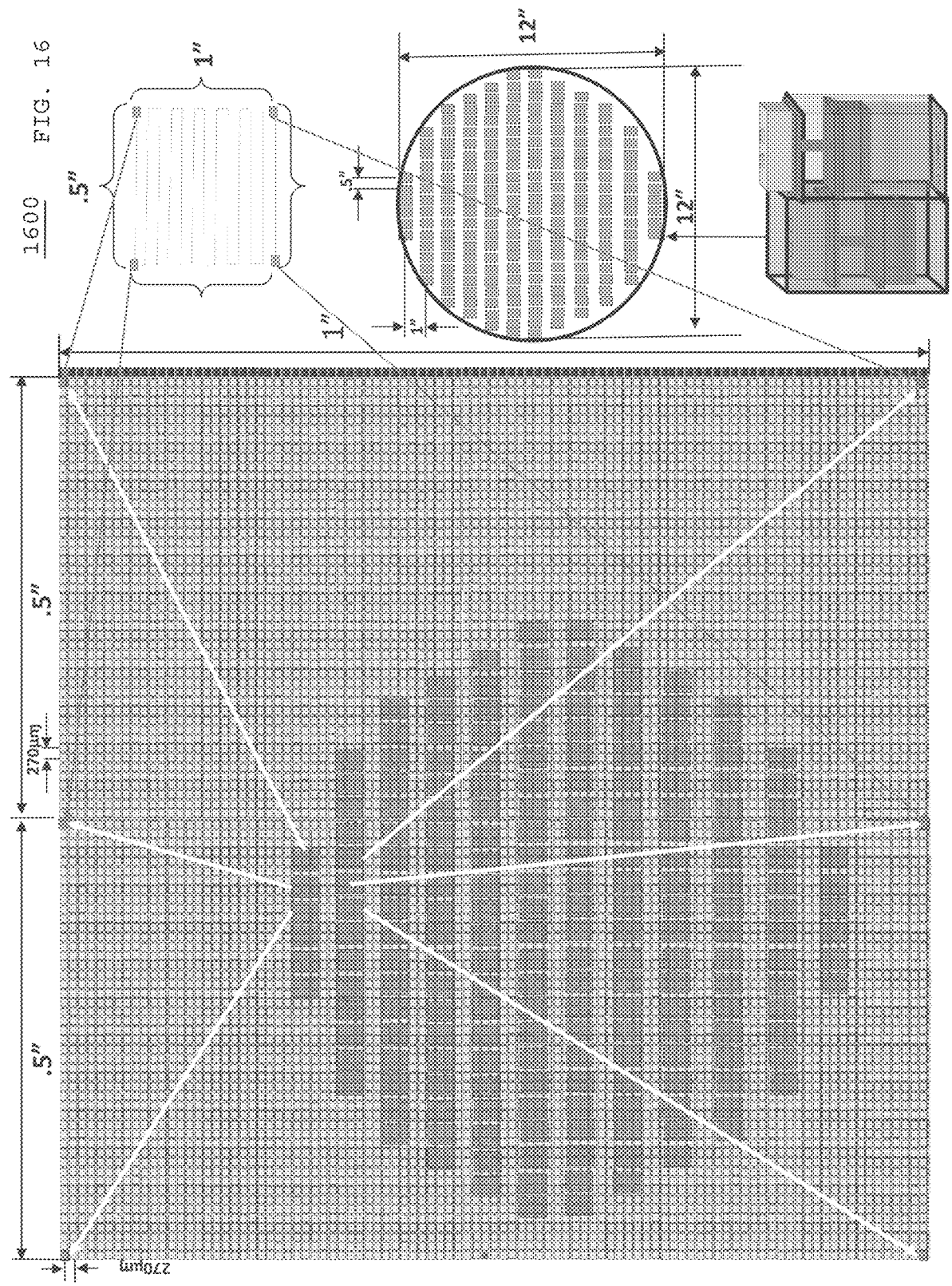
FIG. 16 shows a wafer scribing layout 1600, according to an example embodiment.
Figure 17:
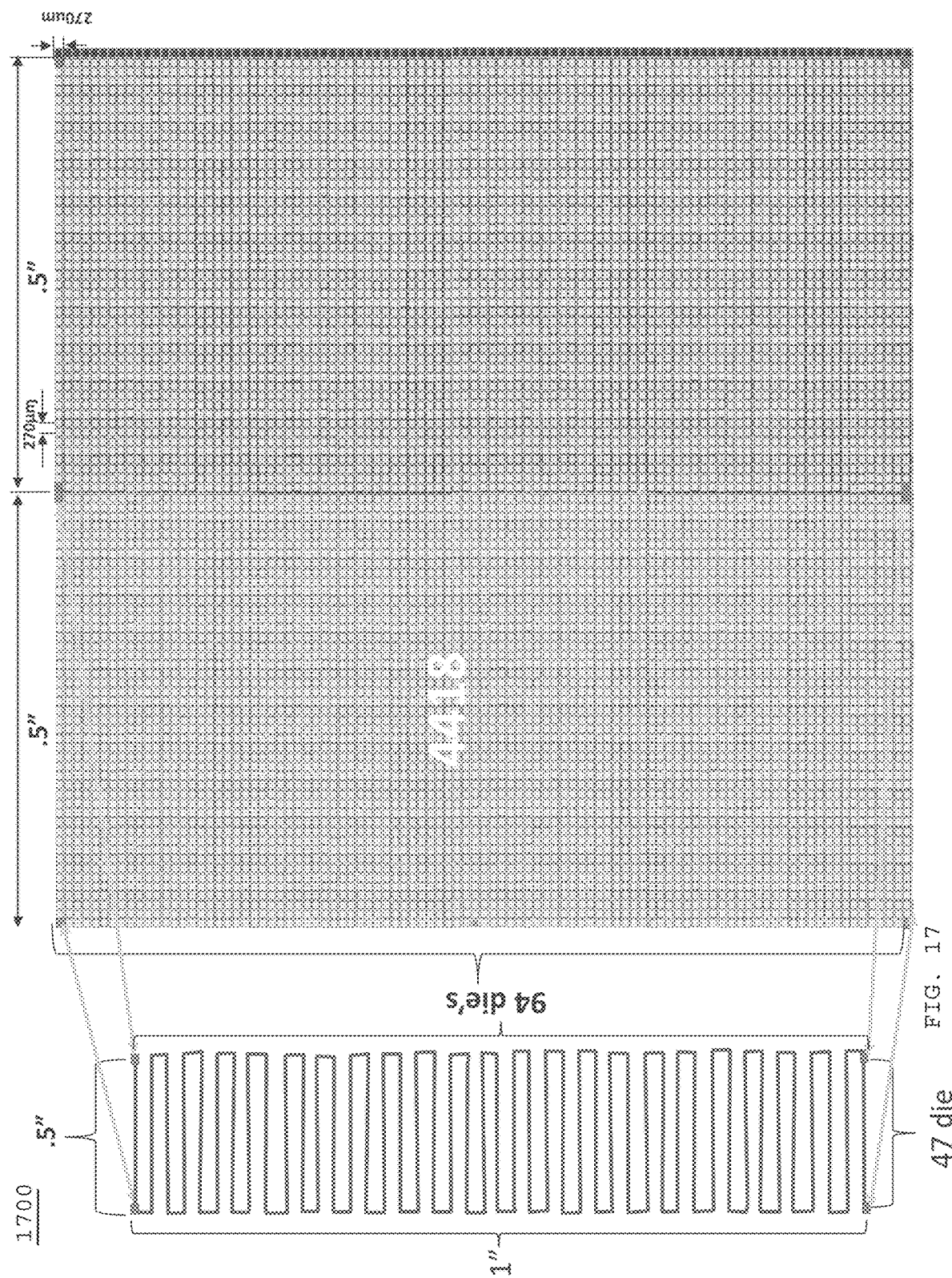
FIG. 17 shows a wafer scribing route layout 1700, according to an example embodiment.
Figure 18:
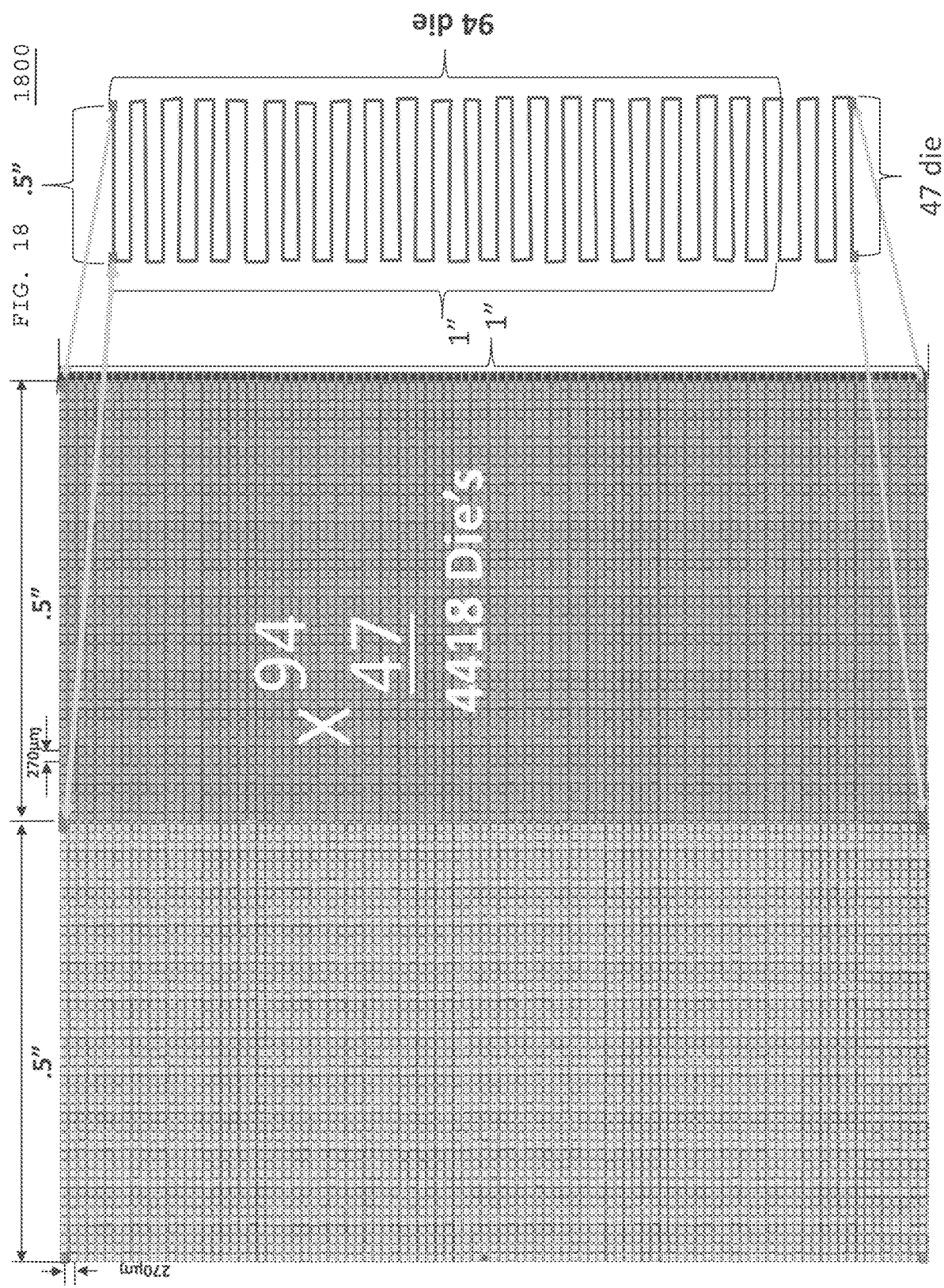
FIG. 18 shows a wafer scribing route layout 1800, according to an example embodiment.
Figure 19:
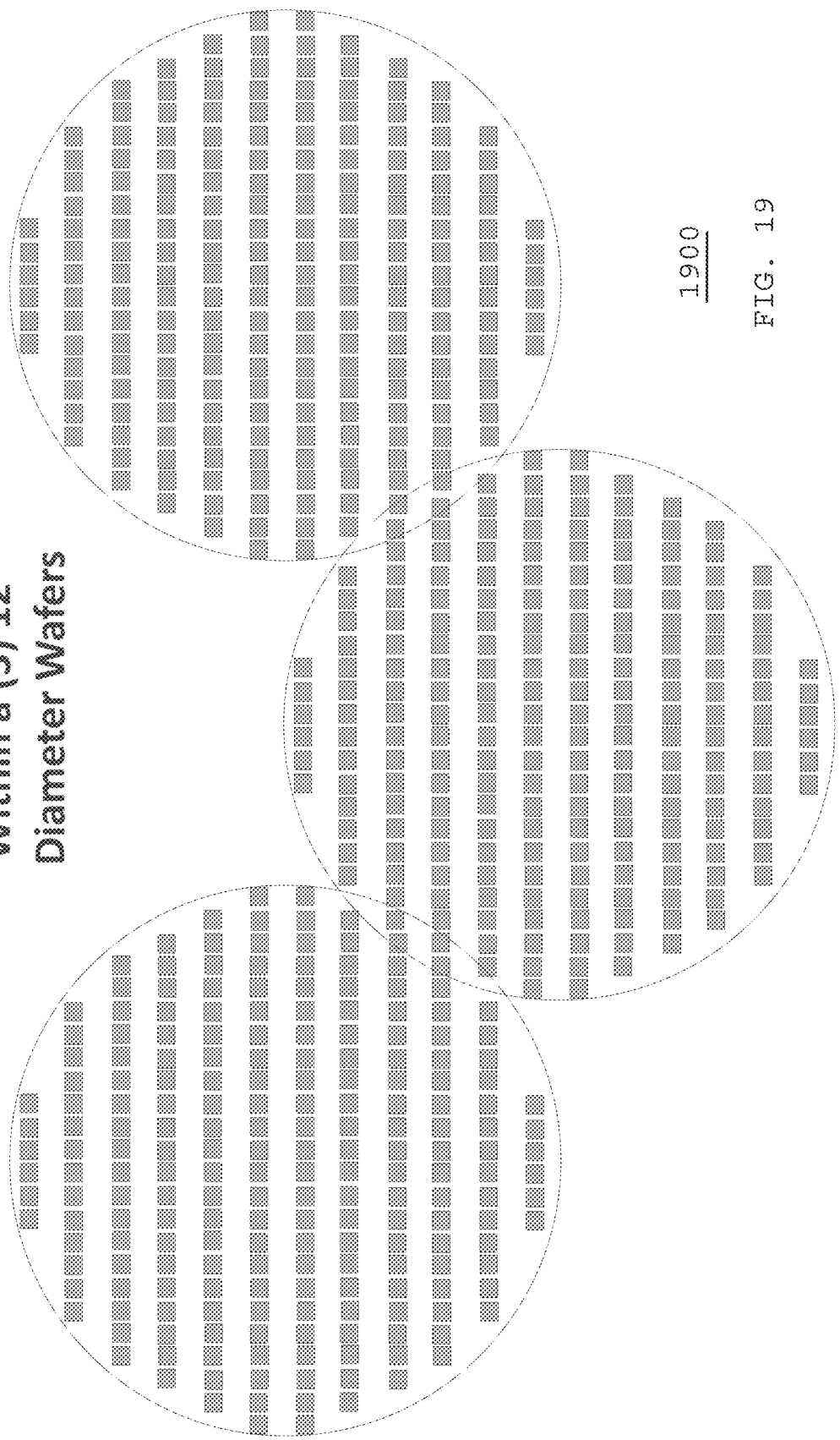
FIG. 19 shows push plates 1900 with respect to wafers, according to an example embodiment.
Figure 20:
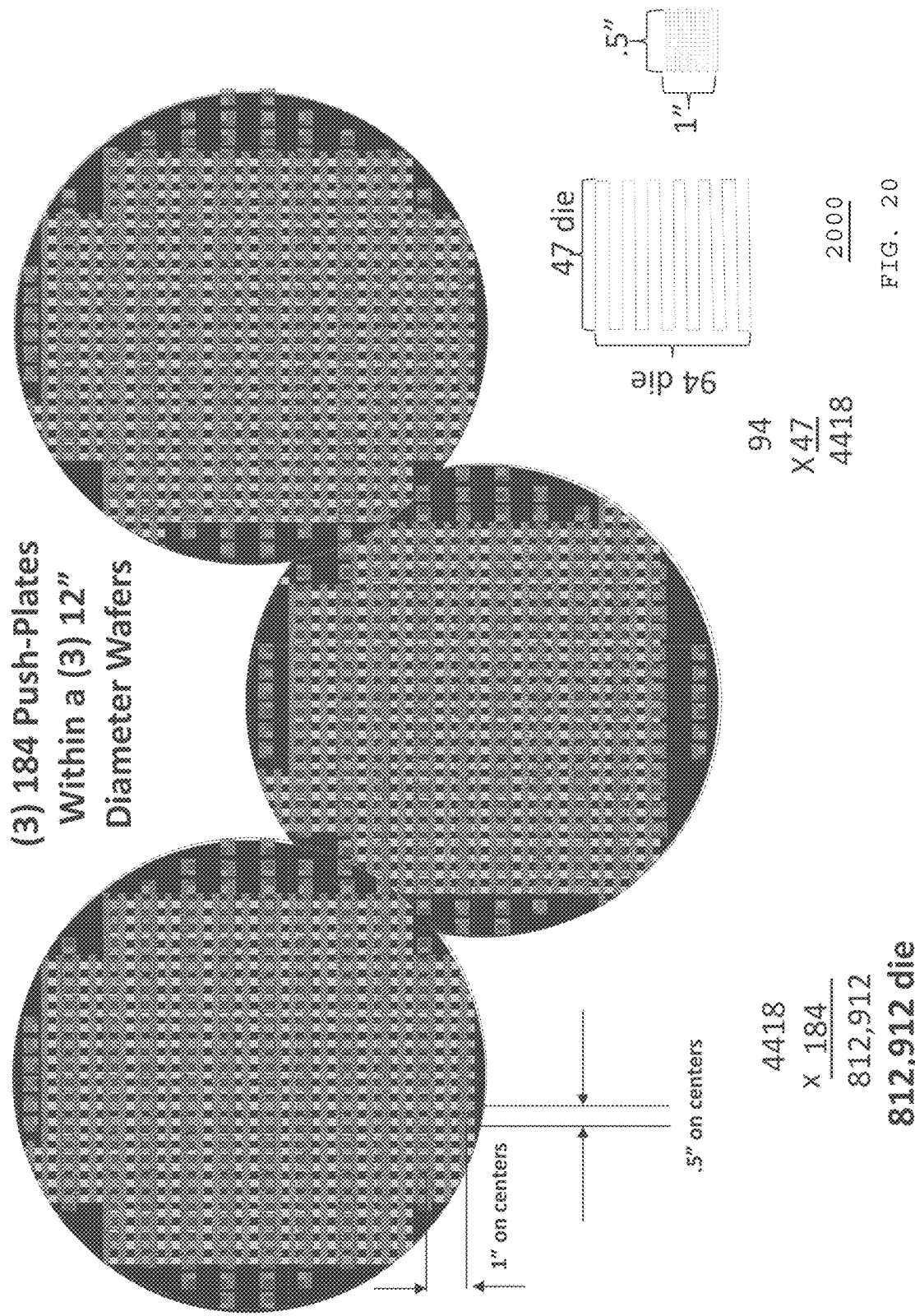
FIG. 20 shows push plates 2000 with respect to wafers and scribing route layouts, according to an example embodiment.
Figure 22:
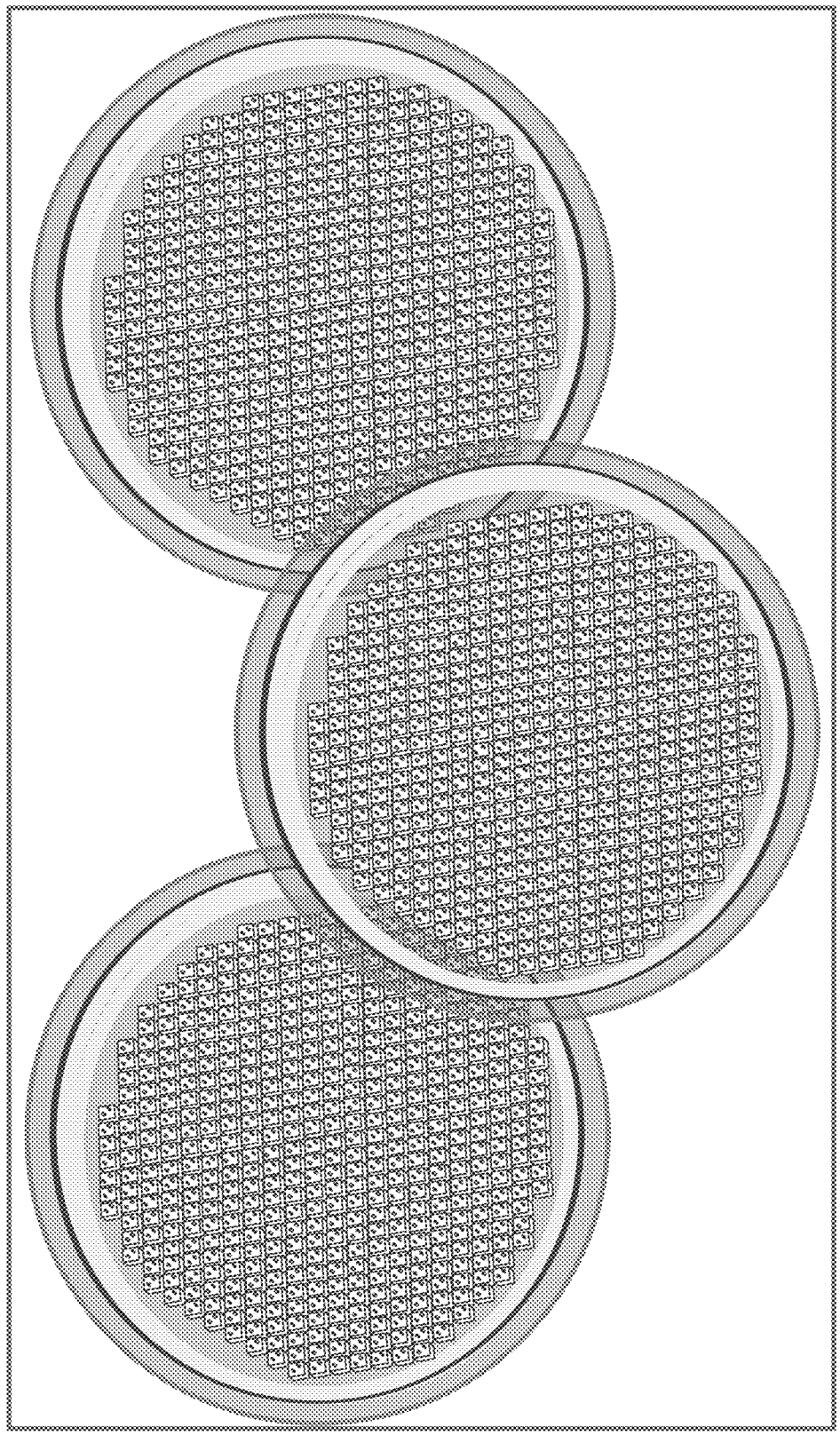
FIG. 22 shows wafers 2200 with die, according to an example embodiment.
Figure 24:
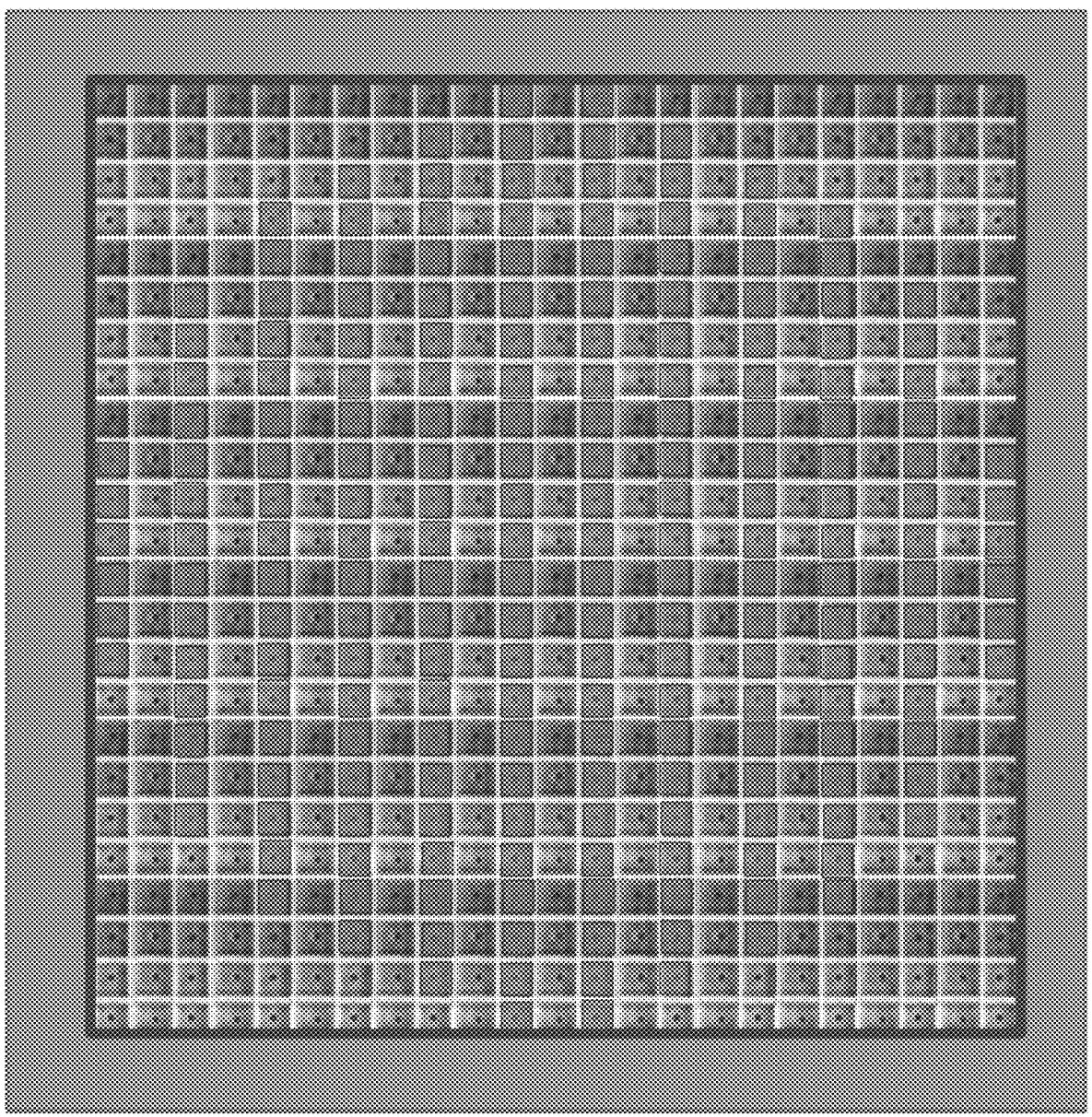
FIG. 24 shows grouped die 2400 of FIG. 23, according to an example embodiment.
Figure 25:
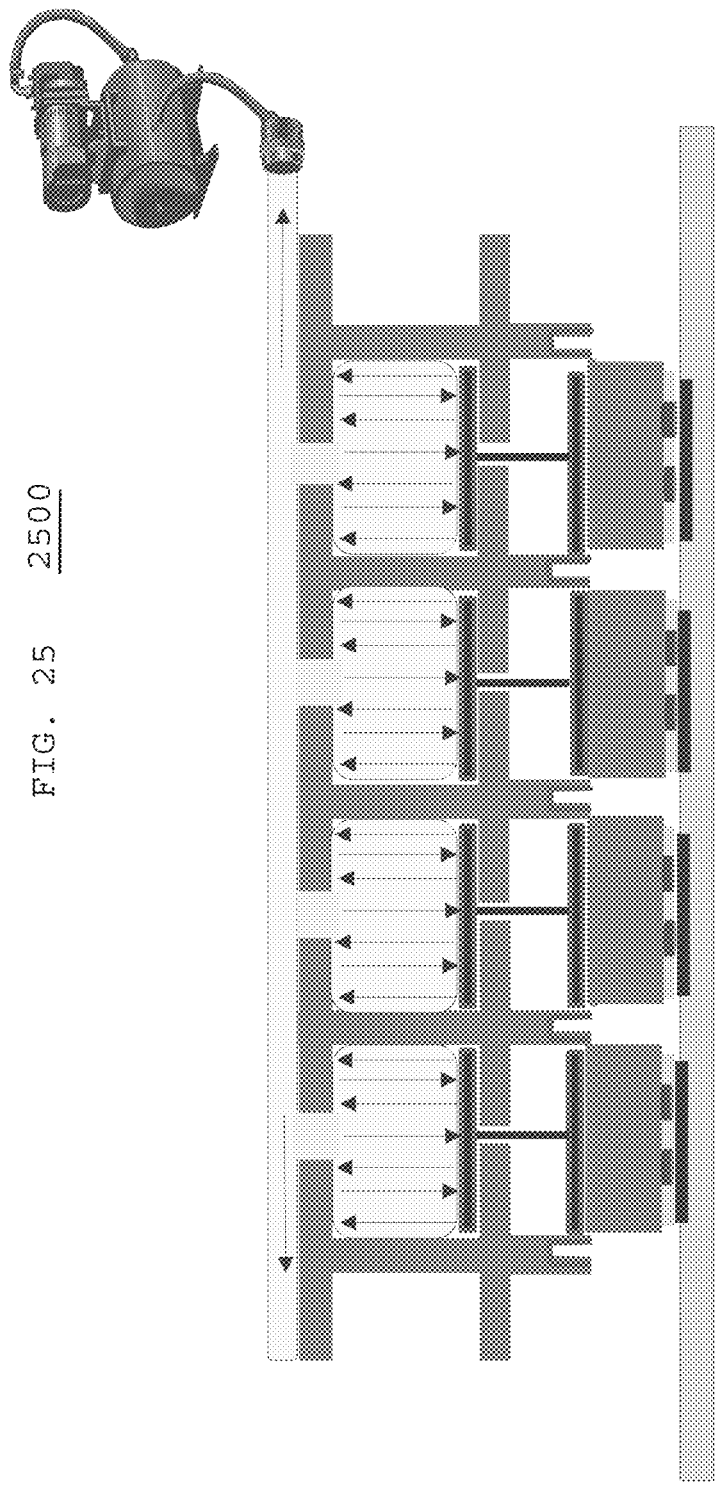
FIG. 25 shows an inverted view of push plates of air chambers with pistons 2500 and corresponding die positioning, according to an example embodiment.
Figure 26:
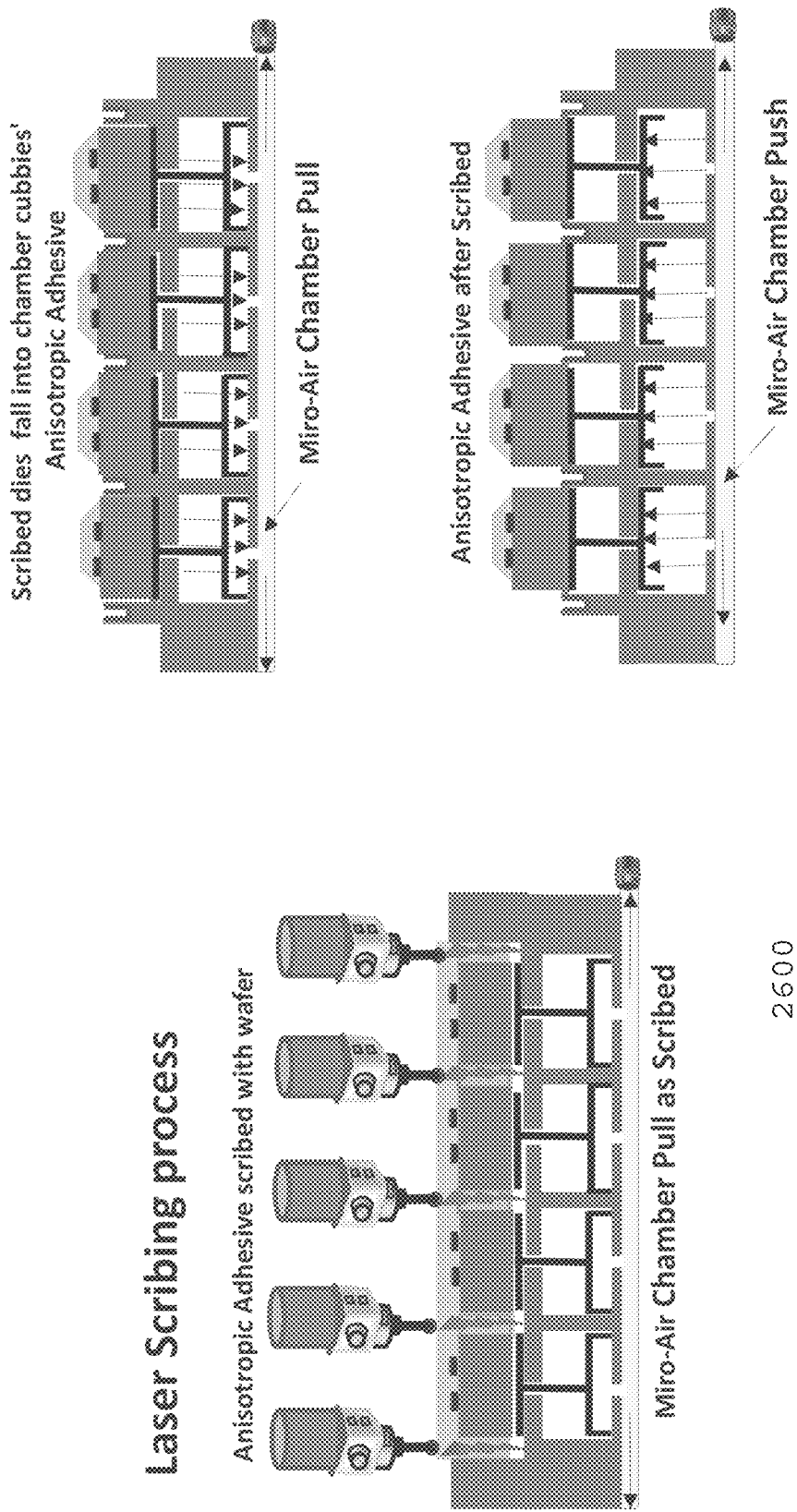
FIG. 26 shows laser scribers and push plates of air chambers with pistons/plungers 2600, according to an example embodiment.
Figure 27:
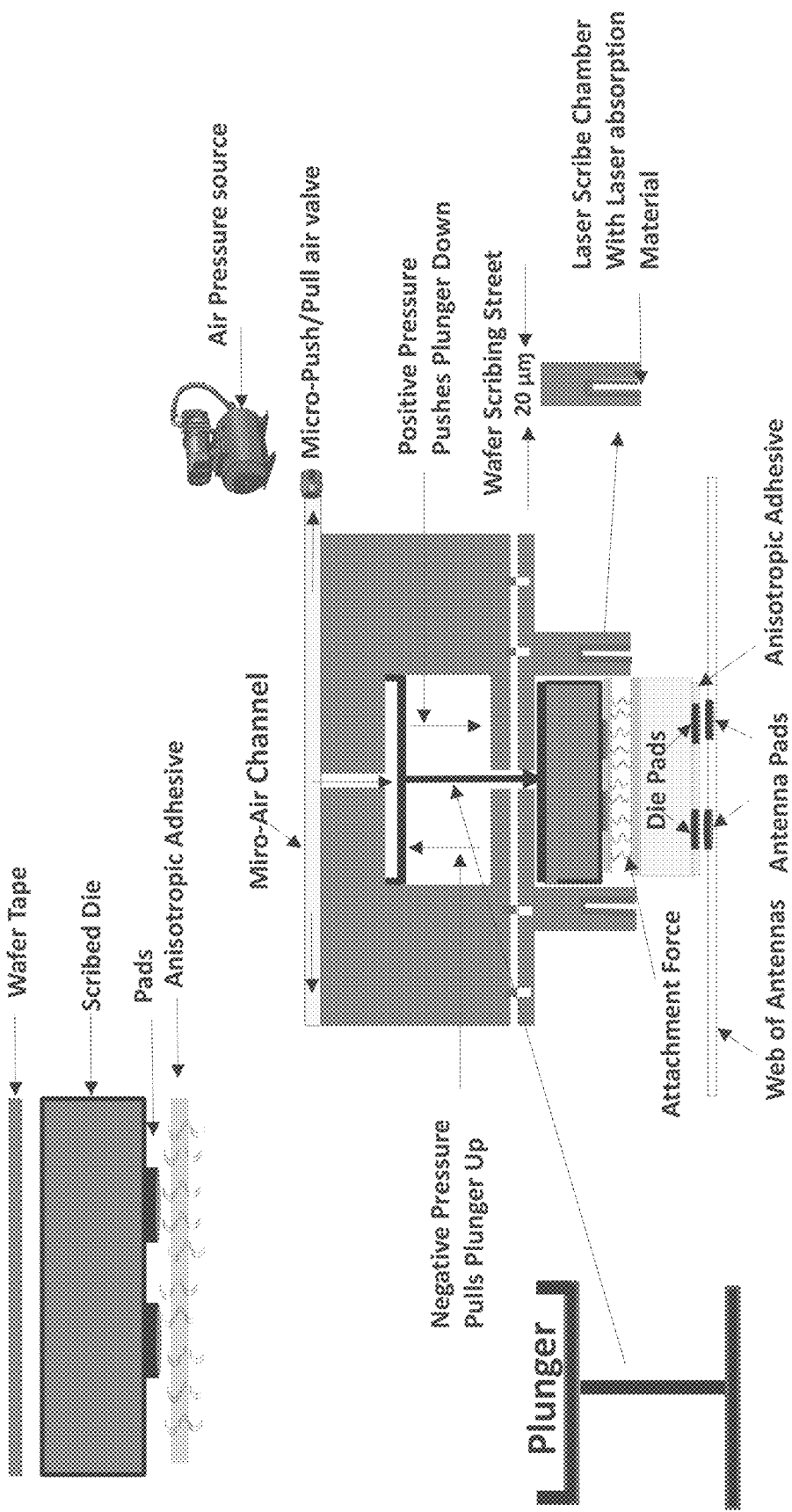
FIG. 27 shows inverted views of scribed die and adhesive materials attaching antennae thereto via a piston/plunger and an air chamber 2700, according to an example embodiment.
Figure 28:
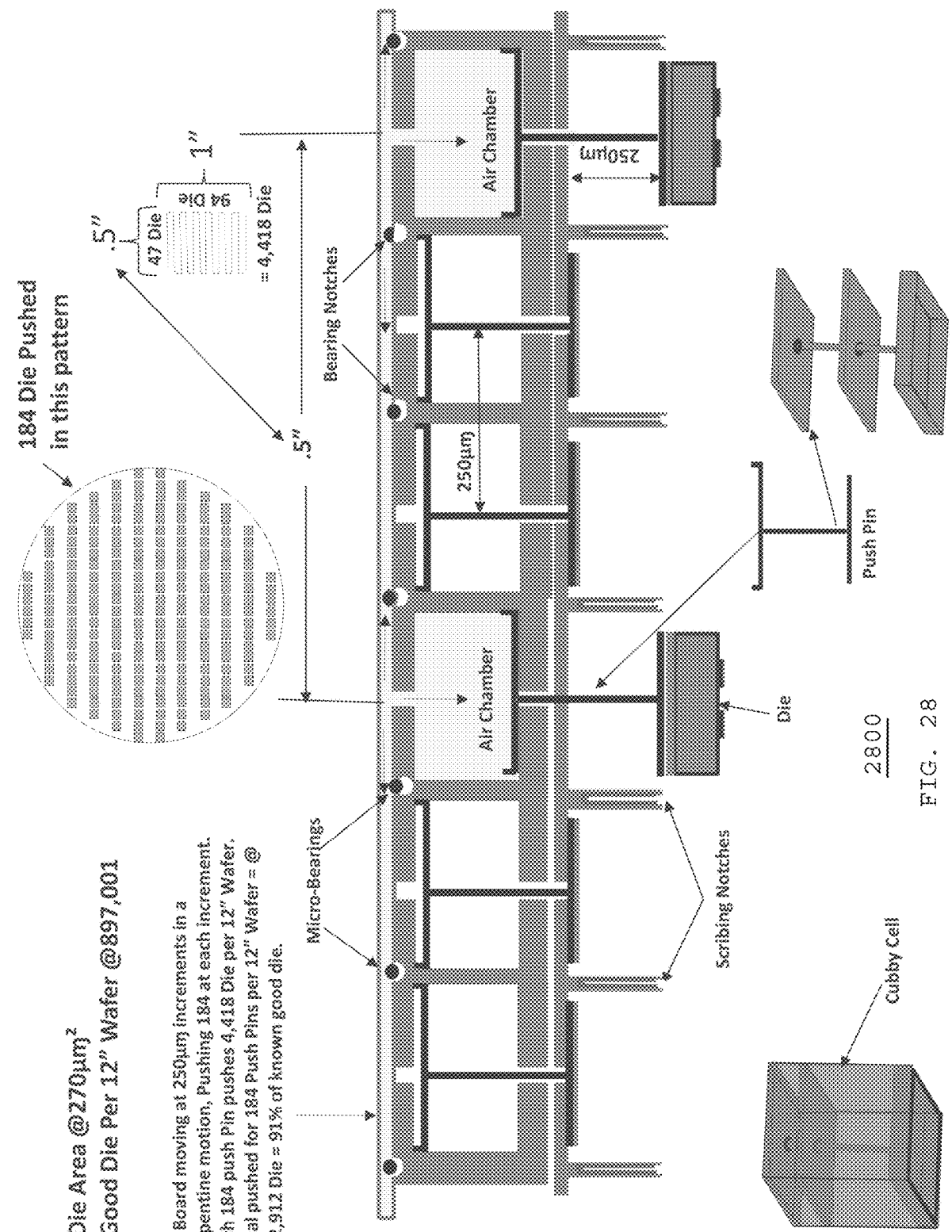
FIG. 28 shows an air board 2800 and associated air chambers and cubbies, according to an example embodiment.
Figure 29:
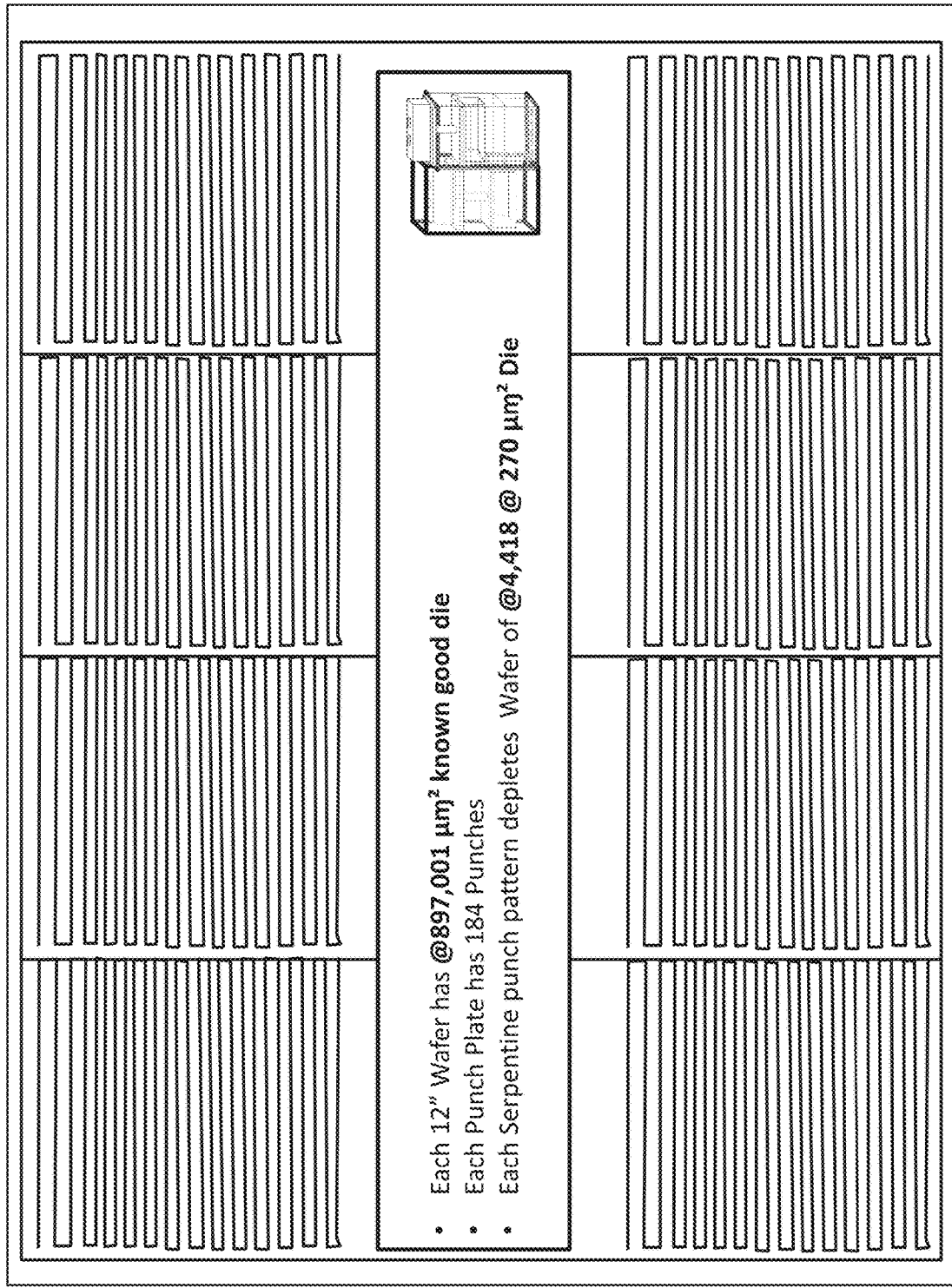
FIG. 29 shows a push/punch route layout 2900 for die, according to an example embodiment.
Figure 30:
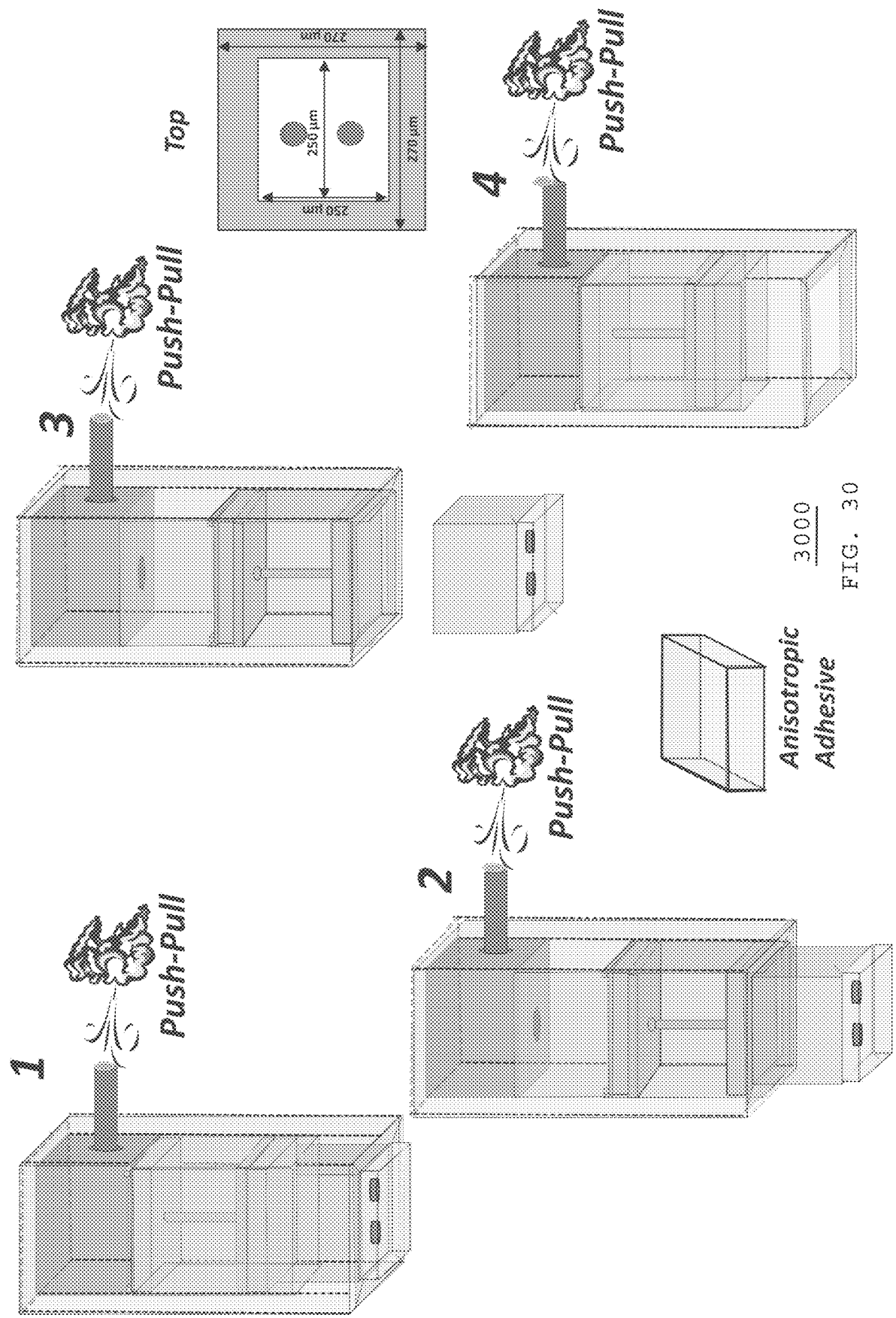
FIG. 30 shows a push/punch operational diagram 3000 for die, according to an example embodiment.
Figure 31:
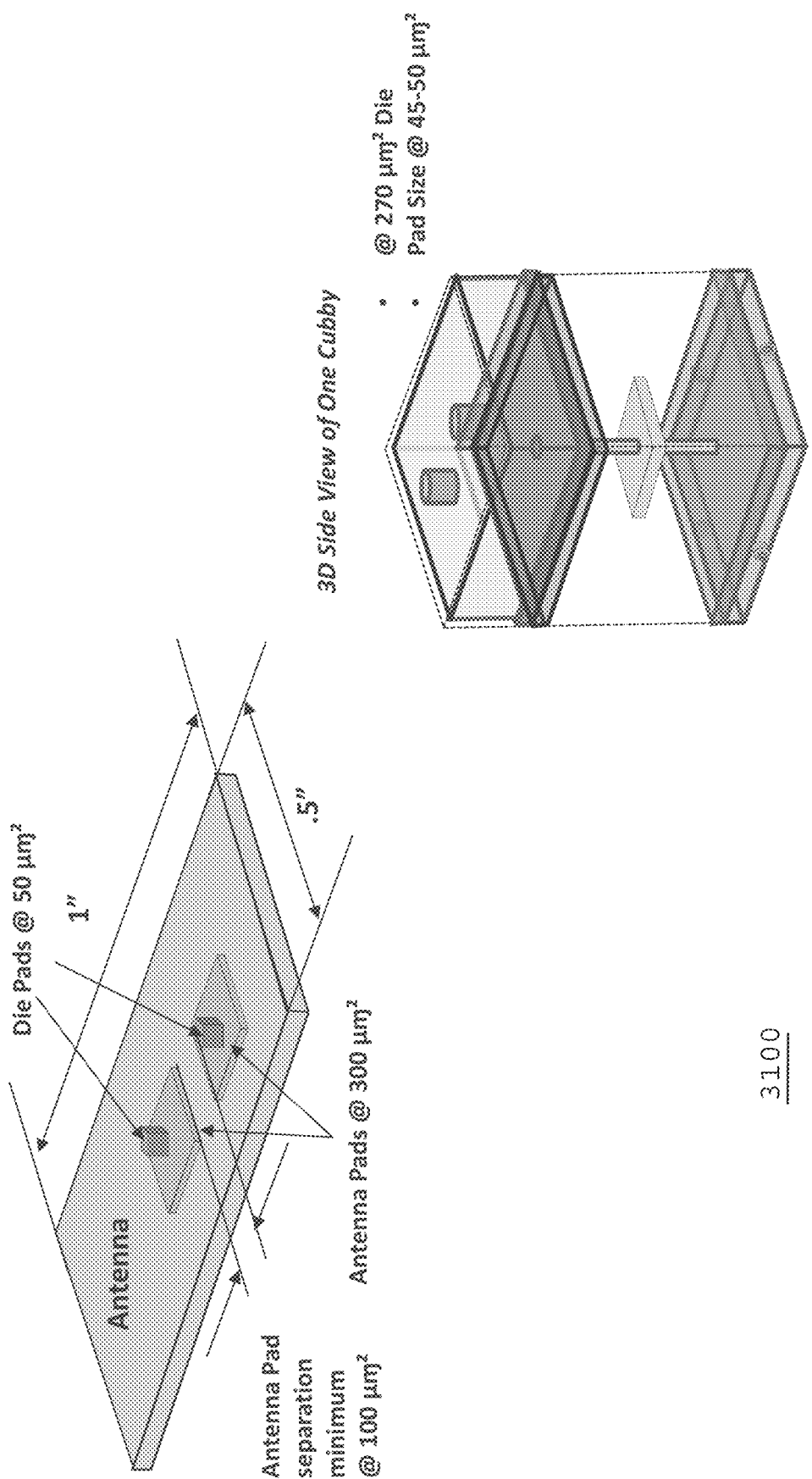
FIG. 31 shows a joining diagram of die pads and antenna pads 3100, and a side view of a corresponding cubby, according to an example embodiment.
Figure 32:
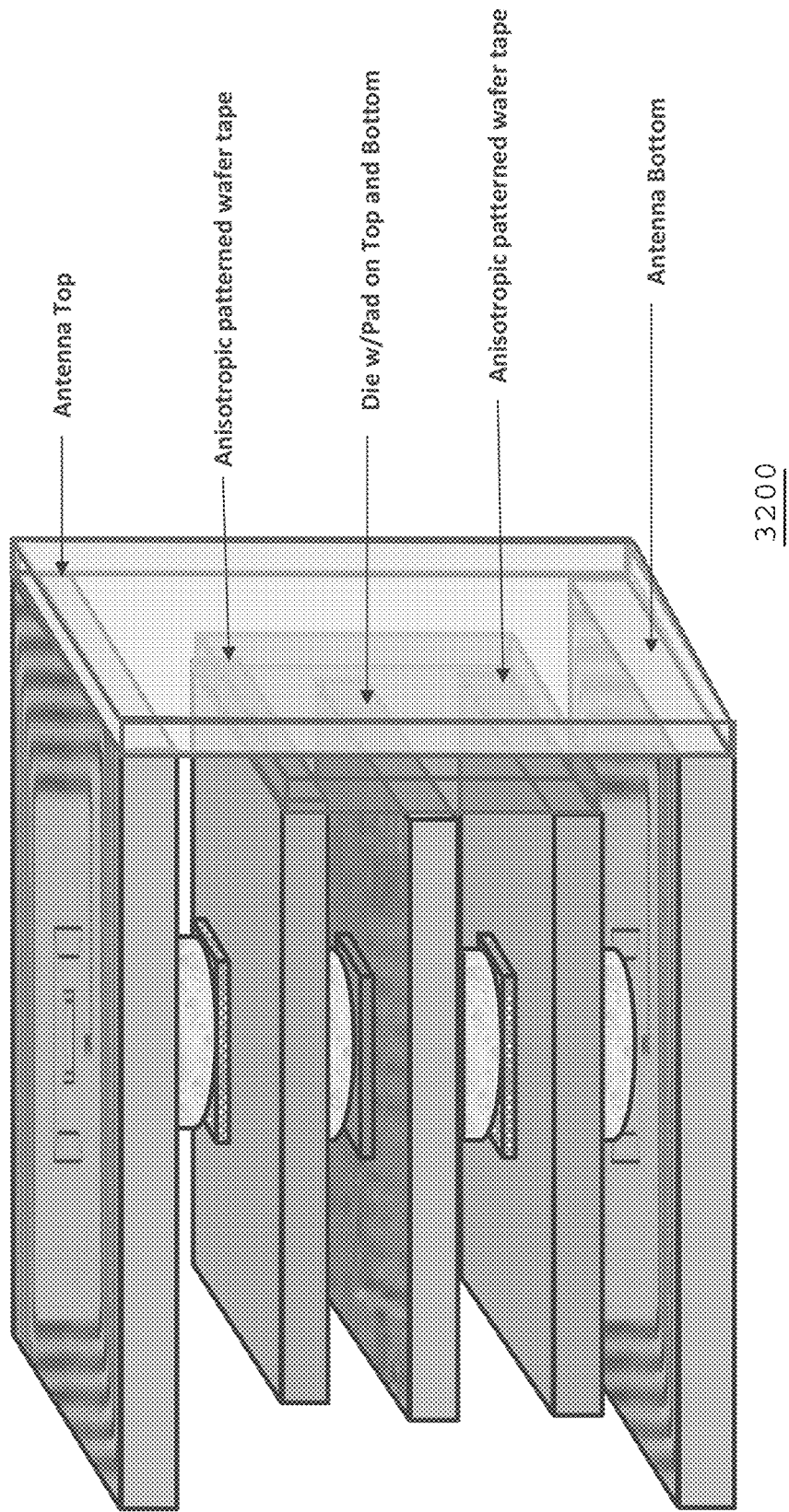
FIG. 32 shows an antenna-die structure 3200, according to an example embodiment.
Figure 34:
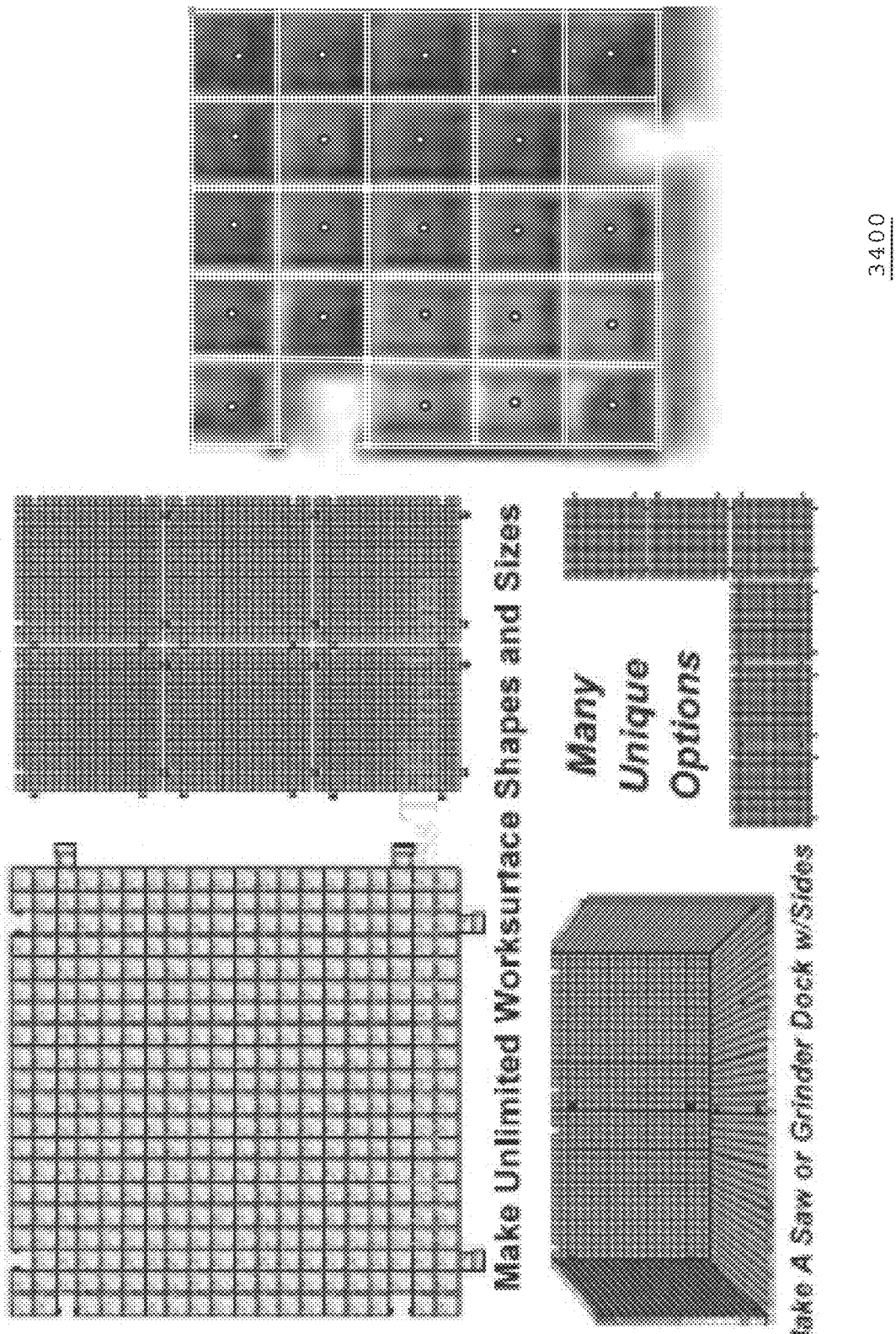
FIG. 34 shows configurations of waffle pack grids 3400, according to an example embodiment.
Figure 35:
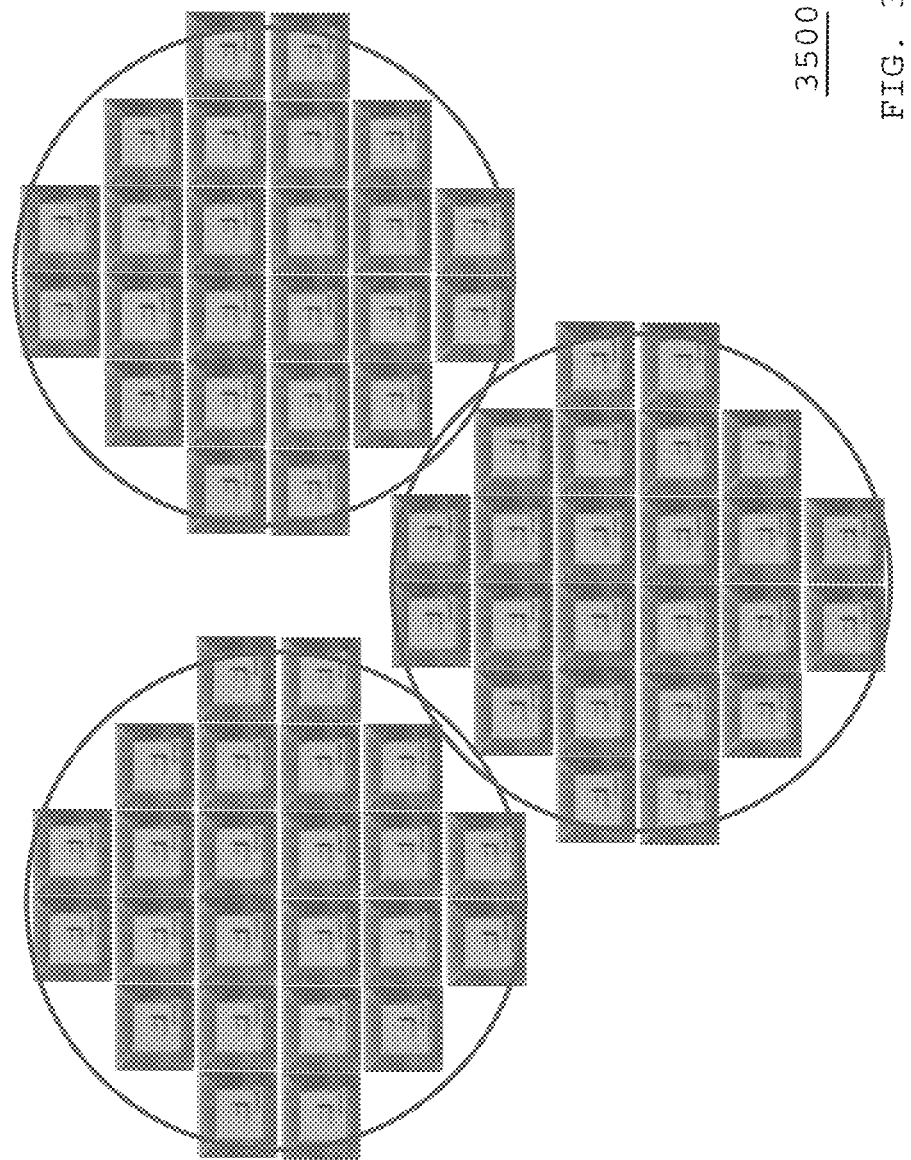
FIG. 35 shows printed antenna patterns 3500 with respect to wafers, according to an example embodiment.
Figure 36:
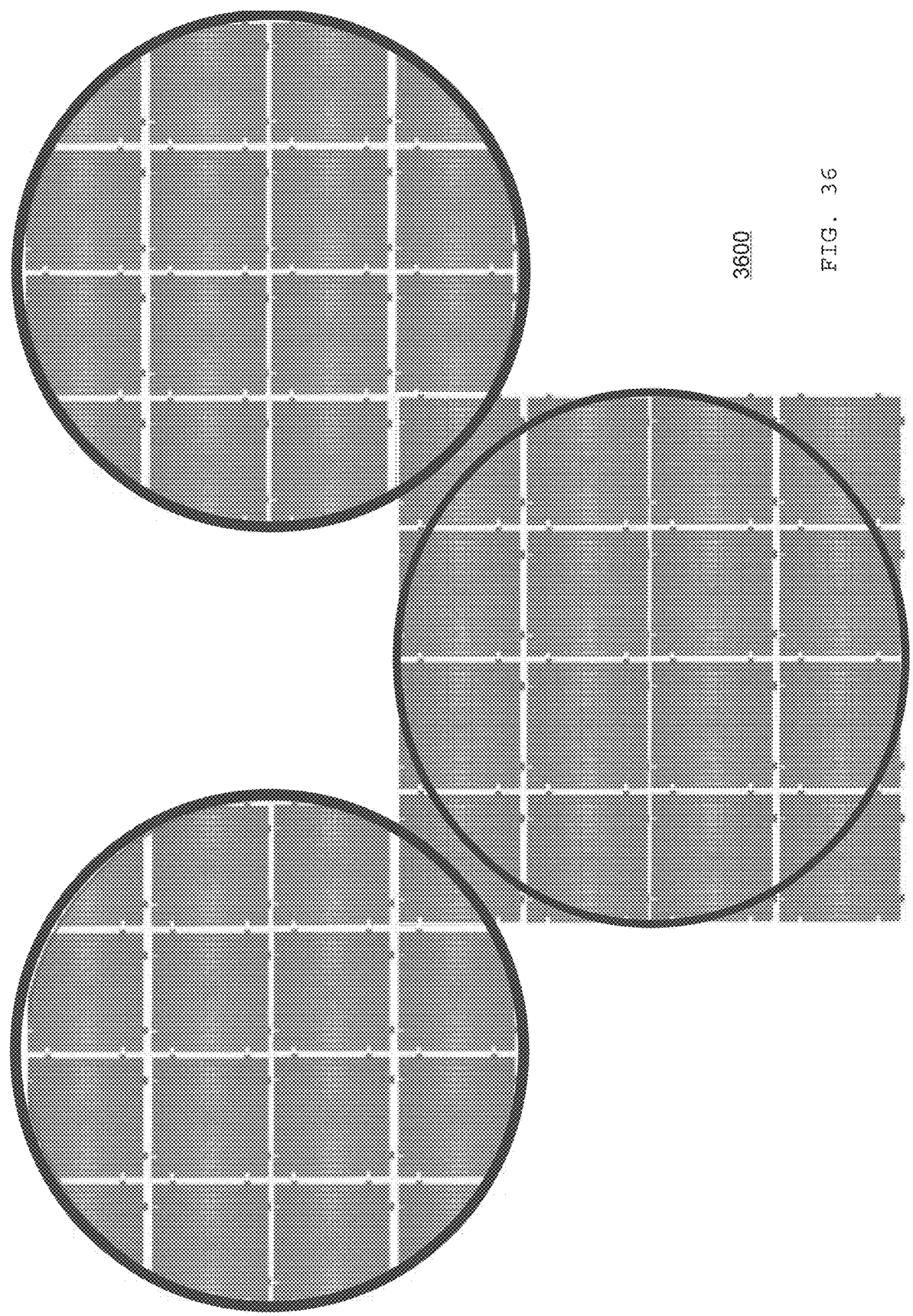
FIG. 36 shows printed antenna patterns 3600 with respect to wafers, according to an example embodiment.
Figure 37:
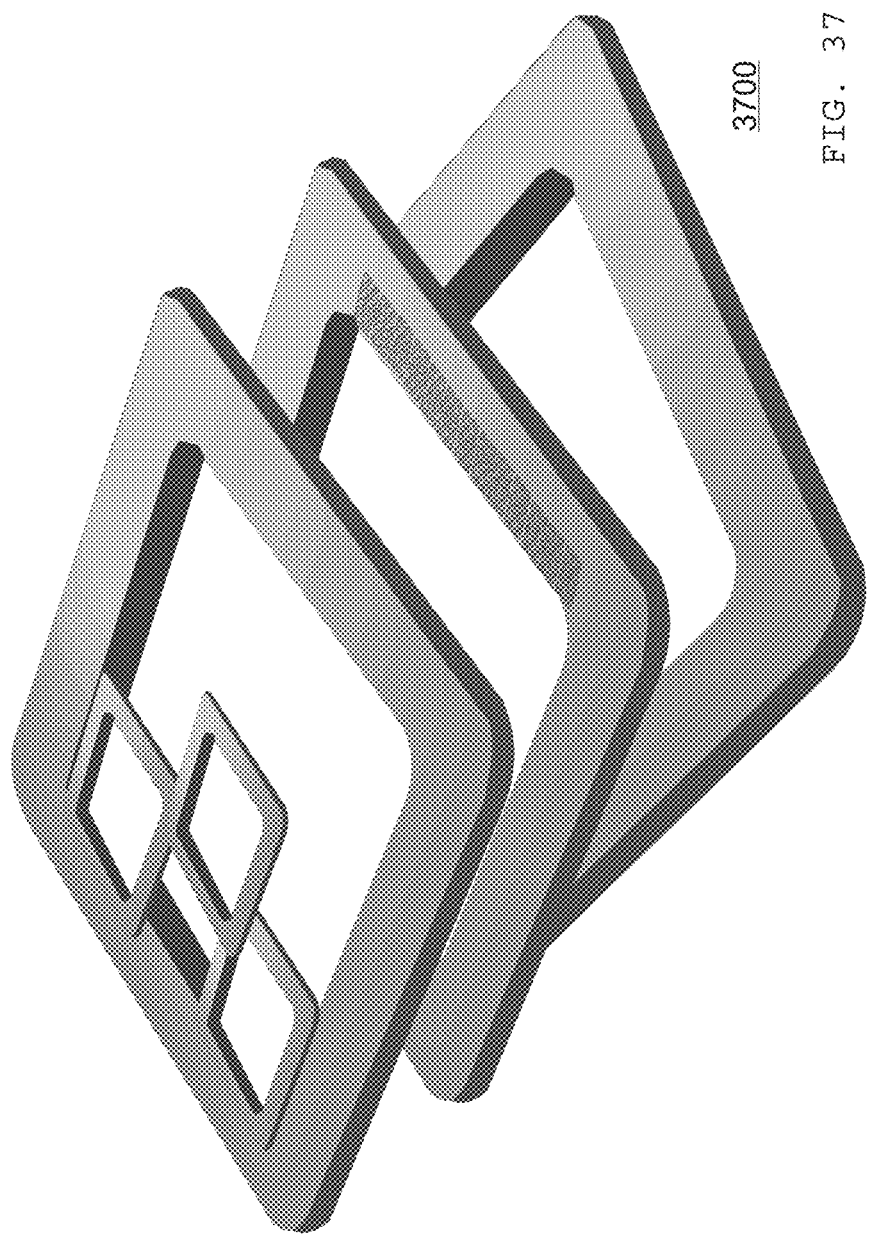
FIG. 37 shows templates 3700 for wafer scribing patterns, according to an example embodiment.
Figure 38:
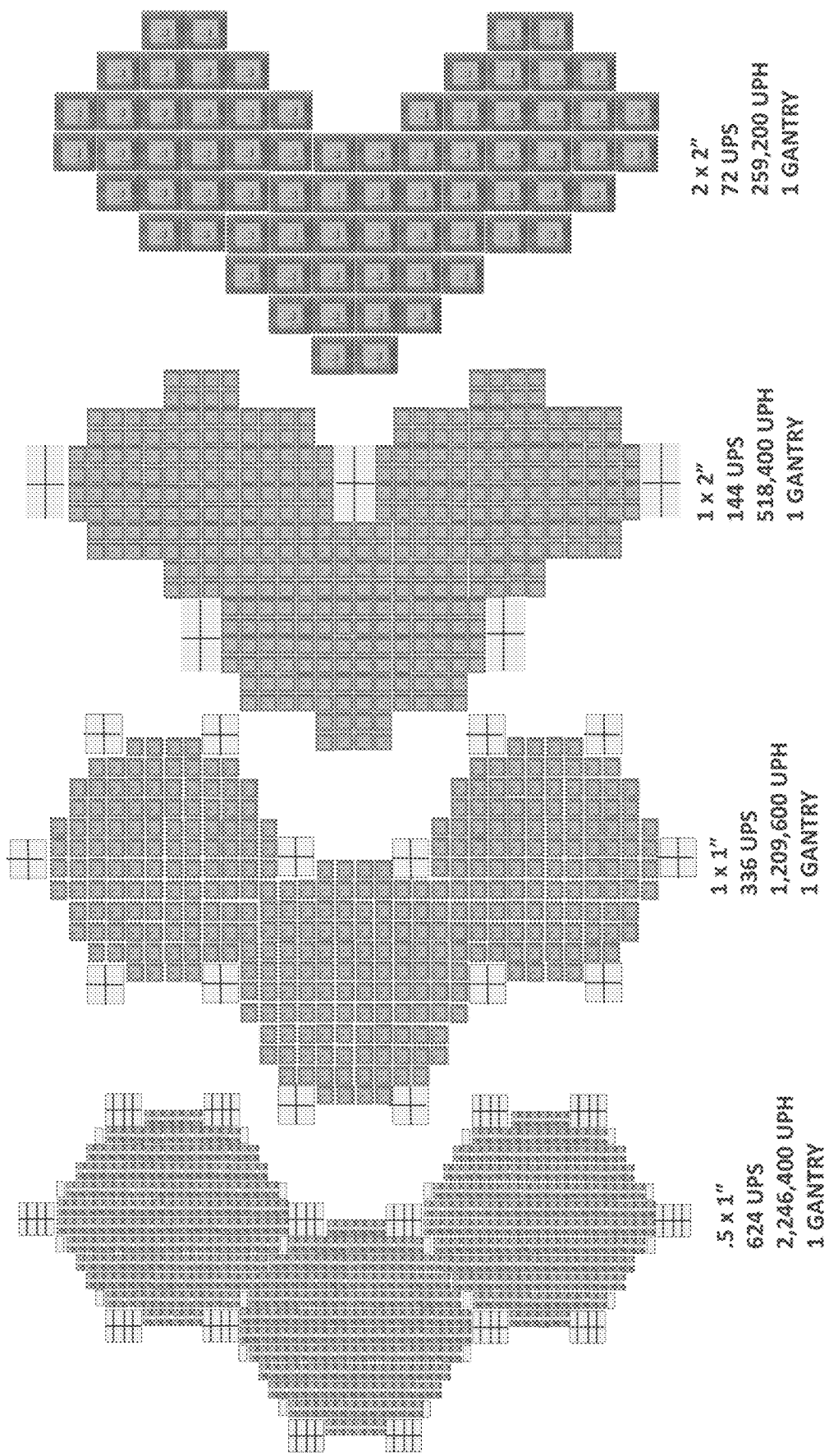
FIG. 38 shows printed antenna patterns 3800 with respect to wafers, according to an example embodiment.
Figure 39:
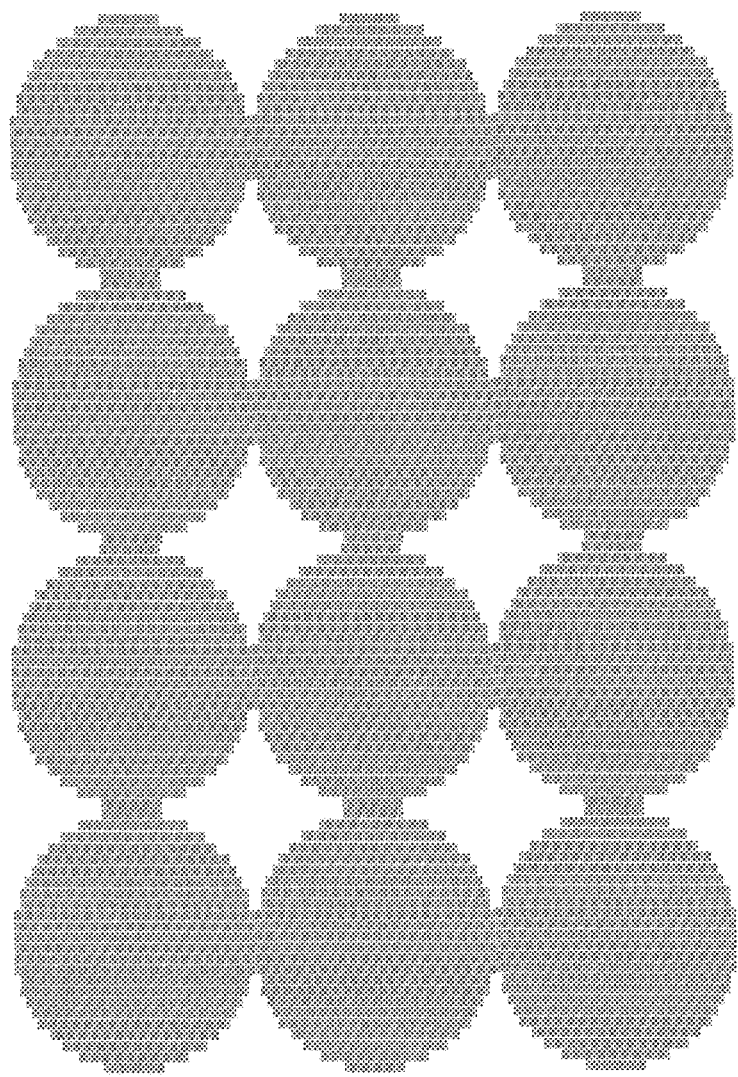
FIG. 39 shows interposer straps 3900 with spaced solenoids, according to an example embodiment.
Figure 40:
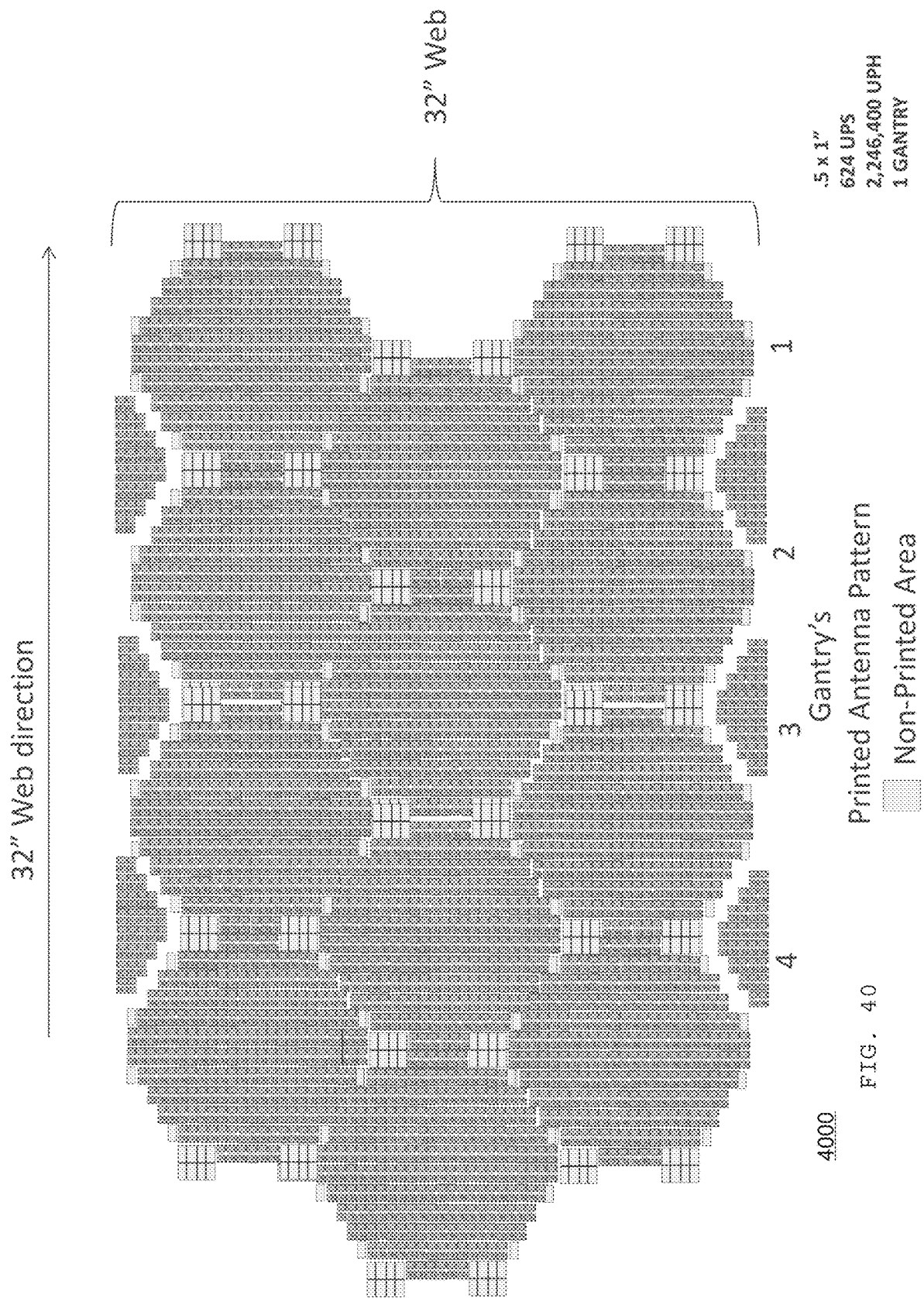
FIG. 40 shows printed antenna patterns 4000 as a web, according to an example embodiment.
Figure 41:
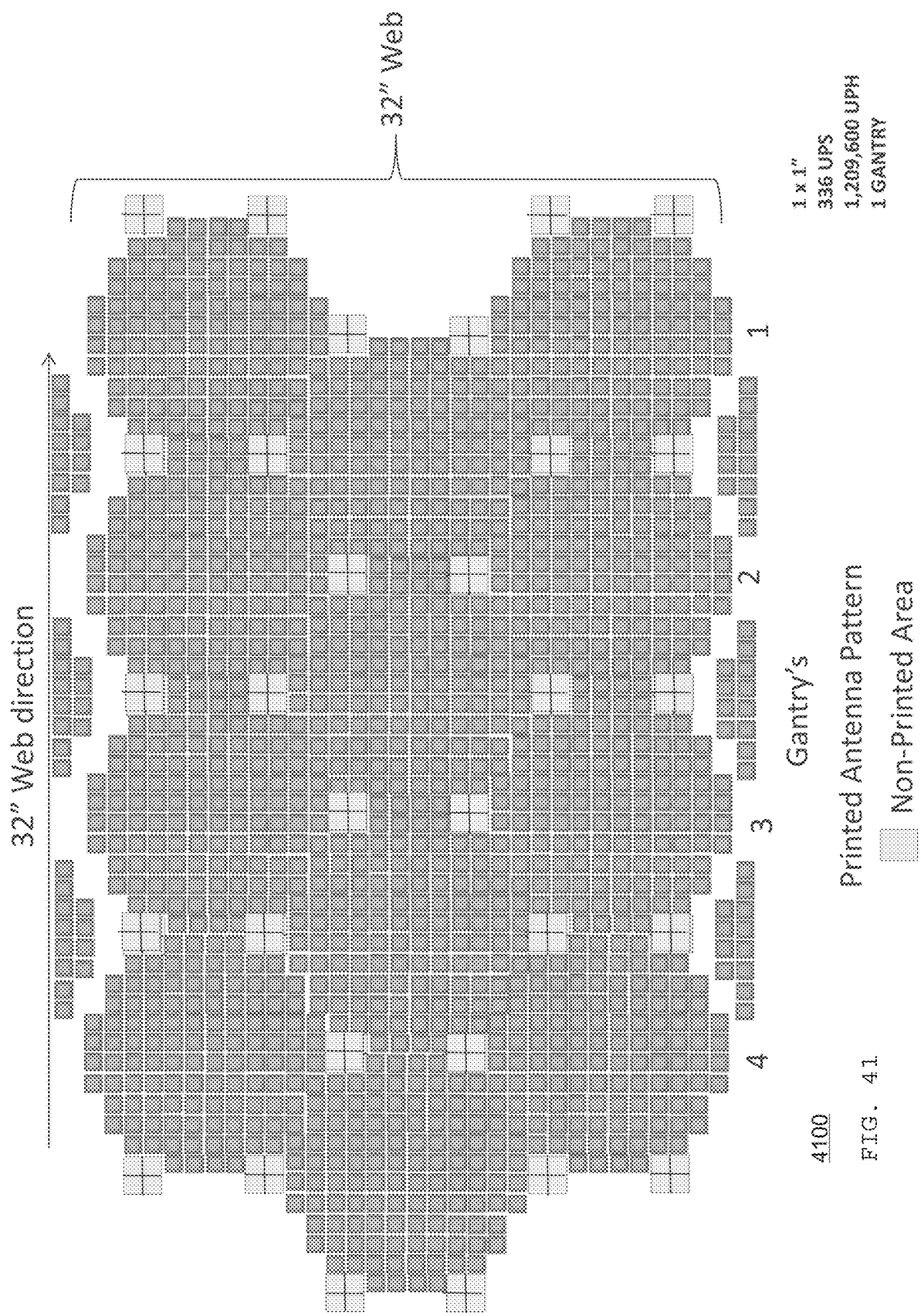
FIG. 41 shows printed antenna patterns 4100 as a web, according to an example embodiment.
Figure 42:
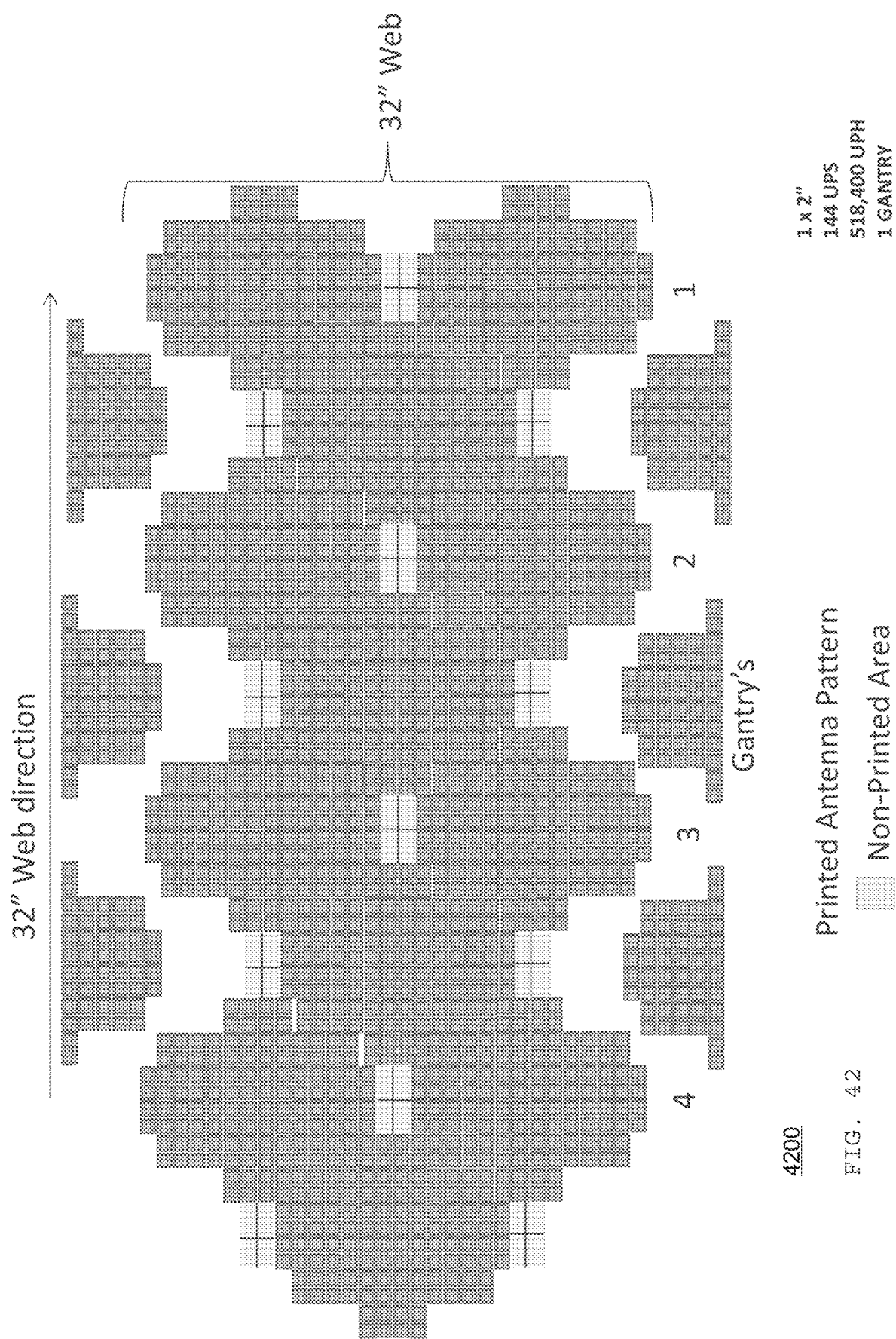
FIG. 42 shows printed antenna patterns 4200 as a web, according to an example embodiment.
Figure 43:
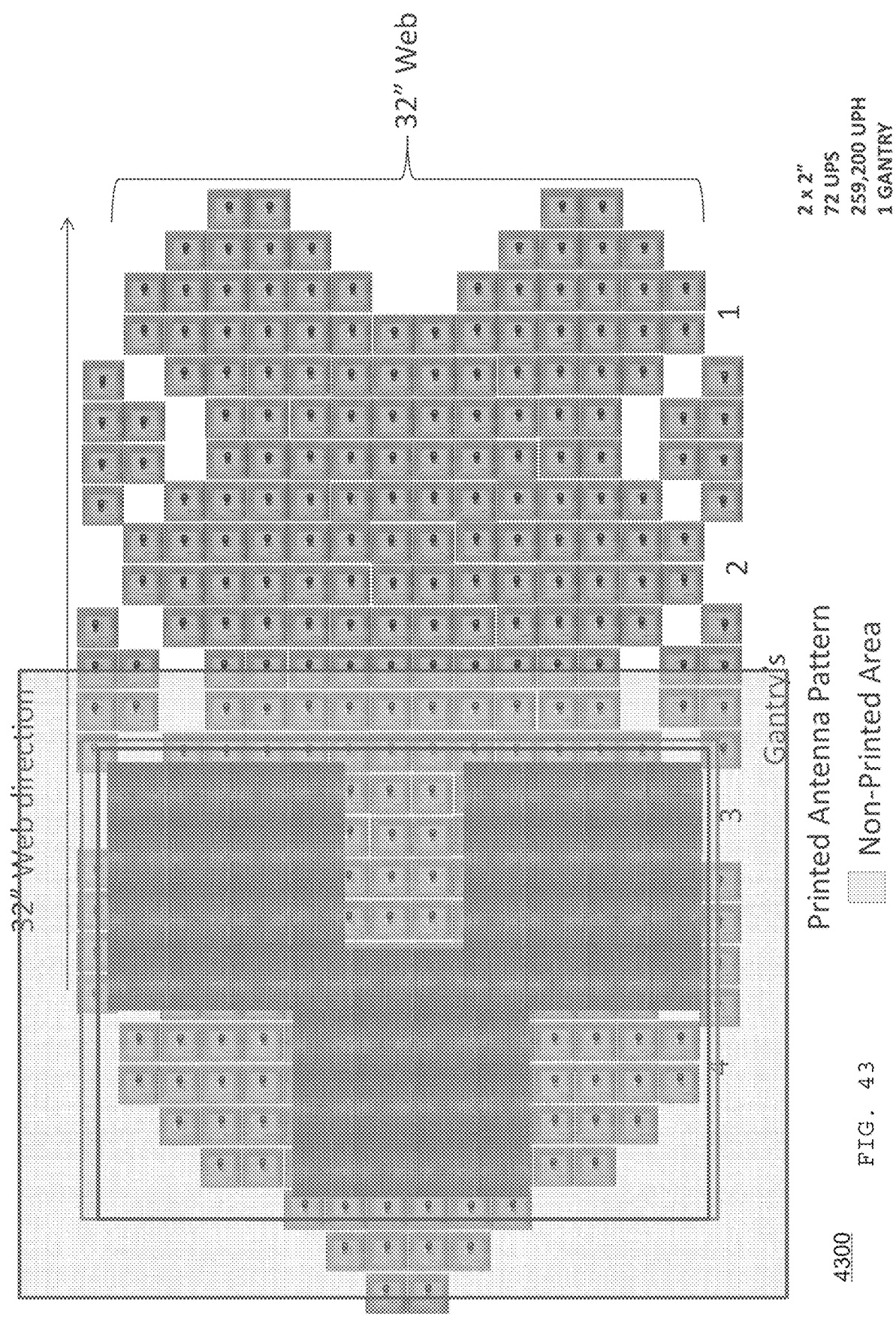
FIG. 43 shows printed antenna patterns 4300 as a web, according to an example embodiment.
Figure 45:
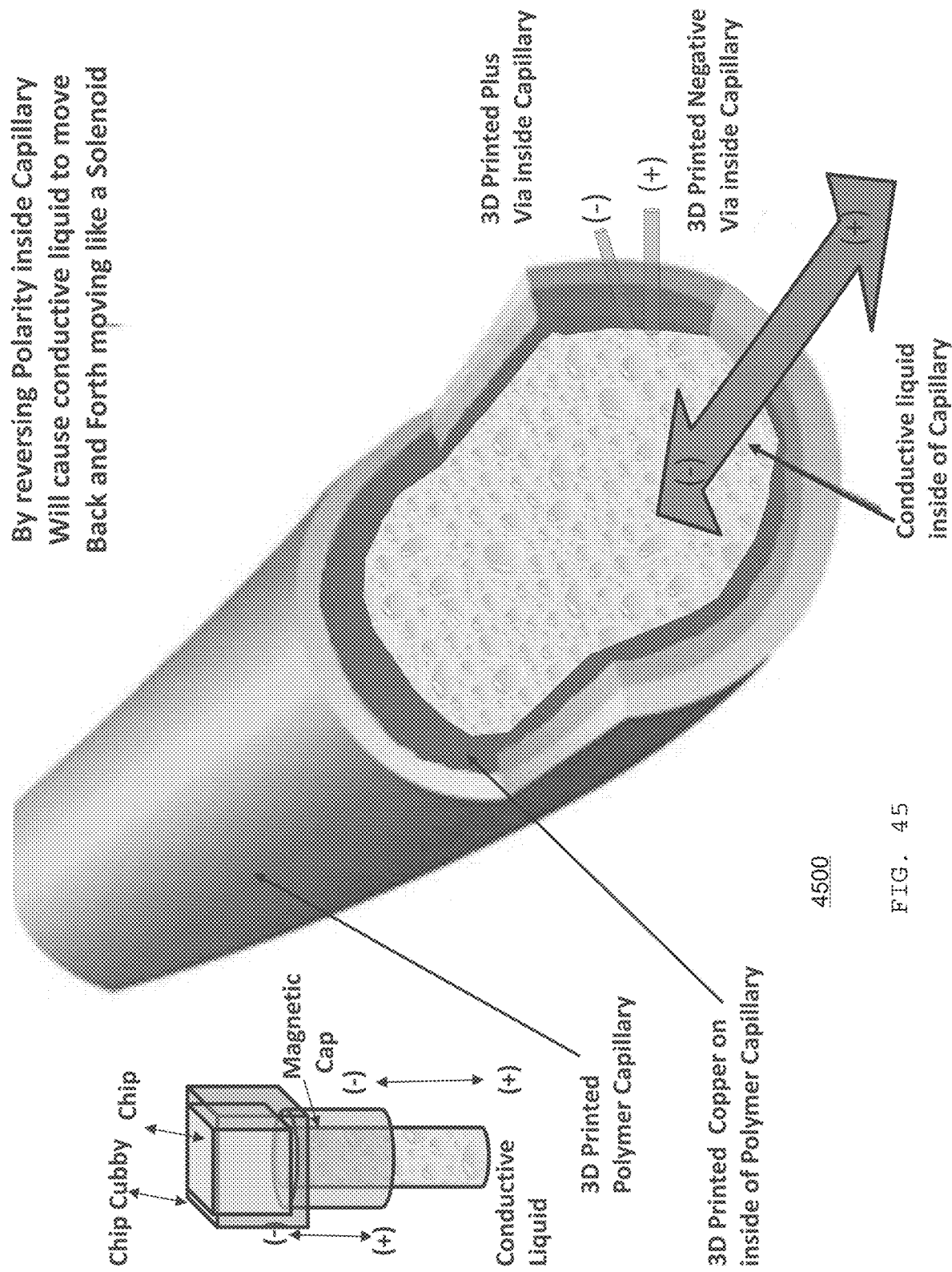
FIG. 45 shows a solenoid capillary 4500 disposed with a cubby, according to an example embodiment.
Figure 46:
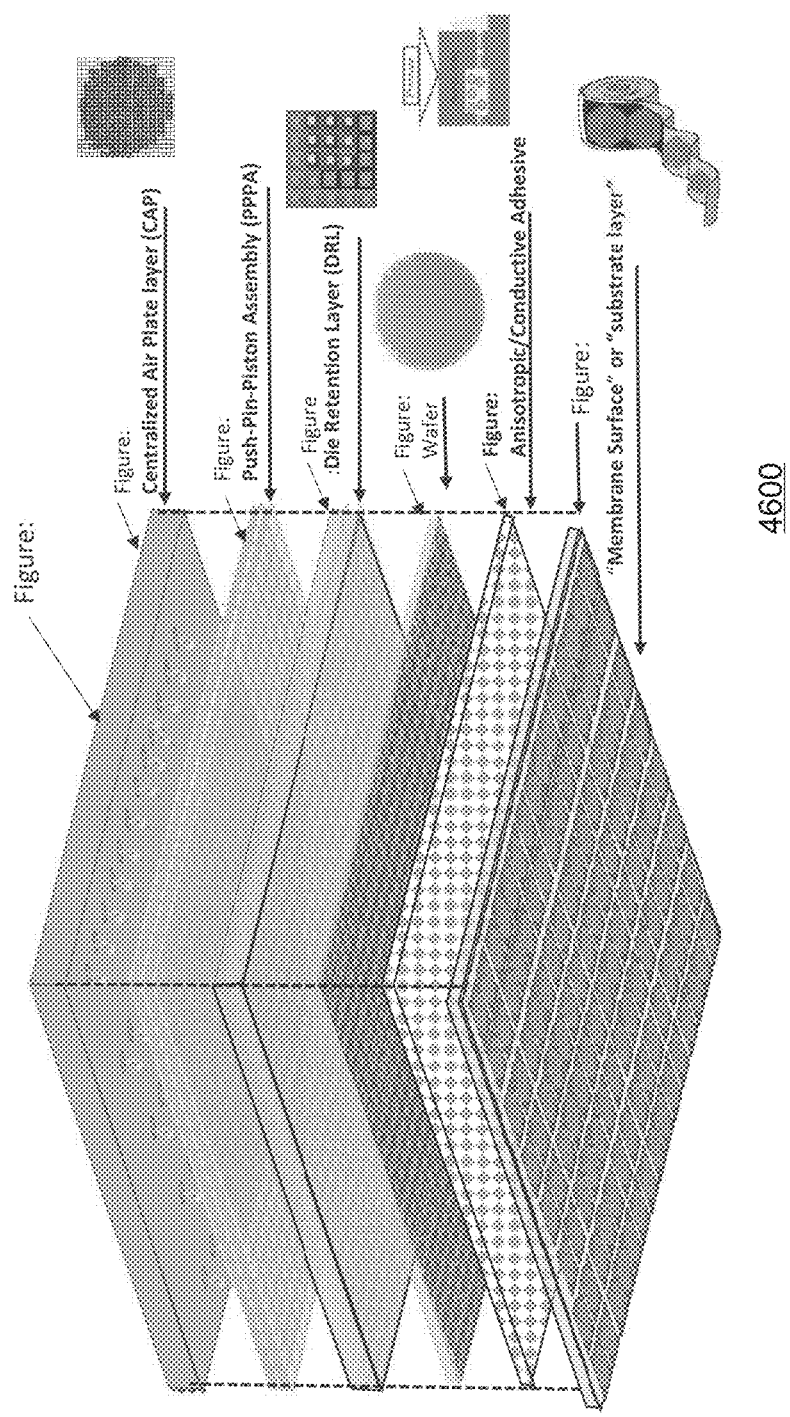
FIG. 46 shows a portion layers of a system 4600 for ICCES for MPICA, according to an example embodiment.
Figure 47:
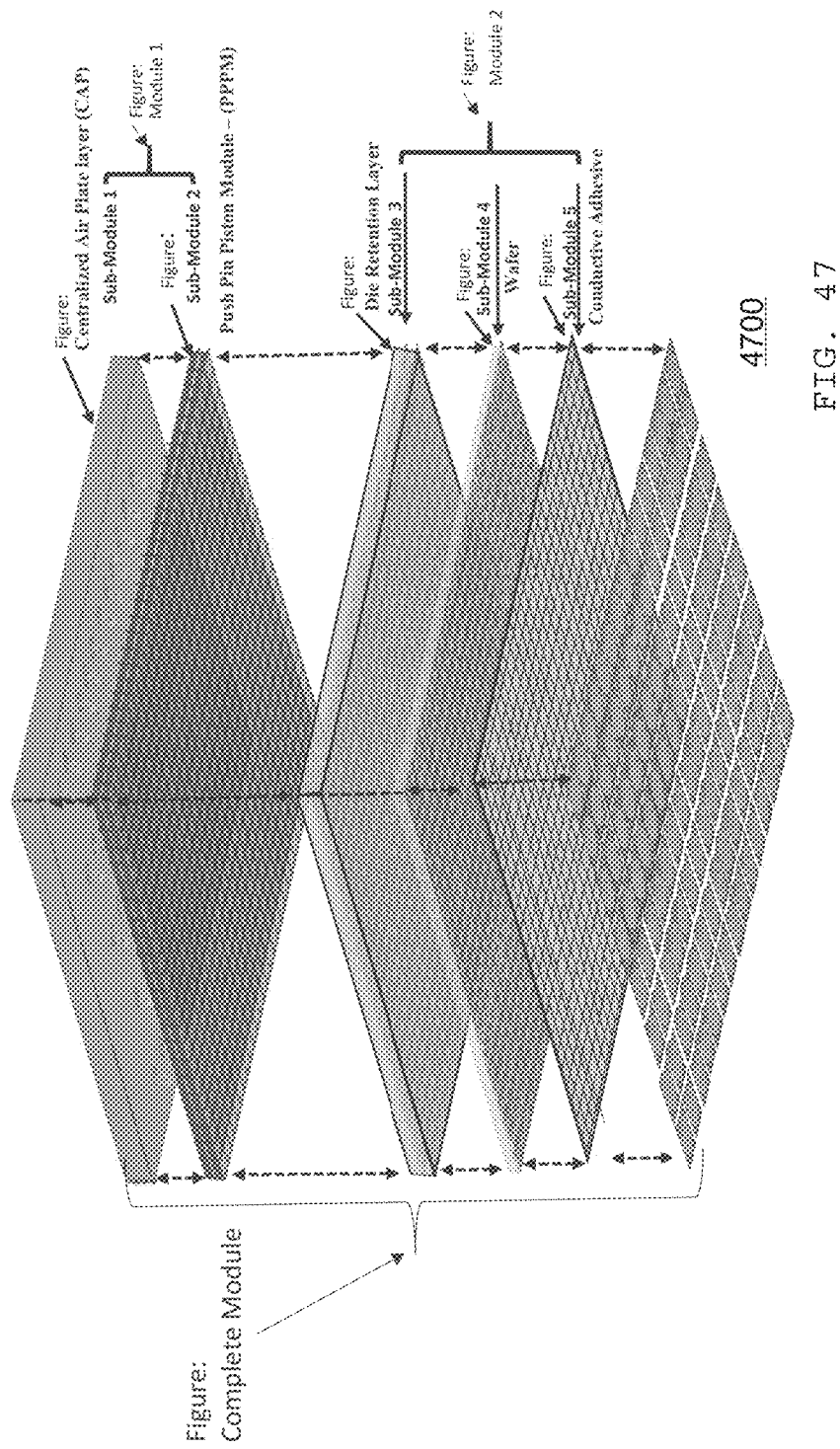
FIG. 47 shows a portion layers of a system 4700 for ICCES for MPICA, according to an example embodiment.
Figure 48:
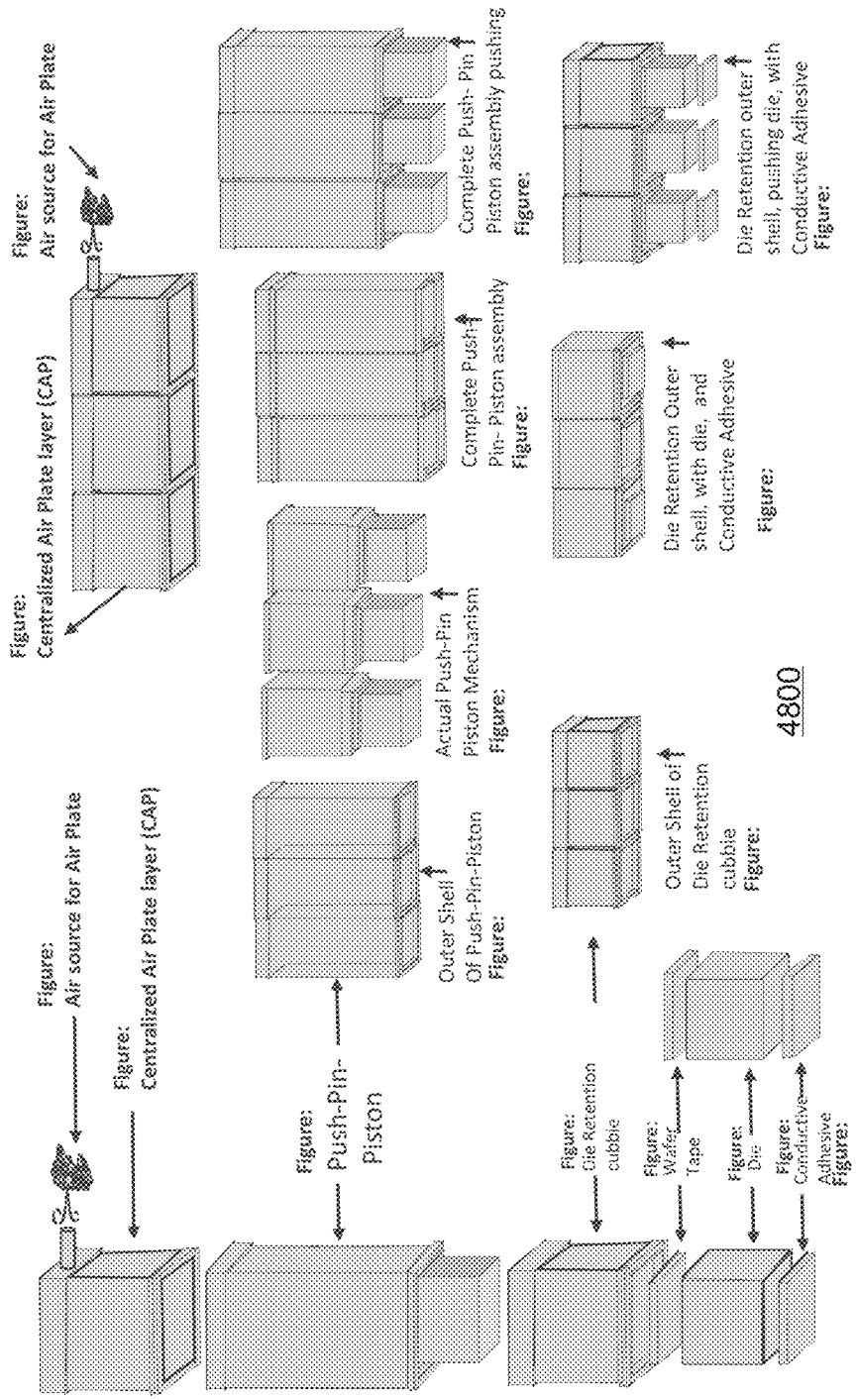
FIG. 48 shows a block diagram of a portion layers of a system 4800 for ICCES for MPICA, according to an example embodiment.
Figure 49:
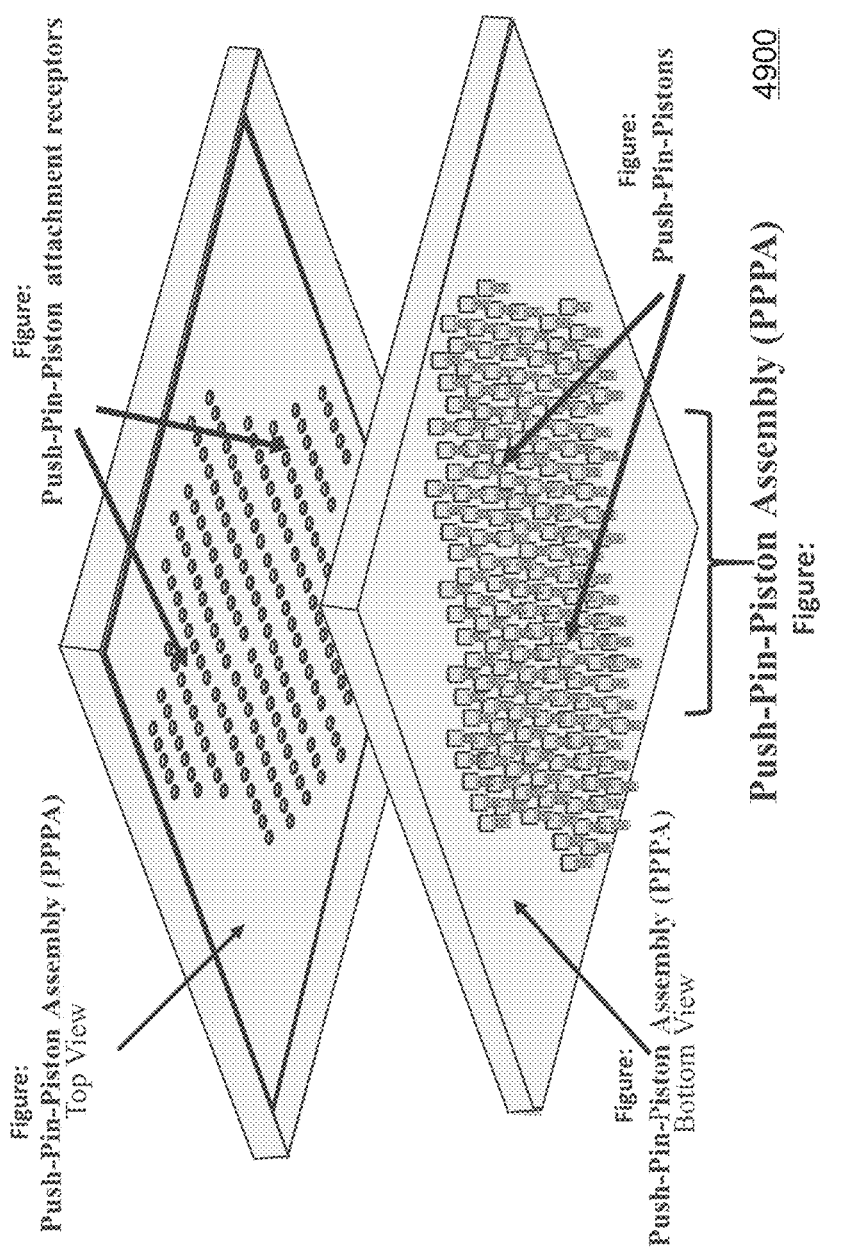
FIG. 49 shows a top and bottom view of a push-pin-piston assembly 4900, according to an example embodiment.
Figure 50:
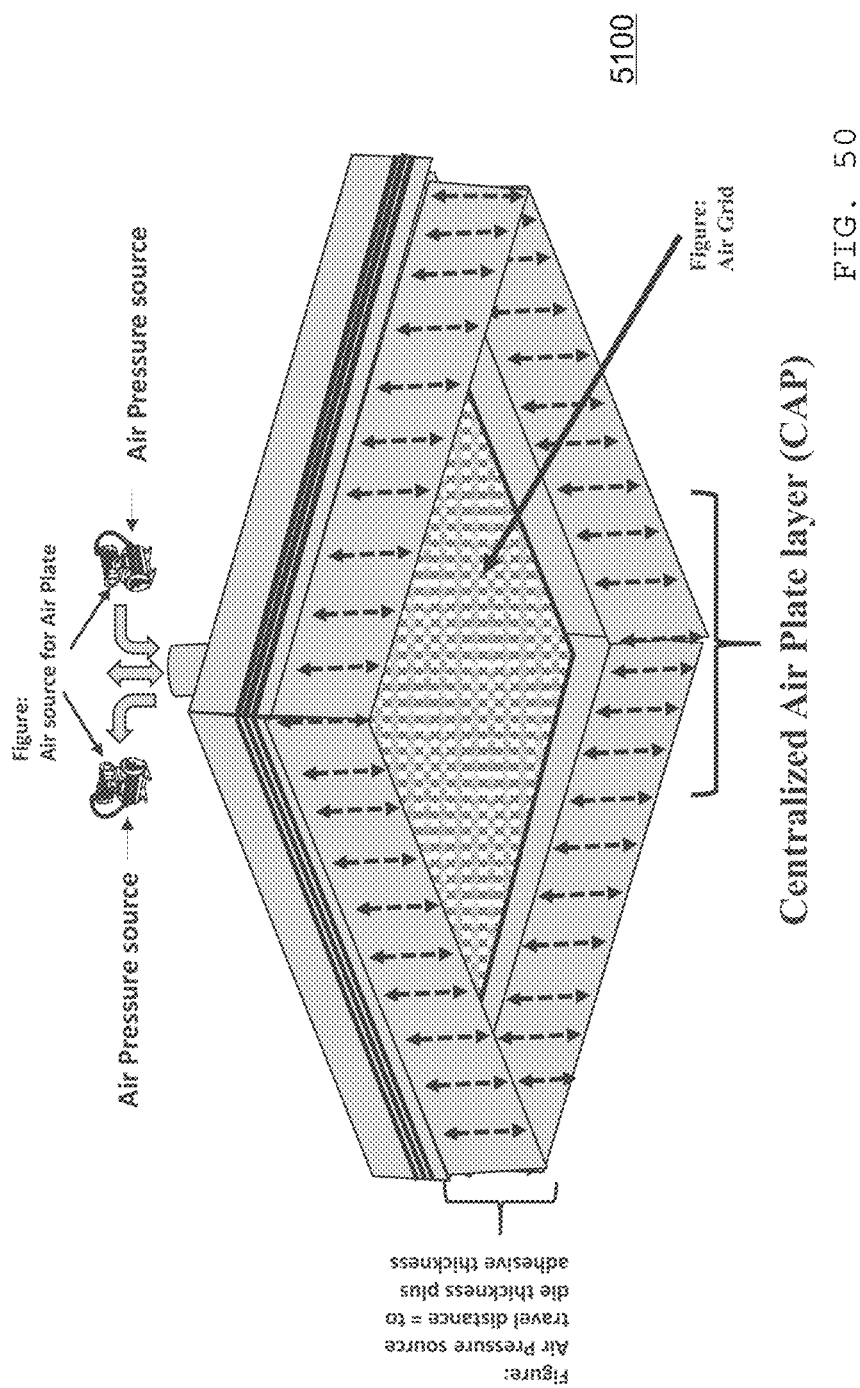
FIG. 50 shows a centralized air plate layer 5000, according to an example embodiment.
Figure 51:
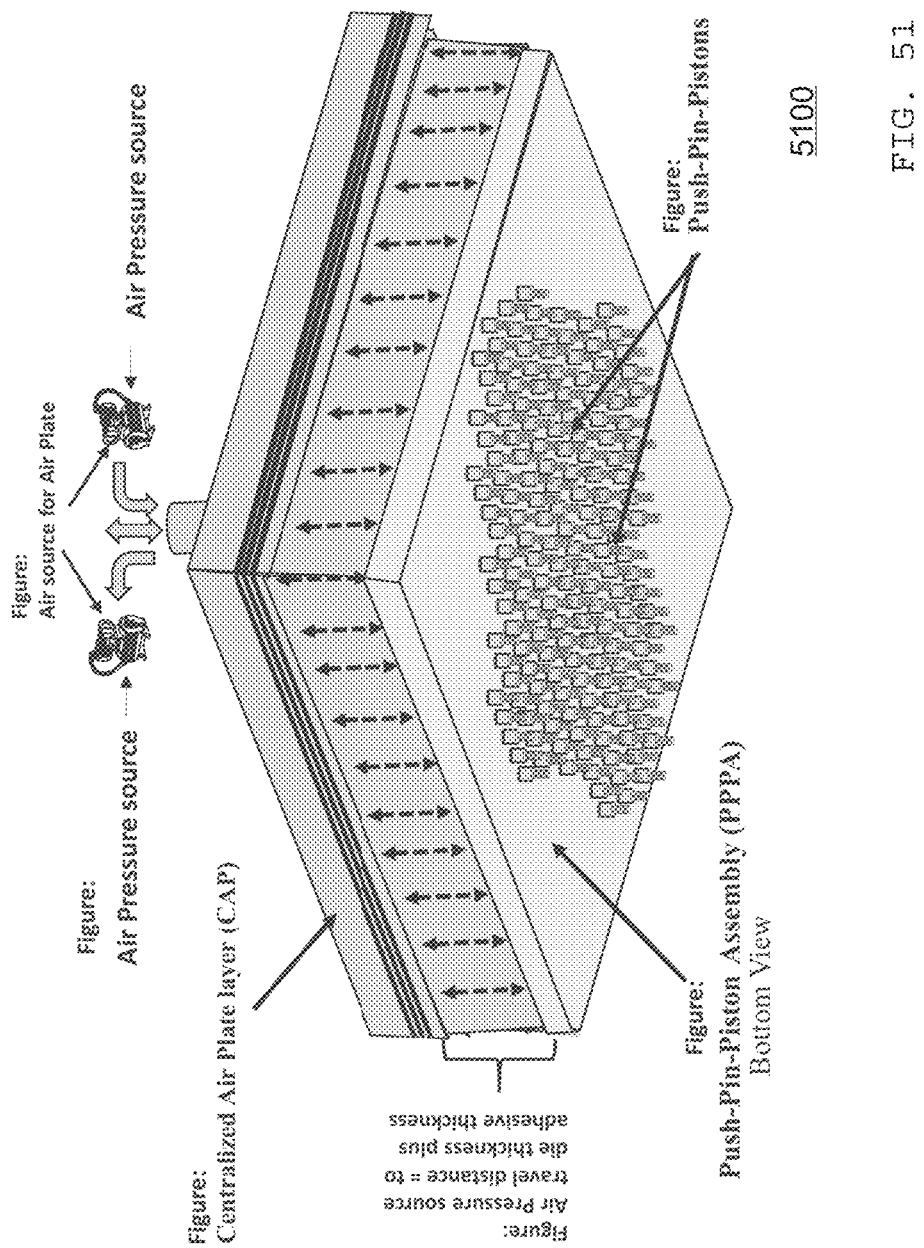
FIG. 51 shows a system 5100 of the push-pin-piston assembly of FIG. 49 with the centralized air plate layer of FIG. 50, according to an example embodiment.
Figure 52:
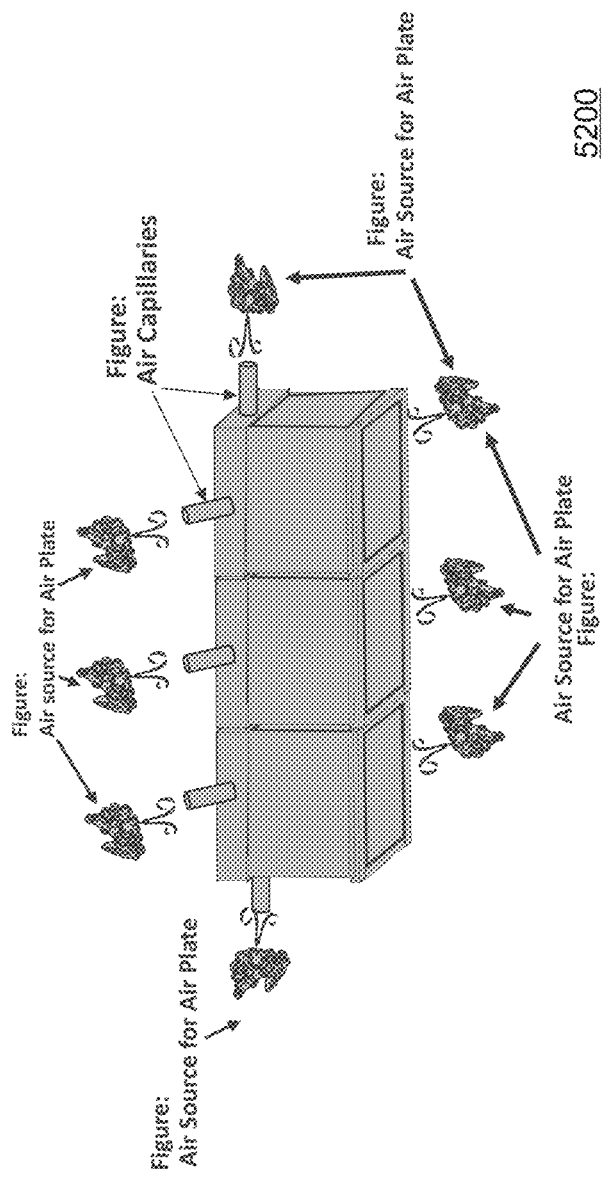
FIG. 52 shows a portion of a centralized air plate layer 5200, according to an example embodiment.
Figure 53:
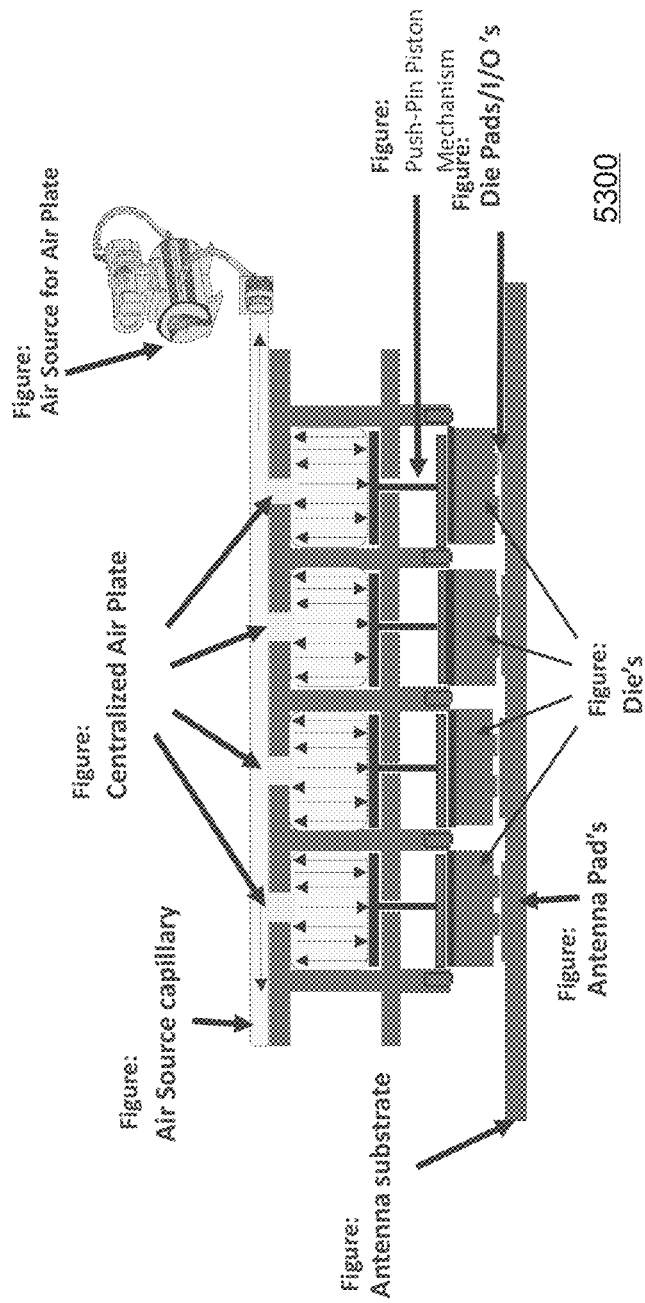
FIG. 53 shows a portion layers of a system 5300 for ICCES for MPICA, according to an example embodiment.
Figure 54:
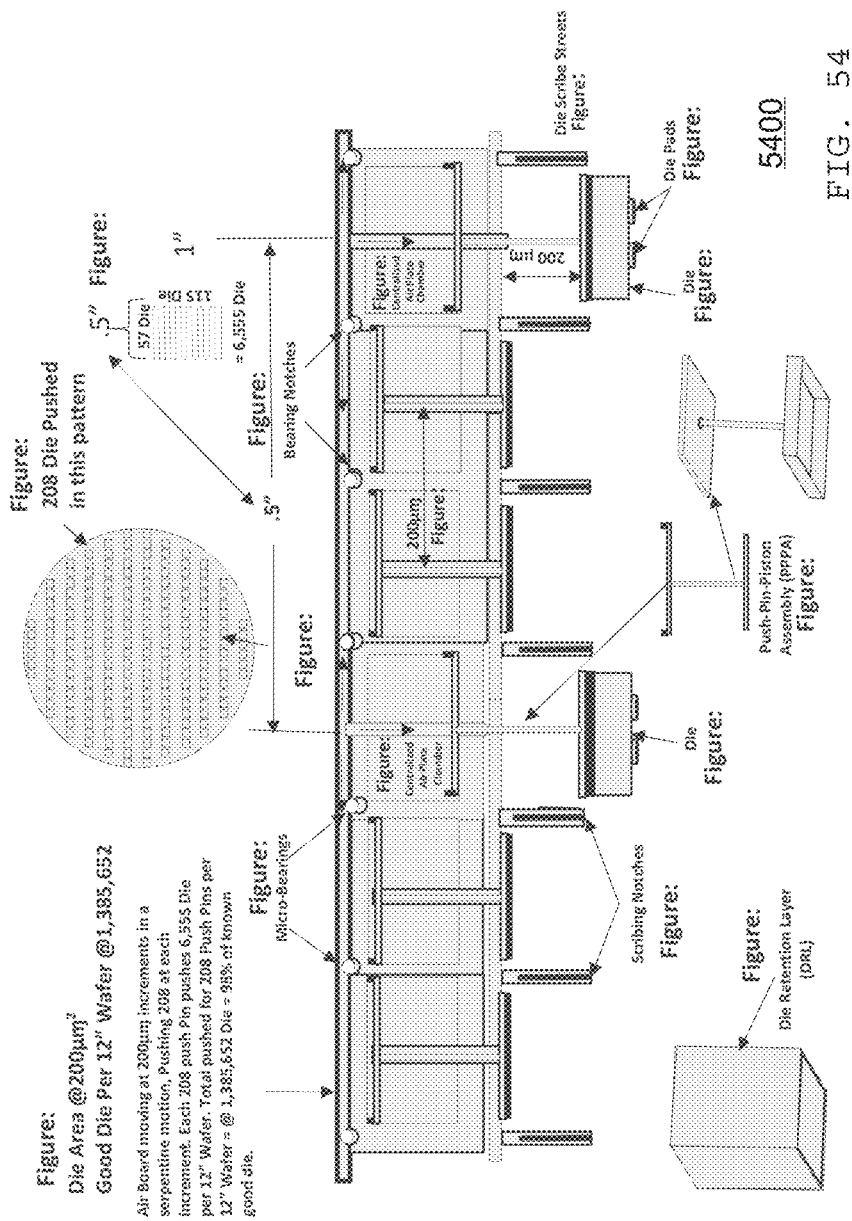
FIG. 54 shows a portion layers of a system 5400 for ICCES for MPICA, according to an example embodiment.
Figure 55:
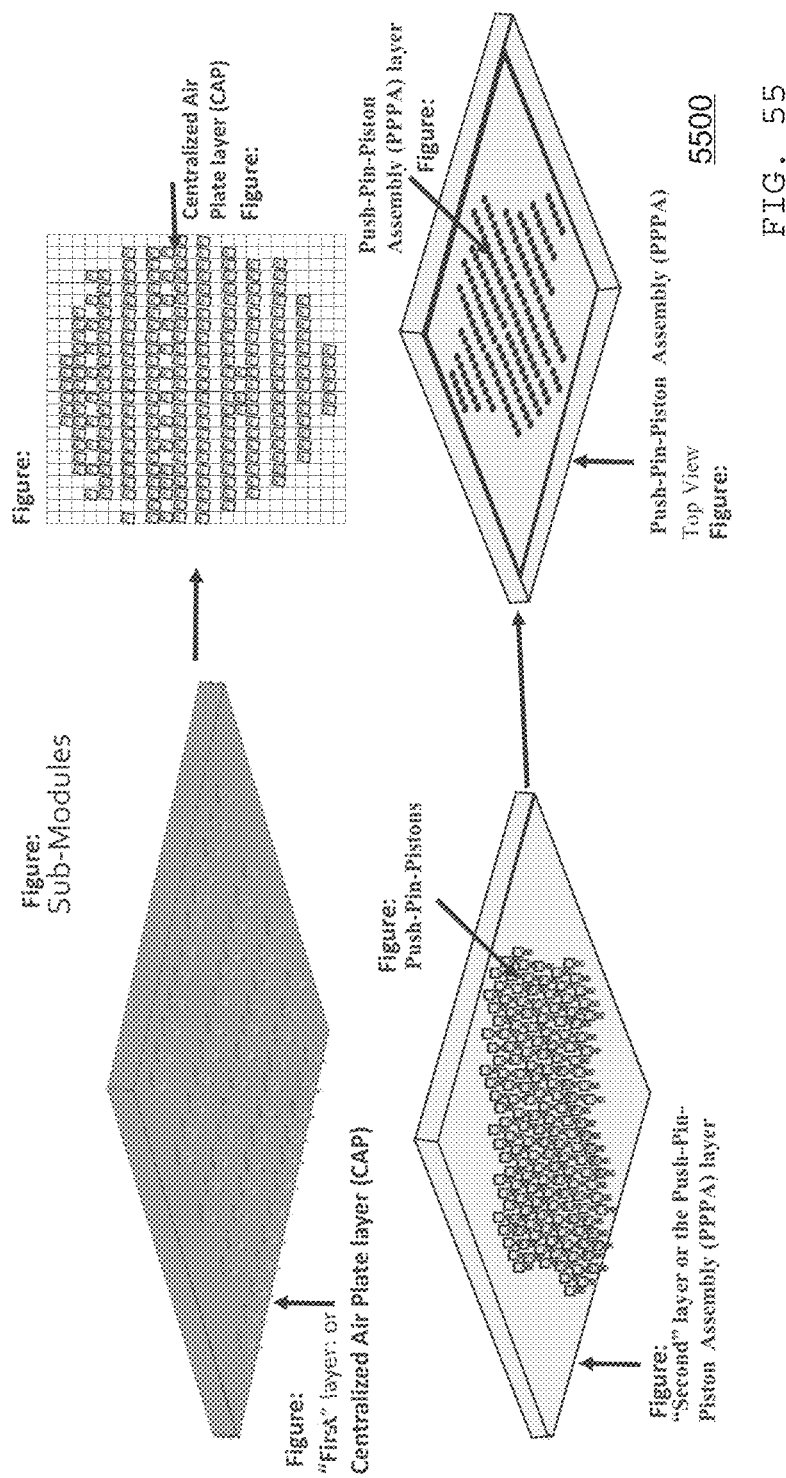
FIG. 55 shows a system 5500 including a push-pin-piston assembly and a centralized air plate layer, according to an example embodiment.
Figure 56:
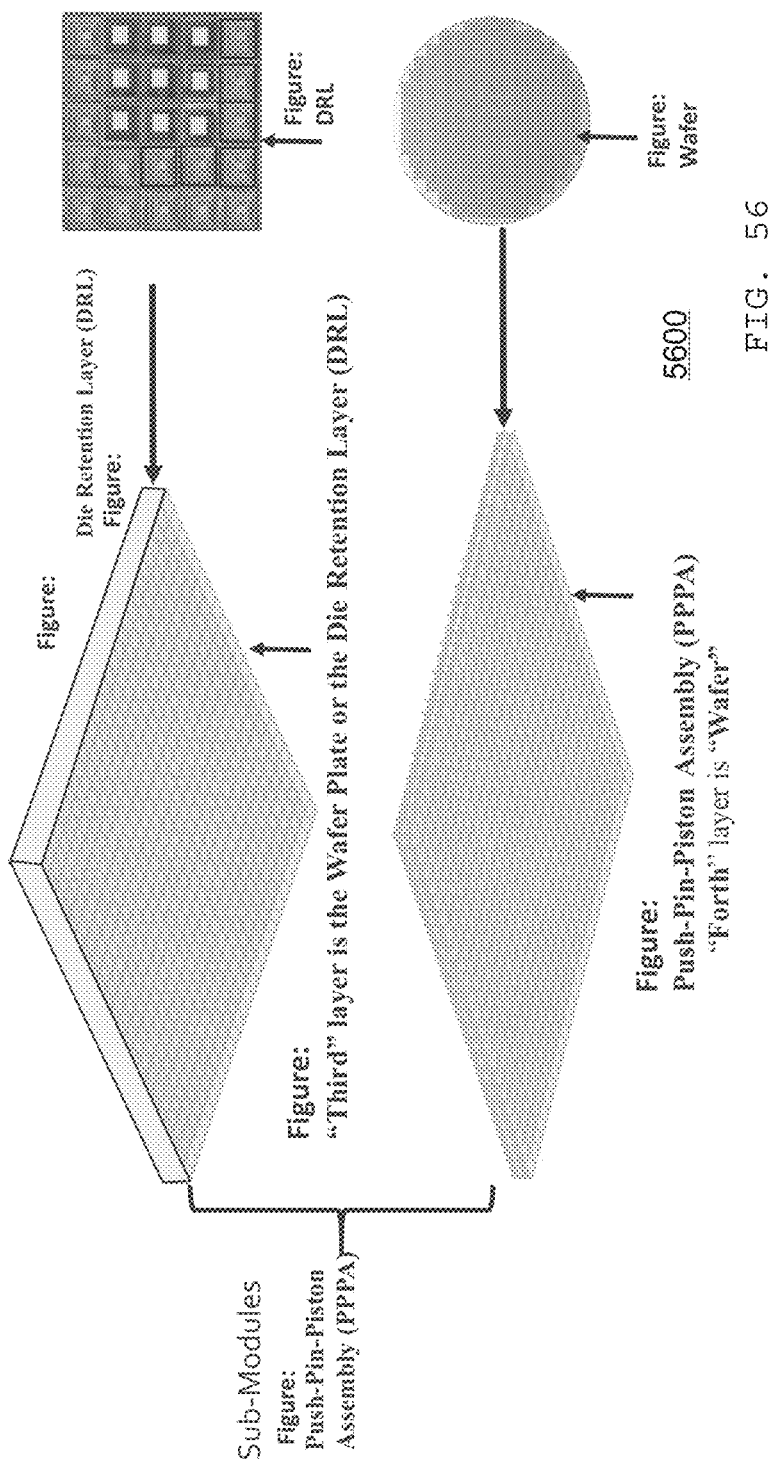
FIG. 56 shows a system 5600 including a push-pin-piston assembly, a die retention layer, and a wafer, according to an example embodiment.
Figure 57:
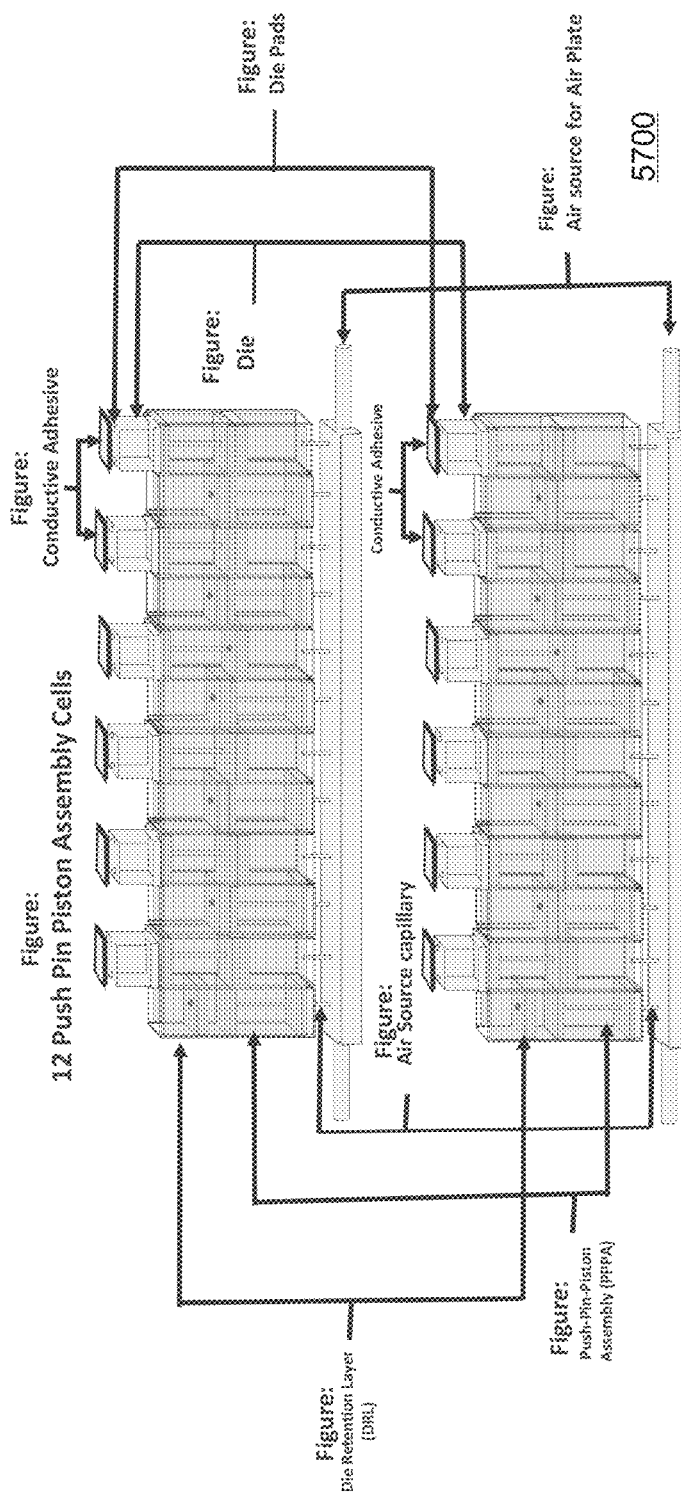
FIG. 57 shows a push-pin-piston assembly of cells 5700, according to an example embodiment.
Figure 58:
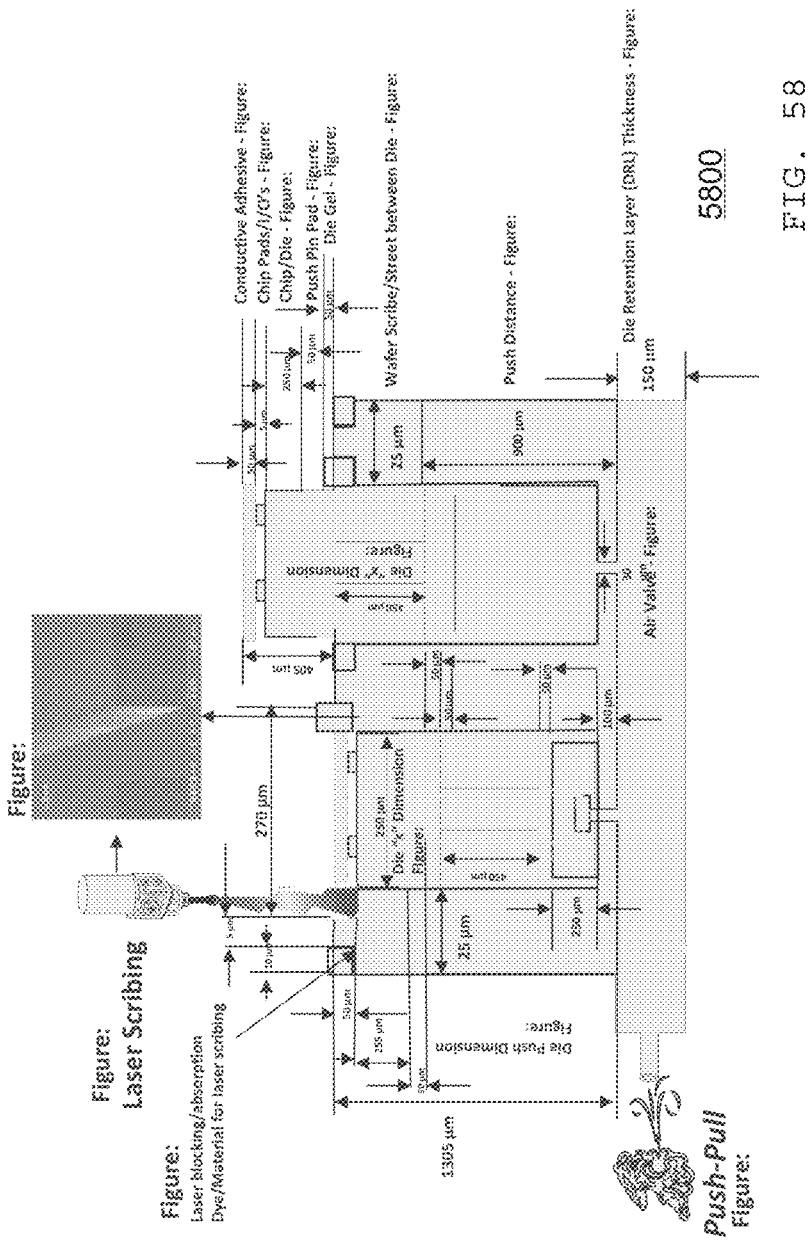
FIG. 58 shows cubbies of a die retention layer 5800, according to an example embodiment.
Figure 59:
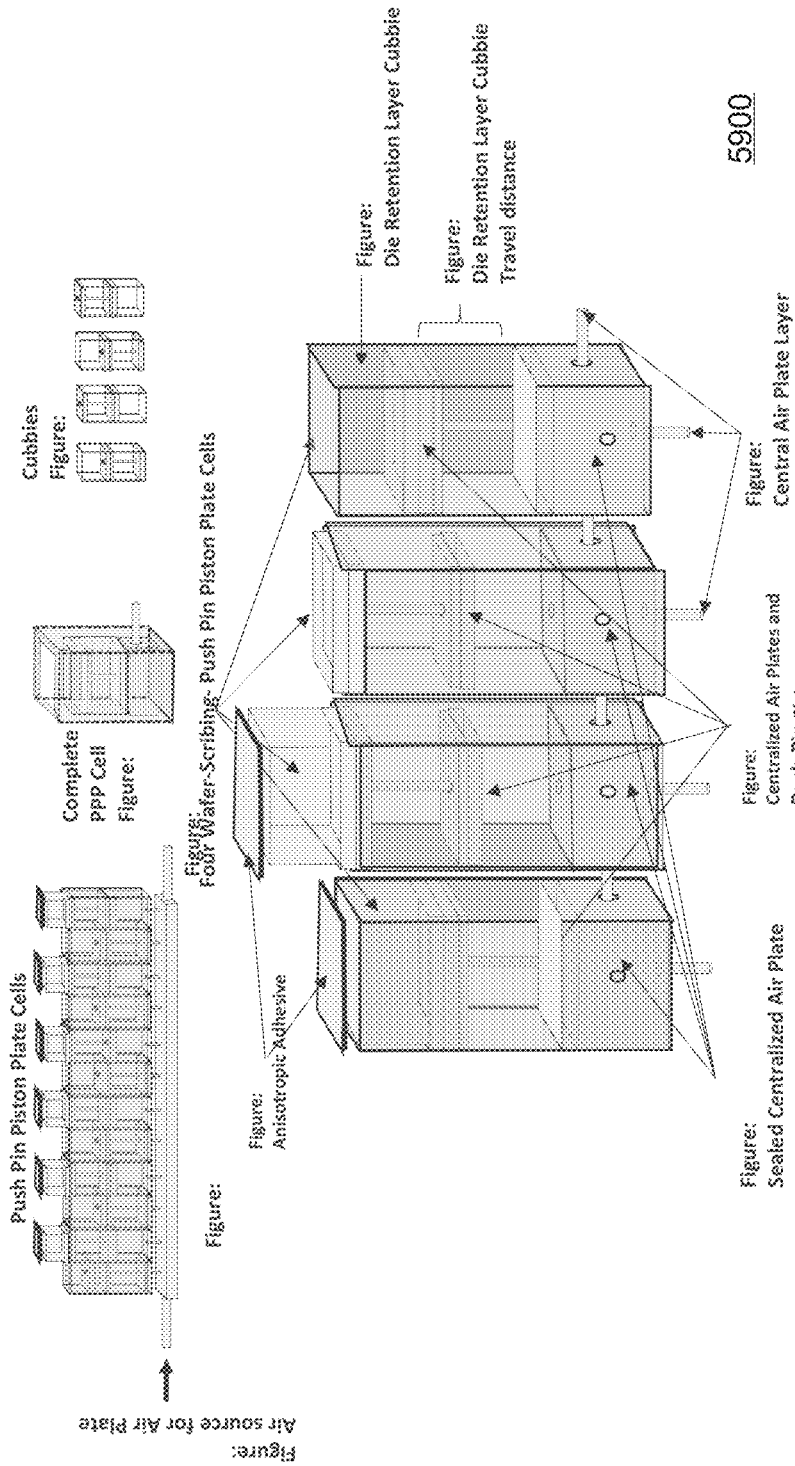
FIG. 59 shows cubbies of a die retention layer 5900, according to an example embodiment.
Figure 60:
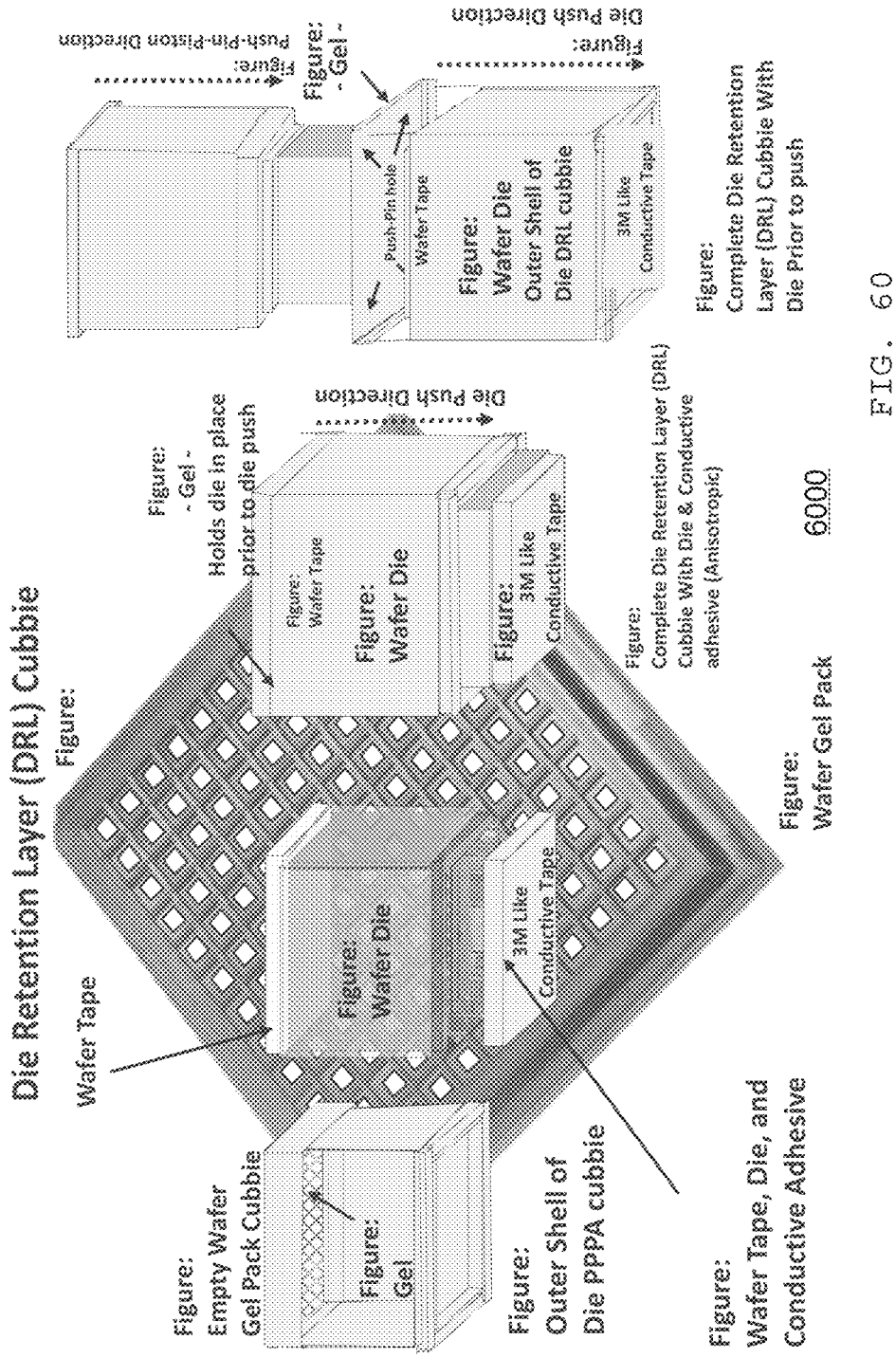
FIG. 60 shows a process flow for cubbies of a die retention layer 6000 according to an example embodiment.
Figure 61:
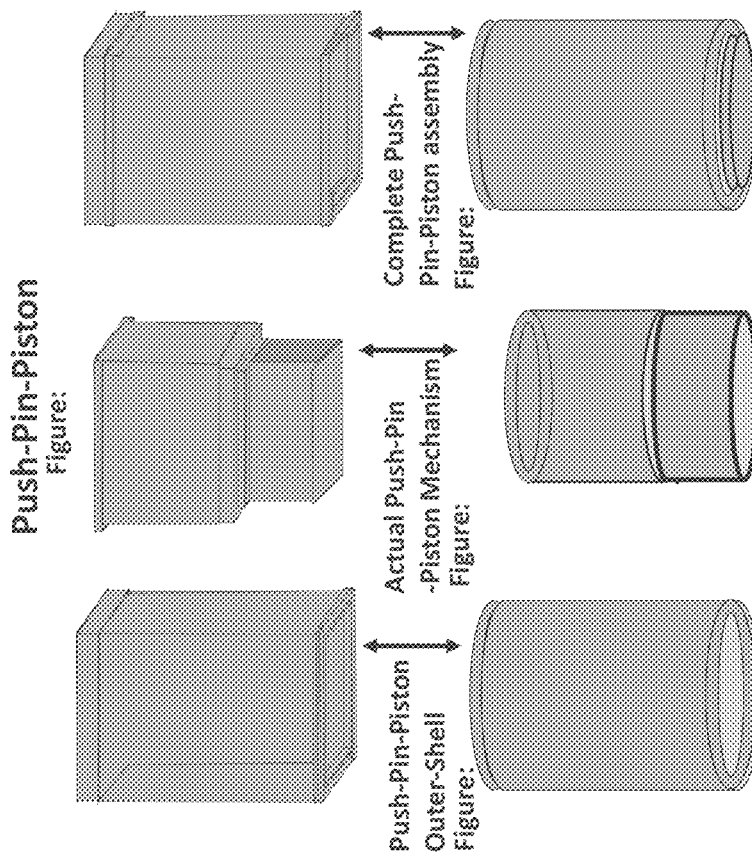
FIG. 61 shows a push-pin-piston system 6100, according to an example embodiment.
Figure 62:
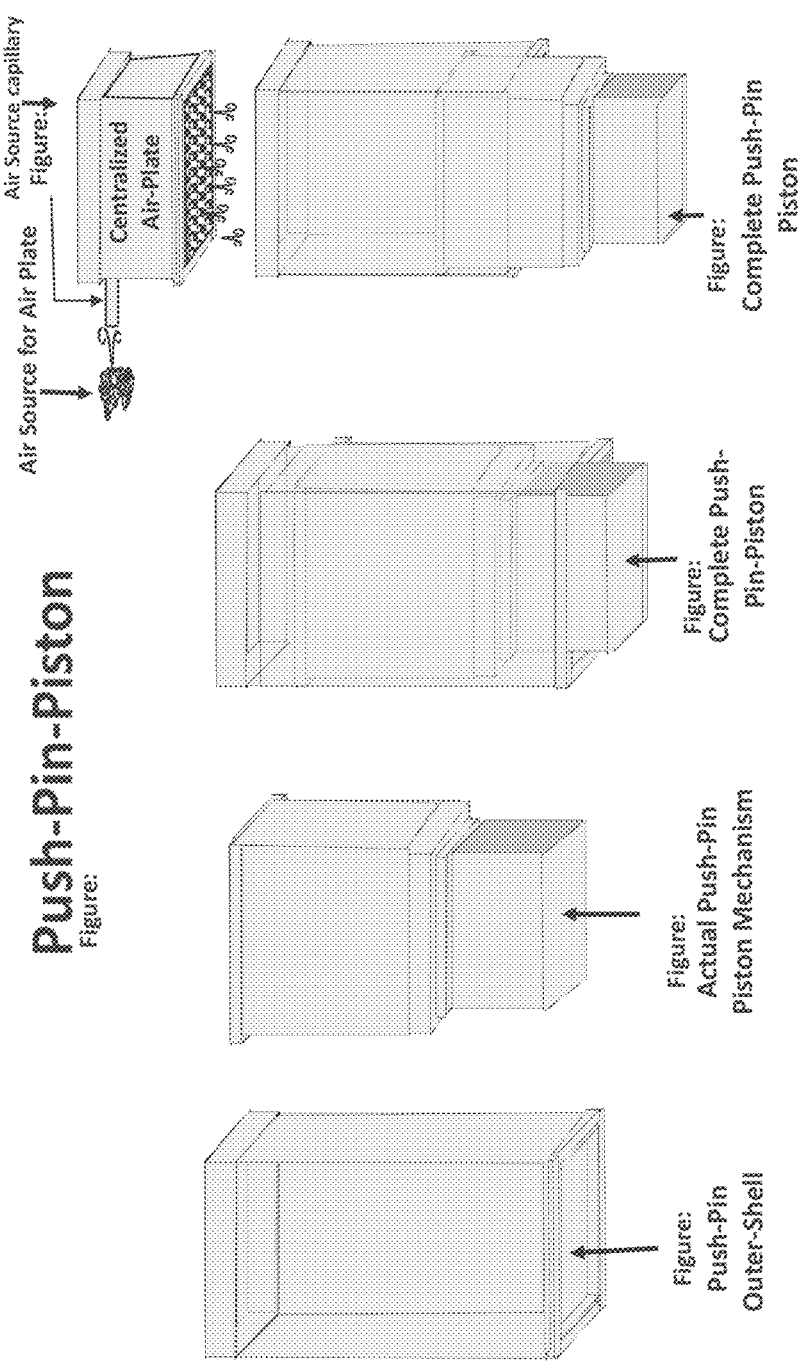
FIG. 62 shows process flow for a push-pin-piston system 6200, according to an example embodiment.
Figure 63:
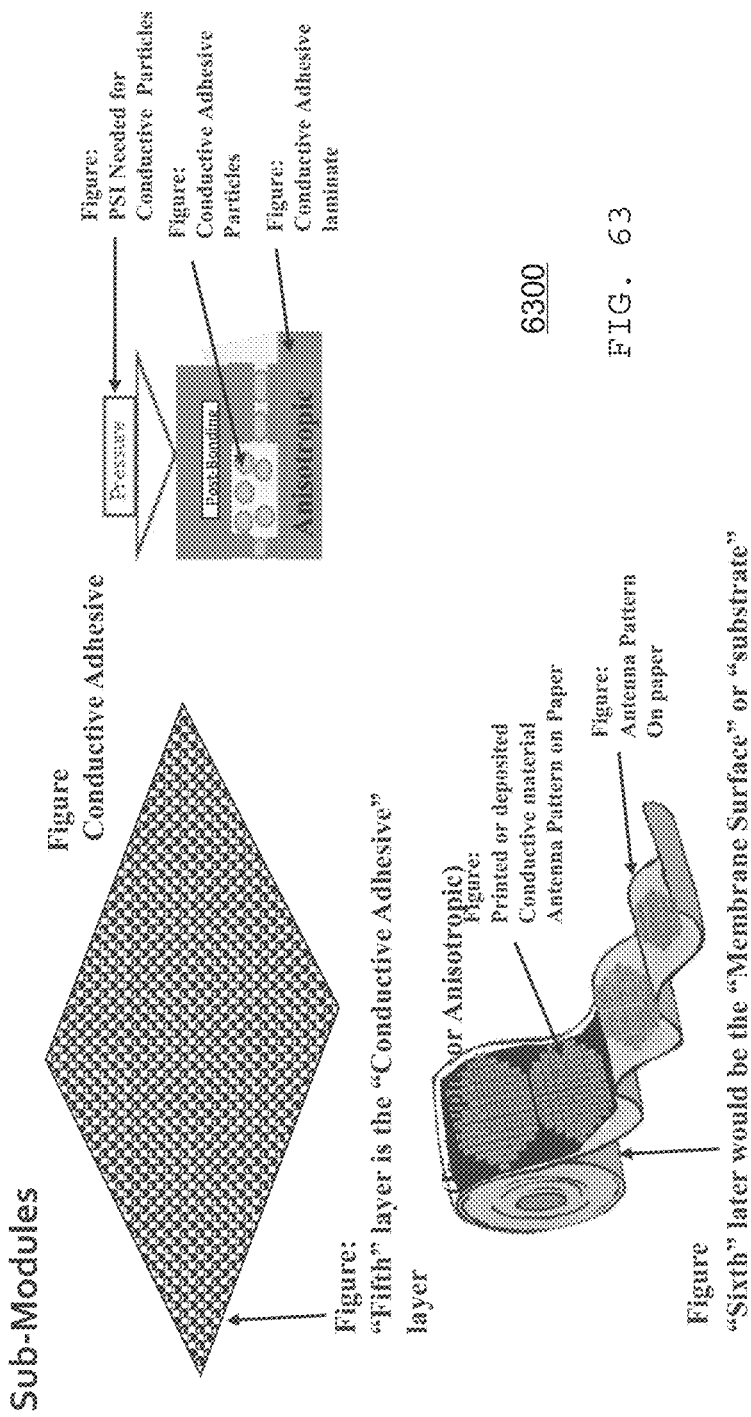
FIG. 63 shows an adhesive layer 6300 with adhesive material conformed to a substrate, according to an example embodiment.
Figure 64:
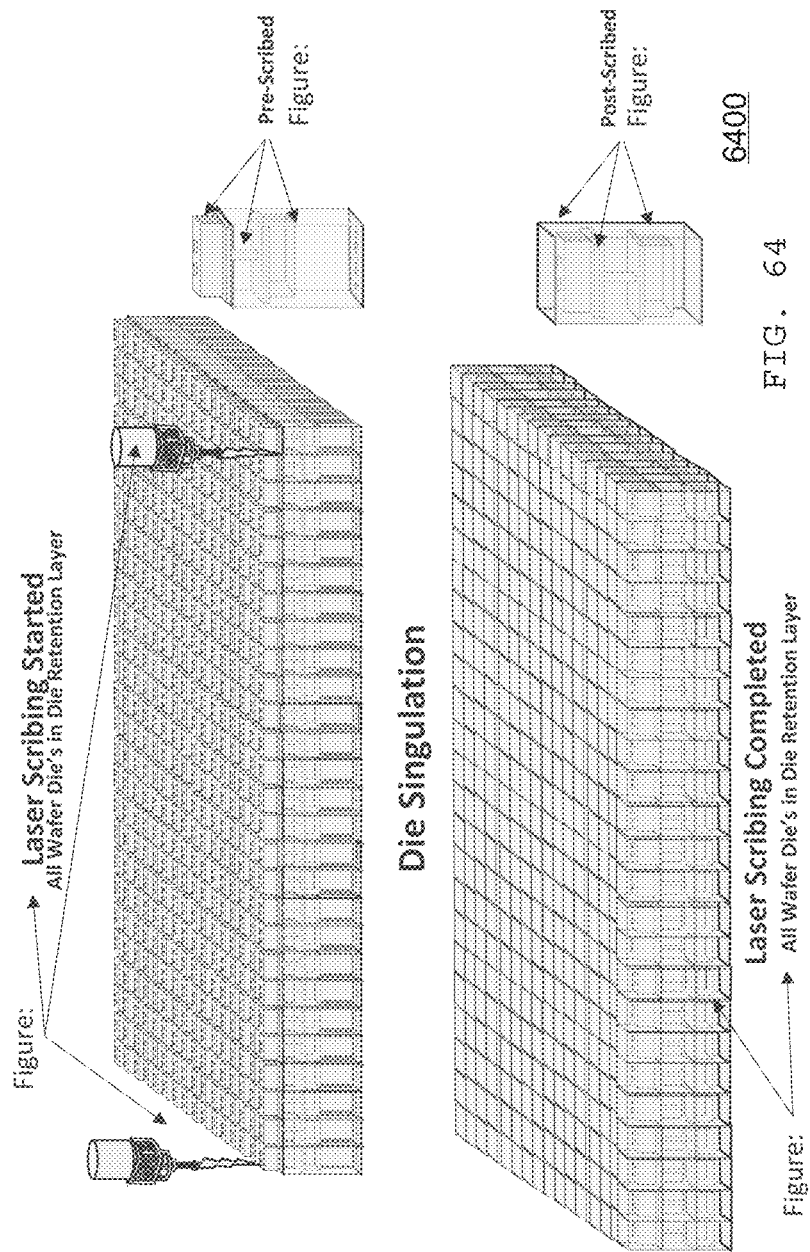
FIG. 64 shows an ICCES for MPICA system 6400 with a laser scriber scribing a portion of a wafer into single die, according to an example embodiment.
Figure 65:
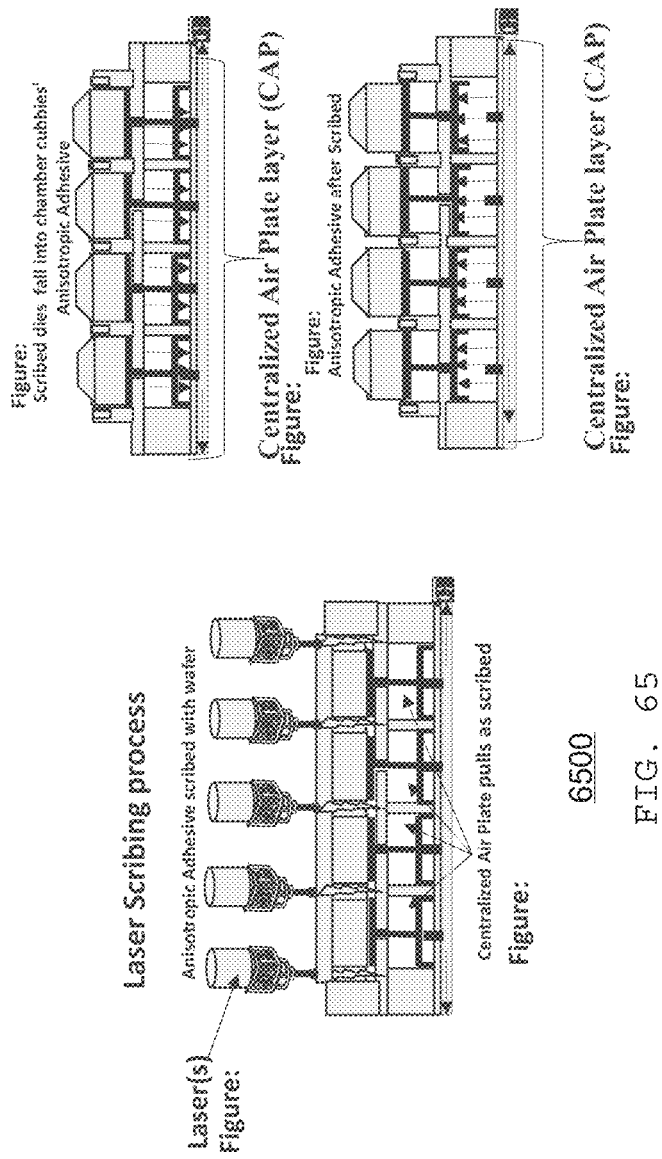
FIG. 65 shows a side view of laser scribers and a centralized air plate layer 6500, according to an example embodiment.
Figure 66:
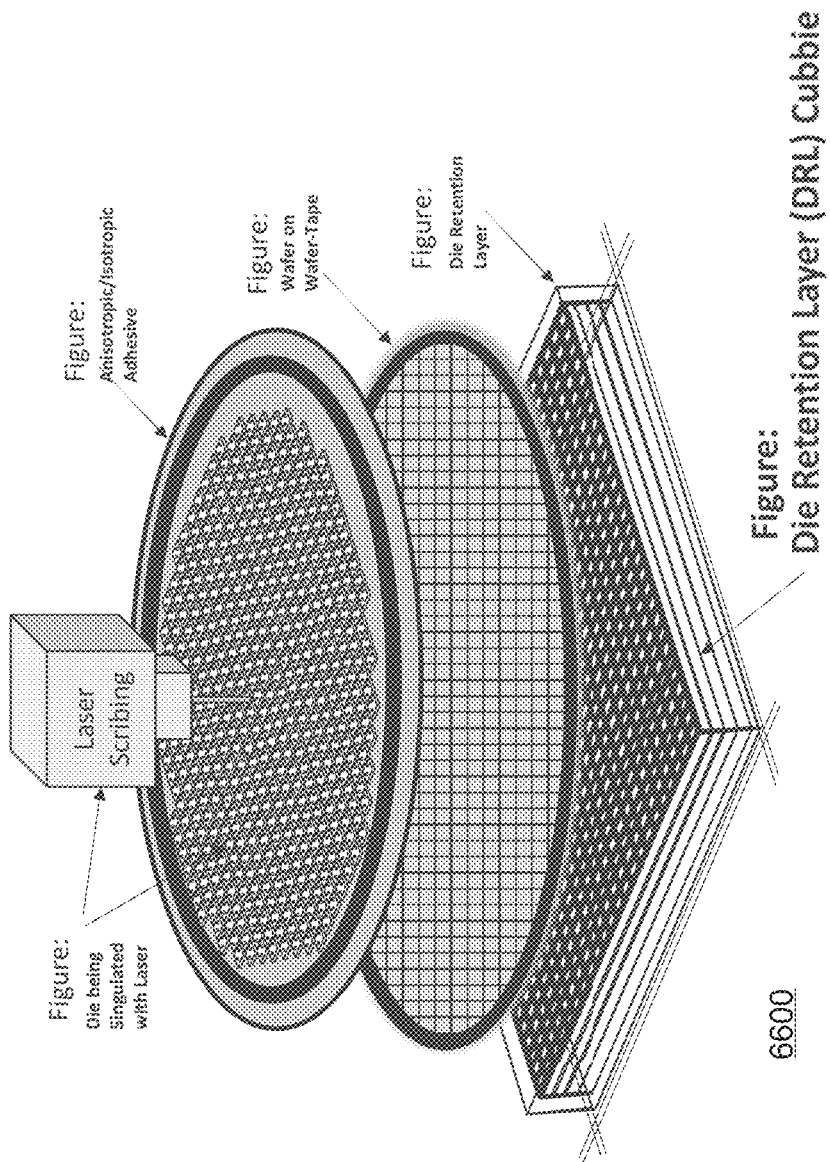
FIG. 66 shows an ICCES for MPICA system 6600 with a laser scriber scribing a portion of a wafer into single die over an adhesive layer and a die retention layer with cubbies, according to an example embodiment.
Figure 67:
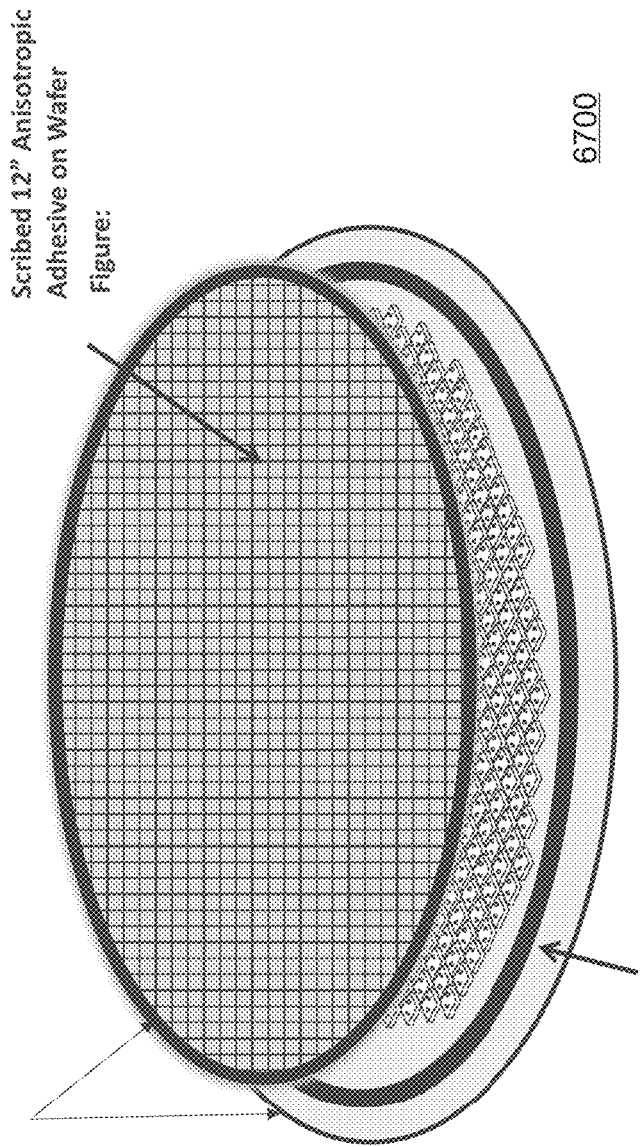
FIG. 67 shows an application diagram 6700 of an adhesive layer with singulated die on a wafer, according to an example embodiment.
Figure 69:
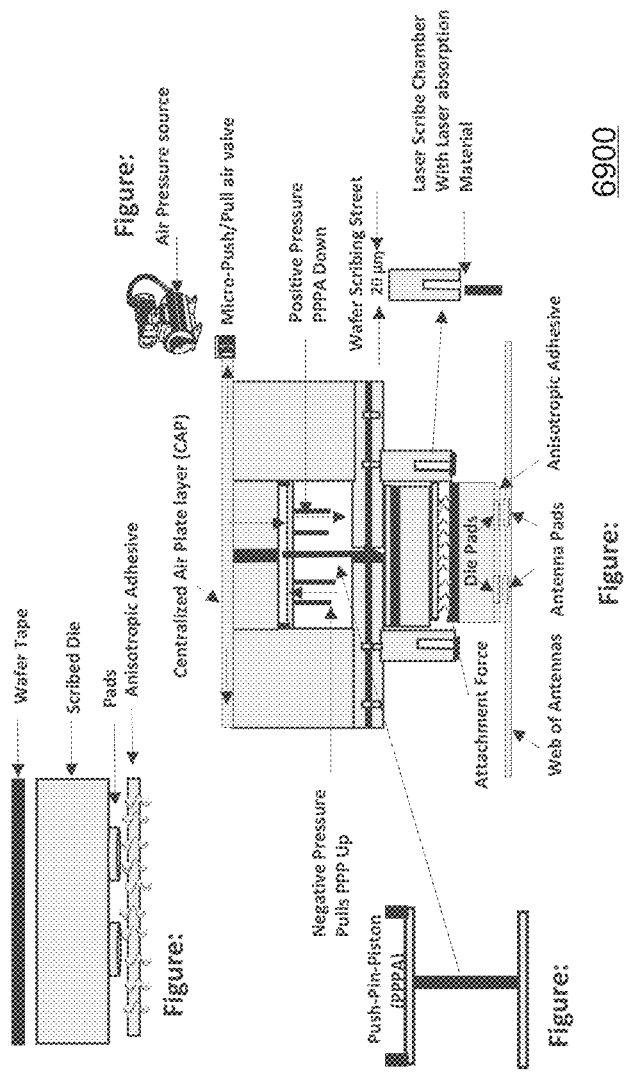
FIG. 69 shows inverted views of scribed die and adhesive materials attaching antennae thereto via a piston/plunger and an air chamber 6900, according to an example embodiment.
Figure 70:
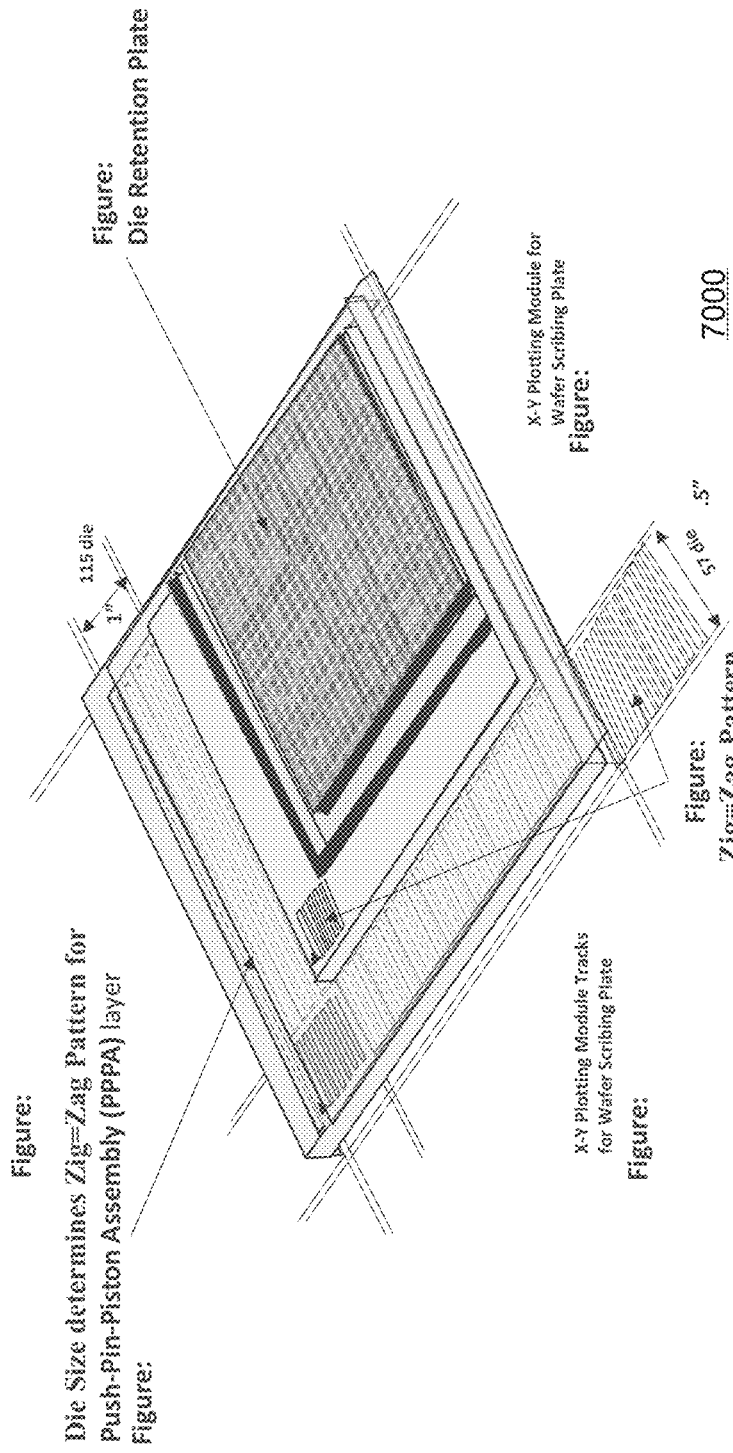
FIG. 70 shows a wafer-scribing and push plates system 7000, according to an example embodiment.
Figure 71:
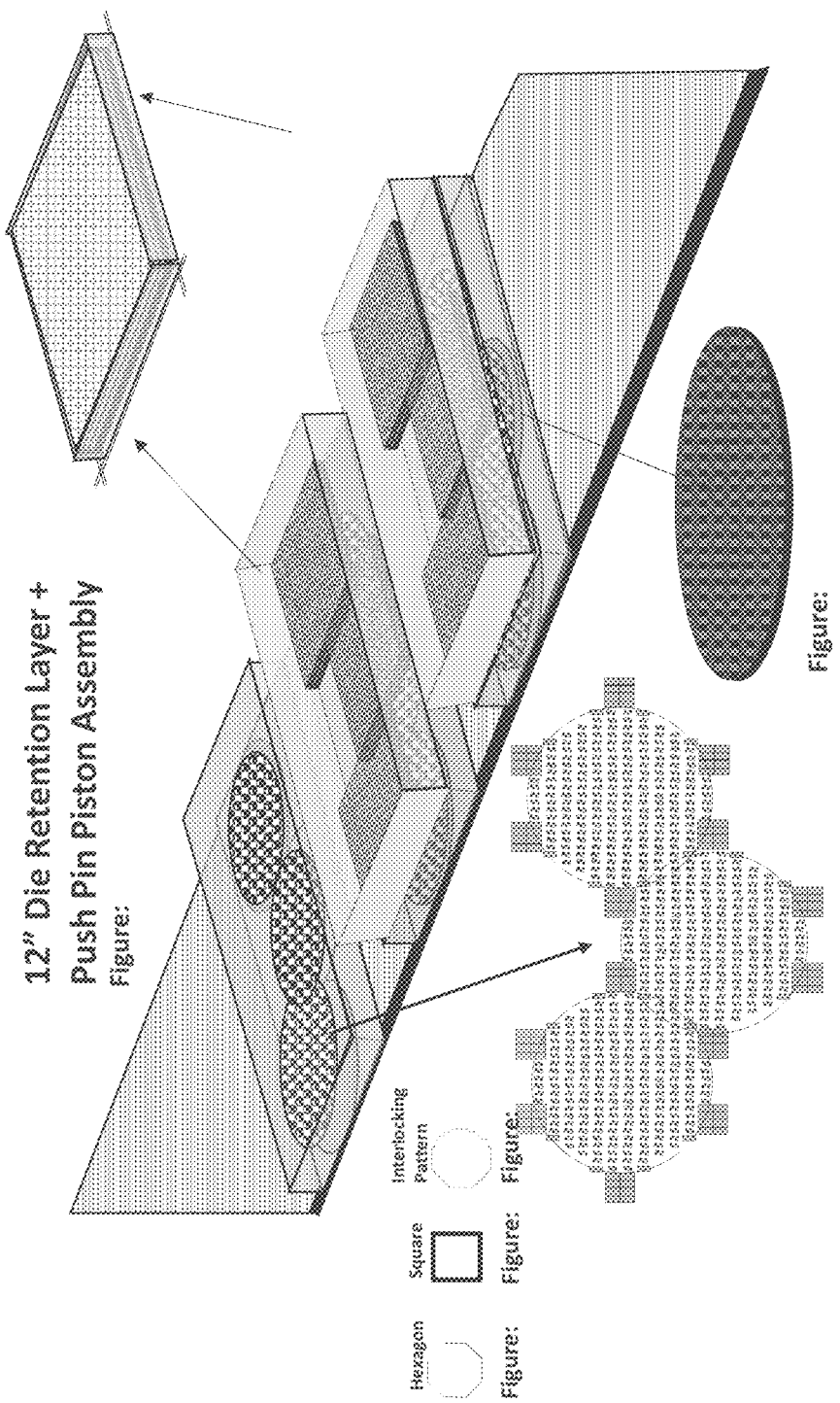
FIG. 71 shows a scaled wafer-scribing and push plates system 7100, according to an example embodiment.
Figure 72:
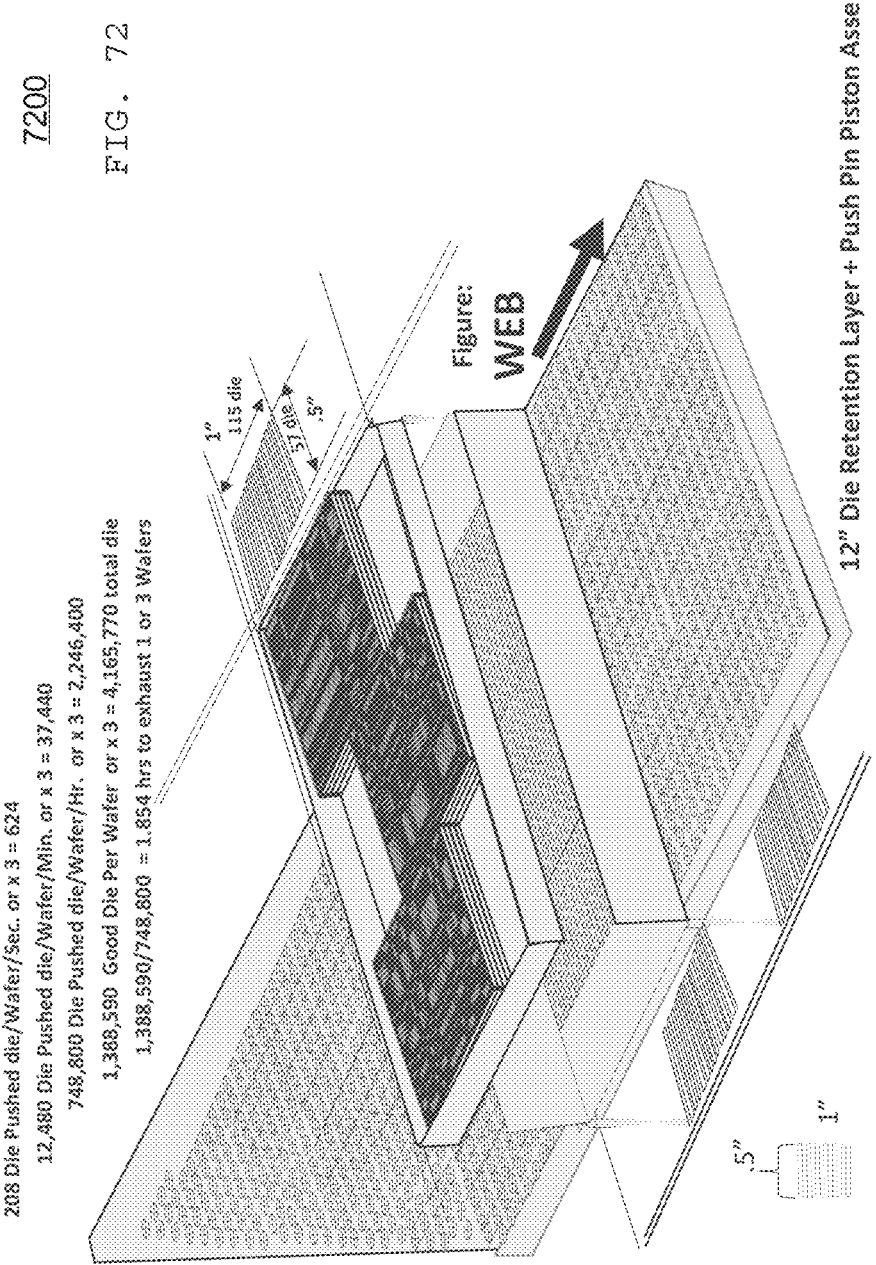
FIG. 72 shows a portion of a system 7200 for ICCES for MPICA, according to an example embodiment.
Figure 73:
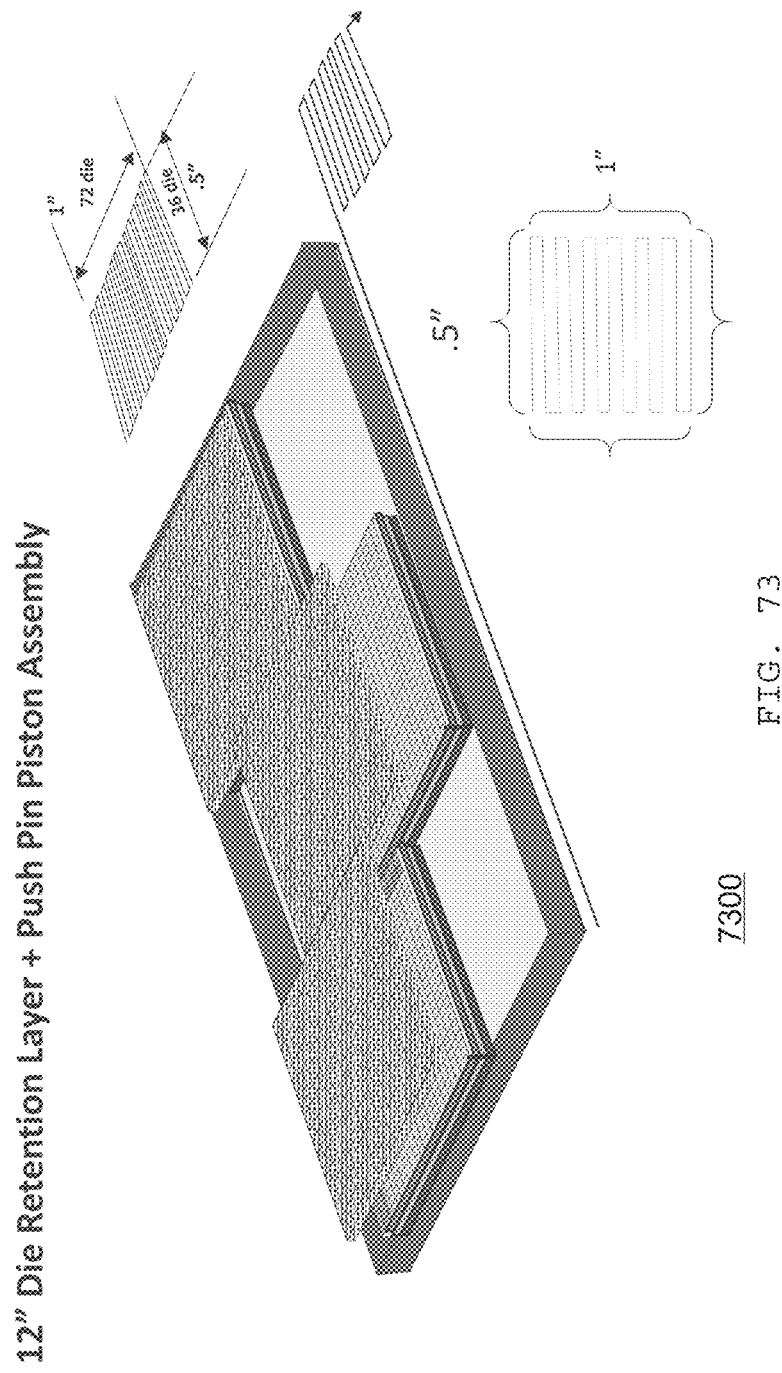
FIG. 73 shows a portion of a system 7300 for ICCES for MPICA, according to an example embodiment.
Figure 74:
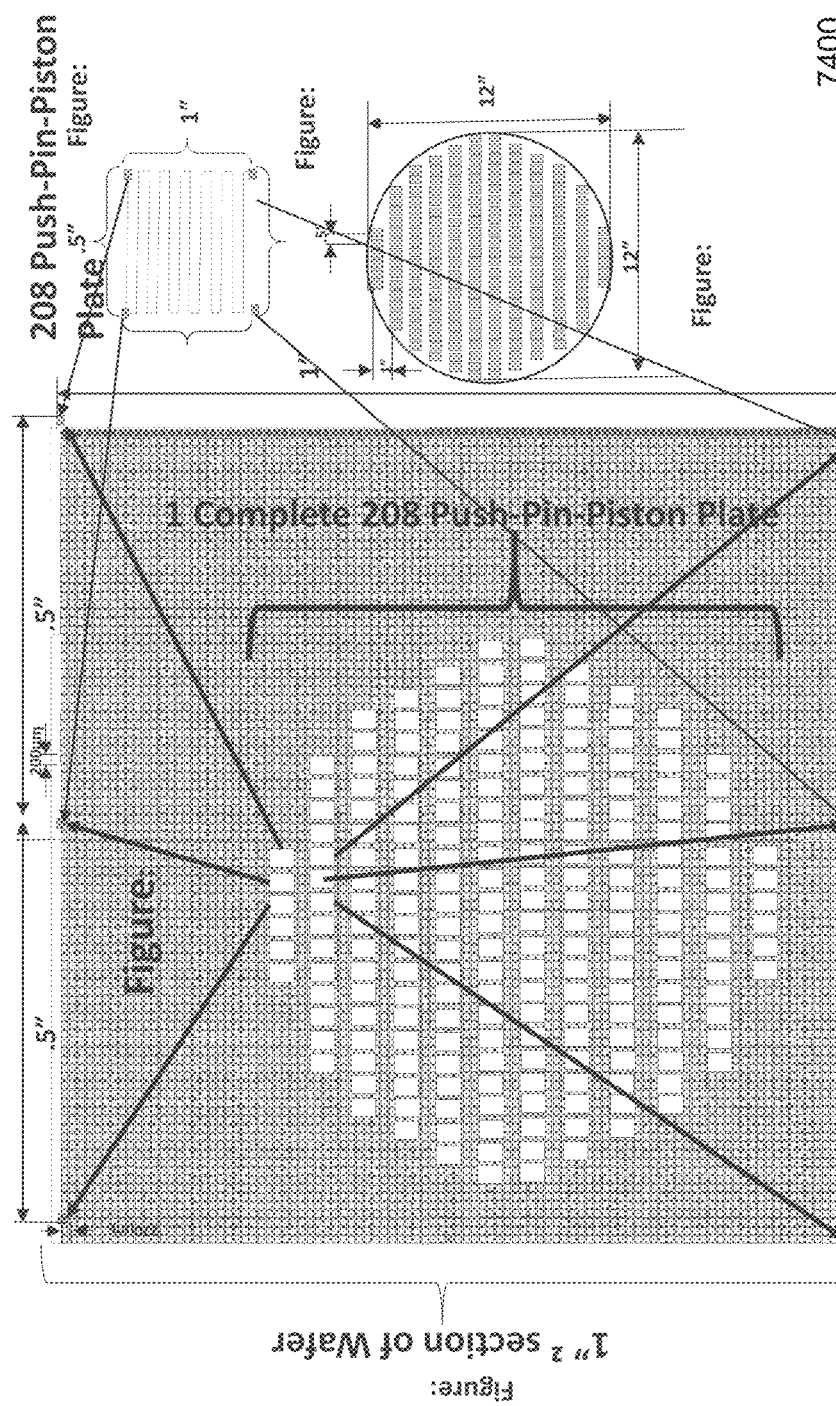
FIG. 74 shows a push-pin-piston layout 7400, according to an example embodiment.
Figure 75:
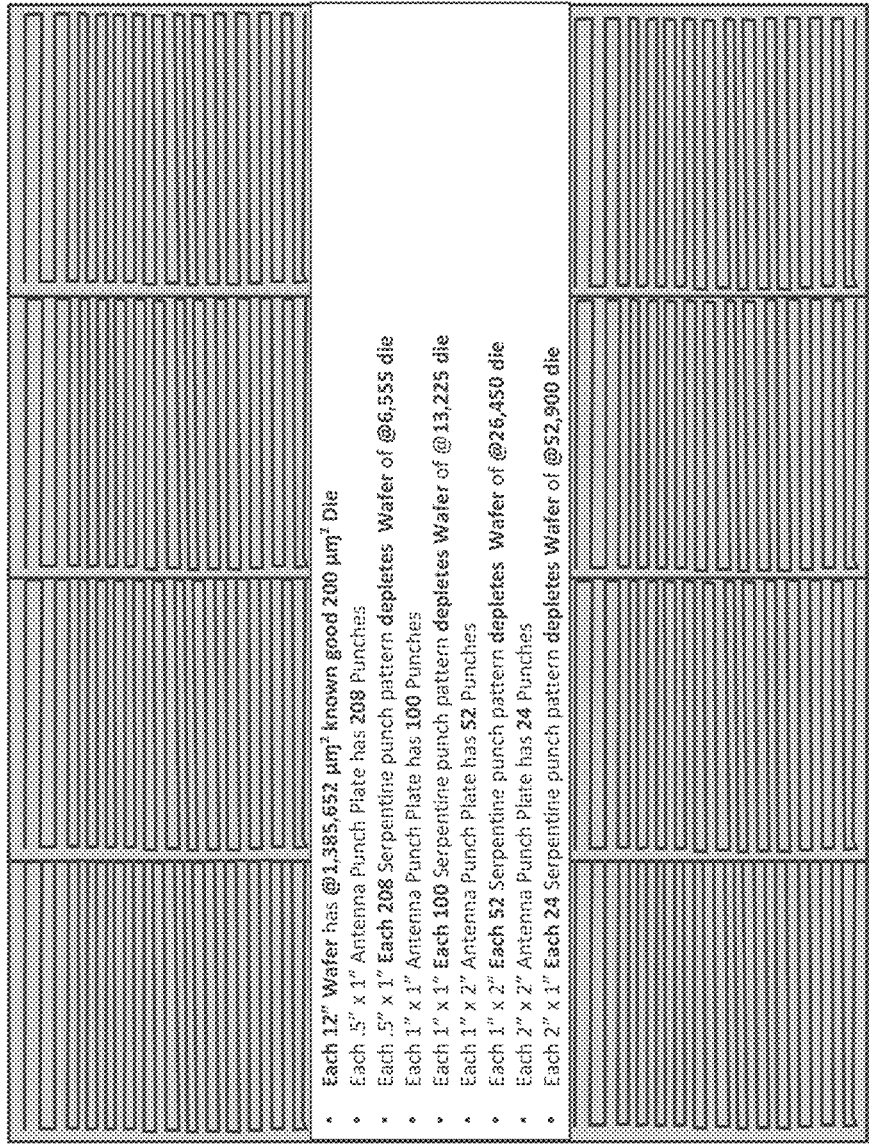
FIG. 75 shows a push-pin-piston layout 7500 for antenna, according to an example embodiment.

The ICCES system embodiments may have several components, or system layers that are described below. FIG. 1 shows a wafer 100 having a plurality of die, according to an example embodiment. FIG. 2 shows a wafer and piston 200, according to an example embodiment. FIG. 3 shows a wafer and adhesive layer 300 with adhesive material, according to an example embodiment. FIG. 4 shows a wafer-scribing and push plates system 400, according to an example embodiment. FIG. 5 shows a scaled wafer-scribing and push plates system 500, according to an example embodiment. FIG. 6 shows a portion of a system 600 for ICCES for MPICA, according to an example embodiment. FIG. 7 shows a portion of a system 700 for ICCES for MPICA, according to an example embodiment. FIG. 8 shows a portion of a system 800 for ICCES for MPICA with a laser scriber, according to an example embodiment. FIG. 9 shows a wafer scribing plate 900 having a plurality of cubbies that hold die, according to an example embodiment. FIG. 10 shows a wafer scribing plate 1000 having a plurality of cubbies that hold die, according to an example embodiment. FIG. 11 shows a side view of a laser scriber, pistons, and wafer scribing plate 1100, according to an example embodiment. FIG. 12 shows a wafer scribing plate 1200 having a plurality of cubbies that hold die, according to an example embodiment. FIG. 13 shows a side view of a laser scriber, pistons, and wafer scribing plate 1300, according to an example embodiment. FIG. 14 shows wafer-scribing push plate cells, pistons, and air chambers 1400, according to an example embodiment. FIG. 15 shows wafer-scribing push plate cells, pistons, and air chambers 1500, according to an example embodiment. FIG. 16 shows a wafer scribing layout 1600, according to an example embodiment. FIG. 17 shows a wafer scribing route layout 1700, according to an example embodiment. FIG. 18 shows a wafer scribing route layout 1800, according to an example embodiment. FIG. 19 shows push plates 1900 with respect to wafers, according to an example embodiment. FIG. 20 shows push plates 2000 with respect to wafers and scribing route layouts, according to an example embodiment. FIG. 21 shows scribing route layouts 2100 for push plates, according to an example embodiment. FIG. 22 shows wafers 2200 with die, according to an example embodiment. FIG. 23 shows a wafers 2300 with grouped die, according to an example embodiment. FIG. 24 shows grouped die 2400 of FIG. 23, according to an example embodiment. FIG. 25 shows an inverted view of push plates of air chambers with pistons 2500 and corresponding die positioning, according to an example embodiment. FIG. 26 shows laser scribers and push plates of air chambers with pistons/plungers 2600, according to an example embodiment. FIG. 27 shows inverted views of scribed die and adhesive materials attaching antennae thereto via a piston/plunger and an air chamber 2700, according to an example embodiment. FIG. 28 shows an air board 2800 and associated air chambers and cubbies, according to an example embodiment. FIG. 29 shows a push/punch route layout 2900 for die, according to an example embodiment. FIG. 30 shows a push/punch operational diagram 3000 for die, according to an example embodiment. FIG. 31 shows a joining diagram of die pads and antenna pads 3100, and a side view of a corresponding cubby, according to an example embodiment. FIG. 32 shows an antenna-die structure 3200, according to an example embodiment. FIG. 33 shows wafer scribing plates 3300, according to an example embodiment. FIG. 34 shows configurations of waffle pack grids 3400, according to an example embodiment. FIG. 35 shows printed antenna patterns 3500 with respect to wafers, according to an example embodiment. FIG. 36 shows printed antenna patterns 3600 with respect to wafers, according to an example embodiment. FIG. 37 shows templates 3700 for wafer scribing patterns, according to an example embodiment. FIG. 38 shows printed antenna patterns 3800 with respect to wafers, according to an example embodiment. FIG. 39 shows interposer straps 3900 with spaced solenoids, according to an example embodiment. FIG. 40 shows printed antenna patterns 4000 as a web, according to an example embodiment. FIG. 41 shows printed antenna patterns 4100 as a web, according to an example embodiment. FIG. 42 shows printed antenna patterns 4200 as a web, according to an example embodiment. FIG. 43 shows printed antenna patterns 4300 as a web, according to an example embodiment. FIG. 44 shows printed antenna patterns 4400, according to an example embodiment. FIG. 45 shows a solenoid capillary 4500 disposed with a cubby, according to an example embodiment. FIG. 46 shows a portion layers of a system 4600 for ICCES for MPICA, according to an example embodiment. FIG. 47 shows a portion layers of a system 4700 for ICCES for MPICA, according to an example embodiment. FIG. 48 shows a block diagram of a portion layers of a system 4800 for ICCES for MPICA, according to an example embodiment. FIG. 49 shows a top and bottom view of a push-pin-piston assembly 4900, according to an example embodiment. FIG. 50 shows a centralized air plate layer 5000, according to an example embodiment. FIG. 51 shows a system 5100 of the push-pin-piston assembly of FIG. 49 with the centralized air plate layer of FIG. 50, according to an example embodiment. FIG. 52 shows a portion of a centralized air plate layer 5200, according to an example embodiment. FIG. 53 shows a portion layers of a system 5300 for ICCES for MPICA, according to an example embodiment. FIG. 54 shows a portion layers of a system 5400 for ICCES for MPICA, according to an example embodiment. FIG. 55 shows a system 5500 including a push-pin-piston assembly and a centralized air plate layer, according to an example embodiment. FIG. 56 shows a system 5600 including a push-pin-piston assembly, a die retention layer, and a wafer, according to an example embodiment. FIG. 57 shows a push-pin-piston assembly of cells 5700, according to an example embodiment. FIG. 58 shows cubbies of a die retention layer 5800, according to an example embodiment. FIG. 59 shows cubbies of a die retention layer 5900, according to an example embodiment. FIG. 60 shows a process flow for cubbies of a die retention layer 6000 according to an example embodiment. FIG. 61 shows a push-pin-piston system 6100, according to an example embodiment. FIG. 62 shows process flow for a push-pin-piston system 6200, according to an example embodiment. FIG. 63 shows an adhesive layer 6300 with adhesive material conformed to a substrate, according to an example embodiment. FIG. 64 shows an ICCES for MPICA system 6400 with a laser scriber scribing a portion of a wafer into single die, according to an example embodiment. FIG. 65 shows a side view of laser scribers and a centralized air plate layer 6500, according to an example embodiment. FIG. 66 shows an ICCES for MPICA system 6600 with a laser scriber scribing a portion of a wafer into single die over an adhesive layer and a die retention layer with cubbies, according to an example embodiment. FIG. 67 shows an application diagram 6700 of an adhesive layer with singulated die on a wafer, according to an example embodiment. FIG. 68 shows singulated die in a die retention layer 6800, according to an example embodiment. FIG. 69 shows inverted views of scribed die and adhesive materials attaching antennae thereto via a piston/plunger and an air chamber 6900, according to an example embodiment. FIG. 70 shows a wafer-scribing and push plates system 7000, according to an example embodiment. FIG. 71 shows a scaled wafer-scribing and push plates system 7100, according to an example embodiment. FIG. 72 shows a portion of a system 7200 for ICCES for MPICA, according to an example embodiment. FIG. 73 shows a portion of a system 7300 for ICCES for MPICA, according to an example embodiment. FIG. 74 shows a push-pin-piston layout 7400, according to an example embodiment. FIG. 75 shows a push-pin-piston layout 7500 for antenna, according to an example embodiment. FIG. 76 push-pin-piston layout 7600 for antenna, according to an example embodiment. FIG. 77 shows a patterned air plate 7700, according to an example embodiment. FIG. 78 shows a push-pin-piston layout 7800 for push plates, according to an example embodiment. FIG. 79 shows attachment configurations 7900 for push-pin-piston patterns, according to an example embodiment. FIG. 80 shows antenna layout configurations 8000 for wafers, according to an example embodiment. FIG. 81 shows antenna layout configurations 8100 for wafers, according to an example embodiment. FIG. 82 shows antenna layout configurations 8200 for wafers, according to an example embodiment. FIG. 83 shows antenna layout configurations 8300 for wafers, according to an example embodiment. FIG. 84 shows a die retention layer 8400, according to an example embodiment. FIG. 85 shows templates 8500 for wafer scribing patterns, according to an example embodiment. FIG. 86 shows wafer scribing pattern configurations 8600, according to an example embodiment. FIG. 87 shows configurations of waffle pack grids 8700, according to an example embodiment. FIG. 88 shows die or antenna patterns 8800 from wafers, according to an example embodiment. FIG. 89 shows configurations for die retention layer plates 8900, according to an example embodiment. FIG. 90 shows die or antenna patterns 9000 with respect to die retention layer plates and attachments per second, according to an example embodiment. FIG. 91 shows printed antenna patterns 9100 as a web, according to an example embodiment. FIG. 92 shows printed antenna patterns 9200 as a web, according to an example embodiment. FIG. 93 shows printed antenna patterns 9300 as a web, according to an example embodiment. FIG. 94 shows printed antenna patterns 9400 as a web, according to an example embodiment. FIG. 95 shows printed antenna patterns 9500 as a web, according to an example embodiment. FIG. 96 shows a die retention layer 9600 with singulated die from a wafer plate, according to an example embodiment. FIG. 97 shows a die retention layer 9700 with an overlay of push-pin vias, die cubbies, and a wafer scribing sheet, according to an example embodiment. FIG. 98 shows configurations of waffle pack grids 9800 for push-pins, according to an example embodiment. FIG. 99 shows a top view of a die retention layer 9900 for singulated die with an overlay of push-pin vias and die cubbies, according to an example embodiment. FIG. 100 shows a top view of a die retention layer 10000 for singulated die with an overlay of push-pin vias and die cubbies, according to an example embodiment. FIG. 101 shows an antenna and corresponding input/output pads of a die 10100, according to an example embodiment. FIG. 102 shows an antenna 10200, according to an example embodiment. FIG. 103 shows an antenna-die structure 10300, according to an example embodiment. FIG. 104 shows a pattern of antenna 10400 with respect to a wafer, according to an example embodiment. FIG. 105 shows a chip design 10500 for the antenna-die structure of FIG. 103, according to an example embodiment. FIG. 106 shows a chip design 10600 for the antenna-die structure of FIG. 103, according to an example embodiment. FIG. 107 shows an alternating substrate configuration 10700 for antenna-chip structures, according to an example embodiment. FIG. 108 shows a solenoid capillary 1080000 disposed with a cubby, according to an example embodiment. FIG. 109 shows sub-modules of layers of a system 10900 for ICCES for MPICA, according to an example embodiment. FIG. 110 shows layers of a system 11000 for ICCES for MPICA with adhesion to a membrane/substrate, according to an example embodiment. FIG. 111 shows a flow diagram 1110 for ICCES for MPICA, according to an example embodiment. FIG. 112 shows printed die retention layer 11200, according to an example embodiment. FIG. 113 shows a pre-push die retention layer 11300, according to an example embodiment. FIG. 114 shows a post-push die retention layer 11400, according to an example embodiment. FIG. 115 shows system 11500 including a push plate, a wafer plate, and an air plate, according to an example embodiment. FIG. 116 shows a centralized air plate layer 11600 for a programmed antenna pattern, according to an example embodiment. FIG. 117 shows push plate configurations 11700 for wafer maps and a die retention layer, according to an example embodiment. FIG. 118 shows a laser cut pattern 11800 from a wafer, according to an example embodiment. FIG. 119 shows a laser cut pattern 11900 from a wafer, according to an example embodiment. FIG. 120 shows combined laser cut patterns 12000 from wafers, according to an example embodiment. FIG. 121 shows a laser cut pattern 12100 from a wafer, according to an example embodiment. FIG. 122 shows combined laser cut patterns 12000 from wafers, according to an example embodiment.

Die retention layer: this layer provides die retention "cubbies" in which the die reside until ejected onto an adjacent substrate. The cubbies are manufactured with 3D printing to be a specified dimension larger than the die size, and are placed exactly to correspond to the placement of the die on the wafer. At the bottom of the cubbies there is a hole of a specified diameter that connects to the push-piston assembly layer, to be described next. Through this hole is a pin with a radius of a specified dimension less than the hole radius, with a piston attached, with the same dimension as the die. The thickness of the piston is some specified dimension. The depth of the cubby is the sum of this dimension and the die thickness. See FIGS. 1-122. In between the cubbies is a material that serves as a "stop" for standard industry laser scribing of the wafer. A "tacky" adhesive is applied to the backside of the wafer containing the die, specified to provide a sticking force of a value less than achieved when the die are attached to the target substrate. The wafer is then placed on the die retention surface with the die facing outward. The push pistons are deployed upward to touch the adhesive layer to secure the die onto the piston surface. See FIGS. 1-122. An anisotropic adhesive film, such as available from 3M, is placed over the wafer. This entire assembly is then scribed by standard industry laser scribing, to separate the die. During scribing, the pistons exert a specified downward force, pulling on the die, so when separated, the die are pulled into the cubbies, along with the anisotropic adhesive layer. Once in the cubbies, the adhesive keeps them retained.

Push Piston layer: this layer has either round, rectangular, or square chambers aligned with the cubbies. The piston pin hole connects a chamber to its corresponding cubby. The chambers have pistons connected to these pins, the radius being a specified dimension less than the radius of the chamber, or of the size being specified dimensions less than the rectangular or square dimensions of the chamber. The thickness of the piston is of some specified dimension. The chamber depth is the sum of this dimension and the die thickness. See FIGS. 1-122. The pistons are manufactured so that they move freely up and down, the total excursion being the same as the die thickness. At the opposite end of the chamber from the cubby piston hole, is a hole to the air manifold, to be described next. See FIGS. 1-122. This air manifold provides first positive pressure to push the chamber piston down to the cubby end, pushing the cubby piston up to meet the die underside surface when the die wafer is placed on the assembly as described above. Then is provides the negative pressure to pull the chamber piston up and away from the cubby side, pulling the cubby piston down to the bottom of the cubby, bring the attached die down into the cubby. When the target substrate is brought into near contact proximity to the cubby surface, positive air pressure is applied to once again move the chamber piston down to the cubby side, pushing the chamber piston up and the die out of the cubby, ejecting it onto the substrate where it is attached by the anisotropic adhesive. The attachment force is designed to be sufficient to pull the die off of the piston. Then negative air pressure is once more induced to withdraw the cubby piston into the cubby, leaving the die attached to the substrate.

Air Chamber layer: This layer is a separate and moveable layer relative to the integrated cubby/piston chamber layer. It has air holes matched to those in the piston chamber layer, but at locations specific to the number of die to be ejected at any one time. For example, it may have air holes located to correspond to the bonding pad position of an underlying substrate, which require only a fraction of the total die to be ejected and bonded at a time. Once those die are ejected, the integrated cubby/piston chamber layer is moved relative to the air chamber layer, such that filled cubbies are aligned to the air holes of the air chamber, for the next ejection of die onto a new segment of the substrate, which is on a reel, and advances to expose new bonding pad positions. The air chamber air holes and the corresponding piston chamber air holes may be male-to-female matched to provide an airtight fit when positioned together. The air chamber is a cavity with dimensions commensurate with the wafer, and some thickness dimension designed to provide uniform pressure throughout the chamber during cycles. An air hose connects this chamber to a pressure pump system to alternatively provide the negative and positive pressures. See FIG. 5. Purified nitrogen gas may be a preferred gas for this operation to prevent contamination and oxidation of interior surfaces, according to an embodiment. Alternatively, the air chamber layer may be integrated with the cubby/piston chamber layer. In this case the chamber may be filled with channels that direct the gas flow to the specified piston chambers for a specific die ejection cycle, and then to different piston chambers for the next die ejection cycle. Computer controlled micro valves select which channels are employed for a specific push cycle. See FIGS. 1-122.

Alternatively, the cubby pistons may be activated by a mechanical piston layer, operated electro-magnetically with solenoids, such as is shown in one or more of FIGS. 1-122. There may be individual solenoids, one for each antenna position, or just one that operates a pin plate, the pins positioned one for each antenna position. In either alternative, once a set of die are ejected, the integrated cubby/piston chamber layer is moved relative to the mechanical piston layer, such that filled cubbies are aligned to the pins, for the next ejection of die onto a new segment of the substrate.

The subject matter disclosed herein also includes a two sided ID die which has bonding pads on both the top and bottom surfaces of the die, as shown in one or more of FIGS. 1-122. For such die, the die can be attached to one side of an antenna or other substrates as described above, or within a pre-embossed shape equal to that of the thickness of the 2 sided I/O bare die, said embossed shape may also have a via or not to allow for a connection to the opposite side of substrate when folded or just to connect to another substrate. After or before that attachment, a conductive adhesive (anisotropic, isotropic, or other) may be applied on the exposed top or bottom die surface, covering either bonding pad(s), as shown in one or more of FIGS. 1-122.

After the antenna or other flexible substrate exits the ICCES stage, it may then be fan folded either over the die or back-to-back, a passivation covering may be applied between both antenna structures by printing or other means as not to short out either or both antenna structures, but with the pad area exposed for connection to die I/O, so that bonding landings on the substrate match the adhesive covered top die surface and then brought into contact with pressure to form the bond attachment, as shown in one or more of FIGS. 1-122. Upon the completion of the fan folding one edge of the stack is then sliced to sever individual antennas which may then be read or authenticated for functioning/nonfunctioning. Said stack may be counted, and or packaged, as shown in one or more of FIGS. 1-122.

In an embodiment, a unique Integrated Circuit (IC) die ejection head assembly system is described, which utilizes one of many types of Three-Dimensional (3D) printing technologies to achieve very high resolution manufacturing to meet the precision tolerances required for very small IC die sizes. Hundreds of thousands to more than a million of randomly Laser programmed unique die are retained in this "First" assembly system until they are selectively ejected in a very controlled and precise way onto any various underlying web like substrates. These arbitrarily large number of die can be selected depending on a predetermined pattern and ejected all at the same time until eventually every die are ejected from the "First" assembly system. The Integrated Circuit Controlled Ejection System (ICCES) embodiments provide a new approach for MPICA. The current "6" layer embodiment is a complex die retention and ejection system that has the size and footprint of any standard silicon wafer on which IC die are fabricated. For a die size of 200 microns on a side, there are about 1,400,000 such die on a 12-inch wafer.

The ICCES system embodiments may have several components, or system layers that are described below:

The "First" layer: or the Centralized Air Plate layer (CAP) which like every other part is manufactured with a high resolution 3D type printing process. The CAP layer is further described elsewhere herein.

The "Second" layer or the Push-Pin-Piston Assembly (PPPA) layer provides a plate or individual "Push Pins" to extract die from wafer on the Wafer Plate, the PPPA layer is further described elsewhere herein.

The "Third" layer is the Wafer Plate or the Die Retention Layer (DRL) provides die retention "cubbies" with vias in which the wafer and randomly Laser programmed unique die reside until ejected onto an adjacent substrate. The DRL layer is further described elsewhere herein.

The "Forth" layer is "Wafer" itself which is of any size or part of any wafer. It is jigged to fit exactly over each "Cubby" and via as to be able to be ejected from the PPPA. The Wafer layer is further described elsewhere herein.

The "Fifth" layer is the "Conductive Adhesive" layer (Isotropic, or Anisotropic) which is applied over the complete "Wafer" and die cut exactly to the shape of that "Wafer", or can be a liquid that flows on the "Wafer" and presets and semi cures or cures enough so that either can be then scribed, diced or cut into the same size dimensions as the die ejected from the DRL. The Conductive layer is further described elsewhere herein.

The "Sixth" layer is the "Membrane Surface" or "substrate" to which the IC or die is being applied to create a circuit or connection. The Membrane layer is further described elsewhere herein.

The "First" Layer, the Centralized Air Plate layer (CAP) module provides the ICCES system to operate by providing either a continuous moving plate or individual air ports or vias with pre-determined pattern(s). For example for a 12" wafer with a solid or continuous CAP moves like a 12"×12" piston moving up and down to a specified distance which is determined only by the thickness of the wafer. For a CAP with individual air ports or vias, air is pushed through the individual predetermined patterned holes. This CAP layer is a separate and moveable layer relative to the "Second" layer the Push-Pin-Piston Assembly (PPPA) layer.

The CAP may be a cavity with dimensions commensurate with the wafer, and some thickness dimension designed to provide uniform pressure throughout the chamber plate during cycles. An air hose connects this chamber to a pressure pump system to alternatively provide the negative and positive pressures, as is shown in one or more of FIGS. 1-122. Purified nitrogen gas may be a preferred gas for this operation to prevent contamination and oxidation of interior surfaces, according to an embodiment. Alternatively, the air chamber layer may be integrated with the cubby/piston chamber layer. In this case the chamber may be filled with channels that direct the gas flow to the specified piston chambers for a specific die ejection cycle, and then to different piston chambers for the next die ejection cycle. Computer controlled micro valves select which channels are employed for a specific push cycle.

The airtight fit when positioned together create the air chamber or cavity with dimensions commensurate with the wafer, and some thickness dimension designed to provide uniform pressure throughout the chamber during cycles. The air hose connects this chamber to a pressure pump system to alternatively provide the negative and positive pressures.

Purified nitrogen gas may be a preferred gas for this operation to prevent contamination and oxidation of interior surfaces, according to an embodiment. Alternatively, the CAP layer may be integrated with as described above to a cubby/piston chamber layer. In this case, the chamber is filled with channels that direct the gas flow to the specified piston chambers for a specific die ejection cycle, and then to different piston chambers for the next die ejection cycle. Computer controlled micro valves may select which channels are employed for a specific push cycle.

The CAP is then attached to the "PPPA" becoming one subassembly and has the ability to move together in a specific pattern to allow for the complete wafer to be exhausted of every one of its die, as is shown in one or more of FIGS. 1-122. For example for a 0.5"×1" antenna for an RFID tag the feasibility is such that one can push 208 200 micron sq. IC's per push, per second. After $1^{st}$ push the plate then move 200 microns in the "X" direction to initiate another push, then another, etc. until all die within each 208 patterns are completed. Roughly each pattern may have @57 die in the "X" direction and @115 die in the "Y" direction giving each push pin the ability to push 6,555 die and a total of 1,363,440 200 Micron sq. die pushed in 6,555 seconds or @1.8 hours, as is shown in one or more of FIGS. 1-122.

The "Second" layer, the Push-Pin-Piston Assembly (PPPA) layer provides a predetermined patterned plate with holes for "Push Pins", or predetermined patterned individual cavities each with holes for "Push Pins". This layer's individual cavities can have either round, rectangular, or square chambers, likewise the predetermined patterned plate may as well, or just simply be a lid like shape to create an air chamber with the predetermined pattern. One example is where the PPPA pin hole connects a chamber to its corresponding cubby on the Die Retention Layer (DRL). The chamber(s) may have pistons connected to these pins with their radius being of a specified predetermined dimension or pattern less than the radius of the chamber, or dimensions less than the rectangular or square dimensions of the chamber. The thickness of the PPPA is of some specified dimension of the chamber depth which is the sum of this dimension and the die thickness, as is shown in one or more of FIGS. 1-122. The PPPA manufactured assembly is made so that they each move freely up and down with their total excursion being the same as the die thickness.

When the target substrate, or "Membrane Surface" is brought into near contact proximity to the cubby surface As the CAP provides first positive pressure to push the PPPA down on to the DRL bottom surface, the action results in pushing either the cubby piston or plate down to meet the die underside surface. The defined positive air pressure which is applied and moves the chamber piston or plate down onto the cubby side, pushing the chamber piston or plate down and the die out of the DRL, ejecting it onto the "Membrane Surface" where it is attached by the "Conductive Adhesive" layer. The attachment force is designed to be sufficient to pull the die off of the PPPA. Then negative air pressure is induced to the CAP to withdraw the PPPA piston off the DRL cubby, leaving the die attached to the "Membrane Surface". This is the completion of one cycle.

Alternatively, the cubby pistons may be activated by a mechanical piston layer, operated electro-magnetically with solenoids, such as is shown in one or more of FIGS. 1-122. There may be individual solenoids, one for each antenna position, or just one that operates a pin plate, the pins positioned one for each antenna position. In either alternative, once a set of die are ejected, the integrated cubby/piston chamber layer is moved relative to the mechanical piston layer, such that filled cubbies are aligned to the pins, for the next ejection of die onto a new segment of the substrate.

The "Third" layer is the Wafer Plate or the Die Retention Layer (DRL) which simply provides for any size wafer with any size die pattern a pre-patterned wafer retention stencil with vias or holes patterned through each die location center. In another embodiment each DRL may also have each and every die scribe line printed to height as to create individual Cubby wall patterns for each die allowing for better die and wafer stabilization. The Cubby wall patterns can also allow for each die Singulation process an exact pattern to follow for either the scribing saw blade or the laser scribe.

The Die Retention Layer (DRL) is where the wafer and die reside until ejected onto an adjacent substrate. For example, it has holes located to correspond to the bonding die position of the Membrane Surface, the underlying substrate, which require or receives only a fraction of the total die to be ejected and bonded by the Conductive Adhesive at a time. This is determined by the predetermined pattern or antenna size. Once those die are ejected, the integrated CAP and PPPA layer is then moved together relative to the next predetermined pattern, as is shown in one or more of FIGS. 1-122.

The "Forth" layer is the "Wafer" itself which is of inclusive of any size or part of any randomly Laser programmed unique wafers. It is attached to a pre-patterned wafer retention stencil with vias or holes patterned under each randomly Laser programmed unique die center and able to be ejected by the PPPA off the DRL. The randomly Laser programmed unique wafers can be whole 18", 12", 8", 6", or 4". They also can be cut out to a pattern that allows for multiple wafers to be put together like a puzzle creating one large continuous wafer and applied to one continuous Wafer plate or DRL. By doing this it allows for unused or nonfunctional die to be excised as to create 100% usable die, as is shown in one or more of FIGS. 1-122.

The "Fifth" layer is the "Conductive Adhesive" layer (Isotropic, Anisotropic or other) which is applied over the complete "Wafer" and die cut exactly to the shape of that "Wafer", or can be a liquid that flows on the "Wafer" and presets and semi cures or cures enough so that either can be then scribed, diced or cut into the same size dimensions as the die ejected from the DRL. Also, the adhesive can be stenciled over a select area or die to be attached, as is shown in one or more of FIGS. 1-122.

The "Sixth" layer is the "Membrane Surface" or "Target Substrate" to which the IC or die is being applied to create a circuit or connection. This layer is a preprinted pattern on a continuous web, like that of a newspaper the continuous pattern if printed to match the PPPA pattern.

The subject matter disclosed herein also includes a new design for a two sided randomly Laser programmed unique die IC die which has at least one bonding pad(s) on both the top and bottom surfaces of the die, as shown in one or more of FIGS. 1-122. For such a die, the die can be attached to either side of an antenna or other substrates, or within a pre-embossed shape equal to that of the thickness of the 2 sided I/O randomly Laser programmed unique bare die, said embossed shape may also have a via or not to allow for a connection to the opposite side of substrate when folded or just to connect to another substrate. After or before that attachment, a conductive adhesive (anisotropic, isotropic, or other) may be applied on the exposed top or bottom die surface, covering either bonding pad(s), as shown in one or more of FIGS. 1-122. After the antenna or other flexible substrate exits the ICCES stage, it may then be fan folded either over the die or back-to-back, a passivation covering may be applied between both antenna structures by printing or other means as not to short out either or both antenna structures, but with the pad area exposed for connection to die I/O, so that bonding landings on the substrate match the adhesive covered top die surface and then brought into contact with pressure to form the bond attachment, as shown in one or more of FIGS. 1-122. Upon the completion of the fan folding one edge of the stack is then sliced to sever individual antennas which may then the randomly Laser programmed unique ID may be read or authenticated for functioning/nonfunctioning. Said stack may be counted, authenticated from the secure database on or off site and then packaged, as is shown in one or more of FIGS. 1-122.

The subject matter herein provides die assembly production capabilities orders of magnitude greater than any currently available, which is required to achieve the goal of low cost high volume assembly.

The subject matter herein provides die assembly production capabilities orders of magnitude greater than any currently available, which is required to achieve the goal of low cost high volume assembly.

Various embodiments are now described by way of example and not limitation.

A method of operation for an integrated circuit controlled ejection system (ICCES) for massively parallel integrated circuit assembly (MPICA) performed in accordance with any of the embodiments described or shown herein.

The method, further comprising: providing at least one die retention Cubbie, in a Die Retention Layer (DRL), in which at least one corresponding die resides until ejected onto an adjacent substrate.

The method, wherein the at least one Die Retention cubby performs a function in accordance with any of the embodiments described or shown herein.

The method, further comprising: providing at least one push piston, in a Push Pin Piston Assembly (PPPA), to eject at least one corresponding die into a membrane substrate.

The method, wherein the at least one push piston from the PPPA performs a function in accordance with any of the embodiments described or shown herein.

The method, further comprising: providing a Centralized Air Plate (CAP) that is separate and moveable with respect to at least one other layer of the ICCES MPICA.

The method, wherein the Centralized Air Plate (CAP) performs a function in accordance with any of the embodiments described or shown herein. The method, wherein the Centralized Air Plate (CAP) and the Push Pin Piston Assembly (PPPA) are one unit, to eject at least one corresponding die into a membrane substrate.

The method, further comprising: multiple wafers providing at least one push piston, in a Push Pin Piston Assembly (PPPA), to eject at least one corresponding die into a membrane substrate.

The method, further comprising: a minimum of one of many wafers which provides at least one push piston, in a Push Pin Piston Assembly (PPPA), to eject at least one corresponding die into a membrane substrate, wherein the corresponding die is programmed (i.e. ROM laser) with a unique ID to correspond to its Wafer Map and to be authenticated as an operational device.

A system for an integrated circuit controlled ejection system (ICCES) for MPICA configured in accordance with any of the embodiments described or shown herein.

The system, further comprising: a die retention layer (DRL).

The system, wherein the Die Retention Layer (DRL) is configured in accordance with any of the embodiments described or shown herein.

The system, wherein the Die Retention Layer (DRL) includes one or more of: a plurality of die retention receptacles formed at a surface of the die retention layer by a three-dimensional printer; each Die Retention Receptacle having dimensions larger than a die size, and positioned to correspond to the placement of a corresponding die on a wafer; each Die Retention Receptacle having a bottom surface having a hole through which a pin is configured to extend, the pin attaching a piston having the die size, the piston included in a plurality of pistons; each die within the Die Retention Receptacle having a top and bottom surface with at least one pad allowing for the die to be attached up or down by the pin extending through the hole of the Die Retention Receptacle, the pin is attached to a piston or pin being smaller than the total area of the die, the piston or pin can include a plurality of pistons or pins; wherein a first tacky or adhesive material may be used on a backside of the wafer containing a plurality of dies including the die, the first tacky material is configured to provide a sticking force having a value less than a second tacky material secures to the target substrate; wherein a first surface of the wafer containing a plurality of dies including the die, the first is configured with air holes to provide a sticking or vacuum force holding or retaining die and wafer until a second tacky material secures the die to the target substrate; wherein the wafer is placed on the die retention surface with the die facing outward, the piston(s) are deployed upward to contact the first tacky layer to secure the die onto a surface of the piston(s); wherein the wafer is placed on the Die Retention Layer (DRL) surface with the die facing outward, the piston(s) form are deployed upward to contact with the air holes providing a sticking or vacuum force holding or retaining die and wafer to secure the die onto a surface of the piston(s); wherein the second adhesive material is an anisotropic adhesive or anisotropic film; wherein the Die Retention Layer (DRL), Wafer and Adhesive material are scribed by a laser to separate the dies of the wafer; or wherein the piston exerts a downward force that pulls on the separated die to pull the separated die into the die receptacle into contact with the anisotropic adhesive layer.

The system, further comprising: a Push Pin Piston layer (PPPL).

The system, wherein the Push Pin Piston Layer (PPPL) is configured in accordance with any of the embodiments described or shown herein.

The system, wherein the Push Pin Piston Layer includes at least one of: a plurality of chambers aligned with a plurality die receptacles of a die retention layer, each chamber including a first hole configured to receive a corresponding pin connected between a chamber and a corresponding die receptacle; each chamber including a piston connected to the corresponding pin, a radius of the pin being less than a dimension of the chamber, each piston configured to move up and down, a total excursion being the at least the same as the die thickness; each chamber including a second hole that opens from the Centralized Air Plate (CAP) configured to provide a first positive pressure to push the piston(s) or plate down to a die receptacle end, to push the piston or plate up to a die underside surface when a wafer that includes a plurality of dies are positioned adjacent to the die retention layer; the Centralized Air Plate (CAP) is configured to provide a negative pressure to pull the piston or piston plate up and away from the die receptacle end, to pull the piston/plate down to a bottom of the die receptacle to bring the die into the die receptacle; wherein, when a Membrane Surface (Target Substrate) is brought into near contact proximity to the die receptacle surface, a positive pressure is applied by the Centralized Air Plate (CAP) to move the piston/plate down to the die receptacle end, to push the chamber piston/plate up and the die out of the die receptacle, to eject the die onto the substrate surface where the die is attached by an anisotropic adhesive material; wherein, the Membrane Surface (Target Substrate) which is brought into near contact proximity to the die receptacle surface, a positive pressure is applied by the Centralized Air Plate (CAP) to move the piston/plate down to the die receptacle end, to push the chamber piston/plate up and the die out of the die receptacle, to eject the die onto the substrate surface where the die is attached by an anisotropic adhesive material can be a circuit, antenna, or any specific pattern known or later defined; wherein an attachment force of the anisotropic adhesive material is configured to pull the die off of the piston/plate; or wherein a negative air pressure is induced by the Centralized Air Plate (CAP) to withdraw the piston into the die receptacle to leave the die attached to the Target Substrate.

The system, further comprising: a Centralized Air Plate (CAP).

The system, wherein the Centralized Air Plate (CAP) layer is configured in accordance with any of the embodiments described or shown herein.

The system, wherein the Centralized Air Plate (CAP) layer includes at least one of: a plurality of air holes matched to a distribution of holes in a piston chamber layer, but at locations specific to a number of die of a wafer to be ejected at any one time, the number of die to be ejected at any one time being less than or equal to a total number of die of the wafer.

The system, wherein the Centralized Air Plate (CAP) layer and the at least one continuous piston chamber/plate layer and has predetermined 3D printed, metal, plastic or other material(s) at specific predetermined locations to a specific number of die of a wafer to be ejected at any one time, the number of die to be ejected at any one time being less than or equal to a total number of die of the wafer.

The system, wherein the Centralized Air Plate (CAP) layer attaches to a Push-Pin-Piston Layer (PPPL) becoming one operating device with the predetermined 3D printed, metal, plastic or other material(s) at specific predetermined locations to a specific number of die of a wafer to be ejected at any one time, the number of die to be ejected at any one time being less than or equal to a total number of die of the wafer.

The system, wherein the Centralized Air Plate (CAP) layer attaches to a Push-Pin-Piston Layer (PPPL) becoming one operating device with the predetermined 3D printed, metal, plastic or other material(s) at specific predetermined locations to a specific number of die of a wafer to be ejected at any one time, the number of die to be ejected at any one time being less than or equal to a total number of die of the wafer, upon completion of an ejection cycle the cycle is repeated over and over again until each Pin location has exhausted every die within its boundary.

The system, wherein the Centralized Air Plate (CAP) layer attaches to a Push-Pin-Piston Layer (PPPL) becoming one operating device which has its own boundaries, and a Boundary is defined by the total number of die being pushed, which is defined by the size of each Antenna, circuit or pattern defined by the Membrane Surface or Target Substrate.

A two-sided ID die configured in accordance with any of the embodiments described or shown herein.

The two-sided ID die, further comprising: a top surface that includes at least a one bonding pad; and a bottom surface that includes at least a one bonding pad.

The two-sided ID die, wherein at least one of the top surface or the bottom surface includes a conductive adhesive that covers the top surface or the bottom surface.

An Integrated Circuit (IC) die ejection head assembly system configured in accordance with any of the embodiments described or shown herein.

The IC die ejection head assembly system, wherein an IC die ejection head assembly system utilizes three-dimensional (3D) printing to achieve very high resolution manufacturing.

The IC die ejection head assembly system, wherein the IC die ejection head assembly system is configured to: retain at least 800,000 die; and eject a first portion of the at least 800,000 die while retaining a second portion of the at least 800,000 die.

The IC die ejection head assembly system, comprising: subassemblies, the Centralized Air Plate (CAP) layer, and the Push Pin Piston layer (PPPL).

The IC die ejection system head assembly system, configured to eject the next die in the next defined movement until each defined die within each defined pattern of each defined push-pin exhaust every die on each defined wafer, as shown in one or more of FIGS. 1-122 The IC die ejection system head assembly system comprising multiple wafers which proceeds to eject the next die in the next defined movement until each defined die within each defined pattern of each defined push-pin exhaust every die on each defined wafer, as shown in one or more of FIGS. 1-122.

An Integrated Circuit (IC) die ejection head assembly system: configured in accordance with any of the embodiments described or shown herein; wherein the IC die ejection head assembly system utilizes three-dimensional (3D) printing to achieve very high resolution manufacturing; and/or wherein the IC die ejection head assembly system is configured to: retain at least 800,000 die; and eject a first portion of the at least 800,000 die while retaining a second portion of the at least 800,000 die.

Further Example Embodiments

A device, as defined herein, is a machine or manufacture as defined by 35 U.S.C. § 101. That is, as used herein, the term "device" refers to a machine or other tangible, manufactured object and excludes software and signals. Devices may be digital, analog or a combination thereof. Devices may include integrated circuits (ICs), one or more processors (e.g., central processing units (CPUs), microprocessors, digital signal processors (DSPs), etc.) and/or may be implemented with any semiconductor technology, including one or more of a Bipolar Junction Transistor (BJT), a heterojunction bipolar transistor (HBT), a metal oxide field effect transistor (MOSFET) device, a metal semiconductor field effect transistor (MESFET) or other transconductor or transistor technology device. Such devices may use the same or alternative configurations other than the configuration illustrated in embodiments presented herein.

Techniques, including methods, described herein may be implemented in hardware (digital and/or analog) or a combination of hardware and software and/or firmware. Techniques described herein may be implemented in one or more components. Embodiments may comprise computer program products comprising logic (e.g., in the form of program code or instructions as well as firmware) stored on any computer useable storage medium, which may be integrated in or separate from other components. Such program code, when executed in one or more processors, causes a device to operate as described herein. Devices in which embodiments may be implemented may include storage, such as storage drives, memory devices, and further types of computer-readable media. Examples of such computer-readable storage media include, but are not limited to, a hard disk, a removable magnetic disk, a removable optical disk, flash memory cards, digital video disks, random access memories (RAMs), read only memories (ROM), and the like. In greater detail, examples of such computer-readable storage media include, but are not limited to, a hard disk associated with a hard disk drive, a removable magnetic disk, a removable optical disk (e.g., CDROMs, DVDs, etc.), zip disks, tapes, magnetic storage devices, MEMS (micro-electromechanical systems) storage, nanotechnology-based storage devices, as well as other media such as flash memory cards, digital video discs, RAM devices, ROM devices, and the like. Such computer-readable storage media may, for example, store computer program logic, e.g., program modules, comprising computer executable instructions that, when executed, provide and/or maintain one or more aspects of functionality described herein with reference to the figures, as well as any and all components, steps and functions therein and/or further embodiments described herein.

Computer readable storage media are distinguished from and non-overlapping with communication media. Communication media embodies computer-readable instructions, data structures, program modules or other data in a modulated data signal such as a carrier wave. The term "modulated data signal" means a signal that has one or more of its characteristics set or changed in such a manner as to encode information in the signal. By way of example, and not limitation, communication media includes wired media as well as wireless media such as acoustic, RF, infrared and other wireless media. Example embodiments are also directed to such communication media.

Conclusion

While various embodiments have been described above, it should be understood that they have been presented by way of example only, and not limitation. It will be apparent to persons skilled in the relevant art that various changes in form and detail can be made therein without departing from the spirit and scope of the embodiments. Thus, the breadth and scope of the embodiments should not be limited by any of the above-described exemplary embodiments, but should be defined only in accordance with the following claims and their equivalents.

What is claimed is:

1. A system for an integrated circuit controlled ejection system (ICCES) for massively parallel integrated circuit assembly (MPICA), the system comprising:
   a scribing apparatus configured to separate a plurality of die from a wafer;
   a die retention layer configured to receive and retain the plurality of die; and
   an ejection apparatus configured to concurrently eject at least two die of the plurality of die from the die retention layer onto a target substrate;
     wherein the die retention layer includes a plurality of die retention receptacles formed at a first surface of the die retention layer and configured to retain the plurality of die;
     wherein the die retention receptacles are three-dimensionally printed to correspond to each die of the plurality of die of the wafer;
     wherein each die retention receptacle of the plurality of die retention receptacles includes a bottom surface having a hole through which a pin is configured to extend, the pin attaching a piston having a size approximately equal to a corresponding die, the piston included in a plurality of pistons, and wherein a first adhesive material is present on a backside of the wafer, the first adhesive material configured to provide a sticking force having a value less than that of an attachment force of a second adhesive material of the target substrate, and each die of the plurality of die is positioned adjacent to a portion of the first adhesive material subsequent to being separated by the scribing apparatus;
   wherein the ejection apparatus comprises:
     a push piston layer comprising the plurality of pistons, each being configured to:
       exert a downward force that pulls on a corresponding die of the plurality of die to pull the corresponding die into the die receptacle and into contact with the first adhesive material prior to being separated by the scribing apparatus, and
       exert an upward force to deploy the piston upward to contact the first adhesive material to secure the corresponding die onto a surface of the piston subsequent to being separated by the scribing apparatus; and
     wherein the push piston layer includes:
       an air manifold; and
       a plurality of chambers aligned with the plurality of die receptacles of the die retention layer;
         each chamber including
           a first hole configured to receive the pin configured to extend through the hole of a corresponding one of the plurality of die receptacles, the pin being connected between the chamber and the corresponding one of the plurality of die receptacles,
           the piston connected to the pin, a radius of the pin being less than a dimension of the chamber, the piston being configured to move up and down, wherein a total excursion of the pin is the same as a die thickness, and
           a second hole that opens the air manifold, the air manifold being configured to:
             provide a positive pressure to push the piston down to a die receptacle end of the corresponding one of the plurality of die receptacles, and push the piston up to a die underside surface when the wafer is positioned adjacent to the die retention layer.

2. The system of claim 1, wherein the air manifold is configured to:
   provide a negative pressure to pull the piston up and away from the die receptacle end, and
   pull the piston down to a bottom of the corresponding one of the plurality of die receptacles to bring the corresponding die into the corresponding one of the plurality of die receptacles;
   wherein, when the target substrate is brought into near contact proximity to the first surface of the die retention layer, the positive pressure is applied by the air manifold to move the piston down to the die receptacle end, to push the piston up and the corresponding die out of the corresponding one of the plurality of die receptacles, to eject the corresponding die onto the target substrate where the corresponding die is attached by the second adhesive material,
   the attachment force of the second adhesive material being configured to pull the corresponding die off of the piston; and
   wherein a negative air pressure is induced by the air manifold to withdraw the piston into the die receptacle to leave the corresponding die attached to the substrate.

3. The system of claim 2, wherein the second adhesive material is an anisotropic adhesive film.

4. The system of claim 2, further comprising an air chamber layer that includes:
   a plurality of air holes, matched to a distribution of holes in the air chamber layer at locations specific to a number of die of the plurality of die to be ejected at any one time, the number of die to be ejected at any one time being less than or equal to a total number of die of the plurality of die,
   the air chamber layer being moveable with respect to the push piston layer.

5. The system of claim 4, wherein the target substrate includes a plurality of antenna, and wherein the ejection apparatus is configured to eject each of the number of die onto the target substrate in respective positions corresponding to an antenna of the plurality of antenna.

6. A system for an integrated circuit controlled ejection system (ICCES) for massively parallel integrated circuit assembly (MPICA), the system comprising:
   a laser scriber configured to separate a plurality of die from a wafer, the plurality of die comprising at least 800,000 die;
   a die retention layer configured to receive and retain the plurality of die, the die retention layer including a plurality of die retention receptacles corresponding to each of the plurality of die; and an ejection apparatus configured to concurrently eject two or more die of the plurality of die from the die retention layer onto a target substrate, the ejection apparatus including a plurality of pistons corresponding to each of the plurality of die retention receptacles, each piston of the plurality of pistons configured to:
pull a die of the plurality of die into a corresponding die retention receptacle of the plurality of die retention receptacles;
attach to the die via a first adhesive material;
push the die onto a second adhesive material of the target substrate; and
release the die.

7. The system of claim 6, wherein the die retention layer includes the plurality of die retention receptacles formed at a first surface of the die retention layer.

8. The system of claim 7, wherein the plurality of die retention receptacles are three-dimensionally printed to correspond to each die of the plurality of die of the wafer.

9. The system of claim 8, wherein each die retention receptacle of the plurality of die retention receptacles includes a bottom surface having a hole through which a pin is configured to extend, the pin attaching a piston having a size approximately equal to a corresponding die, the piston included in a plurality of pistons; and
wherein the first adhesive material is present on a backside of the wafer, the first adhesive material configured to provide a sticking force having a value less than that of an attachment force of a second adhesive material of the target substrate, such that each die of the plurality of die is positioned adjacent to a portion of the first adhesive material subsequent to being separated by the laser scriber.

10. The system of claim 9, the ejection apparatus comprising:
a push piston layer comprising the plurality of pistons, each being configured to:
exert a downward force that pulls on a corresponding die of the plurality of die to pull the corresponding die into the die receptacle and into contact with the first adhesive material prior to being separated by the laser scriber; and
exert an upward force to deploy the piston upward to contact the first adhesive material to secure the corresponding die onto a surface of the piston subsequent to being separated by the laser scriber.

11. The system of claim 10, wherein the push piston layer includes:
an air manifold; and
a plurality of chambers aligned with the plurality of die receptacles of the die retention layer;
each chamber including
a first hole configured to receive the pin configured to extend through the hole of a corresponding one of the plurality of die receptacles, the pin being connected between the chamber and the corresponding one of the plurality of die receptacles,
the piston connected to the pin, a radius of the pin being less than a dimension of the chamber, the piston being configured to move up and down, wherein a total excursion of the pin is the same as a die thickness, and
a second hole that opens the air manifold, the air manifold being configured to:
provide a positive pressure to push the piston down to a die receptacle end of the corresponding one of the plurality of die receptacles, and
push the piston up to a die underside surface when the wafer is positioned adjacent to the die retention layer.

12. The system of claim 11, wherein the air manifold is configured to:
provide a negative pressure to pull the piston up and away from the die receptacle end, and
pull the piston down to a bottom of the corresponding one of the plurality of die receptacles to bring the corresponding die into the corresponding one of the plurality of die receptacles;
wherein, when the target substrate is brought into near contact proximity to the first surface of the die retention layer, the positive pressure is applied by the air manifold to move the piston down to the die receptacle end, to push the chamber piston up and the corresponding die out of the corresponding one of the plurality of die receptacles, to eject the corresponding die onto the target substrate where the corresponding die is attached by the second adhesive material,
the attachment force of the second adhesive material being configured to pull the corresponding die off of the piston; and
wherein a negative air pressure is induced by the air manifold to withdraw the piston into the die receptacle to leave the corresponding die attached to the substrate.

13. The system of claim 12, wherein the second adhesive material is an anisotropic adhesive film.

14. The system of claim 12, further comprising an air chamber layer that includes:
a plurality of air holes, matched to a distribution of holes in the air chamber layer at locations specific to a number of die of the plurality of die to be ejected at any one time, the number of die to be ejected at any one time being less than or equal to a total number of die of the plurality of die,
the air chamber layer being moveable with respect to the push piston layer.

15. The system of claim 14, wherein the target substrate includes a plurality of antenna, and wherein the ejection apparatus is configured to eject each of the number of die onto the target substrate in respective positions corresponding to an antenna of the plurality of antenna.

* * * * *